US010276637B2

(12) United States Patent
Matsumoto et al.

(10) Patent No.: US 10,276,637 B2
(45) Date of Patent: Apr. 30, 2019

(54) ORGANIC EL MULTI-COLOR LIGHT-EMITTING DEVICE

(75) Inventors: Toshiki Matsumoto, Tokyo (JP); Tadahiko Yoshinaga, Tokyo (JP); Tomoki Kato, Sodegaura (JP); Tetsuya Inoue, Sodegaura (JP); Mitsunori Ito, Sodegaura (JP); Kei Yoshida, Sodegaura (JP); Kiyoshi Ikeda, Sodegaura (JP); Mitsuru Eida, Sodegaura (JP)

(73) Assignees: IDEMITSU KOSAN CO., LTD., Tokyo (JP); JOLED INC., Tokyo (JP)

( * ) Notice: Subject to any disclaimer, the term of this patent is extended or adjusted under 35 U.S.C. 154(b) by 919 days.

(21) Appl. No.: 14/114,880

(22) PCT Filed: May 9, 2012

(86) PCT No.: PCT/JP2012/003029

§ 371 (c)(1),
(2), (4) Date: Jan. 22, 2014

(87) PCT Pub. No.: WO2012/157211

PCT Pub. Date: Nov. 22, 2012

(65) Prior Publication Data

US 2014/0159023 A1 Jun. 12, 2014

(30) Foreign Application Priority Data

May 13, 2011 (JP) ................................. 2011-108679

(51) Int. Cl.
*H01L 27/32* (2006.01)
*H01L 51/00* (2006.01)
(Continued)

(52) U.S. Cl.
CPC .......... *H01L 27/3211* (2013.01); *C09K 11/06* (2013.01); *H01L 51/0061* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 8,580,391 | B2 | 11/2013 | Iwakuma et al. |
| 8,703,304 | B2 | 4/2014 | Yabunouchi |

(Continued)

FOREIGN PATENT DOCUMENTS

| | | |
|---|---|---|
| JP | 10-153967 | 6/1998 |
| JP | 2008-021687 | 1/2008 |

(Continued)

OTHER PUBLICATIONS

Chu et al., Ab initio molecular orbital study of 1,3,5-triazine derivatives for phosphorescent organic light emitting devices, Chemical Physics Letters, Elsevier BV, NL, vol. 415 (2005) 137-140.

(Continued)

*Primary Examiner* — Austin Murata
(74) *Attorney, Agent, or Firm* — Foley and Lardner LLP

(57) ABSTRACT

An organic EL multi-color emitting device including a substrate, and a first light-emitting element and a second light-emitting element arranged on the surface of the substrate; the first light-emitting element including, between an anode and a cathode, a first organic layer, a second organic layer and a third organic layer in this sequence in a direction perpendicular to the surface of the substrate; the second light-emitting element including, between an anode and a cathode, a second organic layer and a third organic layer in this sequence in a direction perpendicular to the surface of the substrate; the first organic layer including a first light-emitting dopant; the third organic layer including a second light-emitting dopant; the second organic layer including any of (A) a compound including an arylamine site, and a furan site or a thiophene site, (B) a compound including an arylamine site and a site comprising a nitrogen-containing (Continued)

six-membered ring structure, (C) a compound including a carbazole site, and a furan site or a thiophene site, and (D) a compound including a carbazole site and a site including a nitrogen-containing six-membered ring structure.

28 Claims, 2 Drawing Sheets

(51) Int. Cl.

| | |
|---|---|
| ***C09K 11/06*** | (2006.01) |
| ***H05B 33/10*** | (2006.01) |
| ***H01L 51/50*** | (2006.01) |

(52) U.S. Cl.

CPC ...... *H01L 51/0067* (2013.01); *H01L 51/0072* (2013.01); *H01L 51/0073* (2013.01); *H01L 51/0074* (2013.01); *H01L 51/5044* (2013.01); *H05B 33/10* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1059* (2013.01); *C09K 2211/1088* (2013.01); *C09K 2211/1092* (2013.01); *H01L 51/5016* (2013.01); *H01L 51/5056* (2013.01); *H01L 51/5072* (2013.01); *H01L 51/5096* (2013.01); *H01L 2251/5376* (2013.01)

(56) References Cited

U.S. PATENT DOCUMENTS

| | | | | |
|---|---|---|---|---|
| 8,741,450 | B2 | 6/2014 | Iwakuma et al. | |
| 9,087,997 | B2 | 7/2015 | Yabunouchi | |
| 2004/0086745 | A1 | 5/2004 | Iwakuma et al. | |
| 2005/0249976 | A1 | 11/2005 | Iwakuma et al. | |
| 2005/0264174 | A1* | 12/2005 | Liao | H01L 51/5278 313/500 |
| 2008/0102310 | A1* | 5/2008 | Thompson | H01L 51/5036 428/690 |
| 2008/0284317 | A1 | 11/2008 | Liao et al. | |
| 2009/0284139 | A1* | 11/2009 | Ushikubo | H01L 51/5036 313/504 |
| 2010/0001636 | A1* | 1/2010 | Yabunouchi | C07D 307/91 313/504 |
| 2011/0101398 | A1 | 5/2011 | Uchida | |
| 2011/0297924 | A1* | 12/2011 | Yabunouchi | C07D 209/86 257/40 |
| 2012/0119197 | A1* | 5/2012 | Nishimura | C07D 209/86 257/40 |
| 2012/0161119 | A1 | 6/2012 | Yabunouchi | |
| 2012/0298975 | A1 | 11/2012 | Iwakuma et al. | |
| 2012/0319099 | A1 | 12/2012 | Iwakuma et al. | |
| 2014/0061630 | A1 | 3/2014 | Yabunouchi | |

FOREIGN PATENT DOCUMENTS

| | | |
|---|---|---|
| JP | 2011-233855 | 11/2011 |
| JP | 2012-028275 | 2/2012 |
| KR | 10-0948700 B1 | 3/2010 |
| KR | 20110011647 A | 2/2011 |
| WO | WO-2009/145016 | 12/2009 |

OTHER PUBLICATIONS

Supplementary European Search Report issued in Application No. 12786551.7 dated Nov. 28, 2014.

Higo et al., A High-Performance Hybrid OLED Device Assisted by Evaporated Common Organic Layers. IDW'10, Proceedings of the 17th International Display Workshops vol. 1 (Dec. 1, 2010).

International Search Report in connection with PCT/JP2012/003029 dated Nov. 28, 2013.

Korean Office Action dated Nov. 14, 2018 in corresponding application No. 10-2013-7029539.

* cited by examiner

ORGANIC EL MULTI-COLOR LIGHT-EMITTING DEVICE

This application is the National Phase of PCT/JP2012/003029, filed May 9, 2012, which claims priority to Japanese Application No. 2011-108679, filed May 13, 2011, the disclosures of which are hereby incorporated by reference in their entirety.

TECHNICAL FIELD

The invention relates to an organic EL multi-color light-emitting device.

BACKGROUND ART

An organic electroluminescence (EL) device has many attractive features as a display (multi-color emitting device) such as low consumption power, flatness, high-response speed, wide viewing angle or the like. As for an organic EL display using such an organic EL device, an all-deposition type display in which an emitting layer or the like are formed by depositing a low-molecular weight organic material has been put into practical use in a small-size display such as a mobile phone.

In an all-deposition type organic EL display, materials are not used efficiently. In addition, a vacuum system or a color-coding mask for a deposition layer is required for production, and hence, film formation for a large-sized screen is difficult, whereby it has a problem regarding a reduction in cost and an increase in size.

On the other hand, if a coating-type organic EL display in which an emitting layer or the like are formed by coating a high-molecular material by ink-jetting, nozzle printing, gravure printing or the like can be realized, there is a possibility that the above-mentioned problems associated with a deposition method can be solved (a display in FIG. 2, for example, HIL: hole-injection layer, IL: interlayer (hole-transporting layer), LEP: high-molecular emitting polymer, ETL: electron-transporting layer). However, a coating-type organic EL display has an insufficient luminous efficiency and a shorter lifetime as compared with an all-deposition type display. In particular, it has a serious problem in blue emission.

Patent Document 1 discloses a hybrid-type organic EL display which is a combination of a coating-type display which is inexpensive and enables the screen size to be increased and a high-performance deposition type display (FIG. 3).

The organic EL display shown in FIG. 3 is an organic EL display obtained by a method in which a red emitting layer and a green emitting layer (LEP) are separately provided by a coating method, and a blue emitting layer is allowed to be a common layer (Blue Common layer) by depositing a low-molecular material. The display shown in FIG. 3 can enhance the blue emission performance, and it is possible to reduce to color-coding steps from 3 to 2 steps. However, since a coating type hole-transporting layer (IL) is in contact with the anode side of the blue emitting layer, emission performance of blue color was not sufficient.

The display shown in FIG. 4 which is disclosed in Non-Patent Document 1 exhibits a significant improvement in blue emission performance due to the provision of a hybrid connecting layer (HCL) between the blue common layer as a deposition layer and a coating layer.

As the material of HCL, in order to improve the blue emitting performance, not only matching between the hole-injecting and transporting properties and the blue emitting layer, electron injecting and transporting properties to a red emitting layer and a green emitting layer formed by coating are required; in particular, when a red emitting layer and a green emitting layer formed by coating are phosphorescent layers, a higher triplet energy (T1) is also required in order to prevent diffusion of triplet energy. As the material for HCL, when a common hole-transporting material, a common electron-transporting material or a common high T1 material are respectively used singly, there is a problem that comprehensive improvement in performance or color reproducibility of an organic EL multi-color light-emitting device cannot be attained satisfactorily. That is, due to diffusion of triplet energy from the red emitting layer and the green emitting layer, the blue common layer emits light, whereby color mixing occurs.

RELATED ART DOCUMENTS

Non-Patent Documents

Patent Document 1: JP-A-H10-153967
Non-Patent Document 1: IDW2010 Digest, P311

SUMMARY OF THE INVENTION

An object of the invention is to provide an organic EL multi-color emitting device which has a high luminous efficiency, a long life and a high quality.

As a result of extensive studies, the inventors have found that, by providing a specific layer (adjacent layer) composed of a material which can function as an electron-transporting layer and a triplet exciton blocking layer in a red or yellow phosphorescent emitting element or a green phosphorescent emitting element and can function as a hole-injecting/transporting layer in a blue fluorescent emitting element, a highly efficient, a long-lived and high-quality organic EL multi-color emitting device can be obtained.

According to the invention, the following organic EL multi-color emitting device can be provided.

1. An organic EL multi-color emitting device comprising a substrate, and a first light-emitting element and a second light-emitting element arranged on the surface of the substrate;

the first light-emitting element comprising, between an anode and a cathode, a first organic layer, a second organic layer and a third organic layer in this sequence in a direction perpendicular to the surface of the substrate;

the second light-emitting element comprising, between an anode and a cathode, a second organic layer and a third organic layer in this sequence in a direction perpendicular to the surface of the substrate;

the first organic layer comprising a first light-emitting dopant;

the third organic layer comprising a second light-emitting dopant;

the second organic layer comprising any of the following compounds (A) to (D):

(A) a compound comprising an arylamine site, and a furan site or a thiophene site, (B) a compound comprising an arylamine site and a site comprising a nitrogen-containing six-membered ring structure, (C) a compound comprising a carbazole site, and a furan site or a thiophene site, and (D) a compound comprising a carbazole site and a site comprising a nitrogen-containing six-membered ring structure.

2. The organic EL multi-color light-emitting device according to 1, wherein the compounds (A) to (D) are a compound represented by the following formula (1) or (2):

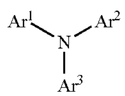
(1)

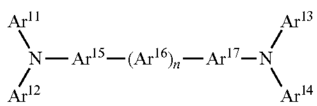
(2)

wherein, in the formula (1), one pair of $Ar^1$ and $Ar^2$, $Ar^1$ and $Ar^3$ and $Ar^2$ and $Ar^3$ is respectively bonded with each other to form a substituted or unsubstituted aromatic heterocyclic ring having 5 to 52 atoms that form a ring (hereinafter referred to as "ring atoms"); and/or $Ar^1$ to $Ar^3$ are independently a substituted or unsubstituted aromatic hydrocarbon group having 6 to 50 carbon atoms that form a ring (hereinafter referred to as "ring carbon atoms") or a substituted or unsubstituted aromatic heterocyclic group having 5 to 52 ring atoms;

provided that at least one of $Ar^1$ to $Ar^3$ is a substituent represented by the following formula (a) or the following formula (b);

in the formula (2), at least one pair of $Ar^{11}$ and $Ar^{15}$, $Ar^{12}$ and $Ar^{15}$, $Ar^{13}$ and $Ar^{17}$ and $Ar^{14}$ and $Ar^{17}$ are respectively bonded with each other to form a substituted or unsubstituted aromatic heterocyclic ring having 5 to 52 ring atoms; and/or $Ar^{11}$ to $Ar^{14}$ are independently a substituted or unsubstituted aromatic hydrocarbon group having 6 to 50 ring carbon atoms or a substituted or unsubstituted aromatic heterocyclic group having 5 to 52 ring atoms; $Ar^{15}$ to $Ar^{17}$ are independently a substituted or unsubstituted divalent aromatic hydrocarbon group having 6 to 50 ring carbon atoms or a substituted or unsubstituted divalent aromatic heterocyclic group having 5 to 52 ring atoms;

provided that at least one of $Ar^{11}$ to $Ar^{14}$ is a substituent represented by the following formula (a) or the following formula (b); and n is an integer of 0 to 2:

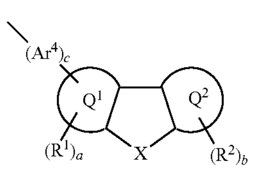
(a)

$$—(Ar^5)_d—AZ \quad (b)$$

wherein X is an oxygen atom (—O—) or a sulfur atom (—S—);

$Q^1$ and $Q^2$ are independently a saturated or unsaturated ring having 5 to 25 atoms;

AZ is a substituted or unsubstituted pyridinyl group, a substituted or unsubstituted pyrimidinyl group, a substituted or unsubstituted pyrazinyl group, a substituted or unsubstituted pyridazinyl group, a substituted or unsubstituted triazinyl group or a substituted or unsubstituted tetrazinyl group;

$Ar^4$ and $Ar^5$ are independently a substituted or unsubstituted divalent aromatic hydrocarbon group having 6 to 12 ring carbon atoms or a substituted or unsubstituted divalent aromatic heterocyclic group having 5 to 13 ring atoms, $R^1$ and $R^2$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, a substituted or unsubstituted aromatic hydrocarbon group having 6 to 25 ring carbon atoms, a substituted or unsubstituted aromatic heterocyclic group having 5 to 25 ring atoms, a halogen atom or a cyano group; and/or at least one of adjacent plural $R^1$s, adjacent plural $R^2$s and adjacent $R^1$ and $R^2$ are bonded with each other to form a substituted or unsubstituted saturated or unsaturated ring; and a, b, c and d are independently an integer of 0 to 3.

3. The organic EL multi-color emitting device according to 2, wherein, in the formula (1), when $Ar^1$ and $Ar^2$, $Ar^1$ and $Ar^3$ and $Ar^2$ and $Ar^3$ are not bonded with each other, at least one of $Ar^1$ to $Ar^3$ is a substituent represented by the formula (a).

4. The organic EL multi-color emitting device according to 2, wherein at least one of $Ar^1$, $Ar^2$ and $Ar^3$ in the formula (1) and at least one of $Ar^{11}$, $Ar^{12}$, $Ar^{13}$ and $Ar^{14}$ in the formula (2) is a substituent represented by the formula (a).

5. The organic EL multi-color emitting device according to any of 2 to 4, wherein the substituent represented by the formula (a) is a substituent represented by the following formula (a-1):

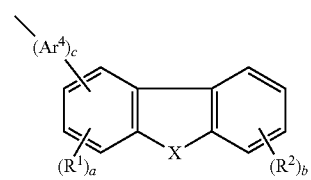
(a-1)

wherein X, $R^1$, $R^2$, $Ar^4$, a, b and c are the same as defined in the formula (a).

6. The organic EL multi-color emitting device according to 5, wherein the substituent represented by the formula (a-1) is a substituent represented by the following formula (a-2):

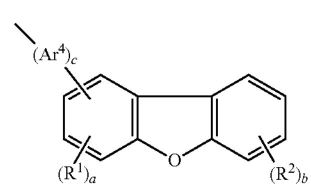
(a-2)

wherein $R^1$, $R^2$, $Ar^4$, a, b and c are the same as defined in the formula (a).

7. The organic EL multi-color emitting device according to any of 2 to 6, wherein at least one of $Ar^1$, $Ar^2$ and $Ar^3$ in the formula (1) and at least one of $Ar^{11}$, $Ar^{12}$, $Ar^{13}$ and $Ar^{14}$ in the formula (2) is a substituent represented by the following formula (c):

$$—Ar^{21}—Ar^{22}—(Ar^{23})_p \qquad (c)$$

wherein $Ar^{21}$ to $Ar^{23}$ are independently a substituted or unsubstituted aromatic hydrocarbon group having 6 to 12 ring carbon atoms or a substituted or unsubstituted aromatic heterocyclic group having 5 to 13 ring atoms; and p is an integer of 0 to 2.

8. The organic EL multi-color emitting device according to 7, wherein the substituent represented by the formula (c) is a substituent represented by the following formula (c-1):

(c-1)

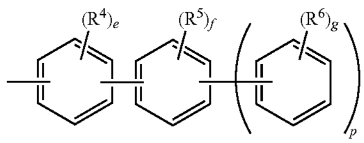

wherein $R^4$, $R^5$ and $R^6$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group; and/or at least one of plural $R^4$s, plural $R^5$s and plural $R^6$s are respectively bonded with each other to form a substituted or unsubstituted saturated or unsaturated ring; and/or at least one of adjacent $R^4$ and $R^5$, and adjacent $R^5$ and $R^6$ are respectively bonded with each other to form a substituted or unsubstituted saturated or unsaturated ring; and p is an integer of 0 to 2, e is an integer of 0 to 4 and f and g are independently an integer of 0 to 5.

9. The organic EL multi-color emitting device according to any of 2 to 8, wherein at least one of $Ar^4$ and $Ar^5$ is a linkage group represented by the formula (d) or (e):

(d)

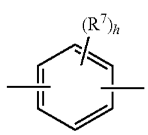

(e)

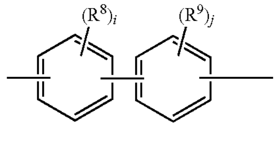

wherein $R^7$, $R^8$ and $R^9$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group; and/or at least one of plural $R^7$s, plural $R^8$s and plural $R^9$s are respectively bonded with each other to form a substituted or unsubstituted saturated or unsaturated ring; and/or adjacent $R^8$ and $R^9$ are respectively bonded with each other to form a substituted or unsubstituted saturated or unsaturated ring; and h, i and j are independently an integer of 0 to 4.

10. The organic EL multi-color emitting device according to any of 2 to 9, wherein the compound represented by the formula (1) is a compound represented by the following formula (1-1):

(1-1)

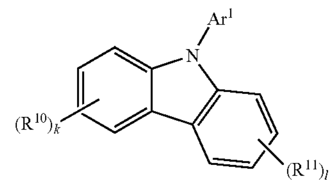

wherein $Ar^1$ is a substituent represented by the formula (a) or (b);

$R^{10}$ and $R^{11}$ are the same as $R^1$ and $R^2$ in the formula (a); and k and l are independently an integer of 0 to 4.

11. The organic EL multi-color emitting device according to any of 2 to 10 wherein, when the aromatic hydrocarbon group having 6 to 25 ring carbon atoms of $R^1$ and $R^2$ and the aromatic heterocyclic group having 5 to 25 ring atoms have a substituent, the substituent is a carbazolyl group, a dibenzofuranyl group or a dibenzothiophenyl group.

12. The organic EL multi-color emitting device according to any of 2 to 11, wherein the compound represented by the formula (2) is a compound represented by the following formula (f):

(f)

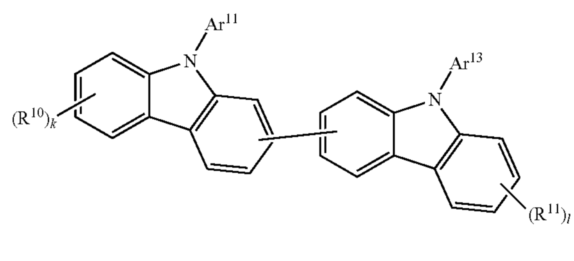

wherein $Ar^{11}$ and $Ar^{13}$ are independently a substituted or unsubstituted aromatic hydrocarbon group having 6 to 50 ring carbon atoms or a substituted or unsubstituted aromatic heterocyclic group having 5 to 52 ring atoms, and at least one of $Ar^{11}$ and $Ar^{13}$ is a substituent represented by the formula (a) or (b);

$R^{10}$ and $R^{11}$ are the same as $R^1$ and $R^2$ in the formula (a); and k and l are independently an integer of 0 to 4.

13. The organic EL multi-color emitting device according to 12, wherein the compound represented by the formula (f) is a compound represented by the following formula (f-1) or the following formula (f-2):

(f-1)

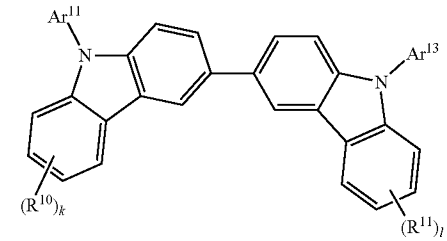

(f-2)

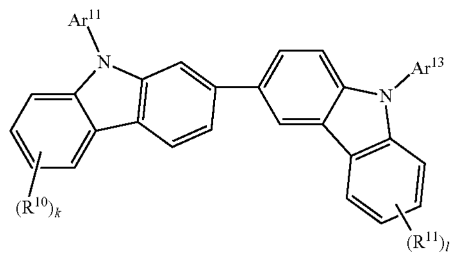

wherein $Ar^{11}$, $Ar^{13}$, $R^{10}$, $R^{11}$, k and l are as defined in the formula (f).

14. The organic EL multi-color emitting device according to any of 1 to 13, wherein the second organic layer of the first light-emitting element and the second organic layer of the second light-emitting element comprise the same compound.

15. The organic EL multi-color emitting device according to any of 1 to 14, wherein the thickness of the second organic layer of the first light-emitting element is the same as the thickness of the second organic layer of the second light-emitting element.

16. The organic EL multi-color emitting device according to any of 1 to 15, wherein the second organic layer is in contact with the first organic layer and the second organic layer comprises the compound represented by the formula (C) or (D).

17. The organic EL multi-color emitting device according to any of 1 to 16, wherein the second organic layer is in contact with the third organic layer, and the second organic layer comprises the compound represented by the formula (A) or (B).

18. The organic EL multi-color emitting device according to any of 1 to 17, wherein the second organic layer is a single layer or a stack of a plurality of organic layers, and the second organic layer comprises two or more selected from the compounds (A) to (D).

19. The organic EL multi-color emitting device according to 18, wherein the second organic layer is a stack of a plurality of organic layers.

20. The organic EL multi-color emitting device according to any of 1 to 19, wherein the second organic layer comprises a compound having a triplet energy of 2.55 eV or more.

21. The organic EL multi-color emitting device according to any of 1 to 20, wherein the second organic layer is in contact with the first organic layer, and the second organic layer comprises a compound having a triplet energy of 2.65 eV or more.

22. The organic EL multi-color emitting device according to any of 1 to 21, wherein the first organic layer is a red, yellow or green phosphorescent emitting layer and the third organic layer is a blue fluorescent emitting layer.

23. The organic EL multi-color emitting device according to any of 1 to 22, wherein the first organic layer is formed by coating and the third organic layer is formed by deposition.

24. The organic EL multi-color emitting device according to any of 1 to 23, wherein a hole-injecting/transporting layer formed by coating is provided on the anode side of the second organic layer of the second light-emitting element.

According to the invention, an organic EL multi-color light-emitting device having a high efficiency, a long life and a high quality can be provided.

MODE FOR CARRYING OUT THE INVENTION

Figure 1:
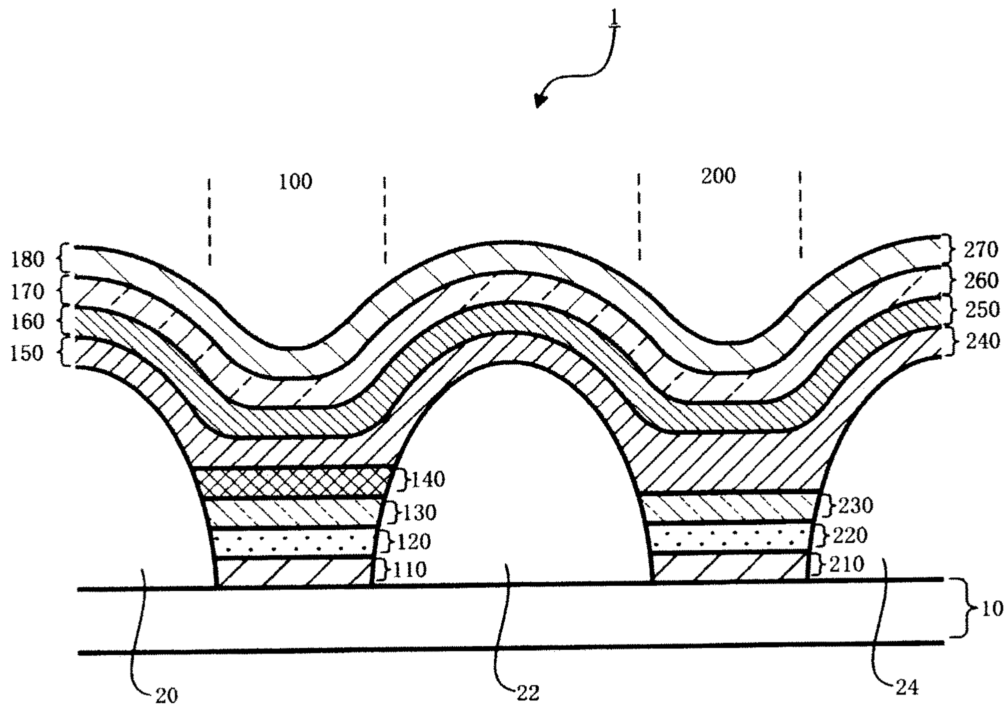
FIG. 1 is a view showing one embodiment of the organic EL multi-color light-emitting device of the invention.
Figure 2:
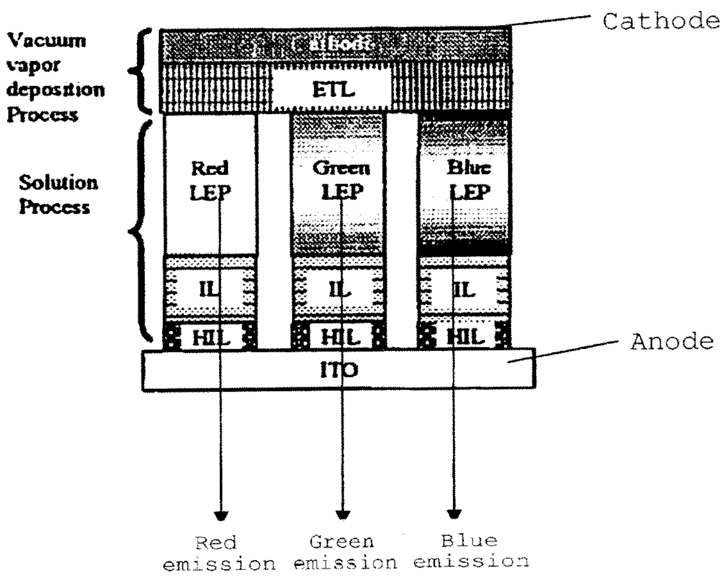
FIG. 2 is a schematic cross-sectional view of a coating-type organic EL display.
Figure 3:
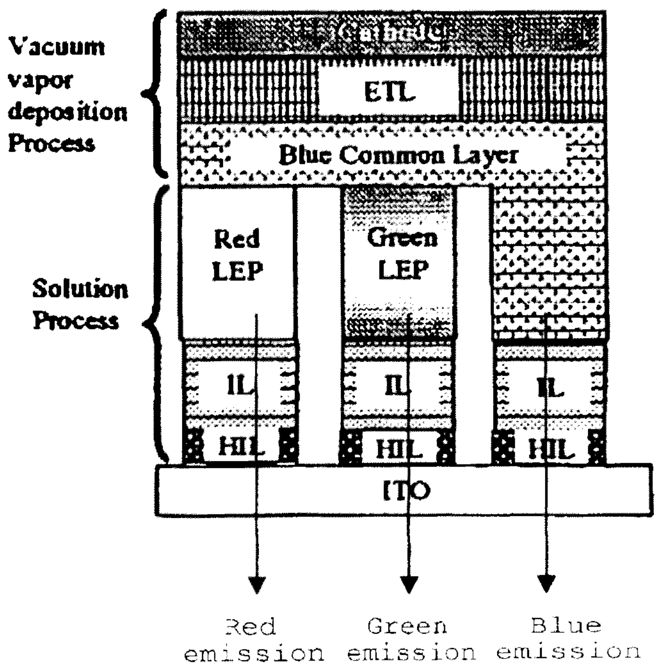
FIG. 3 is a schematic cross-sectional view of a coating type/deposition type hybrid organic EL display.
Figure 4:
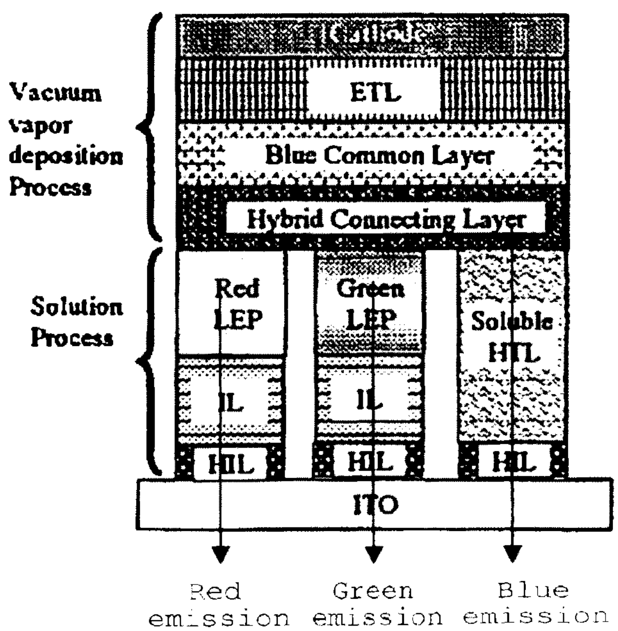
FIG. 4 is a schematic cross-sectional view of an organic EL display provided with a hybrid connecting layer.

The organic EL multi-color light-emitting device of the invention comprises a substrate, a cathode and an anode, and between the anode and the cathode, a first light-emitting element and a second light-emitting element being arranged in parallel relative to the substrate surface.

The first light-emitting element is a stack comprising a first organic layer, a second organic layer and a third organic layer being stacked perpendicularly from the substrate in this sequence, for example. The second light-emitting element is a stack comprising a second organic layer and a third organic layer being stacked perpendicularly from the substrate in this sequence, for example.

The second organic layer of the first light-emitting element and the second organic layer of the second light-emitting element are preferably the same although they may be the same or different. The third organic layer of the first light-emitting element and the third organic layer of the second light-emitting element are preferably the same although they may be the same or different.

The first organic layer contains a first light-emitting dopant, the third organic layer contains a second light-emitting dopant, and the two second organic layers of the first light-emitting element and the second light-emitting element respectively contain any of the following compounds (A) to (D):

(A) a compound having an arylamine site (aromatic amine site), and a furan site or a thiophen site (B) a compound having an arylamine site (aromatic amine site), and a site containing a nitrogen-containing six-membered ring structure (azine site)

(C) a compound having a carbazole site, and a furan site or a thiophene site (D) a compound having a carbazole site, and a site containing a nitrogen-containing six-membered ring structure (azine site)

As shown below, the arylamine site mentioned above has a structure in which a nitrogen atom is substituted by an aromatic hydrocarbon group or an aromatic heterocyclic group (Ar).

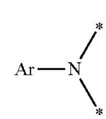

wherein Ar is an aromatic hydrocarbon group or an aromatic heterocyclic group; and * is an arbitral atomic bonding.

The carbazole site mentioned above is a structure shown below.

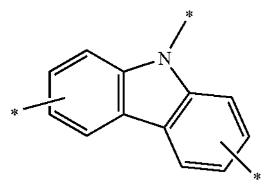

wherein * is an arbitral atomic bonding, and there may be further atomic bondings.

As for the carbazole site mentioned above, one or a plurality of CH of the benzene ring that constitutes the carbazole ring may be substituted by a nitrogen atom.

The furan site and the thiophene site mentioned above have the following structures.

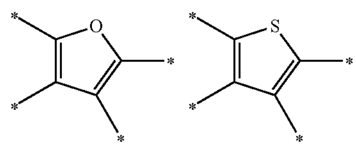

Furan Thiophene wherein * is an arbitral atomic bonding.

The site containing the nitrogen-containing six-membered ring structure (azine site) is specifically a structure having any of a pyridinyl group, a pyrimidinyl group, a pyridazinyl group, a pyrazinyl group, a triazinyl group and a tetrazinyl group.

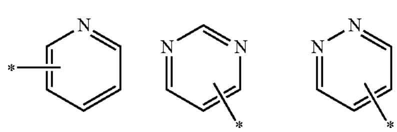

Pyridinyl group Pyrimidinyl group Pyridazinyl group

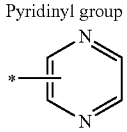

Pyrazinyl group (wherein * is an arbitral atomic bonding, and there may be further atomic bondings)

Triazinyl group

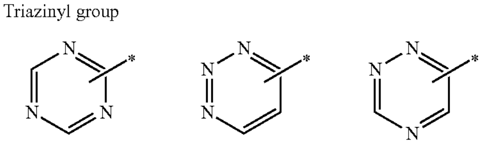

1,3,5-triazinyl group 1,2,3-triadinyl group 1,2,4-triazinyl group (wherein * is an arbitral atomic bonding, and there may be further atomic bondings)

Tetrazinyl group

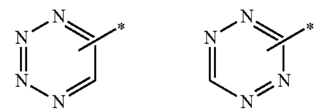

1,2,3,4-tetrazinyl group 1,2,4,5-tetrazinyl group

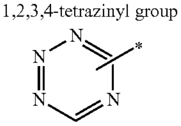

1,2,3,5-tetrazinyl group (wherein * is an arbitral atomic bonding, and there may be further atomic bondings)

The compound contained in the second organic layer is, for example, a compound in which an arylamine site and a carbazole site, and a furan site, a thiophene site and a site containing a nitrogen-containing six-membered ring structure are respectively bonded by a single bond or an aromatic hydrocarbon group or an aromatic heterocyclic group (Ar).

By containing an arylamine site or a carbazole site in the compound for the second organic layer, the second organic layer can exhibit hole-injecting properties and hole-transporting properties. On the other hand, by containing a furan site, a thiophene site or a site containing a nitrogen-containing heterocyclic structure, the second organic layer can exhibit electron-injecting properties and electron-transporting properties.

The compound of the second organic layer has both functions of hole-injection and hole-transportation, as well as electron-injection and electron-transportation. As a result, the second organic layer of the first light-emitting element has electron-injection properties and electron-transportation properties, and the second organic layer of the second light-emitting element has hole-injecting properties and hole-transportation properties.

Since the compound of the second organic layer has a carbazole site, and, a furan site, a thiophene site or a site containing a nitrogen-containing six-membered ring structure, effects of maintaining a high triplet energy can be attained. As a result, diffusion of triplet energy from the red or yellow phosphorescent emitting layer or the green phosphorescent emitting layer can be prevented, whereby luminous efficiency of phosphorescent emission can be increased.

Meanwhile, the triplet energy means a difference between the lowest excited triplet state and the ground state.

The compounds (A) to (D) are preferably compounds represented by the following formula (1) or (2):

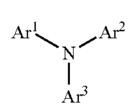

(1)

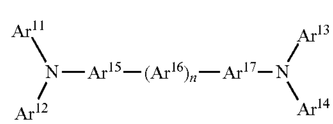

(2)

wherein, in the formula (1), one of $Ar^1$ and $Ar^2$, $Ar^1$ and $Ar^3$ and $Ar^2$ and $Ar^3$ is respectively bonded with each other to form a substituted or unsubstituted aromatic heterocyclic ring having 5 to 52 atoms that form a ring (hereinafter abbreviated as "ring atoms"); and/or $Ar^1$ to $Ar^3$ are independently a substituted or unsubstituted aromatic hydrocarbon group having 6 to 50 carbon atoms that form a ring (hereinafter referred to as "ring carbon atoms") or a substituted or unsubstituted aromatic heterocyclic group having 5 to 52 ring atoms.

That is, one of $Ar^1$ and $Ar^2$, $Ar^1$ and $Ar^3$ and $Ar^2$ and $Ar^3$ may or may not be respectively bonded with each other to form a substituted or unsubstituted aromatic heterocyclic ring having 5 to 52 ring atoms.

When a ring is formed, $Ar^1$ to $Ar^3$ which do not form a ring is a substituted or unsubstituted aromatic hydrocarbon group having 6 to 50 ring carbon atoms or a susbstituted or unsubstituted aromatic heterocyclic group having 5 to 52 ring atoms.

Further, when a ring is not formed, $Ar^1$ to $Ar^3$ are respectively a substituted or unsubstituted aromatic hydrocarbon group having 6 to 50 ring carbon atoms or a substituted or unsubstituted aromatic heterocyclic group having 5 to 52 ring atoms (the same as $Ar^1$ to $Ar^3$ mentioned above which do not form a ring).

At least one of $Ar^1$ to $Ar^3$ is a substituent represented by the following formula (a) or the following formula (b).

At least one of $Ar^{11}$ and $Ar^{15}$, $Ar^{12}$ and $Ar^{15}$, $Ar^{13}$ and $Ar^{17}$ and $Ar^{14}$ and $Ar^{17}$ is respectively bonded with each other to form a substituted or unsubstituted aromatic heterocyclic ring having 5 to 52 ring atoms; and/or $Ar^{11}$ to $Ar^{14}$ are independently a substituted or unsubstituted aromatic hydrocarbon group having 6 to 50 ring carbon atoms or a substituted or unsubstituted aromatic heterocyclic group having 5 to 52 ring atoms; and $Ar^{15}$ to $Ar^{17}$ are independently a substituted or unsubstituted divalent aromatic hydrocarbon group having 6 to 50 ring carbon atoms or a substituted or unsubstituted divalent aromatic heterocyclic group having 5 to 52 ring atoms.

That is, at least one of $Ar^{11}$ and $Ar^{15}$, $Ar^{12}$ and $Ar^{15}$, $Ar^{13}$ and $Ar^{17}$ and $Ar^{14}$ and $Ar^{17}$ may or may not be bonded with each other to form a substituted or unsubstituted aromatic heterocyclic group having 5 to 52 ring atoms.

When a ring is formed, $Ar^{11}$ to $Ar^{14}$ which do not form a ring are independently a substituted or unsubstituted aromatic hydrocarbon group having 6 to 50 ring carbon atoms or a substituted or unsubstituted aromatic heterocyclic ring group having 5 to 52 ring atoms, $Ar^{15}$ and $Ar^{17}$ which do not form a ring are independently a substituted or unsubstituted divalent aromatic hydrocarbon group having 6 to 50 ring carbon atoms or a substituted or unsubstituted divalent aromatic heterocyclic ring having 5 to 52 ring atoms.

When a ring is not formed, $Ar^{11}$ to $Ar^{15}$ and $Ar^{17}$ are the same as $Ar^{11}$ to $Ar^{15}$ and $Ar^{17}$ mentioned above which do not form a ring.

At least one of $Ar^{11}$ to $Ar^{14}$ is a substituent represented by the following formula (a) or the following formula (b).

n is an integer of 0 to 2, and when n is 0, $(Ar^{16})_0$ is a single bond.

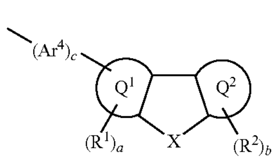

(a)

-continued $$—(Ar^5)_d—AZ \qquad (b)$$

wherein X is an oxygen atom (—O—) or a sulfur atom (—S—).

$Q^1$ and $Q^2$ are independently a saturated or unsaturated ring having 5 to 25 atoms.

AZ is a site comprising a nitrogen-containing hetero six-membered ring structure, and is specifically a substituted or unsubstituted pyridinyl group, a substituted or unsubstituted pyrimidynyl group, a substituted or unsubstituted pyridazinyl group, a substituted or unsubstituted triazinyl group or a substituted or unsubstituted tetrazinyl group.

As the substituent of the nitrogen-containing hetero six-membered ring structure of AZ, the same as $R^1$ and $R^2$ in the formula (a) can be given. It is preferred that one or two phenyl or biphenyl be substituted.

$Ar^4$ and $Ar^5$ are independently a substituted or unsubstituted divalent aromatic hydrocarbon group having 6 to 12 ring carbon atoms or a substituted or unsubstituted divalent aromatic heterocyclic group having 5 to 13 ring atoms.

$R^1$ and $R^2$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group; and/or at least one of adjacent plural $R^1$s, adjacent plural $R^2$s, and adjacent $R^1$ and $R^2$ are bonded with each other to form a substituted or unsubstituted saturated or unsaturated ring.

That is, at least one of adjacent plural $R^1$s, adjacent plural $R^2$s and adjacent $R^1$ and $R^2$ may or may not be bonded with each other to form a substituted or unsubstituted saturated or unsaturated ring.

When a ring is formed, $R^1$ and $R^2$ which do not form a ring are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group.

When a ring is not formed, $R^1$ and $R^2$ are the same as $R^1$ and $R^2$ mentioned above which do not form a ring.

a, b, c and d are independently an integer of 0 to 3.

In the organic EL multi-color emitting device of the invention, a first light-emitting element and a second light-emitting element are provided on a substrate. The first light-emitting element comprises, between an anode and a cathode, a first organic layer, a second organic layer and a third organic layer in this sequence from the anode. The second light-emitting element comprises, between an anode and a cathode, a second organic layer and a third organic layer in this sequence from the anode. It is preferred that the first organic layer of the first light-emitting element and the third organic layer of the second light-emitting element be emitting layers which emit light of different colors.

Each element may comprise other layers. For example, between the third organic layer of the first light-emitting element and the cathode, and between the third organic layer of the second light-emitting element and the cathode, an electron-transporting layer may further be provided. Further, for example, between the first organic layer of the first light-emitting element and the second organic layer of the second light-emitting element, a hole-transporting region (hole-transporting layer, a hole-injecting layer or the like) may be provided.

An insulating layer may be provided within and/or between each element. For example, an insulating layer which insulates the anode of the first light-emitting element and the first organic layer against the second light-emitting element.

FIG. 1 is a schematic cross-sectional view showing one embodiment of the organic EL multi-color emitting device of the invention.

An organic EL multi-color emitting device 1 is a device in which a first light-emitting element 100 and a second light-emitting element 200 are provided in parallel on a substrate 10.

A first light-emitting element 100 is a stack in which, between an anode 110 and a cathode 180, a hole-injecting layer 120, a hole-transporting layer 130, a first emitting layer 140, a first adjacent layer 150, a second emitting layer 160 and an electron-transporting layer 170 are provided in this sequence. Further, a second light-emitting element 200 is a stack in which, between an anode 210 and a cathode 270, a hole-injecting layer 220, a hole-transporting layer 230, a second adjacent layer 240, a second emitting layer 250 and an electron-transporting layer 260 are provided in this sequence.

Between the first light-emitting element 100 and the second light-emitting element 200, interlayer insulating films 20, 22 and 24 are provided. The anode 110, the hole-injecting layer 120, the hole-transporting layer 130 and the first emitting layer 140 of the first light-emitting element 100 and the anode 210, the hole-injecting layer 220 and the hole-transporting layer 230 of the second light-emitting element 200 are stacked while being sandwiched by the interlayer insulating films 20, 22 and 24. On the other hand, the first adjacent layer 150, the second emitting layer 160 and the electron-transporting layer 170 of the first light-emitting element 100 are the same as the second adjacent layer 240, the second emitting layer 250 and the electron-transporting layer 260 of the second light-emitting element 200. These layers are provided such that they cover the interlayer insulating films 20, 22 and 24. The second emitting layer 160 of the first light-emitting element 100 also functions as the electron-transporting layer.

In the first light-emitting element 100 of the organic EL multi-color emitting device 1, the first emitting layer 140 corresponds to the first organic layer of the first light-emitting element of the invention, the first adjacent layer 150 corresponds to the second organic layer of the first light-emitting element of the invention, and the second emitting layer 160 corresponds to the third organic layer of the first light-emitting element. Similarly, in the second light-emitting element 200 of the organic EL multi-color emitting device 1, the second adjacent layer 240 corresponds to the second organic layer of the second light-emitting element, and the second emitting layer 250 corresponds to the third organic layer of the second light-emitting element. As shown in FIG. 1, the first and second light-emitting elements may contain other layers in addition to the first organic layer, the second organic layer and the third organic layer.

In the organic EL multi-color emitting device 1, the first adjacent layer 150 and the second adjacent layer 240, the second emitting layer 160 and the second emitting layer 250, the electron-transporting layer 170 and the electron-transporting layer 260, and the cathode 180 and the cathode 270 are the same layers and can be formed of the same compound. Therefore, these layers can be formed simultaneously by deposition without using a mask. This particularly leads to an improvement in productivity when the first light-emitting element and the second light-emitting element emit different colors.

In FIG. 1, the anode is formed on the substrate, and the layers are stacked thereon. However, it is possible to form the cathode on the substrate, and each layer may be formed thereon in a reverse order (from the electron-transporting layer to the hole-injecting layer).

In FIG. 1, the first light-emitting element is a green light-emitting element and the second light-emitting element is a blue light-emitting element. The first light-emitting element and the second light-emitting element may be a yellow light-emitting element and a blue light-emitting element, respectively.

In FIG. 1, a third light-emitting element (a red light-emitting element), which has the same configuration as that of the first light-emitting element except that the first emitting layer of the first light-emitting element is a red emitting layer, may further be provided. Such a third light-emitting element is preferably provided in adjacent to the first light-emitting element.

It is preferred that the first light-emitting element be a green phosphorescent light-emitting element, the second light-emitting element be a blue phosphorescent light-emitting element and the third light-emitting element be a red phosphorescent light-emitting element.

Hereinbelow, for each layer of the organic EL multi-color emitting device of the invention, an explanation is made by referring to each layer of the organic EL multi-color emitting device 1 shown in FIG. 1.

[Adjacent Layer]

In the organic EL multi-color emitting device of the invention, the first adjacent layer and the second adjacent layer comprise any of the compounds (A) to (D), preferably a compound having a structure represented by the formula (1) or (2) (hereinafter the compounds (A) to (D) and the compound represented by the formula (1) or (2) may be referred to as the "adjacent layer compound").

The structure represented by the formulas (1) and (2) are respectively an arylmonoamine structure and an aryldiamine structure, and respectively have hole-injecting properties and hole-transporting properties. If the structure represented by the formula (1) or the formula (2) has a substituent represented by the formula (a) or the formula (b), it is possible to impart electron-injecting properties and electron-transporting properties to the adjacent layer compound. Therefore, if the adjacent layer comprises the compound represented by the formula (1) or (2), in the first adjacent layer, electrons can be efficiently transported and injected into the first emitting layer, whereby the luminous efficiency of the first light-emitting element can be improved. In the second adjacent layer, holes can be efficiently transported and injected into the second emitting layer, whereby the luminous efficiency of the second light-emitting element can be enhanced.

In addition to the above, the substituent represented by the formula (a) or (b) has an effect of increasing the triplet energy (T1), and hence, can prevent diffusion of triplet energy from the red or yellow phosphorescent emitting layer or the green phosphorescent emitting layer. The triplet energy means a difference in energy between the lowest excited triplet state and the ground state.

From the above, it can be understood that, due to the presence of an adjacent layer compound in the adjacent layer, the organic EL multi-color emitting device of the invention can exhibit effects such as improvement in comprehensive performance and color reproducibility.

As for the adjacent layer compound, it is preferred that at least one of $Ar^1$, $Ar^2$ and $Ar^3$ in the formula (1) and at least one of $Ar^{11}$, $Ar^{12}$, $Ar^{13}$ and $Ar^{14}$ in the formula (2) be a substituent represented by the formula (a).

By selecting a substituent represented by the formula (a) for each of the arylmonoamine structure and the aryldiamine structure, electron-injecting properties and electron-transporting properties can be retained at an appropriate level, whereby lowering of luminous efficiency of blue color emission can be prevented.

The substituent represented by the formula (a) is preferably a substituent represented by the following formula (a-1), more preferably a substituent represented by the following formula (a-2).

Both the substituent represented by the formula (a-1) and the substituent represented by the formula (a-2) can be synthesized easily, and can be easily substituted to the arylmonoamine structure or the aryldiamine structure. The substituent represented by the formula (a-2) has a high electron resistance and hence, can prolong the life of a blue light-emitting element.

(a-1)

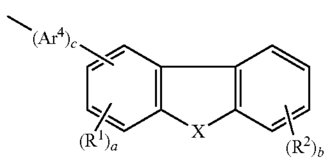

wherein X, $R^1$, $R^2$, $Ar^4$, a, b and c are as defined in the formula (a).

(a-2)

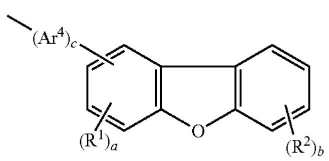

wherein $R^1$, $R^2$, $Ar^4$, a, b and c are as defined in the formula (a).

As for the adjacent layer compound, it is preferred that at least one of $Ar^1$, $Ar^2$ and $Ar^3$ in the formula (1) and at least one of $Ar^{11}$, $Ar^{12}$, $Ar^{13}$ and $Ar^{14}$ in the formula (2) be a substituent represented by the formula (b).

The reason is as follows. By selecting the substituent represented by the formula (b) respectively for the arylmonoamine structure and the aryldiamine structure, appropriate electron-injection properties and electron-transporting properties are imparted, though the effects are not as significant as those brought by the introduction of the substituent (a), and as a result, lowering of luminous efficiency of blue emission can be prevented.

The substituent represented by the formula (b) is preferably a substituted or unsubstituted pyridinyl group, a substituted or unsubstituted pyrimidinyl group or a substituted or unsubstituted 1,3,5-triazinyl group since they are electrically stable in respect of structure, and do not lower the triplet energy.

The substituent for the pyridinyl group, the pyrimidinyl group and the 1,3,5-triazinyl group is preferably a phenyl group, a biphenyl group and a terphenyl group. These substituents can improve electrical stability.

As for the adjacent layer compound, it is preferred that at least one of $Ar^1$, $Ar^2$ and $Ar^3$ in the formula (1) and at least one of $Ar^{11}$, $Ar^{12}$, $Ar^{13}$ and $Ar^{14}$ in the formula (2) be a substituent represented by the formula (c).

By introducing the substituent represented by the formula (c) to the adjacent layer compound, heat resistance is improved, whereby the life of a blue light-emitting element can be prolonged.

$$-Ar^{21}-Ar^{22}-(Ar^{23})_p \quad (c)$$

wherein $Ar^{21}$ to $Ar^{23}$ are independently a substituted or unsubstituted aromatic hydrocarbon group having 6 to 12 ring carbon atoms or a substituted or unsubstituted aromatic heterocyclic group having 5 to 13 ring atoms.

p is an integer of 0 to 2.

In the substituent represented by the formula (c), a substituent represented by the formula (c) in which p is 2 is as follows:

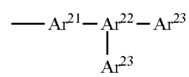

The substituent represented by the formula (c) is preferably a substituent represented by the following formula (c-1).

By introducing the substituent represented by the formula (c-1) into the adjacent layer compound, heat resistance can be improved, and as a result, the life of a blue light-emitting element can be prolonged, and the triplet energy (T1) of the adjacent layer compound can be increased, whereby diffusion of triplet energy from the red or yellow phosphorescent emitting layer or the green phosphorescent emitting layer can be prevented.

(c-1)

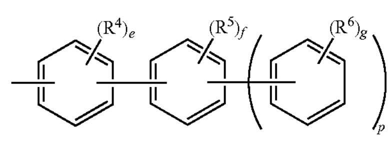

wherein $R^4$, $R^5$ and $R^6$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 carbon atoms, an aromatic hydrocarbon group having 6 to 25 ring carbon atoms, an aromatic heterocyclic group having 5 to 25 ring atoms, a halogen atom or a cyano group; and/or at least one of plural $R^4$s, plural $R^5$s and plural $R^6$s are respectively bonded with each other to form a substituted or unsubstituted saturated or unsaturated ring; and/or at least one of adjacent $R^4$ and $R^5$ and adjacent $R^5$ and $R^6$ are respectively bonded with each other to form a substituted or unsubstituted saturated or unsaturated ring.

That is, at least one of plural $R^4$s, plural $R^5$s, plural $R^6$s, adjacent $R^4$ and $R^5$ and adjacent $R^5$ and $R^6$ may or may not be bonded with each other to form a substituted or unsubstituted saturated or unsaturated ring.

When a ring is formed, $R^4$, $R^5$ and $R^6$ which do not form a ring are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom, or a cyano group.

When a ring is not formed, $R^4$, $R^5$ and $R^6$ are the same as $R^4$, $R^5$ and $R^6$ mentioned above which do not form a ring.

All of $Ar^1$, $Ar^2$ and $Ar^3$ in the formula (1) and all of $Ar^{11}$, $Ar^{12}$, $Ar^{13}$ and $Ar^{14}$ in the formula (2) can be those represented by the formula (a), (b) and/or (c).

p is an integer of 0 to 2, e is an integer of 0 to 4, and f and g are independently an integer of 0 to 5.

As for the substituent represented by the formulas (a) and (b) of the adjacent layer compound, it is preferred that at least one of $Ar^4$ and $Ar^5$ be a linkage group represented by the following formula (d) or (e).

By introducing the linkage group represented by the formula (d) or (e) into the substituent represented by the formulas (a) and (b), heat resistance is improved and the life of a blue light-emitting element can be improved. At the same time, the triplet energy (T1) can be increased, whereby diffusion of triplet energy from the red or yellow phosphorescent emitting layer or the green phosphorescent emitting layer can be prevented.

(d)

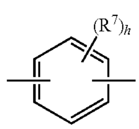

(e)

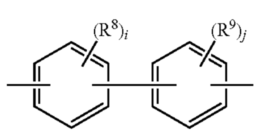

wherein $R^7$, $R^8$ and $R^9$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsily group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group; and/or at least one of plural $R^7$s, plural $R^8$s and plural $R^9$s are respectively bonded with each other to form a substituted or unsubstituted saturated or unsaturated ring; and/or adjacent $R^8$ and $R^9$ are bonded with each other to form a substituted or unsubstituted saturated or unsaturated ring.

That is, at least one of plural $R^7$s, plural $R^8$s, plural $R^9$s and adjacent $R^8$ and $R^9$ may or may not be bonded with each other to form a substituted or unsubstituted saturated or unsaturated ring.

When a ring is formed, $R^7$, $R^8$ and $R^9$ which do not form a ring are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group.

When a ring is not formed, $R^7$, $R^8$ and $R^9$ are the same as $R^7$, $R^8$ and $R^9$ mentioned above which do not form a ring.

h, i, and j are independently an integer of 0 to 4.

The compound represented by the formula (2), which is the adjacent layer compound, is preferably a compound comprising a structure represented by the following formula (f), more preferably a compound represented by the following formula (f), further preferably a compound comprising a structure represented by the following formula (f-1) or a structure represented by the following formula (f-2), most preferably a compound represented by the following formula (f-1) or a compound represented by the following formula (f-2).

Due to the presence of a structure represented by the formula (f), effects of increasing the triplet energy (T1) of the adjacent layer compound can be attained. As a result, diffusion of triplet energy from the red or yellow phosphorescent emitting layer or the green phosphorescent emitting layer can be prevented. Of the structures represented by the formula (f), the structure represented by the formula (f-1) or the following formula (f-2) are synthesized easily.

(f)

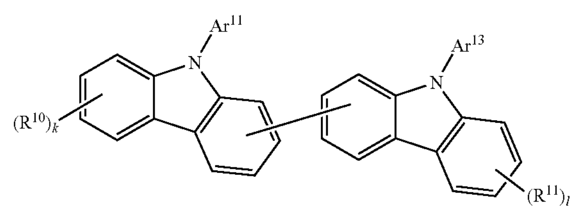

wherein $Ar^{11}$ and $Ar^{13}$ are as defined in the formula (2), and at least one of $Ar^{11}$ and $Ar^{13}$ is a substituent represented by the formula (a) or the formula (b).

$R^{10}$ and $R^{11}$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsily group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group.

k and l are independently an integer of 0 to 4.

(f-1)

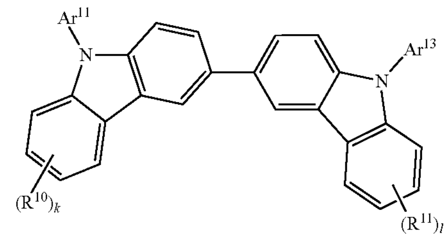

(f-2)

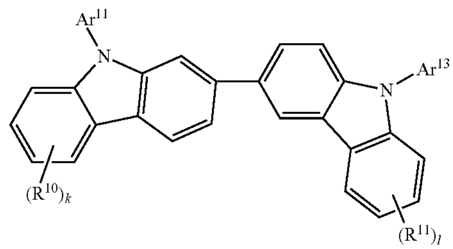

wherein $Ar^{11}$ and $Ar^{13}$ are as defined in the formula (2) and a least one of $Ar^{11}$ and $Ar^{13}$ is a substituent represented by the formula (a) or (b).

$R^{10}$ and $R^{11}$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group.

k and l are independently an integer of 0 to 4.

Hereinbelow, an explanation will be made on each group of the adjacent layer compound.

Examples of the aromatic hydrocarbon group having 6 to 50 ring carbon atoms represented by $Ar^1$ to $Ar^3$ and $Ar^{11}$ to $Ar^{14}$ include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a naphthacenyl group, a pyrenyl group, a chrysenyl group, a benzo[c]phenanthryl group, a benzo[g]chrysenyl group, a triphenylenyl group, a 1-fluorenyl group, a 2-fluorenyl group, a 3-fluorenyl group, a 4-fluorenyl group, a 9-fluorenyl group, a benzofluorenyl group, a dibenzofluorenyl group, a 2-biphenylyl group, a 3-biphenylyl group, a 4-biphenylyl group, a terphenyl group and a fluoranthenyl group. Of these, a phenyl group, a biphenyl group, a tolyl group, a xylyl group and a 1-naphthyl group are preferable.

The aromatic hydrocarbon group having 6 to 50 ring carbon atoms is preferably an aromatic hydrocarbon group having 6 to 20 ring carbon atoms, more preferably an aromatic hydrocarbon group having 6 to 12 ring carbon atoms.

As the divalent aromatic hydrocarbon group having 6 to 50 ring carbon atoms represented by $Ar^{15}$ to $Ar^{17}$, residues corresponding to the above-mentioned aromatic hydrocarbon group can be given. As the aromatic hydrocarbon group having 6 to 12 ring carbon atoms represented by $Ar^4$ to $Ar^5$ and $Ar^{21}$ to $Ar^{23}$, the above-mentioned aromatic hydrocarbon group having 6 to 12 ring carbon atoms of which the number of valences is corresponded can be given. As the aromatic hydrocarbon group having 6 to 25 ring carbon atoms represented by $R^1$ to $R^2$, $R^4$ to $R^6$, $R^7$ to $R^9$ and $R^{10}$ to $R^{11}$, of the above-mentioned aromatic hydrocarbon groups, one having 6 to 25 ring carbon atoms can be given.

As the aromatic heterocyclic group having 5 to 52 ring atoms represented by $Ar^1$ to $Ar^3$ and $Ar^{11}$ to $Ar^{14}$, a pyrrolyl group, a pyrazinyl group, a pyridinyl group, an indolyl group, an isoindolyl group, a furyl group, a benzofuranyl group, an isobenzofuranyl group, a 1-dibenzofuranyl group, a 2-dibenzofuranyl group, a 3-dibenzofuranyl group, a 4-dibenzofuranyl group, a 1-dibenzothiophenyl group, a 2-dibenzothiophenyl group, a 3-dibenzothiophenyl group, a 4-dibenzothiophenyl group, a quinolyl group, an isoquinolyl group, a quinoxalinyl group, a 1-carbazolyl group, a 2-carbazolyl, a 3-carbazolyl group, a 4-carbazolyl group, a 9-carbazolyl group, a phenanthrydinyl group, an acrydinyl group, a phenanthrolinyl group, a phenazinyl group, a phenothiazinyl group, a phenoxazinyl group, an oxazolyl group, an oxadiazolyl group, a furazanyl group, a thienyl group and a benzothiophenyl group, or the like can be given. Preferably, a 1-benzofuranyl group, a 2-dibenzofuranyl group, a 3-dibenzofuranyl group, a 4-dibenzofuranyl group, a 1-dibenzothiophenyl group, a 2-dibenzothiophenyl group, a 3-dibenzothiophenyl group, a 4-dibenzothiophenyl group, a 1-carbazolyl group, a 2-carbazolyl group, a 3-carbazolyl group, a 4-carbazolyl group and a 9-carbazolyl group can be given.

The aromatic heterocyclic group having 5 to 52 ring atoms is preferably an aromatic heterocyclic group having 5 to 20 ring atoms, more preferably an aromatic heterocyclic group having 5 to 14 ring atoms.

As the divalent aromatic heterocyclic group having 5 to 52 ring atoms represented by $Ar^{15}$ to $Ar^{17}$, residues corresponding to the above-mentioned aromatic heterocyclic group can be given. As the aromatic heterocyclic group having 5 to 13 ring carbon atoms represented by $Ar^4$ to $Ar^5$ and $Ar^{21}$ to $Ar^{23}$, the above-mentioned aromatic heterocyclic group having 5 to 13 atoms of which the number of valences is corresponded can be given. As the aromatic heterocyclic group having 5 to 25 ring atoms represented by $R^1$ to $R^2$, $R^4$ to $R^6$, $R^7$ to $R^9$ and $R^{10}$ to $R^{11}$, of the above-mentioned aromatic heterocyclic groups, one having 5 to 25 ring atoms can be given.

As the further substituent of the aromatic hydrocarbon group having 6 to 25 ring carbon atoms and the aromatic heterocyclic group having 5 to 25 ring atoms represented by $R^1$ to $R^2$, a dibenzofuranyl group, (specifically, a 1-dibenzofuranyl group, a 2-dibenzofuranyl group, a 3-dibenzofuranyl group and a 4-dibenzofuranyl group), a dibenzothiophenyl group (specifically, a 1-dibenzothiophenyl group, a 2-dibenzothiophenyl group, a 3-dibenzothiophenyl group, a 4-dibenzothiophenyl group), and a carbazolyl group (specifically, a 1-carbazolyl group, a 2-carbazolyl group, a 3-carbazolyl group, a 4-carbazolyl group and a 9-carbazolyl group) can be given.

The aromatic heterocyclic group having 5 to 52 ring atoms formed by $Ar^1$ and $Ar^2$, $Ar^1$ and $Ar^3$, $Ar^2$ and $Ar^3$, $Ar^{11}$ and $Ar^{15}$, $Ar^{12}$ and $Ar^{15}$, $Ar^{13}$ and $Ar^{17}$ and $Ar^{14}$ and $Ar^{17}$, a ring corresponding to the above-mentioned aromatic heterocyclic group having 5 to 52 ring atoms represented by $Ar^1$ to $Ar^3$ and $Ar^{11}$ to $Ar^{14}$ can be given. Carbazole is preferable.

As the linear or branched alkyl group having 1 to 15 carbon atoms represented by $R^1$ to $R^2$, $R^4$ to $R^6$, $R^7$ to $R^9$ and $R^{10}$ to $R^{11}$, a methyl group, an ethyl group, a propyl group, an isopropyl group, an n-butyl group, an isobutyl group, a sec-butyl group, a tert-butyl group, an n-pentyl group, an n-hexyl group, an n-heptyl group, and an n-octyl group or the like can be given. Preferably, the alkyl group is a methyl group, an ethyl group, a propyl group, an isopropyl group, an n-butyl group, an isobutyl group, a sec-butyl group and a tert-butyl group can be given. A methyl group, an ethyl group, a propyl group, an isopropyl group, an n-butyl group, an s-butyl group and a t-butyl group are preferable.

As the linear or branched alkenyl group having 2 to 15 carbon atoms represented by $R^1$ to $R^2$, $R^4$ to $R^6$, $R^7$ to $R^9$ and $R^{10}$ to $R^{11}$, a substituent having an unsaturated bond in the molecule of the above-mentioned alkyl group can be given.

As the cycloalkyl group having 3 to 15 carbon atoms represented by $R^1$ to $R^2$, $R^4$ to $R^6$, $R^7$ to $R^9$ and $R^{10}$ to $R^{11}$, a cyclopropyl group, a cyclobutyl group, a cyclopentyl group, a cyclohexyl group, a cyclopentylmethyl group, a cyclohexylmethyl group, a cyclohexylethyl group, a 1-adamantyl group, a 2-adamantyl group, a 1-norbornyl group, a 2-norbornyl group or the like can be given. Of these, a cyclopentyl group and a cyclohexyl group are preferable.

As the trialkylsilyl group having an alkyl group having 1 to 15 carbon atoms represented by $R^1$ to $R^2$, $R^4$ to $R^6$, $R^7$ to $R^9$ and $R^{10}$ to $R^{11}$, a trimethylsilyl group, a triethylsilyl group, a tripropylsilyl group, a propyldimethylsilyl group, a tributylsilyl group, a t-butyldimethylsilyl group, a tripentylsilyl group, a triheptylsilyl group, a trihexylsilyl group or the like can be given. A trimethylsilyl group and a triethylsilyl group are preferable.

The alkyl group substituting the silyl group may be the same or different.

The triarylsilyl group having an aryl group having 6 to 25 ring carbon atoms represented by $R^1$ to $R^2$, $R^4$ to $R^6$, $R^7$ to $R^9$ and $R^{10}$ to $R^{11}$, a triphenylsilyl group, a trinaphthylsilyl group or the like can be given. Of these, a triphenylsilyl group is preferable.

The aryl group substituting the silyl group may be the same or different.

As the alkylarylsilyl group having an alkyl group having 1 to 15 carbon atoms and an aryl group having 6 to 25 ring carbon atoms represented by $R^1$ to $R^2$, $R^4$ to $R^6$, $R^7$ to $R^9$ and $R^{10}$ to $R^{11}$, a dimethylphenylsilyl group, a diethylphenylsilyl group, a diphenylmethylsilyl group, an ethyldiphenylsilyl group or the like can be given. Of these, a diphenylmethylsilyl group and an ethyldiphenylsilyl group are preferable.

The alkyl group and the aryl group substituting the silyl group may be the same or different.

As the halogen atom represented by $R^1$ to $R^2$, $R^4$ to $R^6$, $R^7$ to $R^9$ and $R^{10}$ to $R^{11}$, a fluorine atom, a chlorine atom and a bromine atom can be given, with a fluorine atom being preferable.

The adjacent layer compound preferably has a triplet energy of 2.55 eV or more, more preferably 2.60 eV or more, further preferably 2.70 eV or more, and particularly preferably 2.80 eV or more. Although no specific restrictions are imposed on the upper limit, the upper limit is normally 3.2 eV or less.

If the triplet energy of the adjacent layer compound is 2.55 eV or more, it is possible to prevent diffusion of triplet energy from the red or yellow phosphorescent emitting layer or the green phosphorescent emitting layer. On the other hand, if the triplet energy of the adjacent layer compound is less than 2.55 eV, diffusion of the triplet energy from the red or yellow phosphorescent emitting layer or the green phosphorescent emitting layer may not be prevented sufficiently, and as a result, the blue common layer may be allowed to emit light or the luminous efficiency of the red or yellow phosphorescent emitting layer or the green phosphorescent emitting layer may be lowered.

If the adjacent layer is formed of two or more layers, in particular, a layer on the phosphorescent emitting layer side is preferably composed of a compound having a triplet energy of 2.65 eV or more. If the adjacent layer is a single layer formed of two or more compounds, it is preferred that a compound having a higher triplet energy (e.g. 2.65 eV or more) be present in a large amount on the side nearer to the phosphorescent emitting layer.

It is preferred that the adjacent layer compound have an ionization potential of 5.45 to 5.75 eV, more preferably 5.50 eV to 5.70 eV, and further preferably 5.55 eV to 5.65 eV.

If the adjacent layer compound has an ionization potential of 5.45 to 5.75 eV, hole injection from the second adjacent layer to the second emitting layer (blue fluorescent emitting layer) is promoted, whereby the luminous efficiency of blue color emission can be increased and the life can be prolonged. On the other hand, if the adjacent layer compound has an ionization potential of less than 5.45 eV, hole injection barrier for the blue fluorescent emitting layer may become large, whereby the luminous efficiency of blue color emission may be lowered. On the other hand, if the ionization potential of the adjacent layer compound exceeds 5.75 eV, a hole injection barrier from the anode to the second adjacent layer may become large, whereby the luminous efficiency of blue color emission may be lowered or the life may be shortened.

It is preferred that the adjacent layer compound have an electron affinity of 2.35 to 2.65 eV, more preferably 2.40 to 2.60 eV, and further preferably 2.45 to 2.55 eV.

If the adjacent layer compound has an electron affinity of 2.35 to 2.65 eV, electron injection from the first adjacent layer to the red phosphorescent emitting layer or the green phosphorescent emitting layer of the first emitting layer is promoted, whereby the luminous efficiency or the life of the red phosphorescent emitting layer or the green phosphorescent emitting layer may be increased. On the other hand, if the adjacent layer compound has an electron affinity of less than 2.35 eV, electron injection barrier from the cathode to the first adjacent layer may become large, whereby the luminous efficiency or the life of the red phosphorescent emitting layer or the green phosphorescent emitting layer may be lowered. If the adjacent layer compound has an electron affinity exceeding 2.65 eV, electron injection barrier to the red phosphorescent emitting layer or the green phosphorescent emitting layer may become large, whereby the luminous efficiency or the life of the red phosphorescent emitting layer or the green phosphorescent emitting layer may be lowered.

Specific examples of the adjacent layer compound of the invention will be shown below.

As the adjacent layer compound of the invention, the following compounds disclosed in WO2009/145016 can be given.

-continued
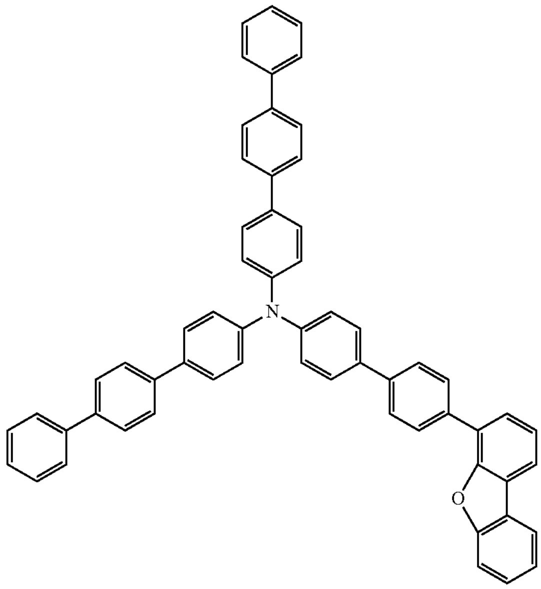
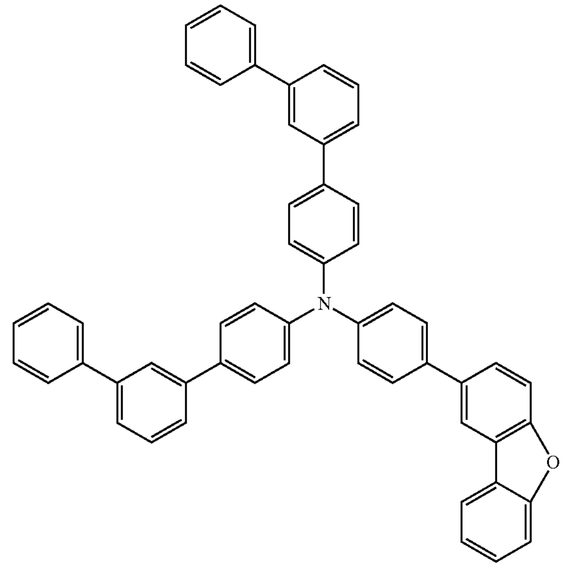
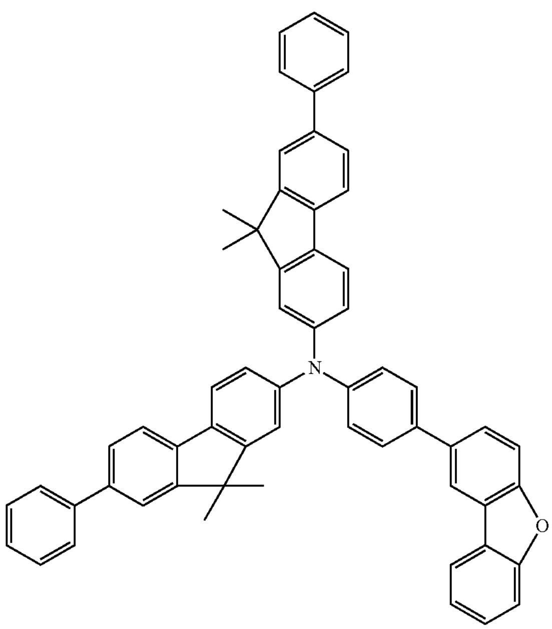
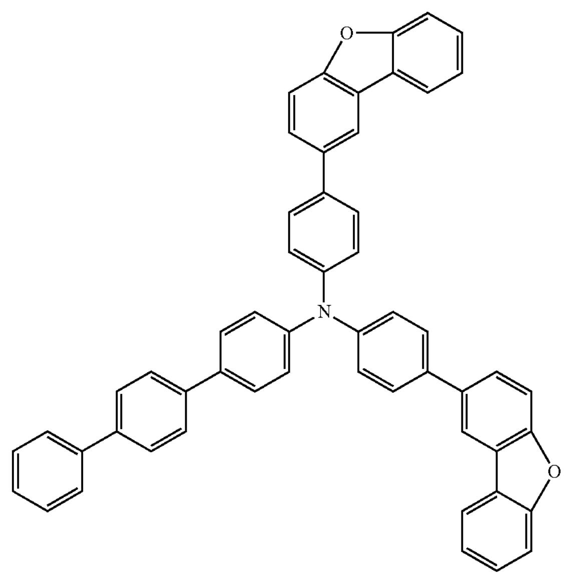
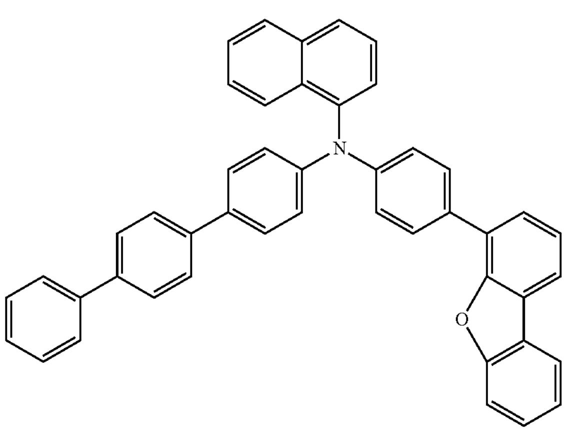
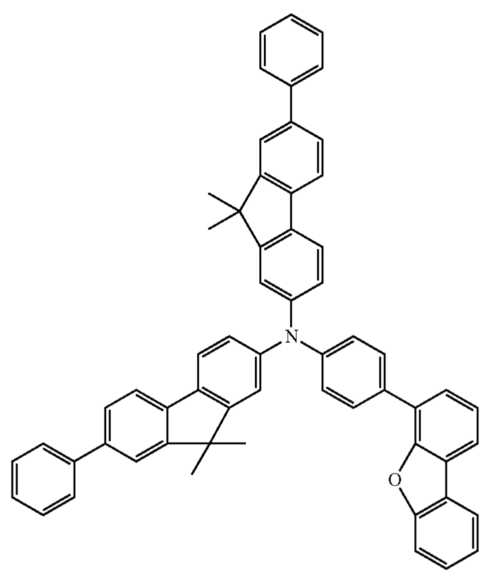

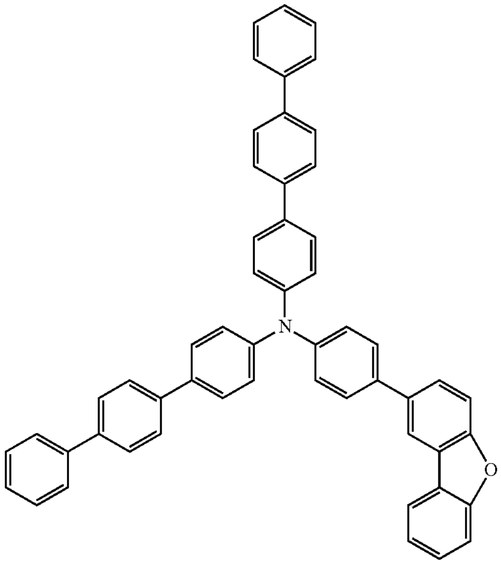
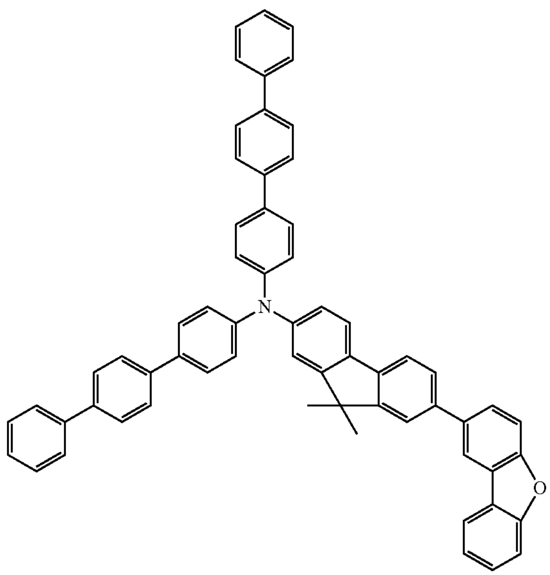
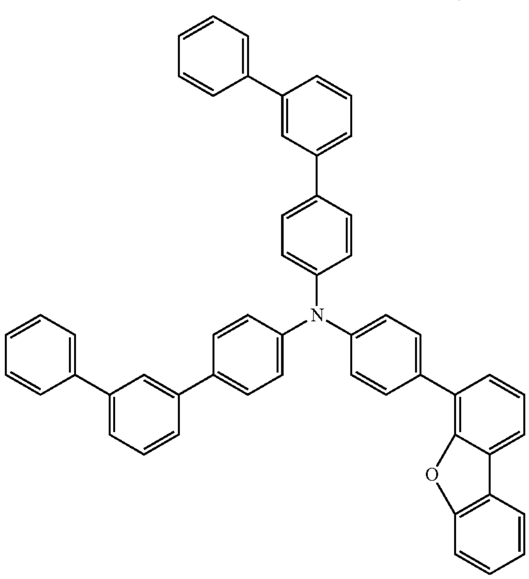
N
O
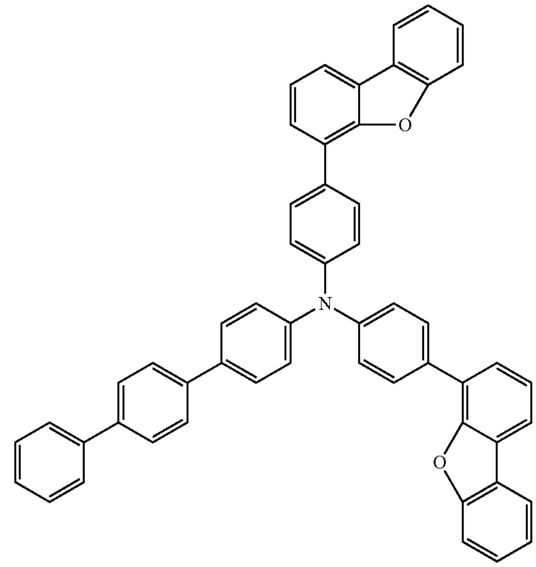
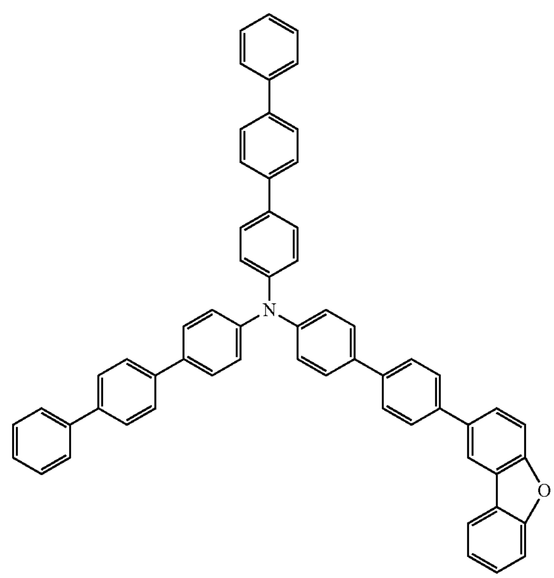
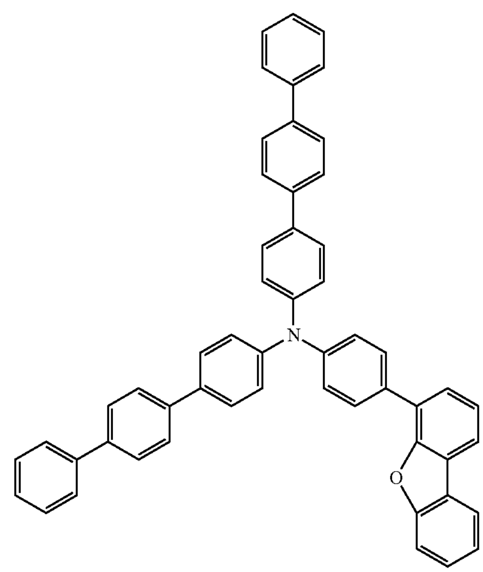
N
O

-continued
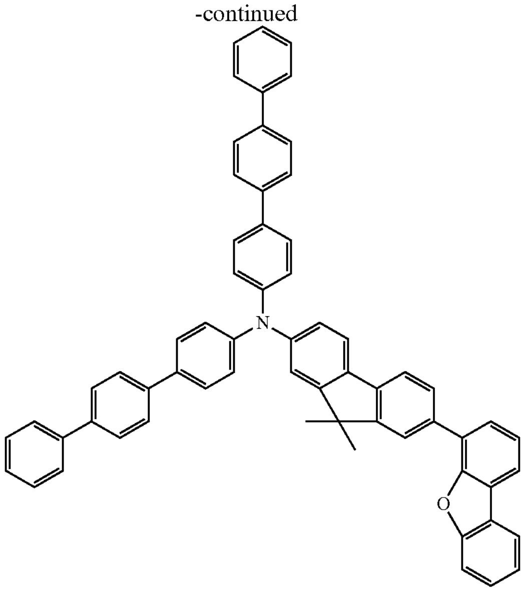
-continued
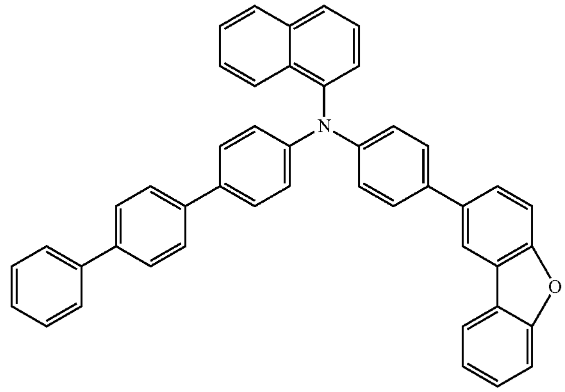
In addition to the above, the following compounds can be given as the specific examples of the adjacent layer compound of the invention.
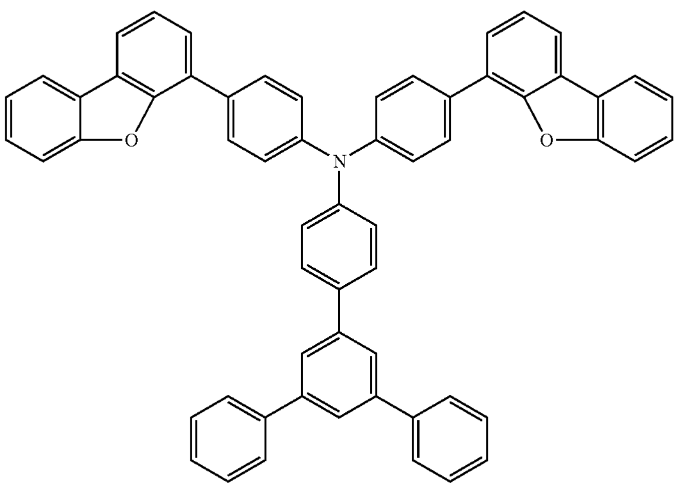
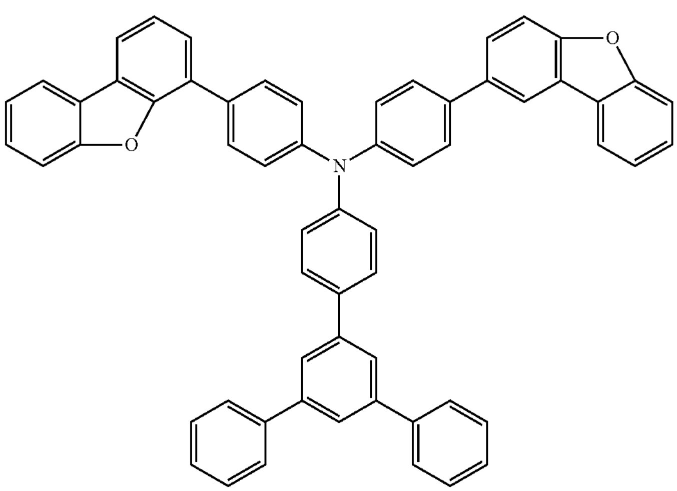

-continued
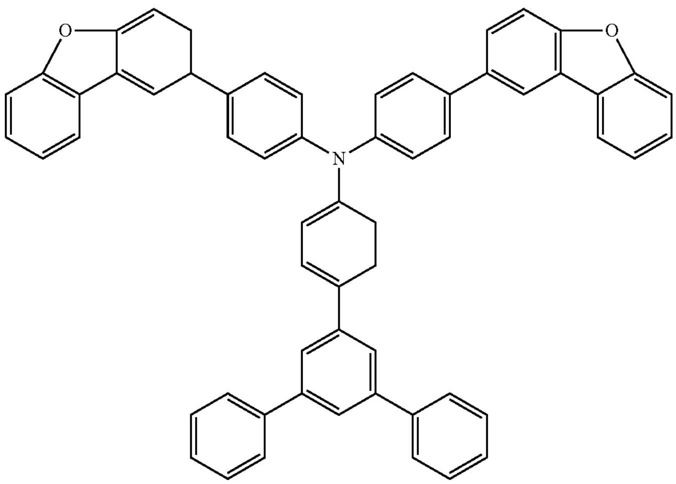
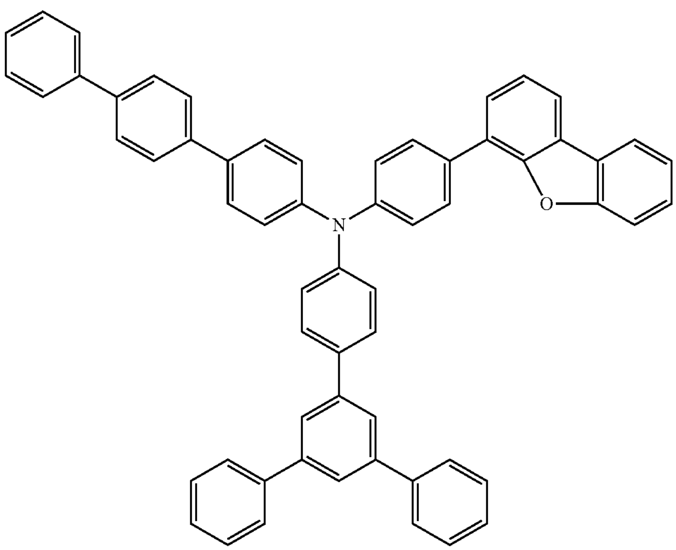
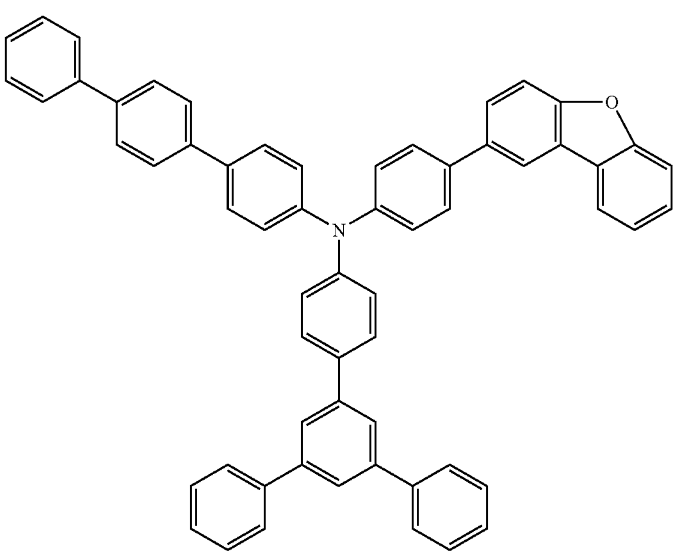

-continued
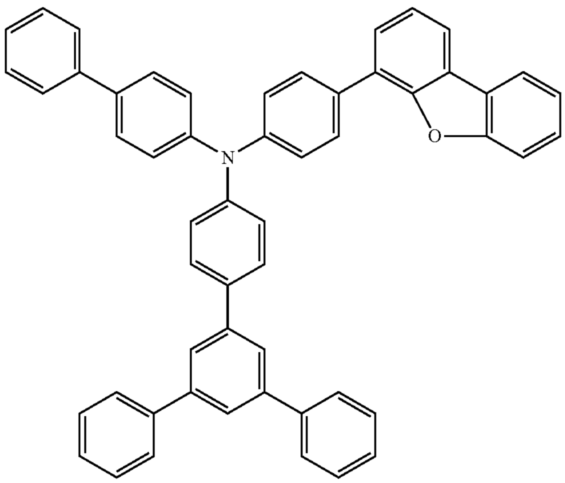
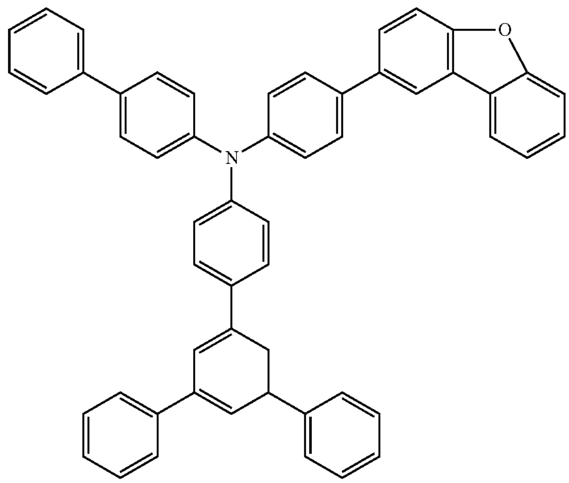
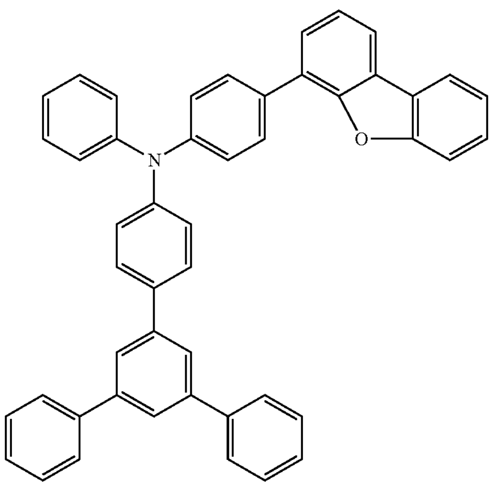
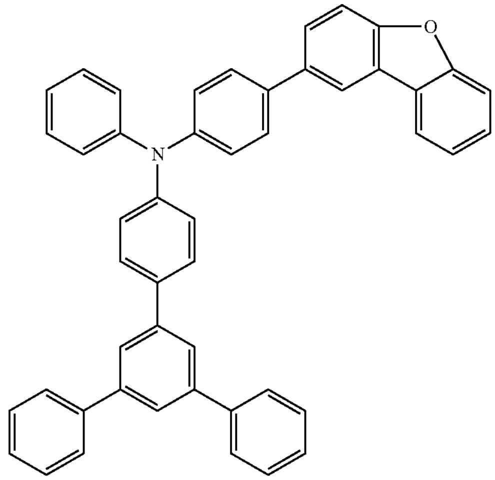
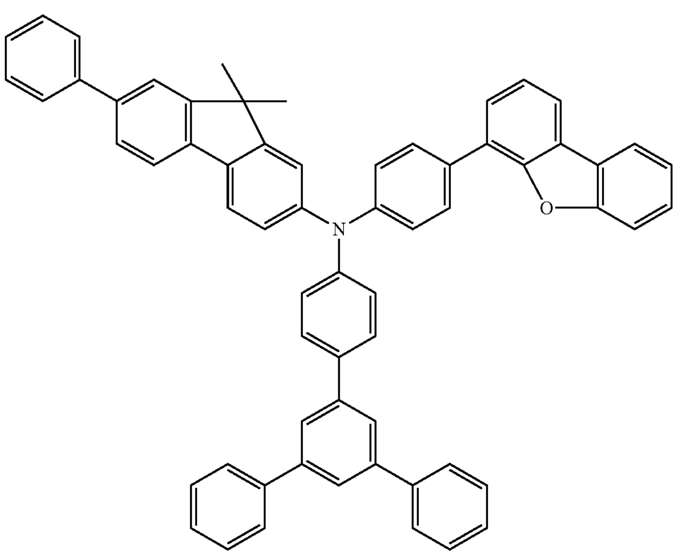

-continued
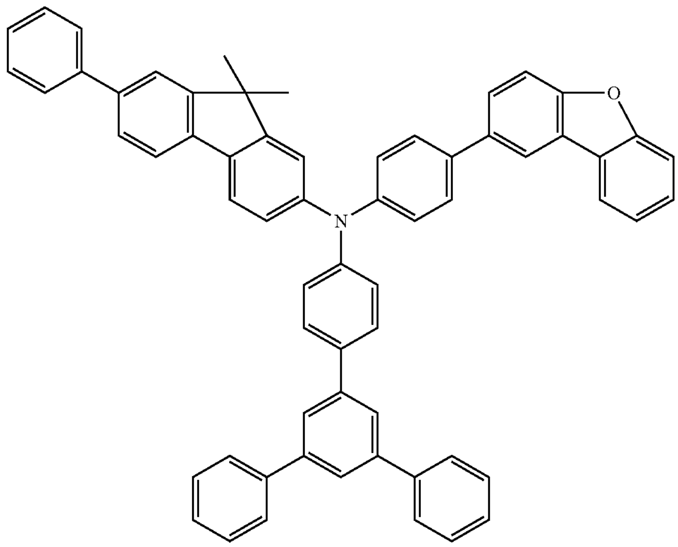
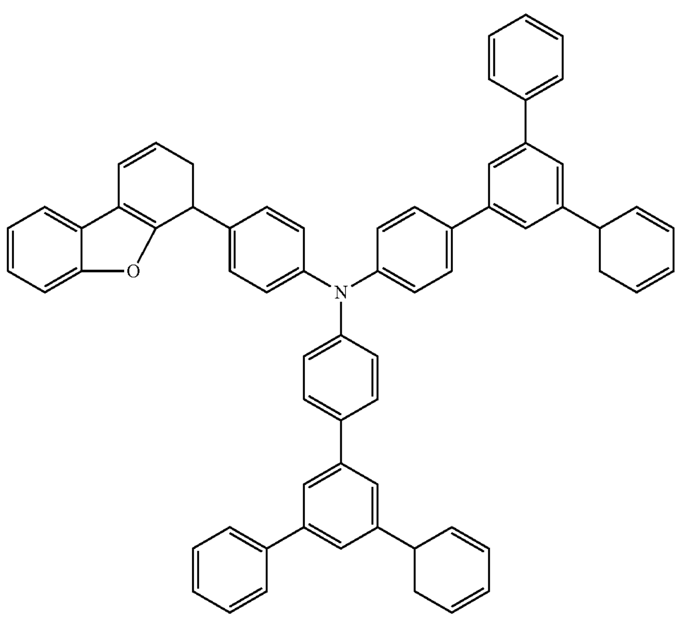

-continued
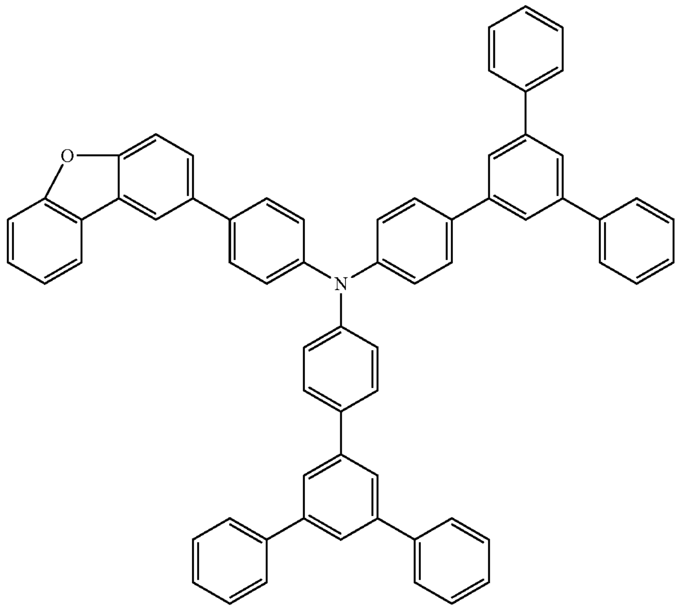
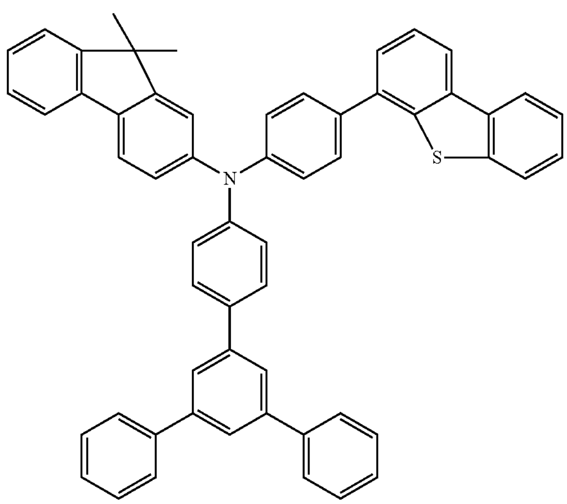
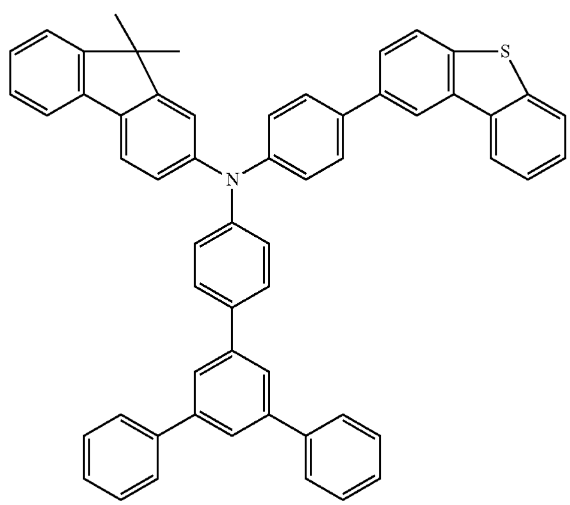
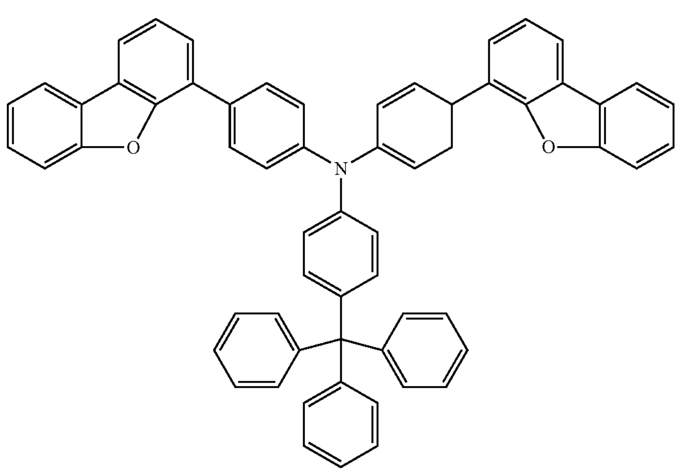

-continued
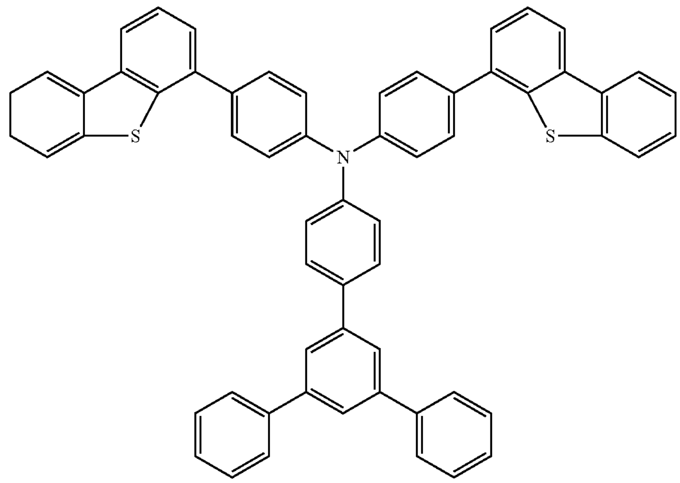
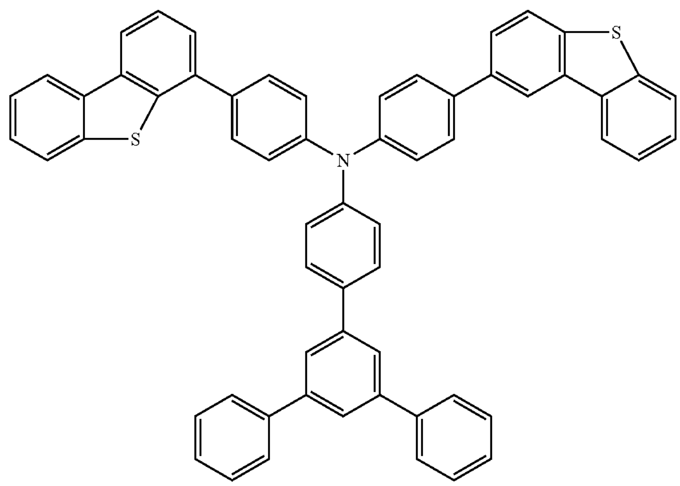
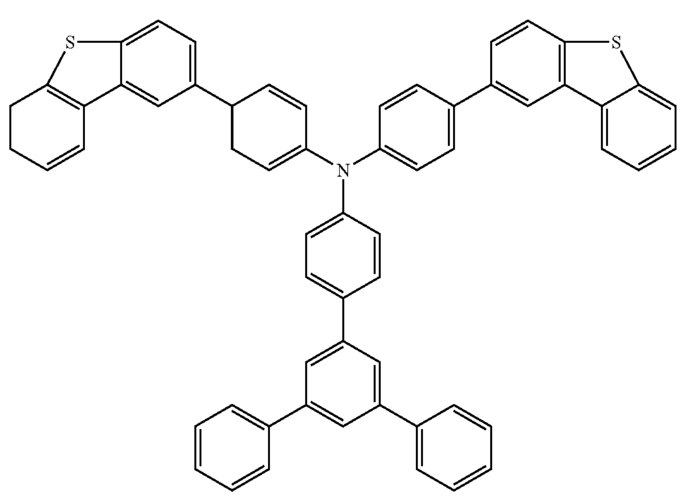

-continued
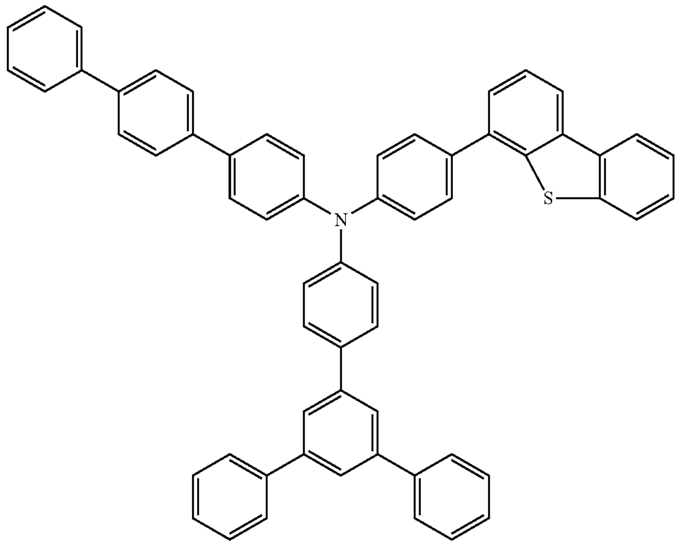
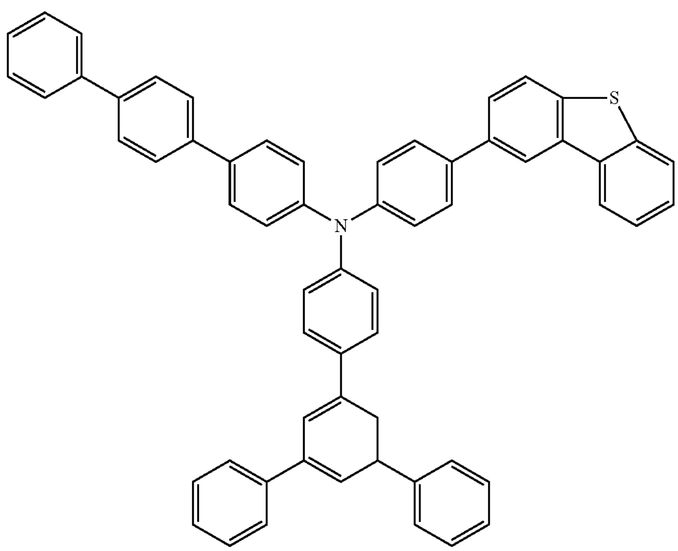
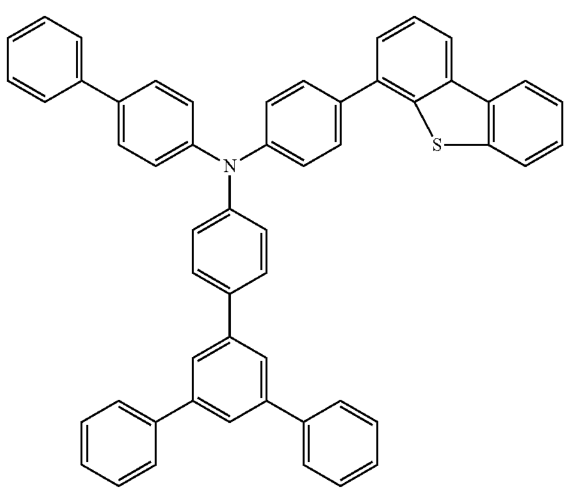
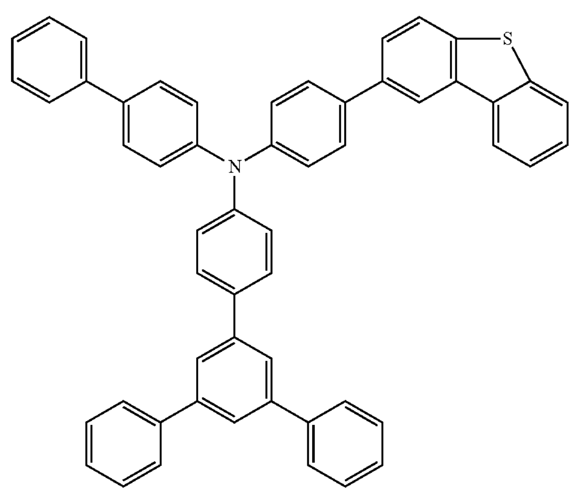

-continued
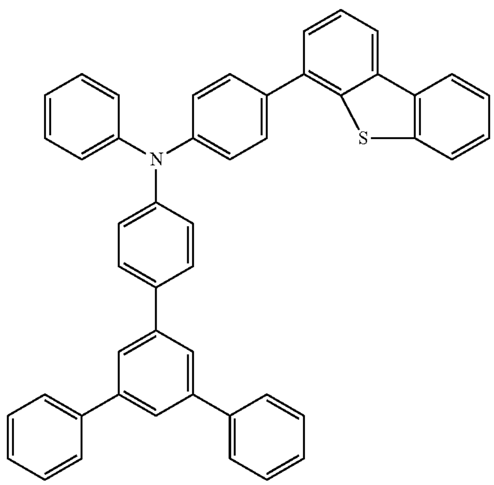
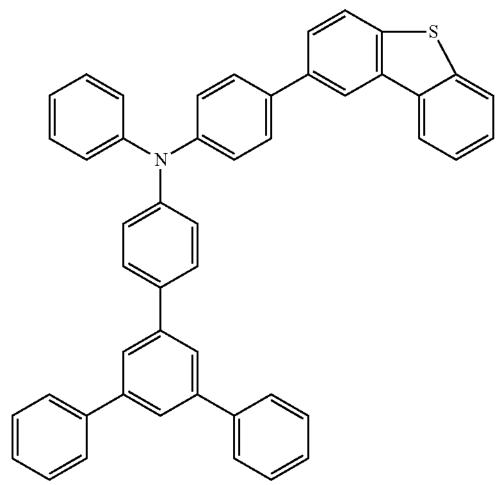
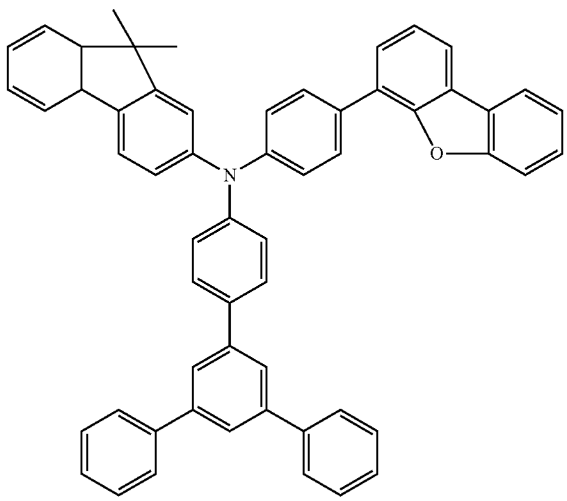
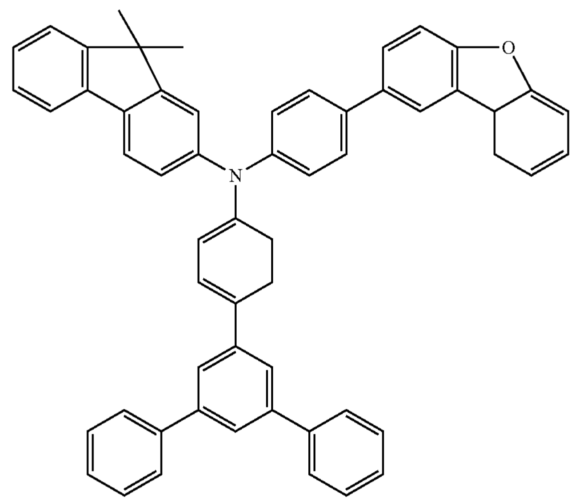
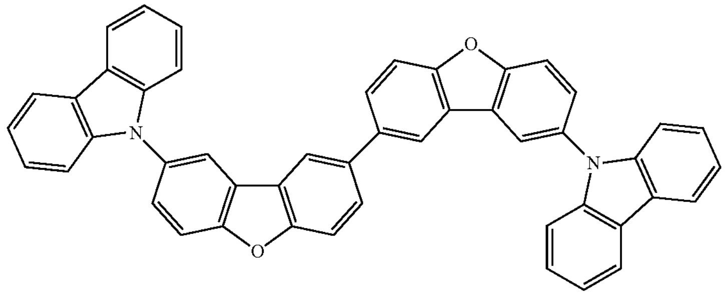
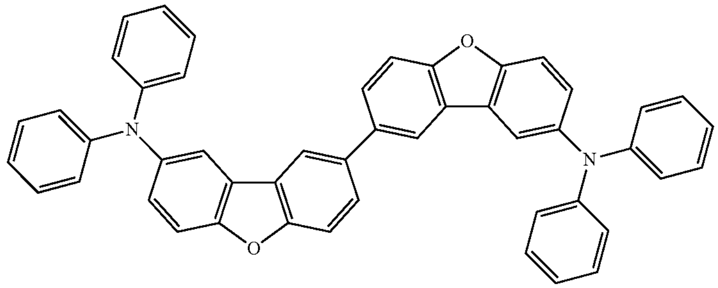

-continued
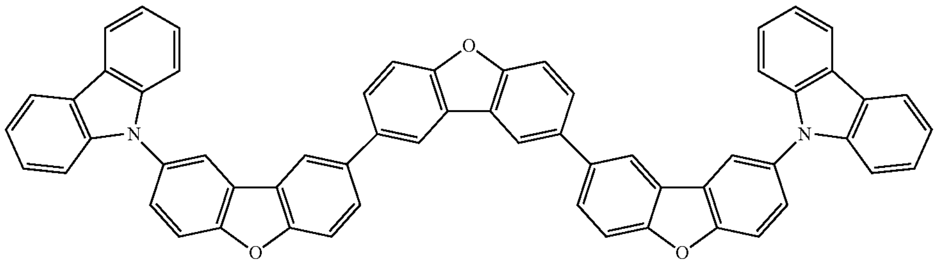
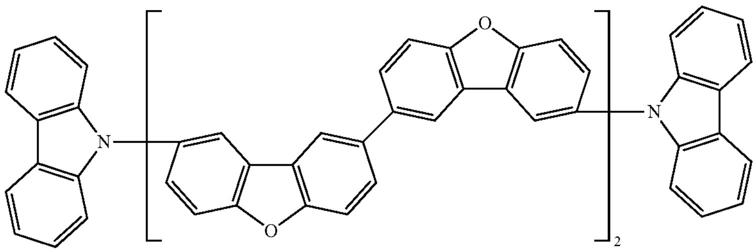
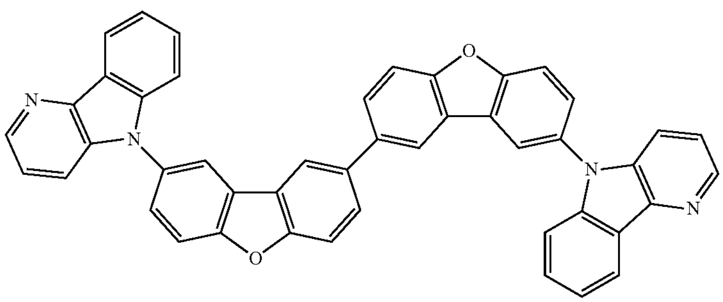
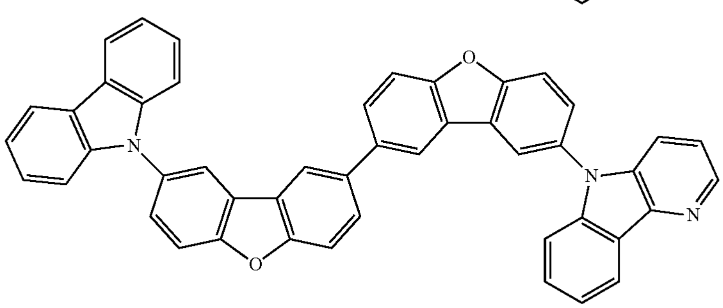
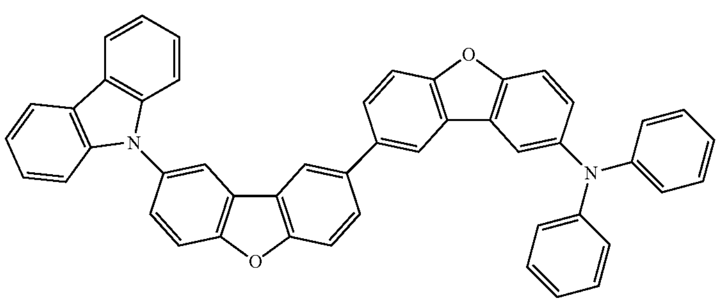
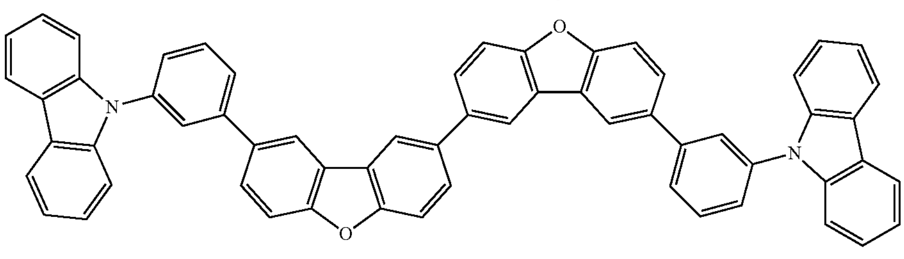

-continued
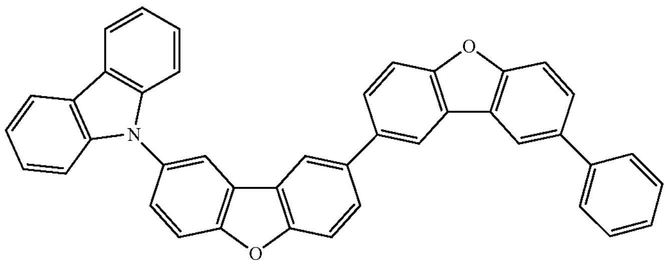
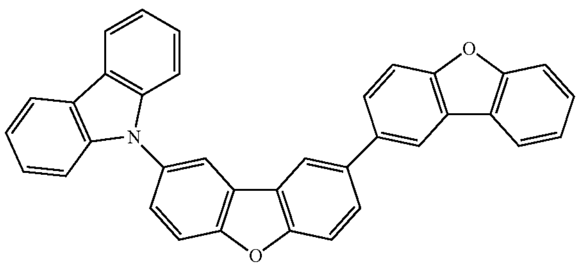
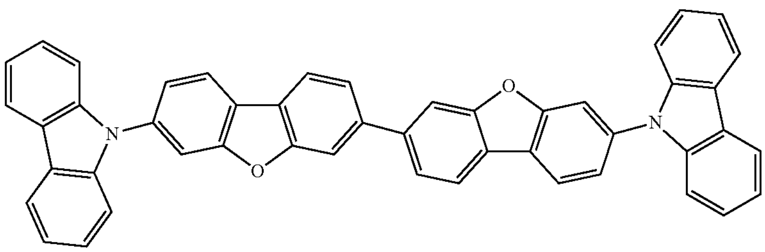
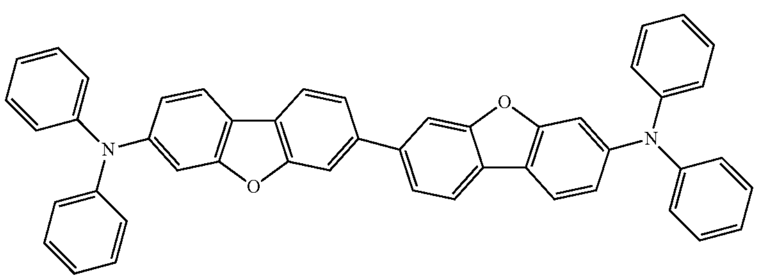
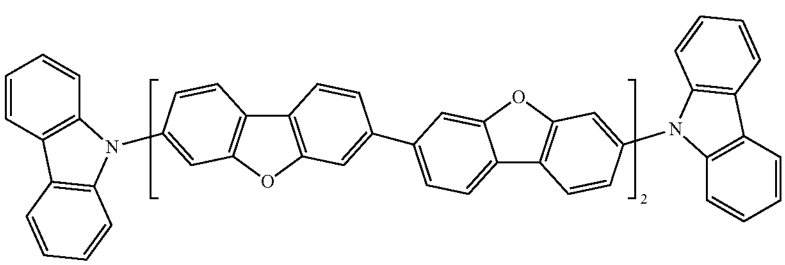
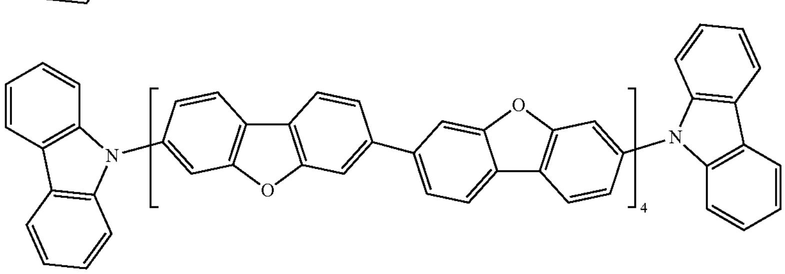

-continued
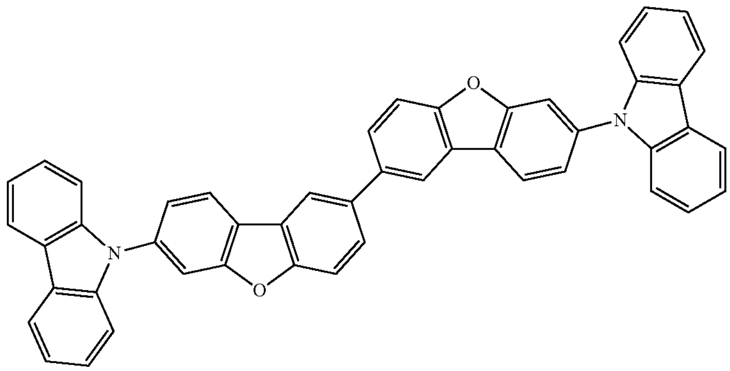
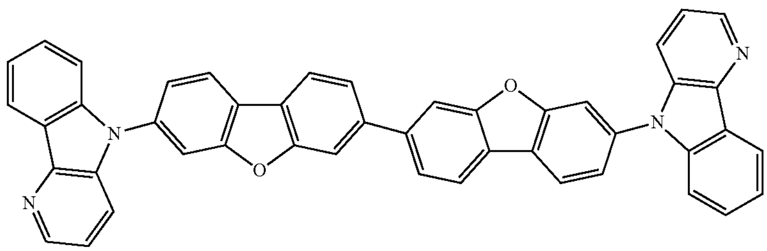
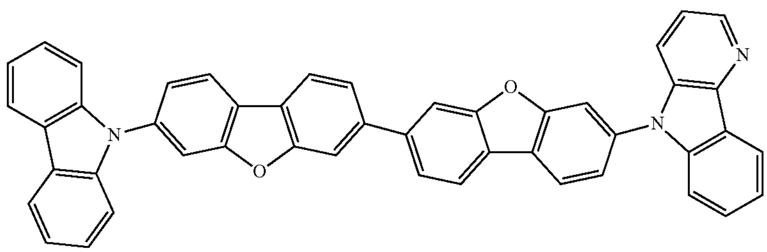
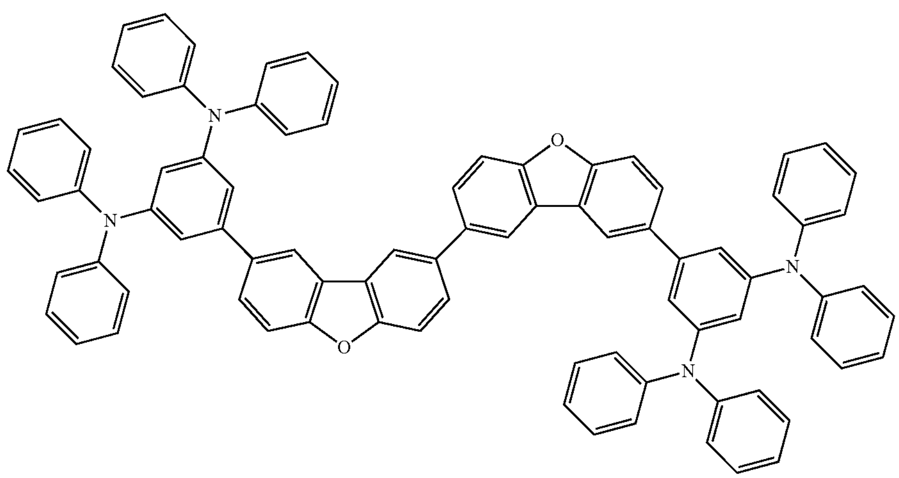
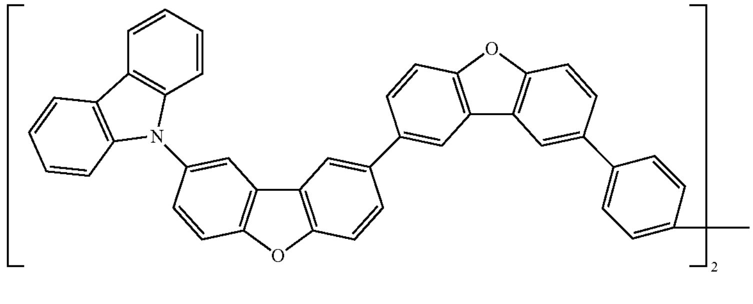

-continued
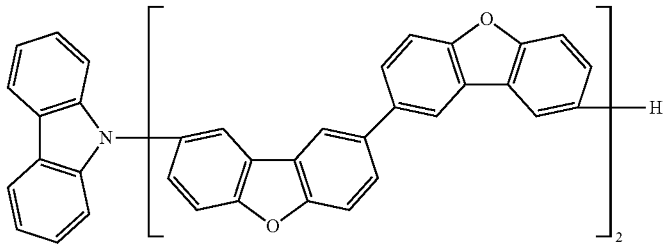
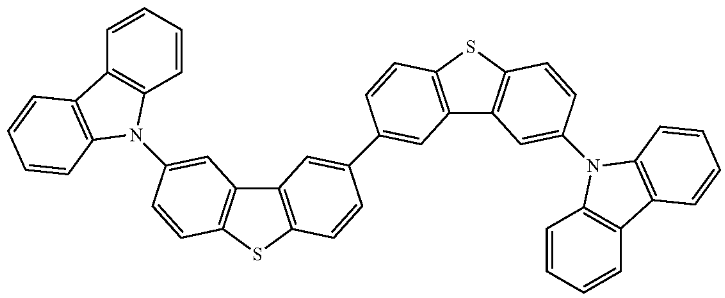
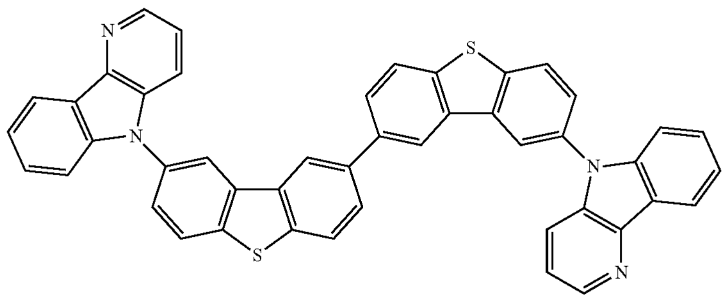
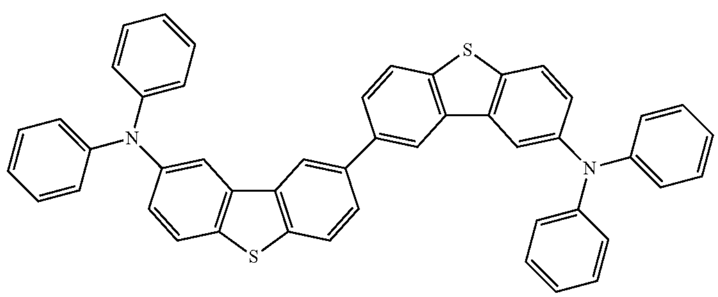
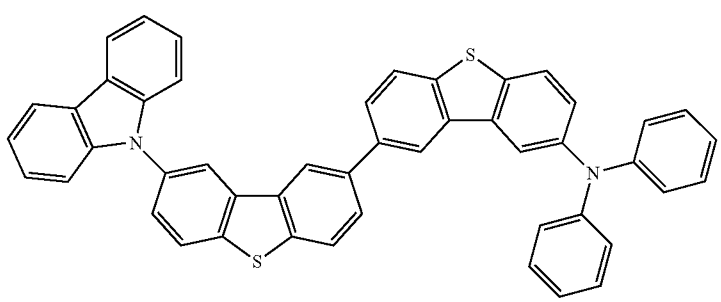
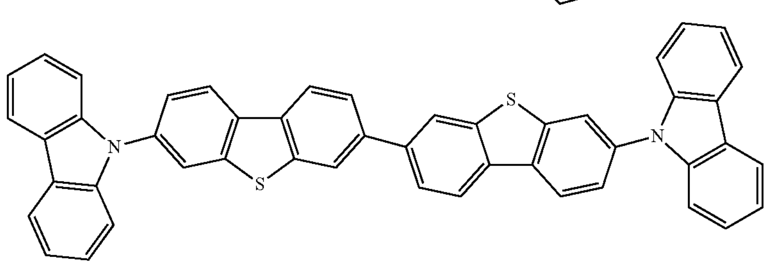

-continued
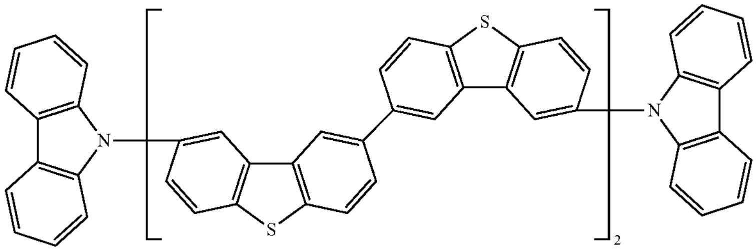
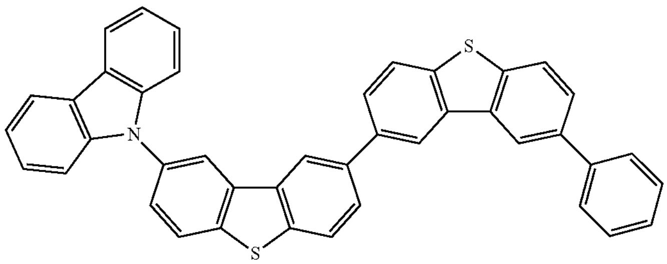
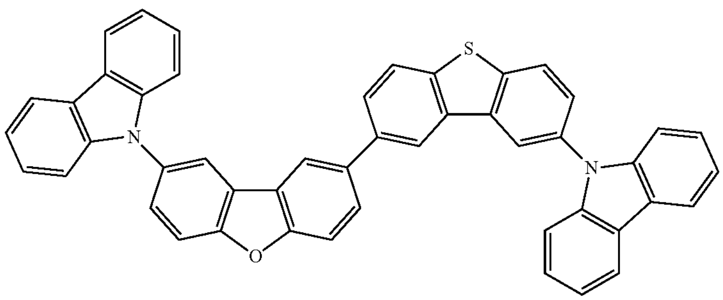
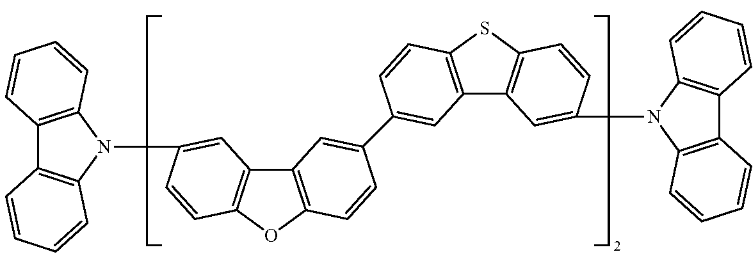
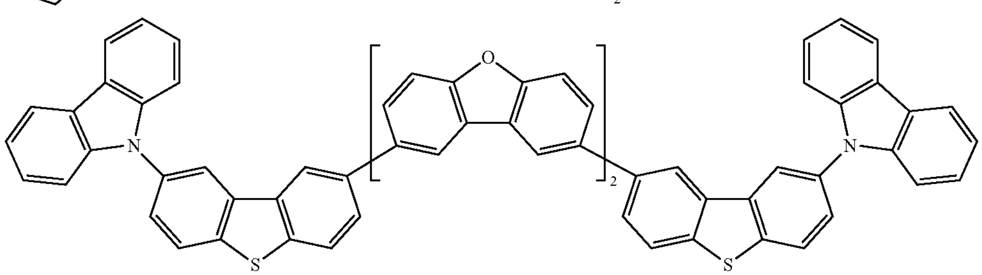
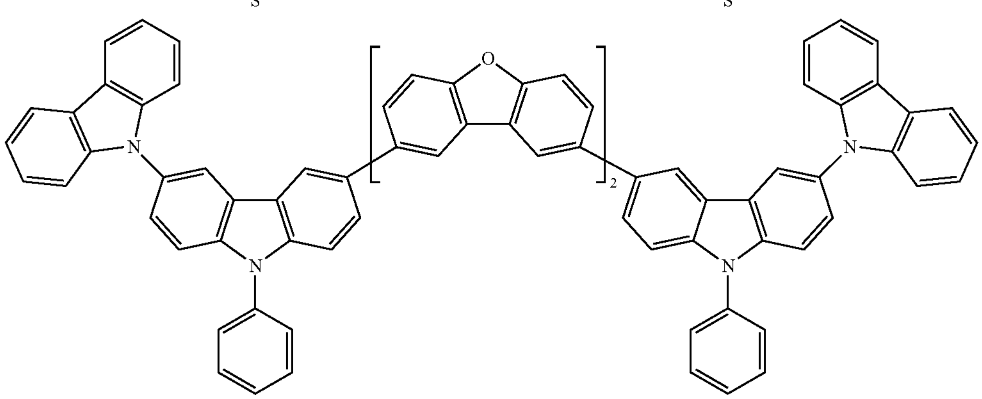

-continued
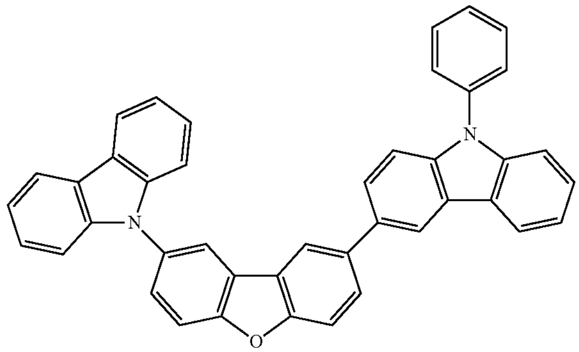
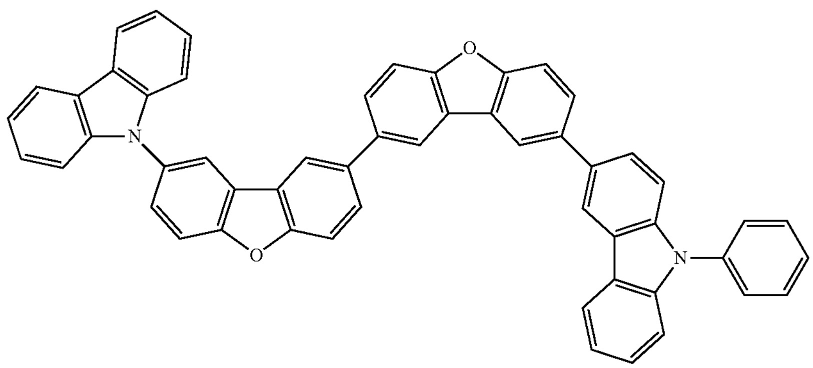
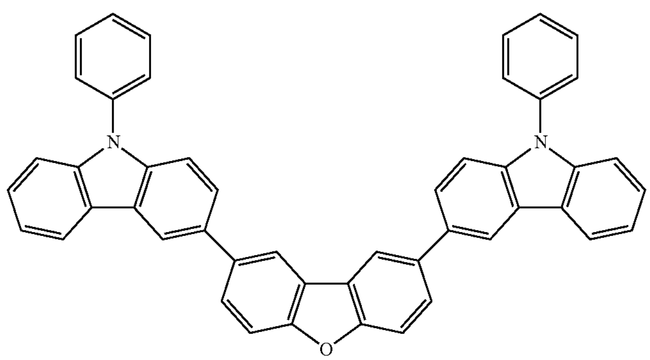
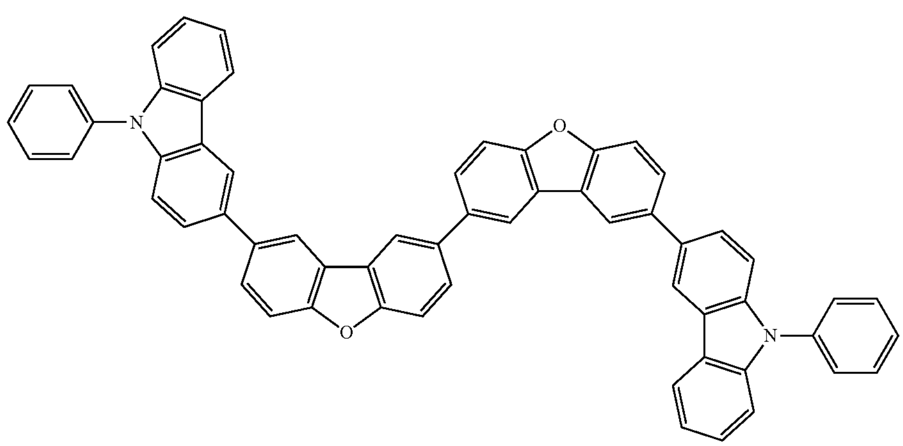

-continued
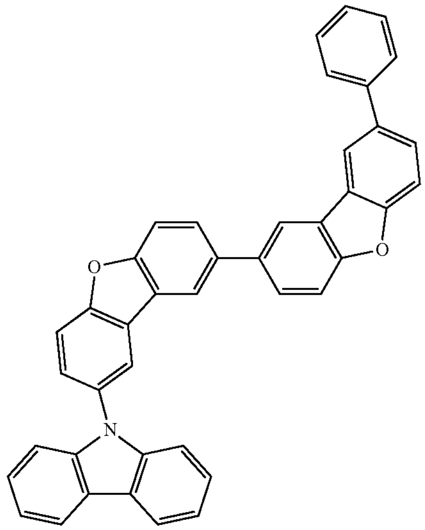
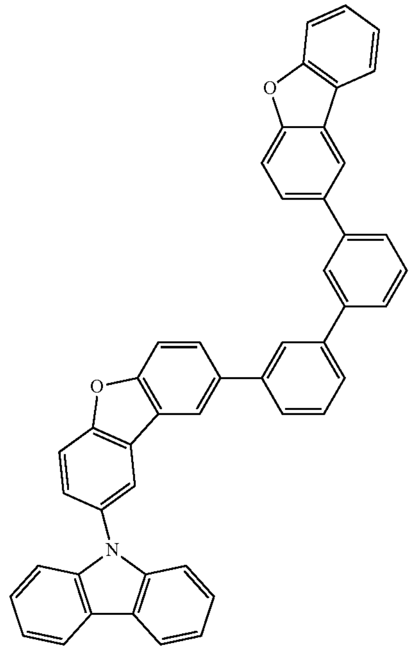
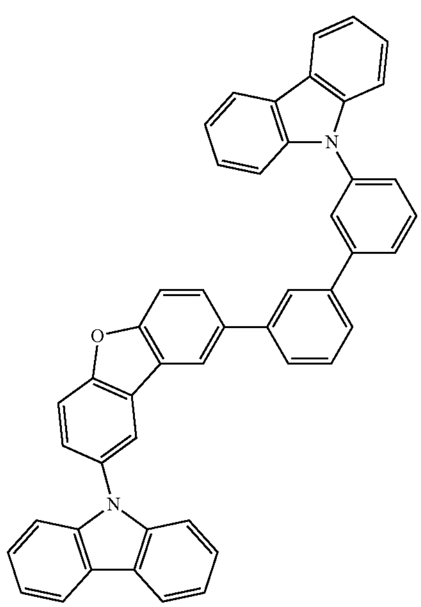
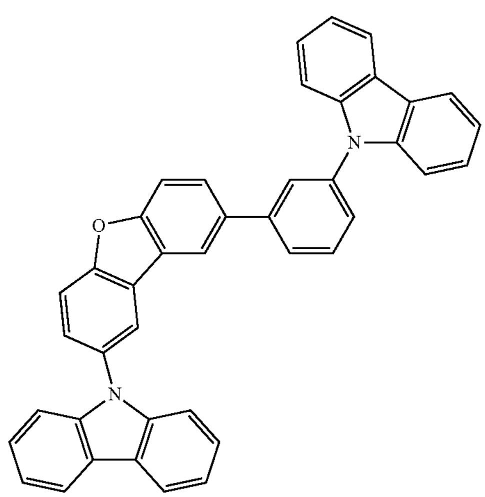

-continued
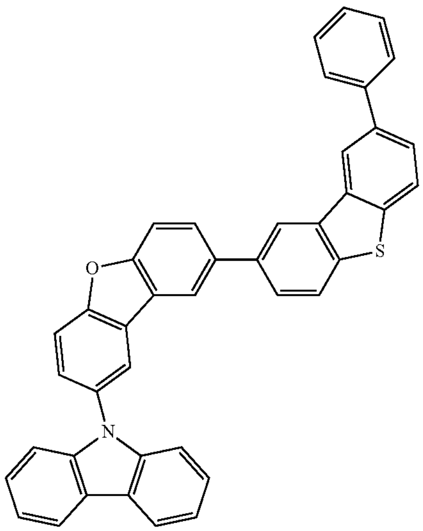
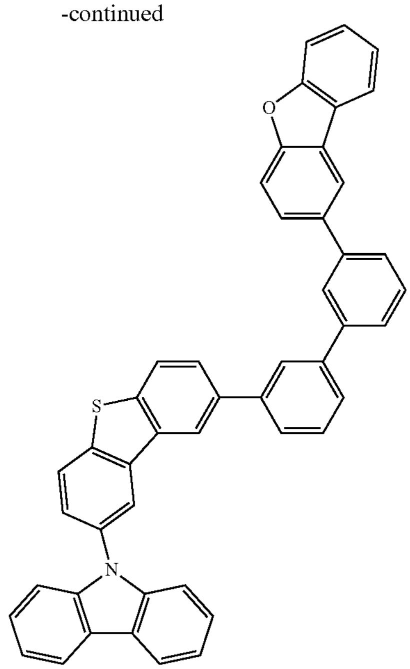
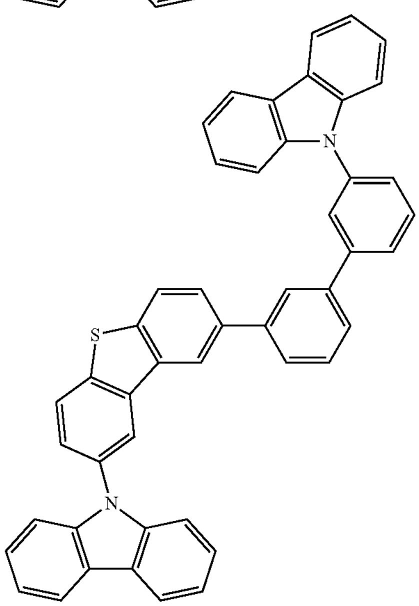
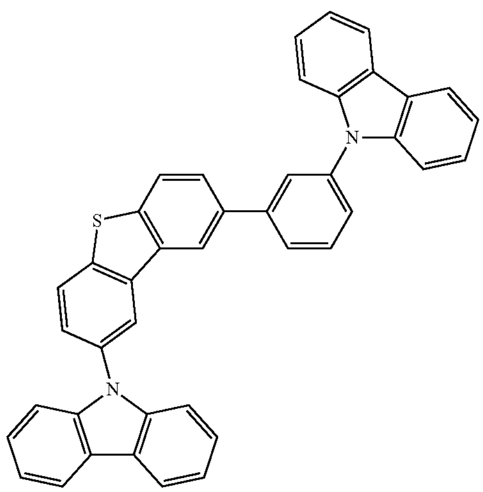
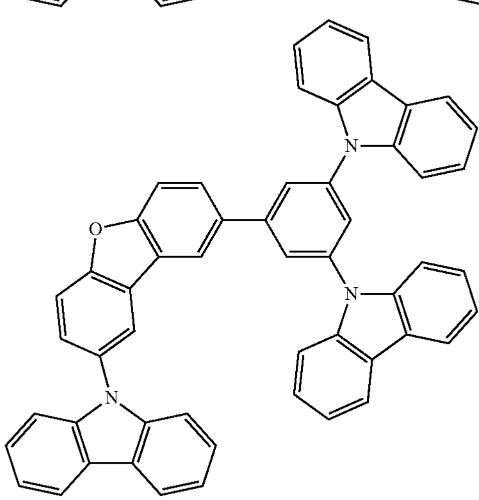
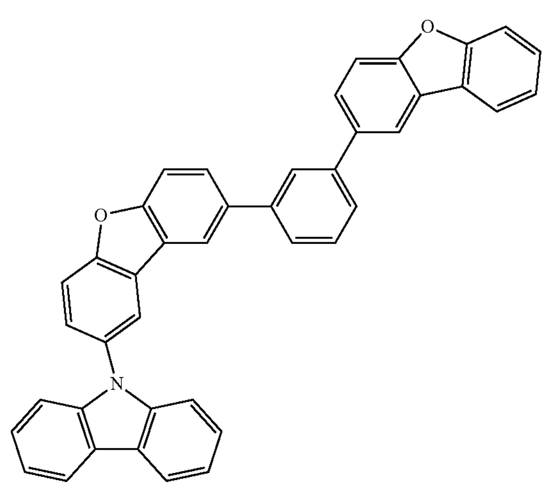

-continued
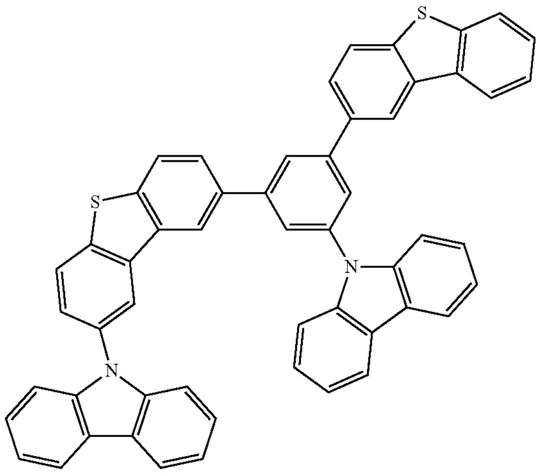
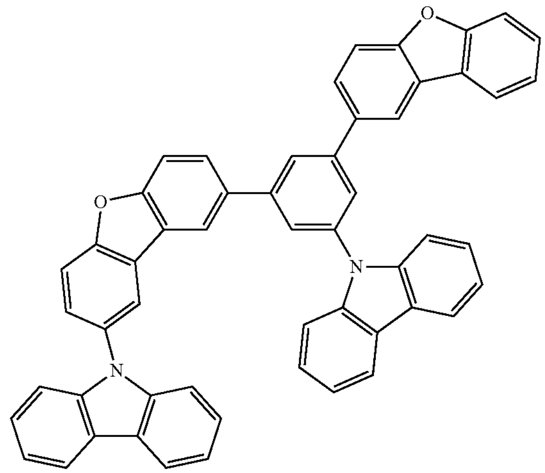
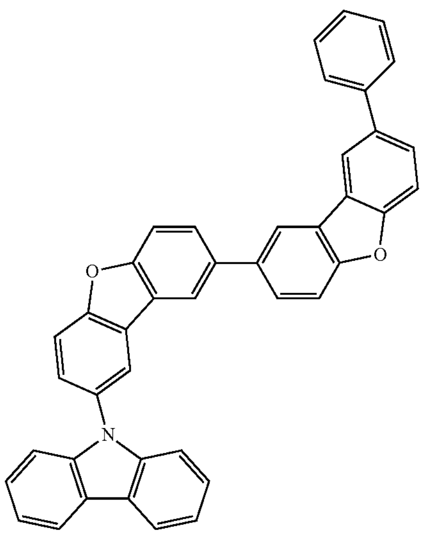
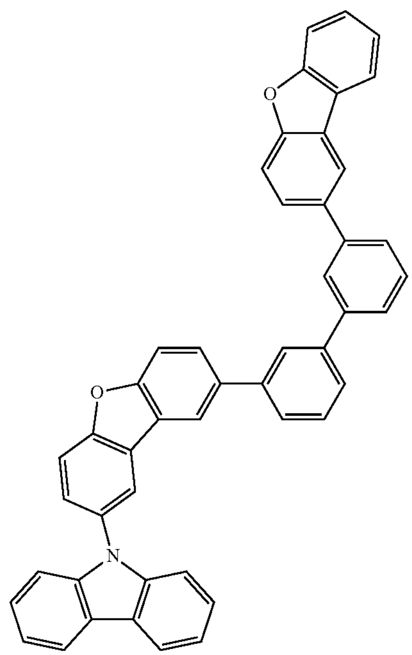
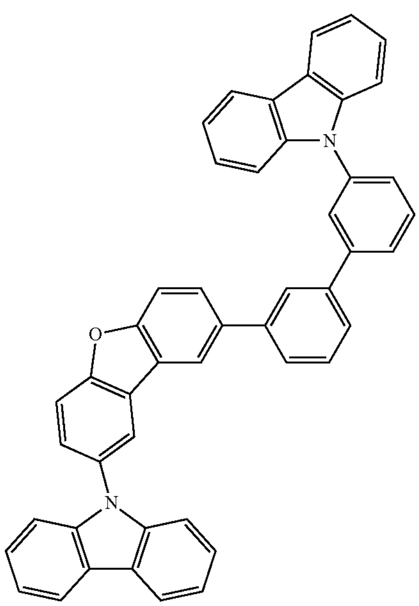
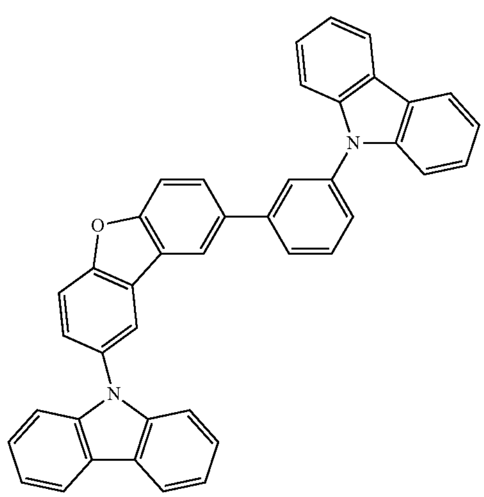

-continued
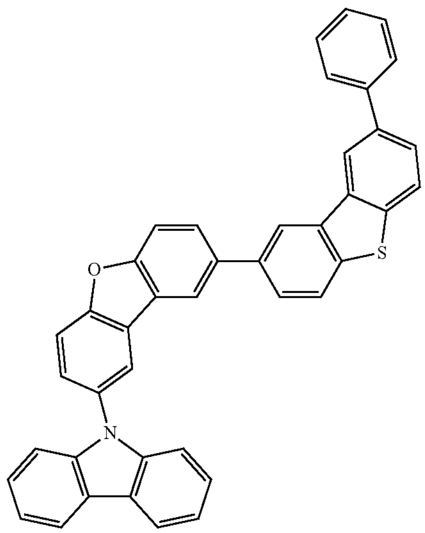
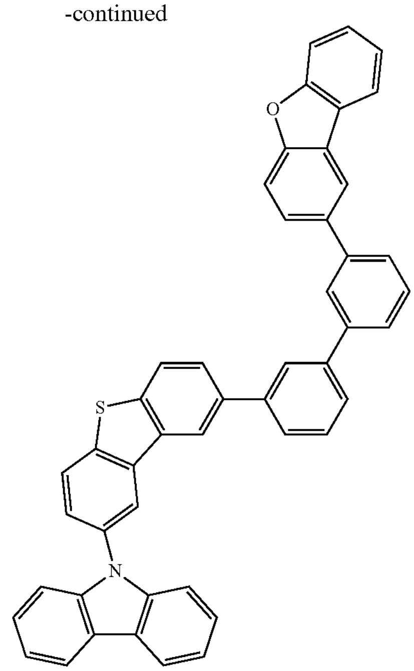
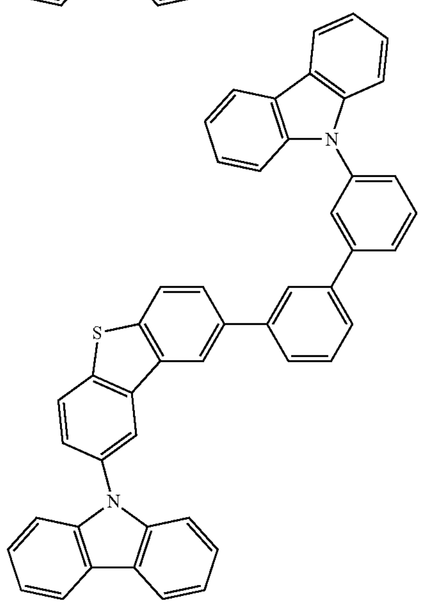
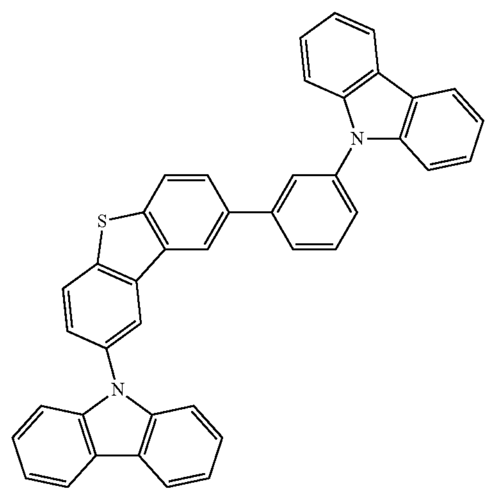
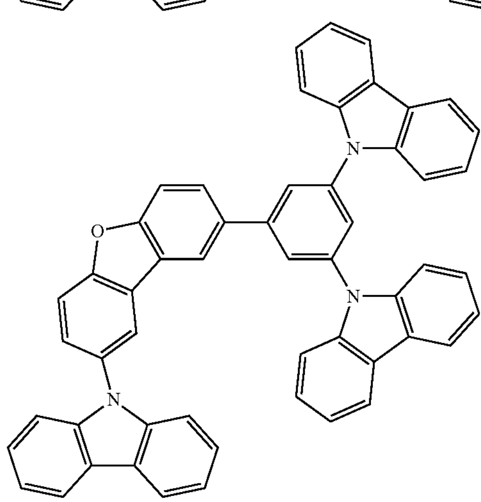
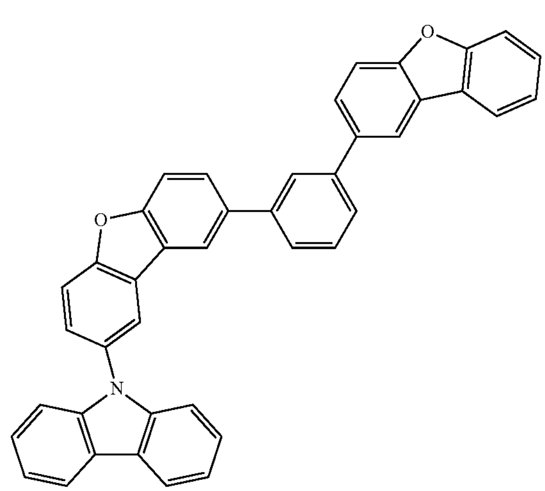

-continued
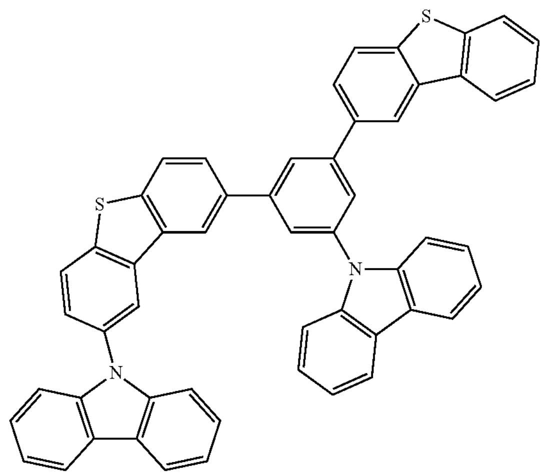
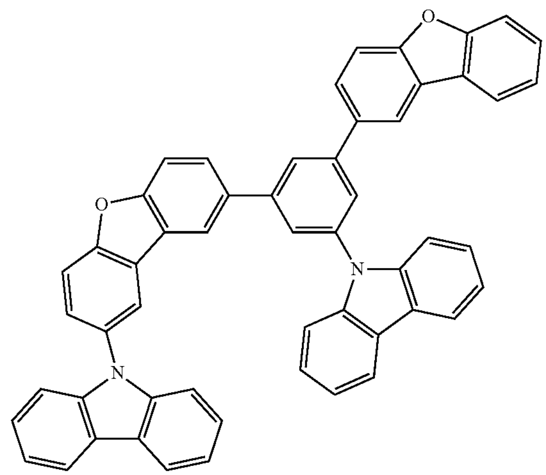
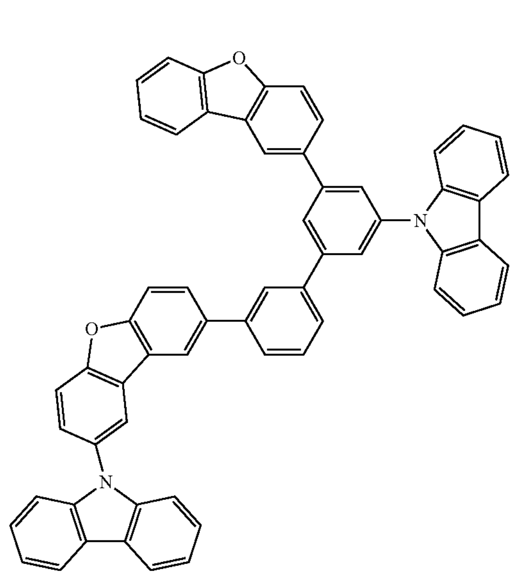
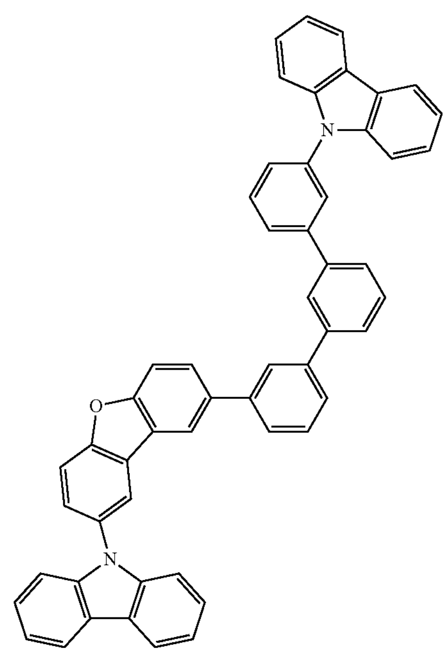

-continued
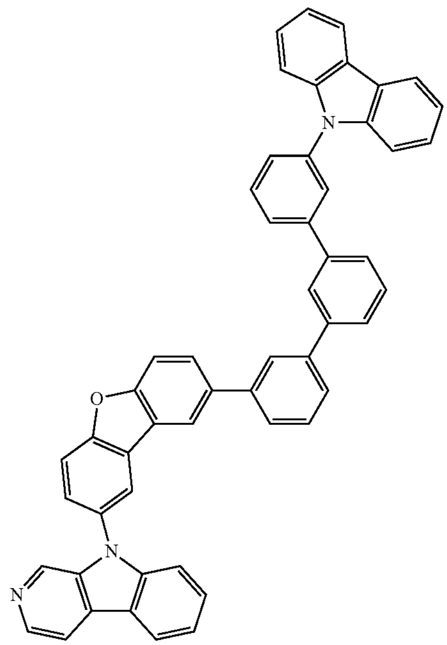
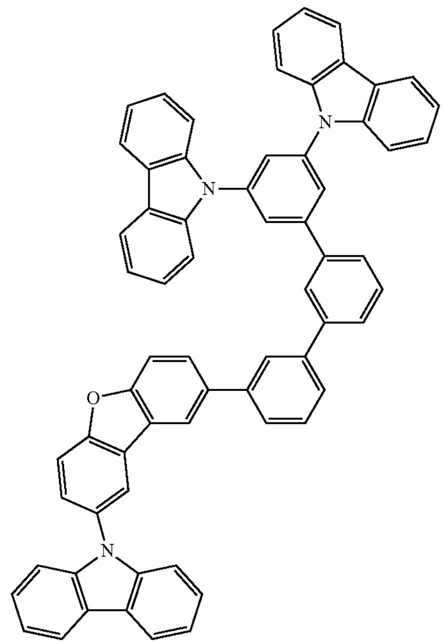
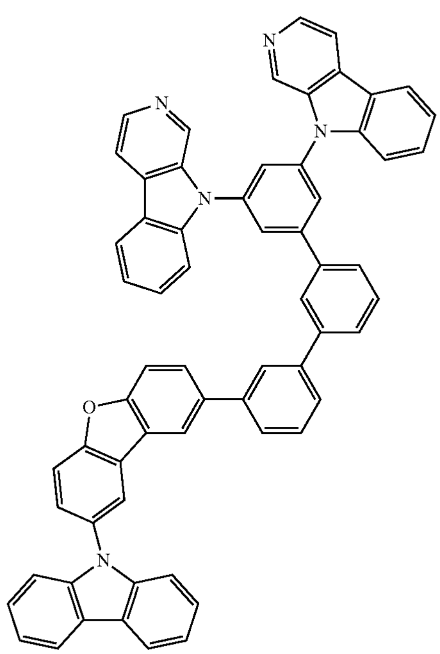
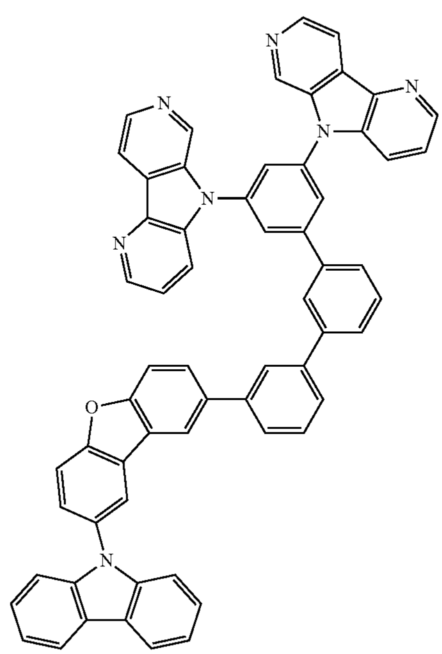

-continued
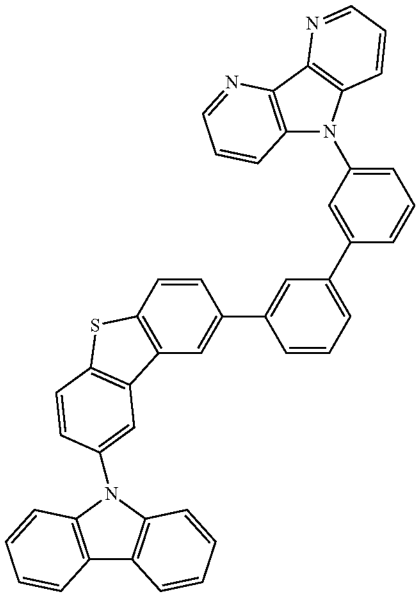
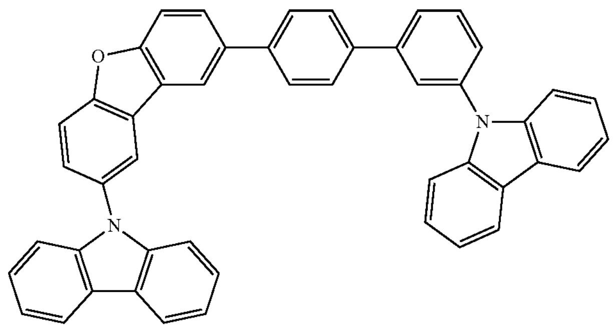
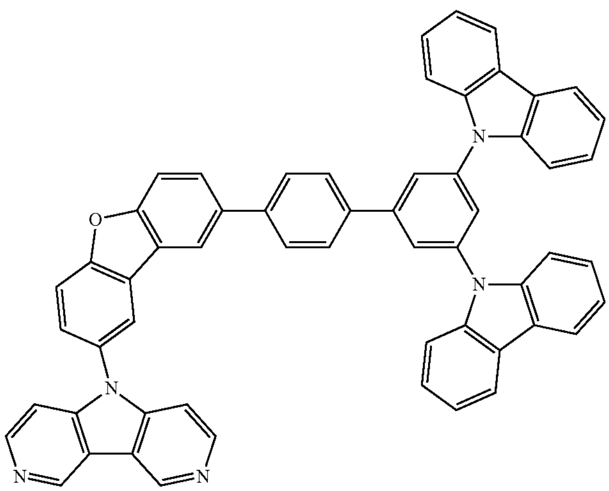
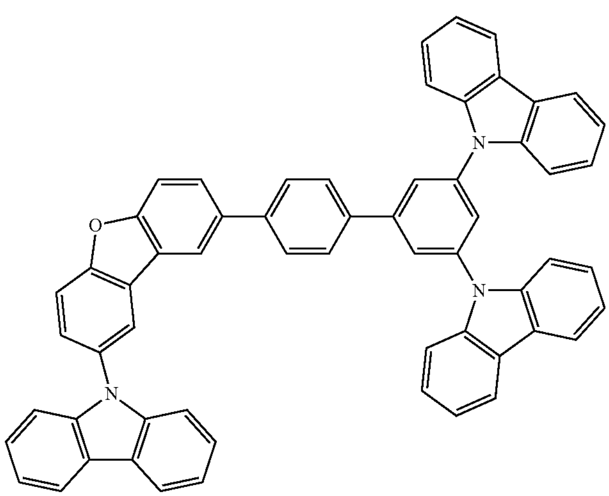

-continued
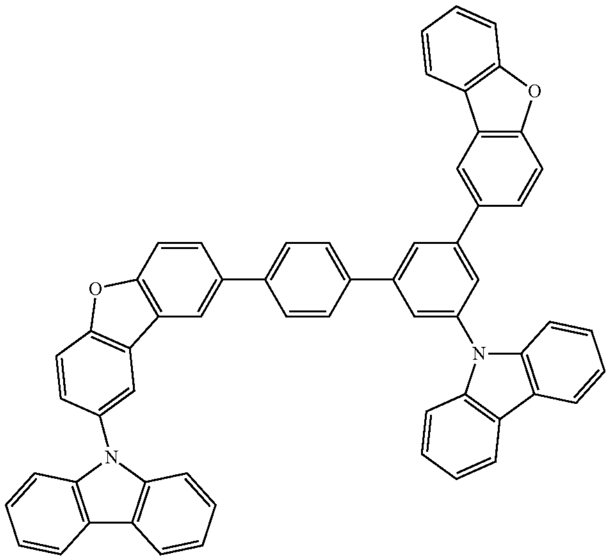
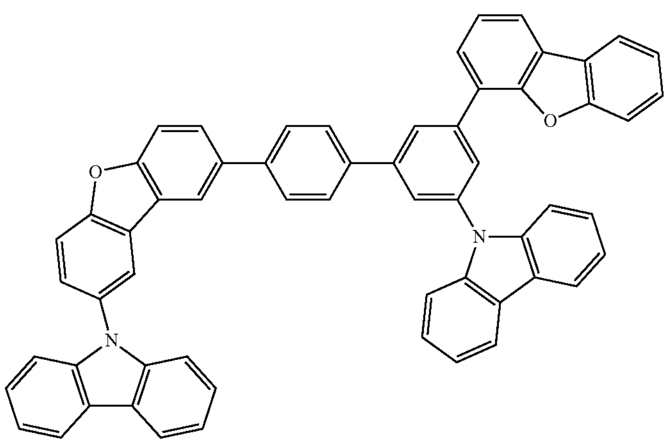
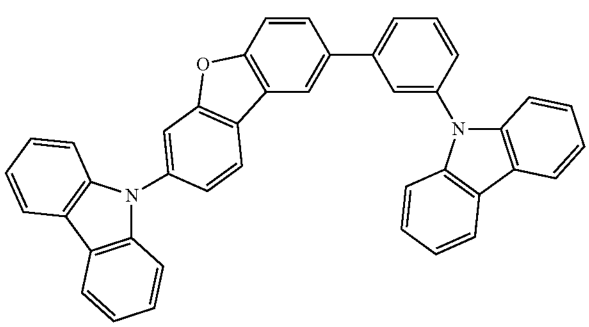
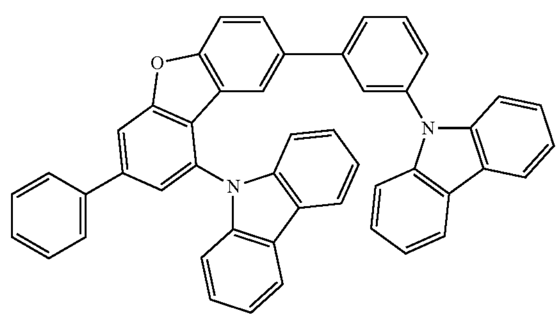

-continued
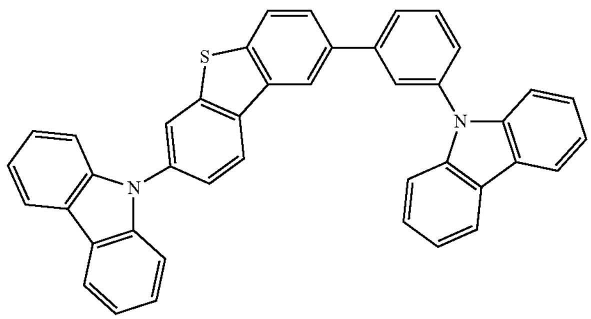
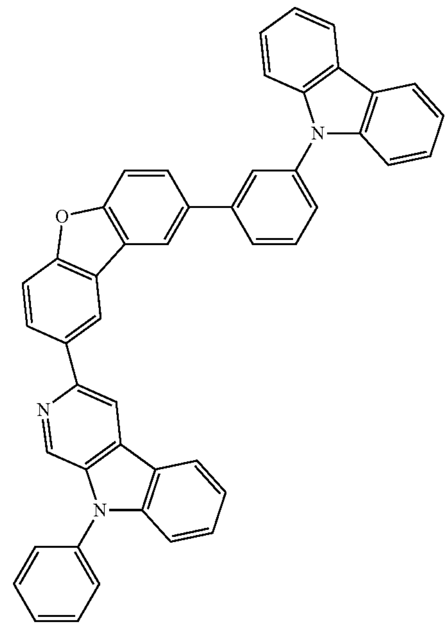
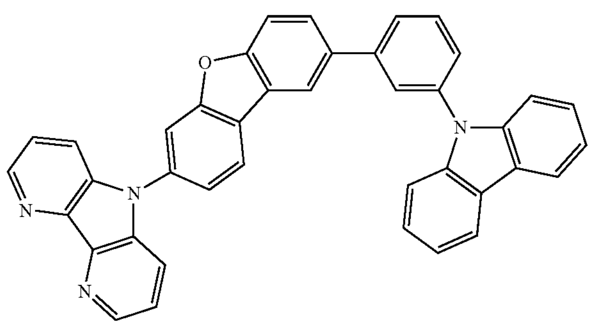
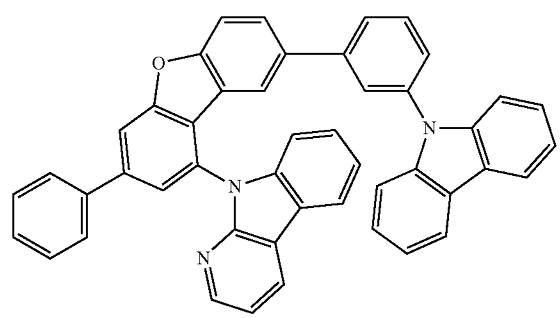
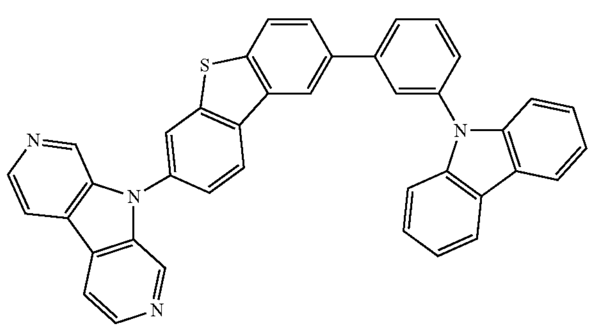
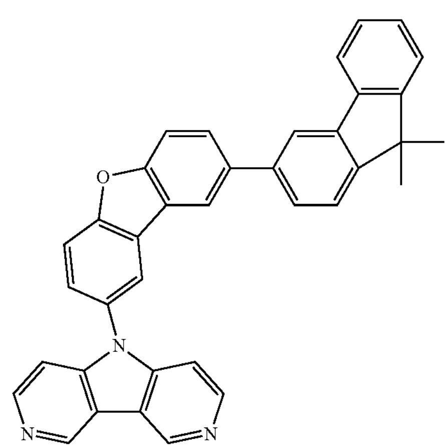

-continued
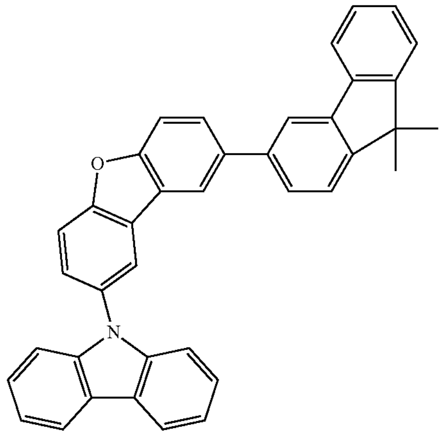
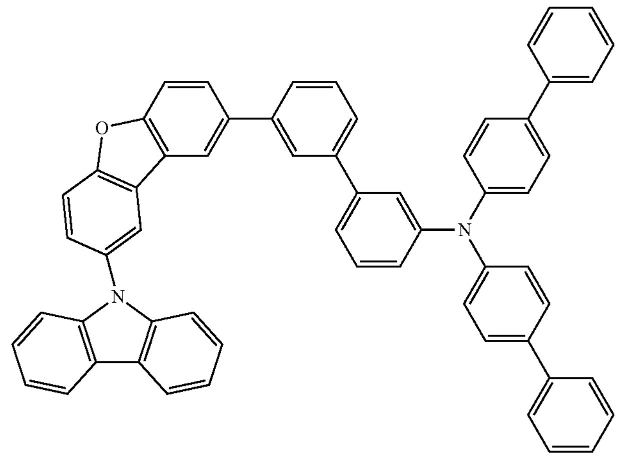
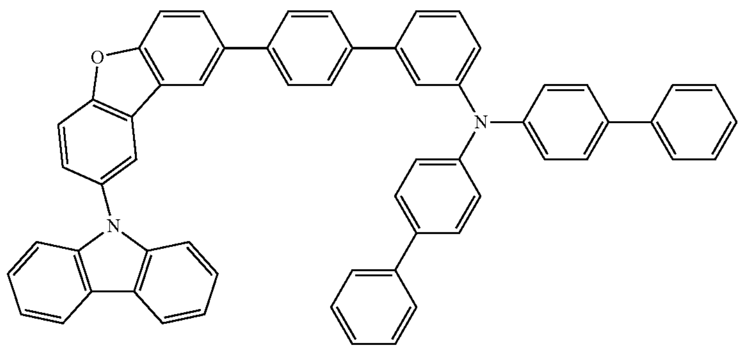
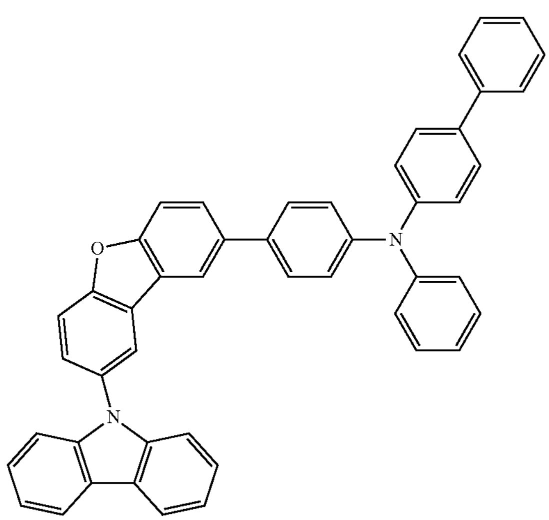
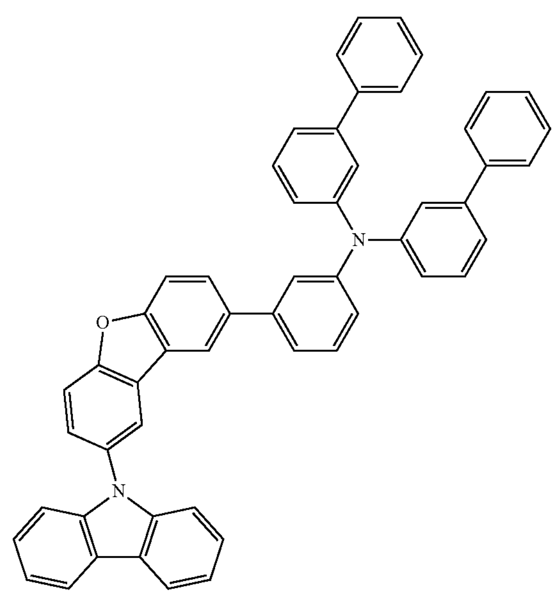

-continued
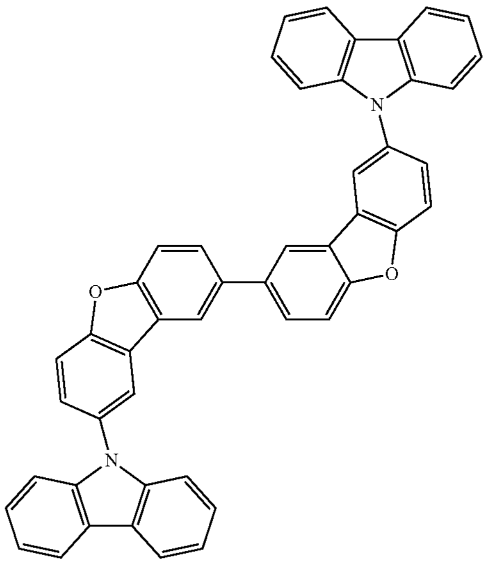
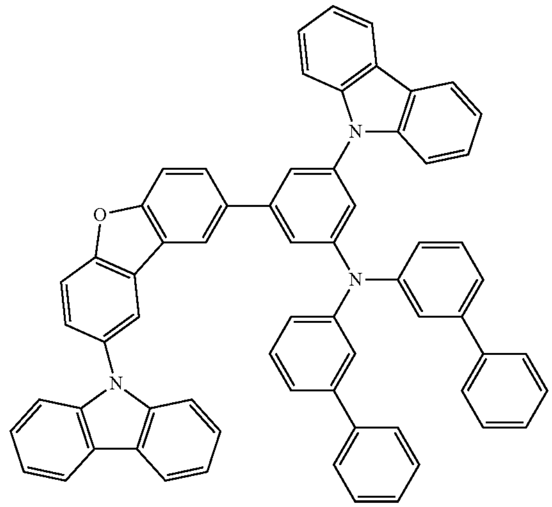
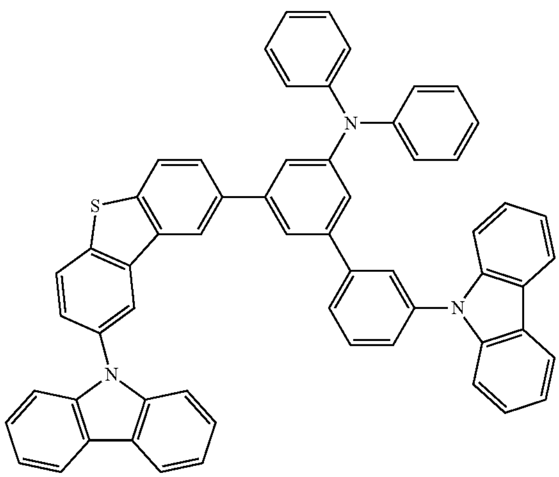
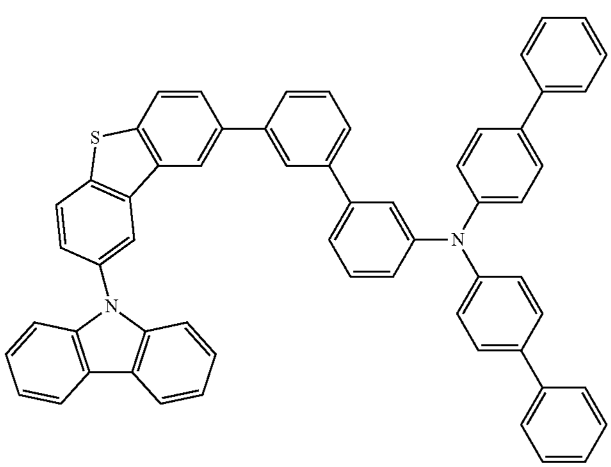

-continued
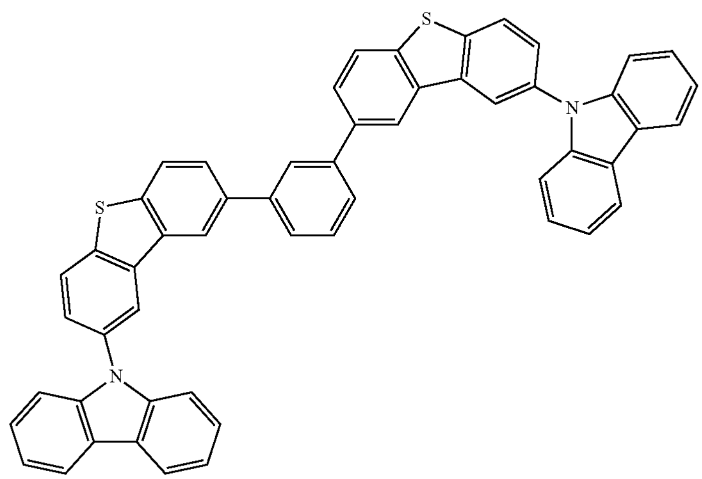
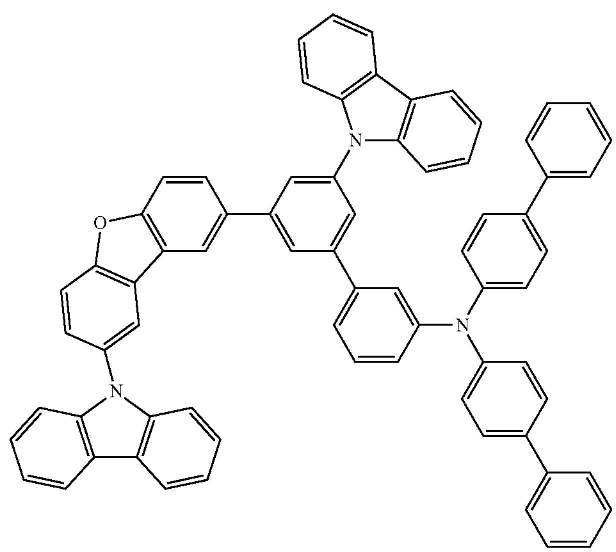
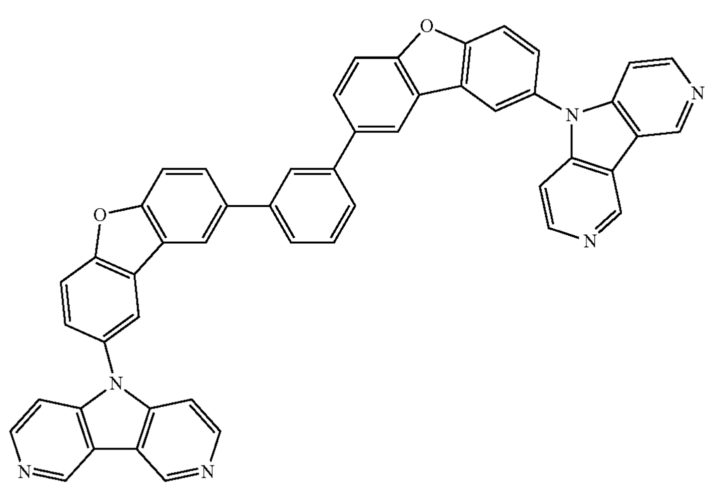

-continued
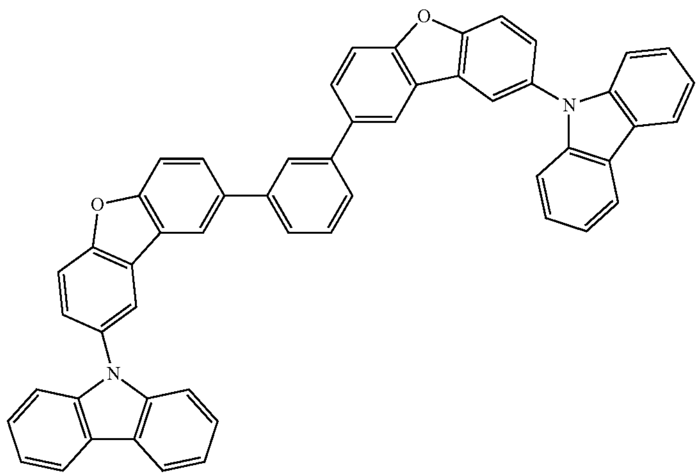
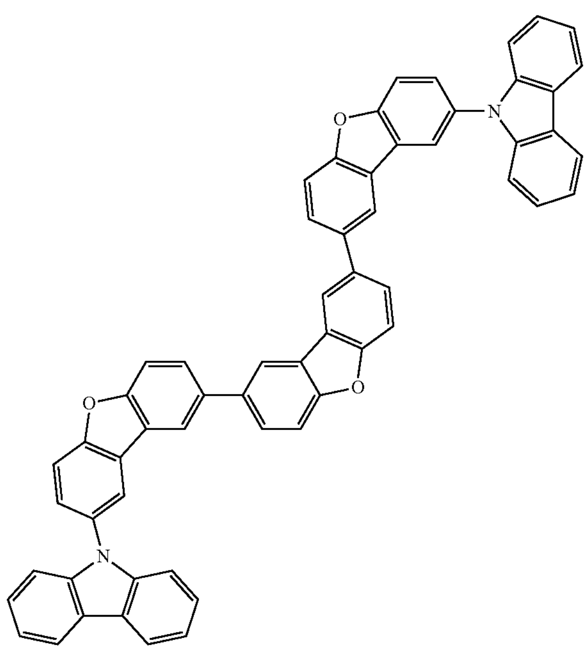

-continued
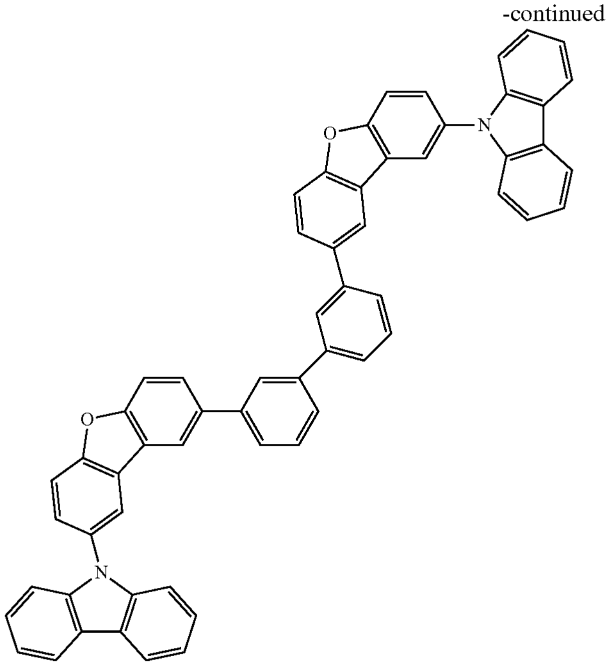
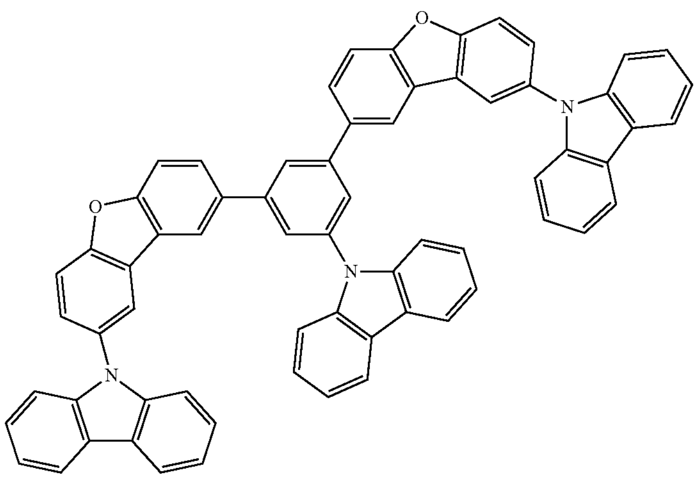
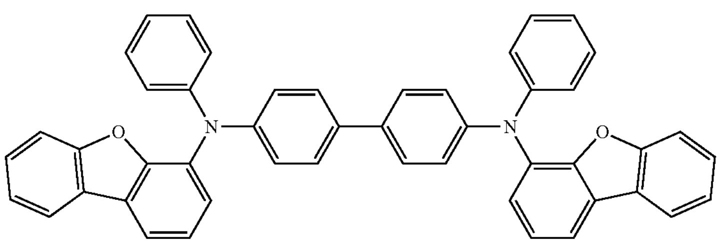
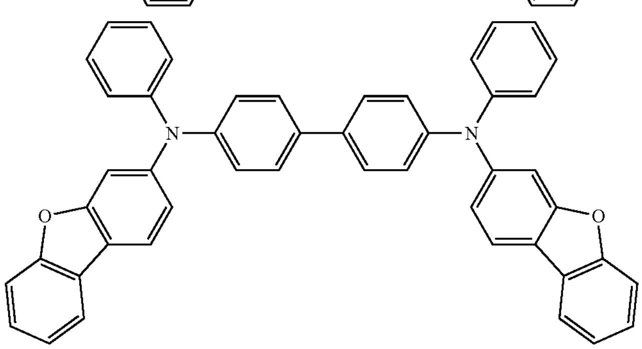

-continued
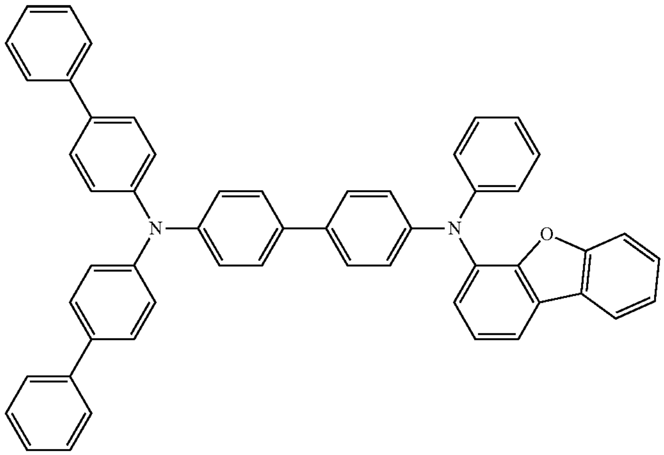
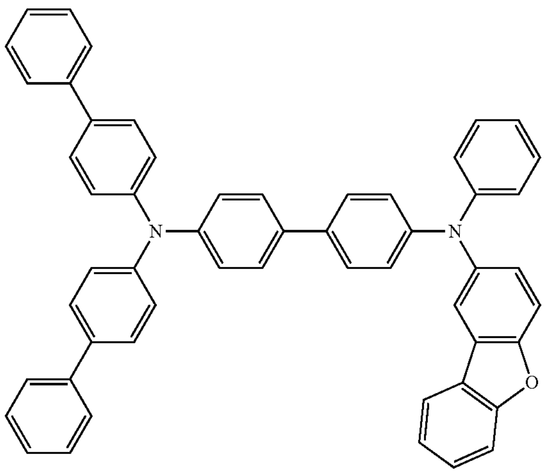
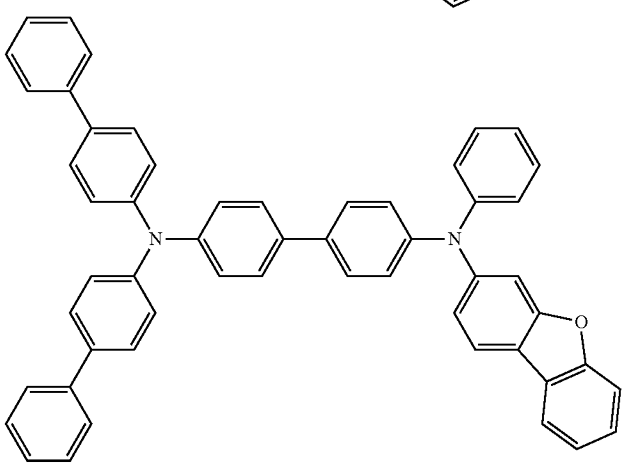
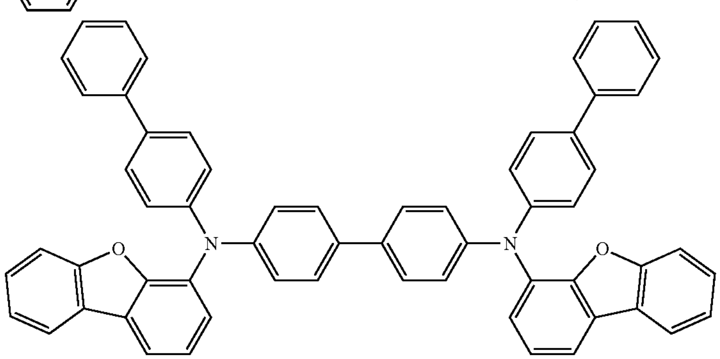

-continued
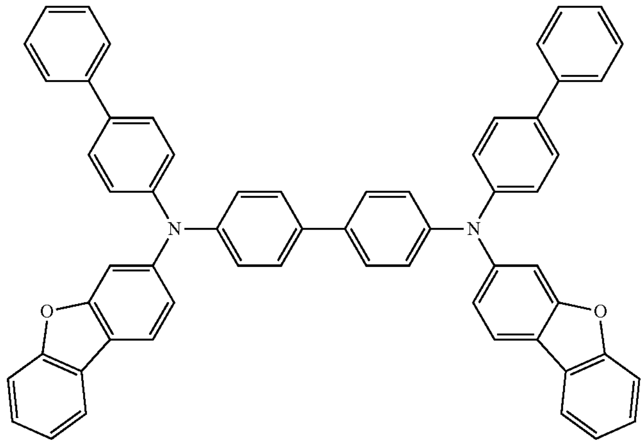
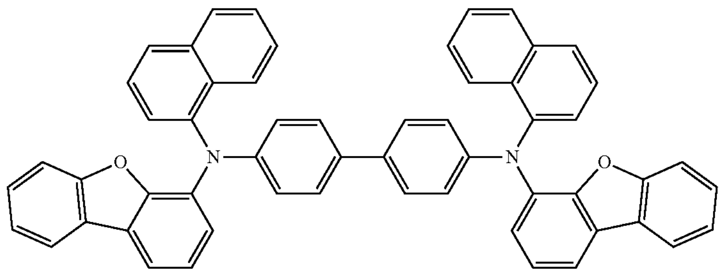
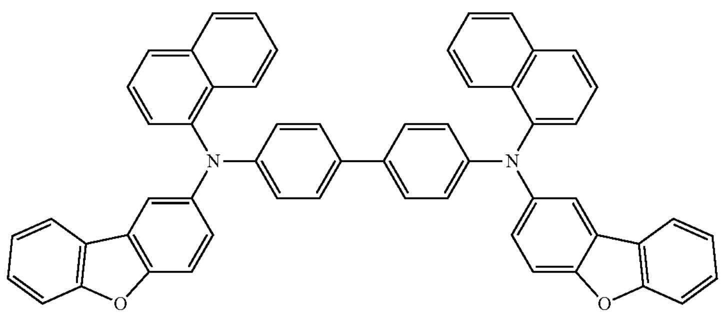
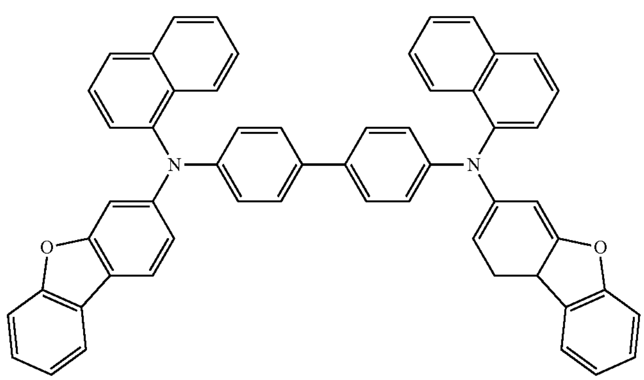
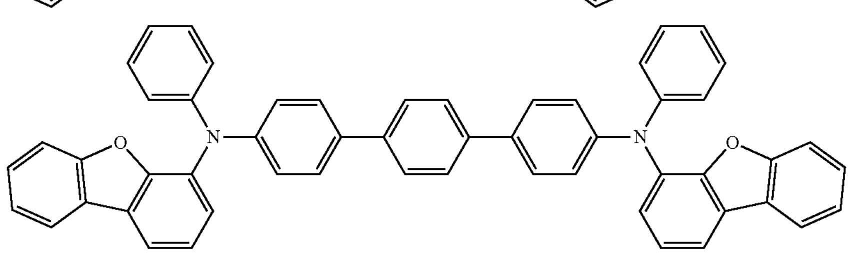

-continued
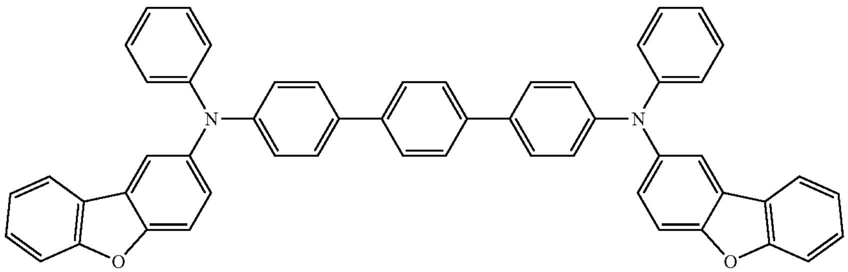
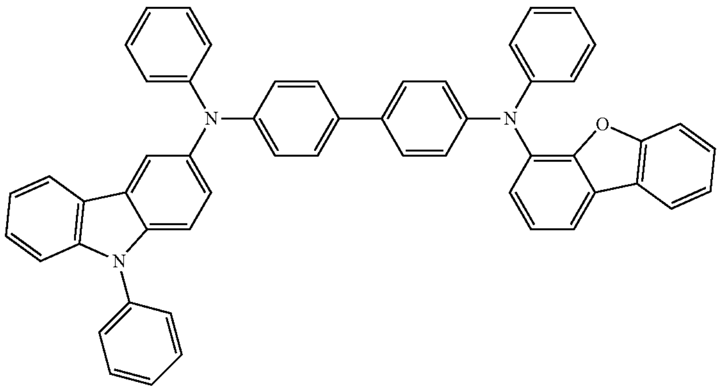
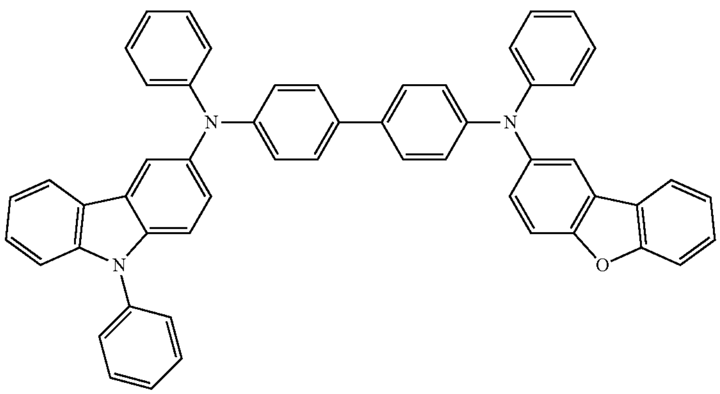
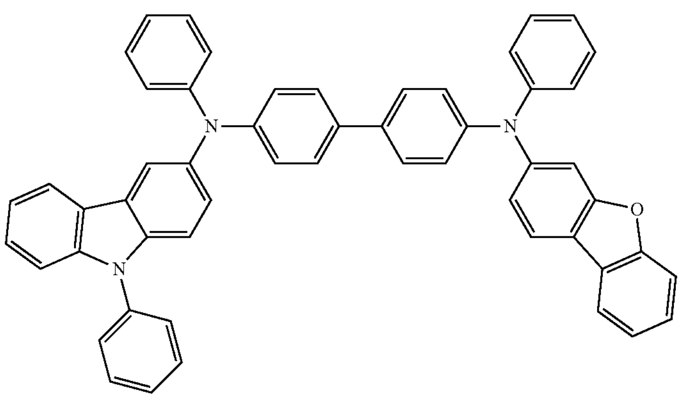
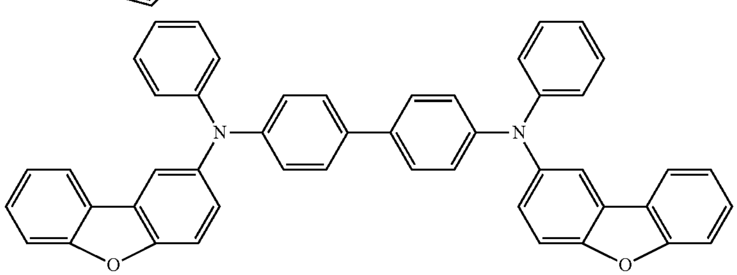

-continued
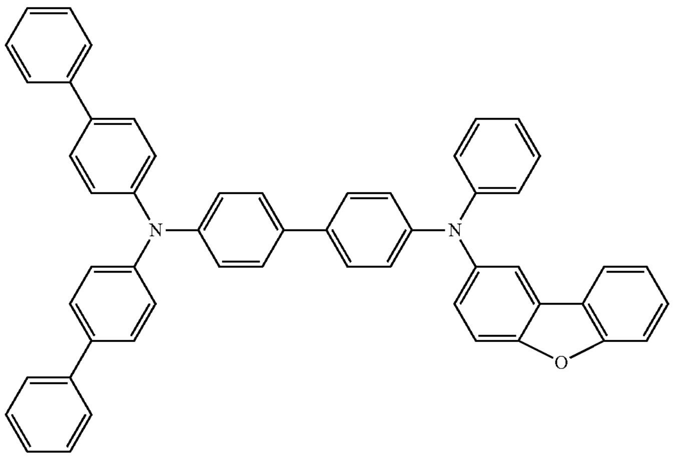
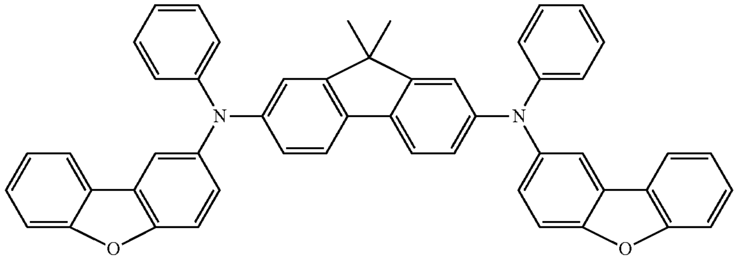
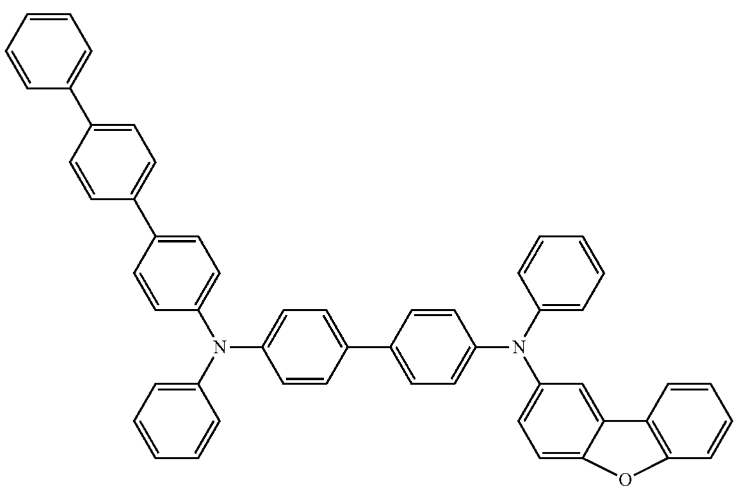
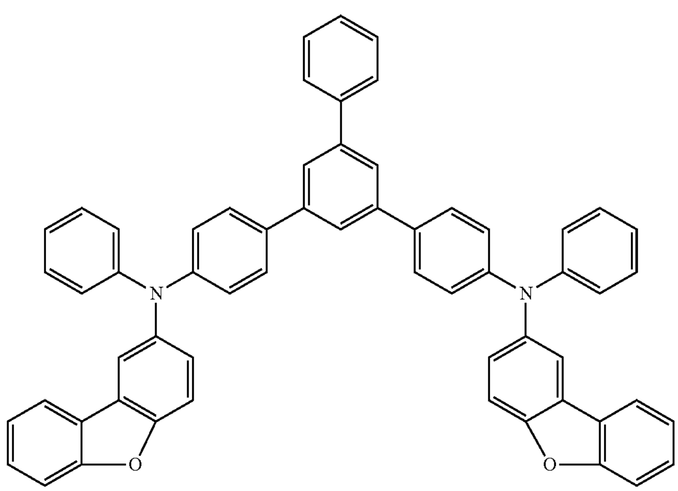

-continued
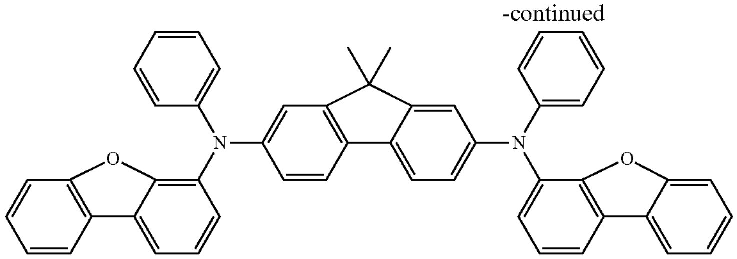
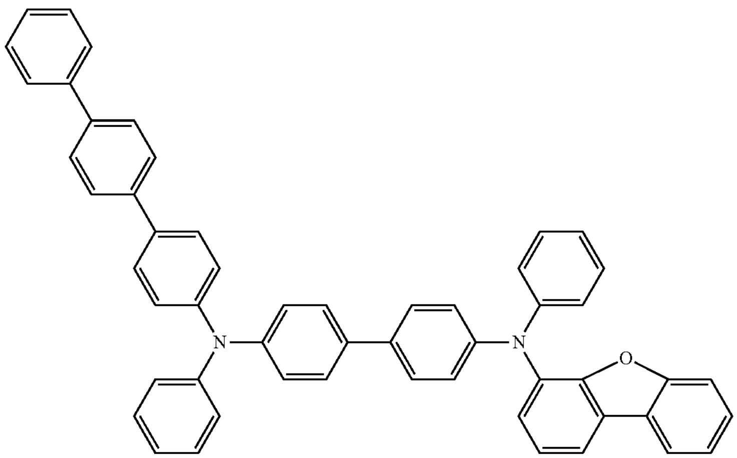
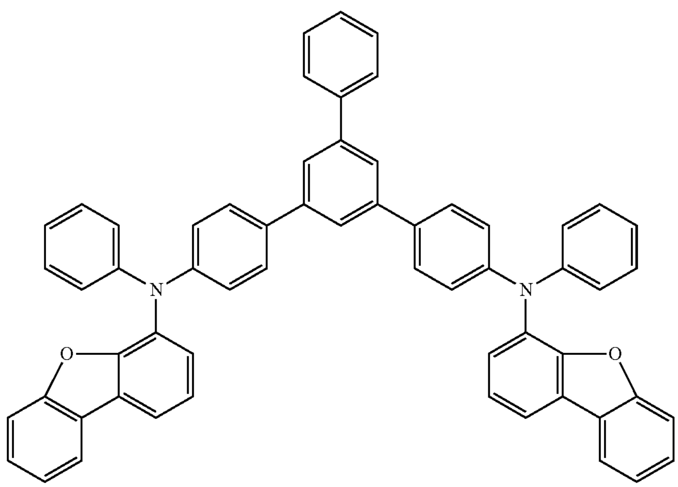
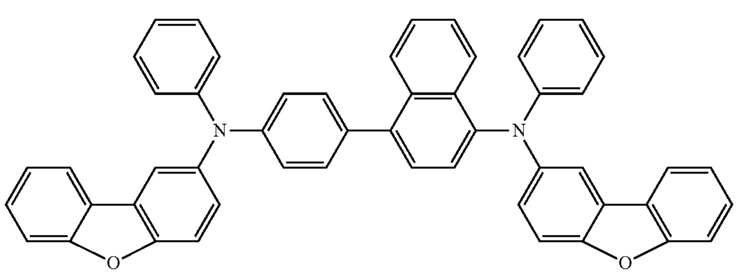

-continued
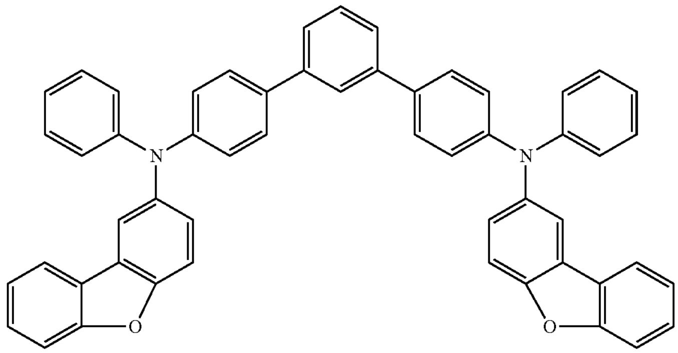
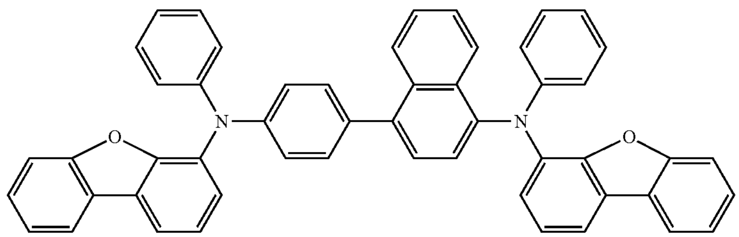
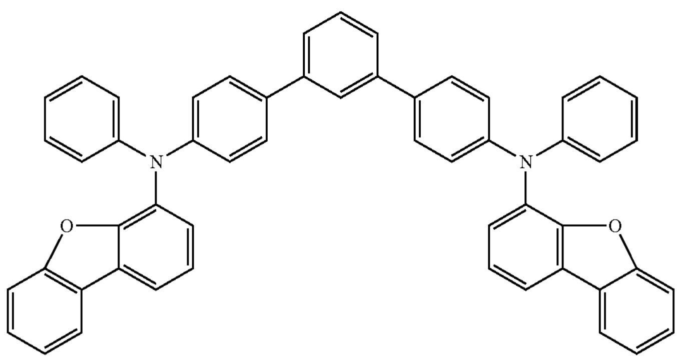
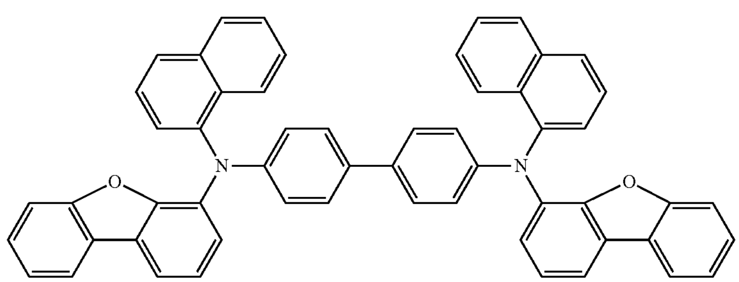
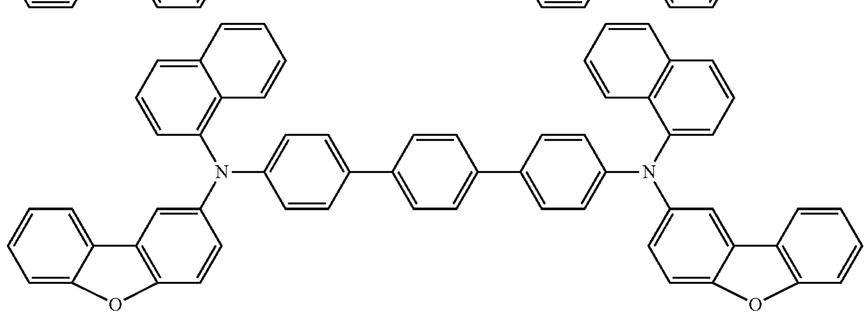

-continued
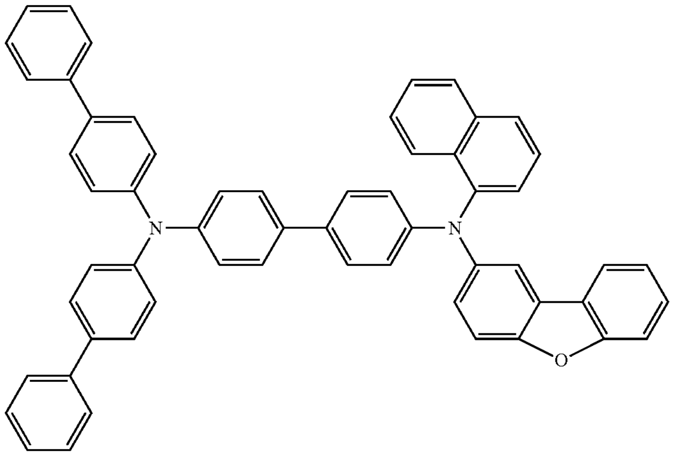
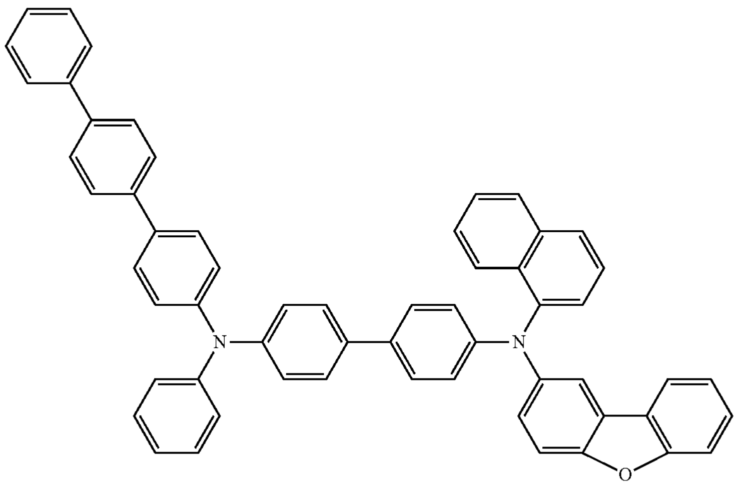
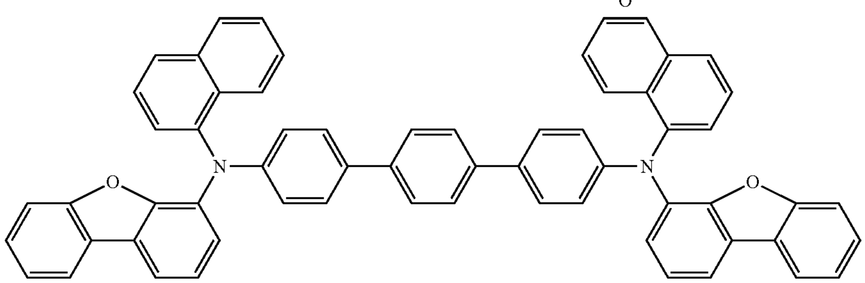
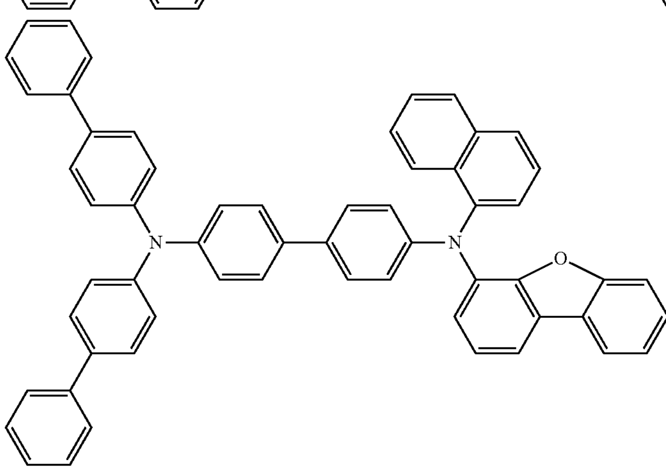

-continued
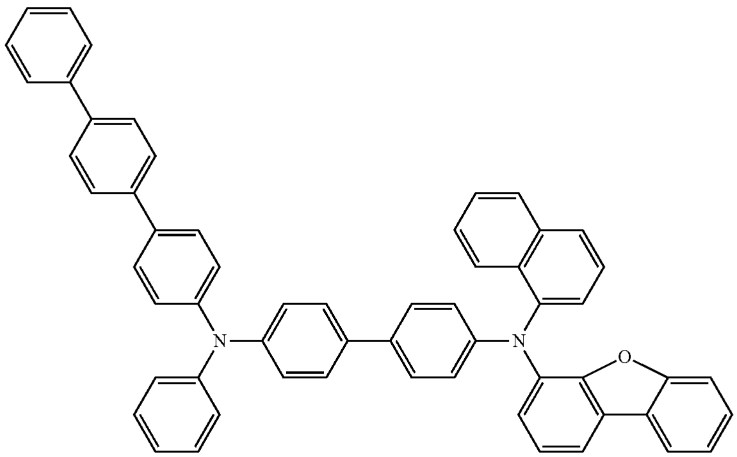
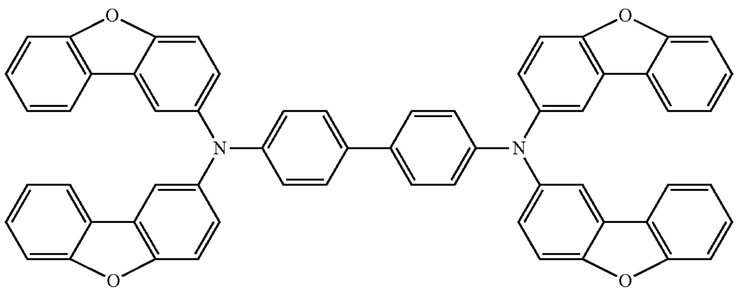
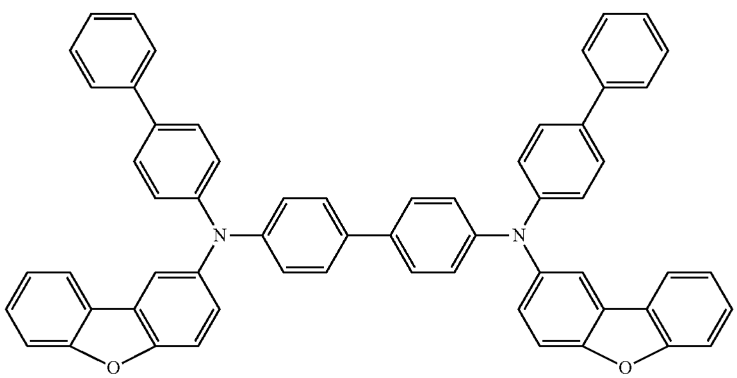
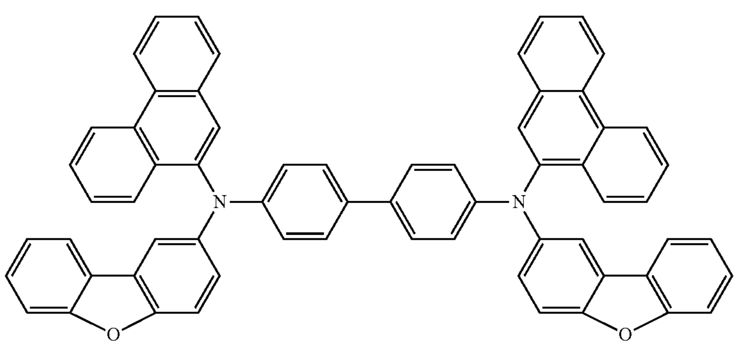
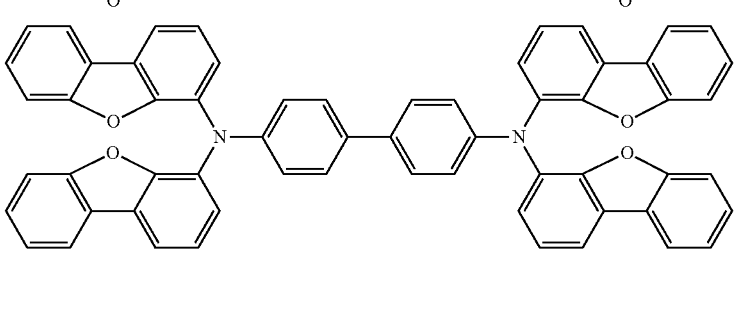

-continued
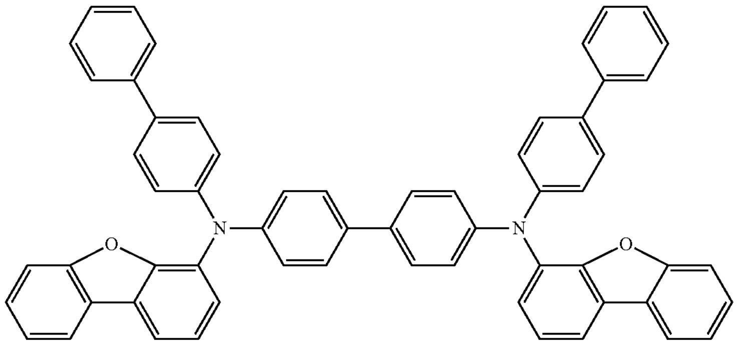
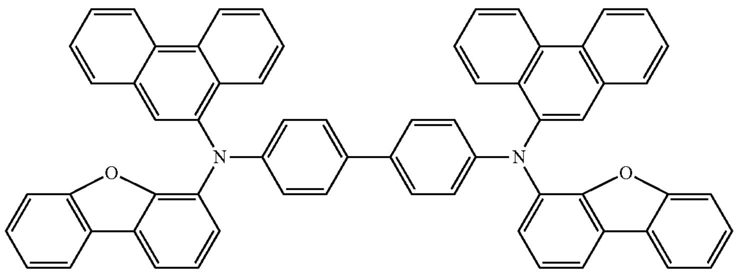
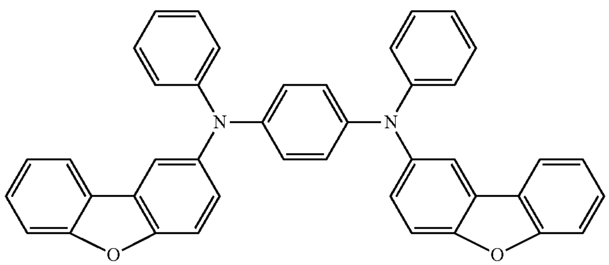
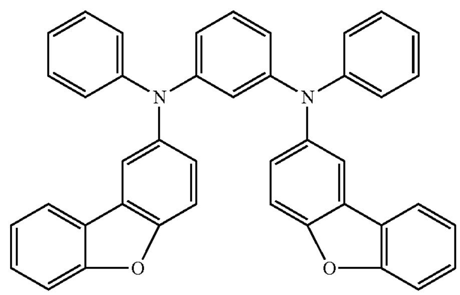
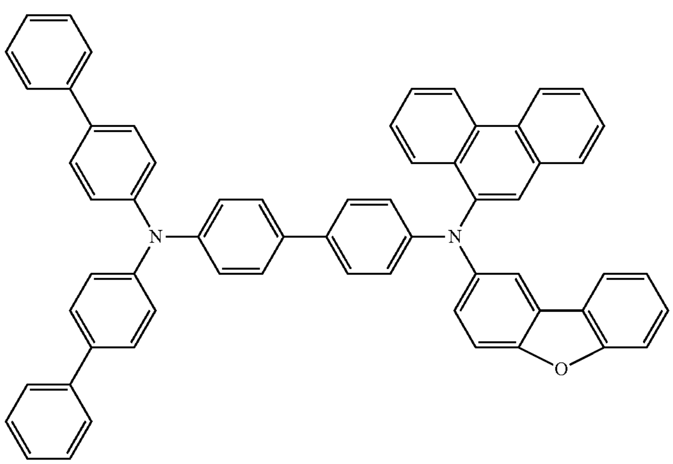
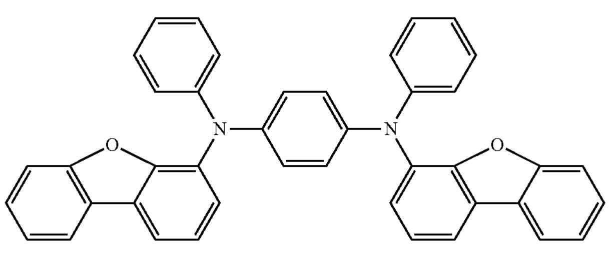
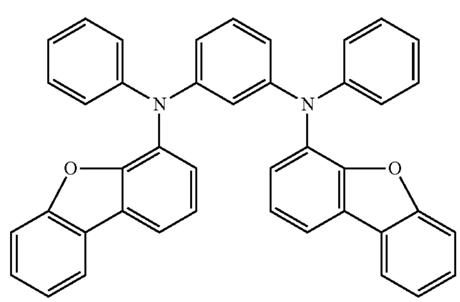

-continued
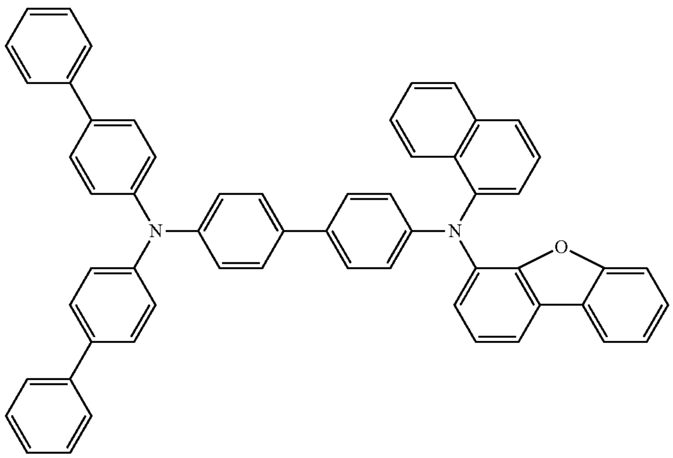
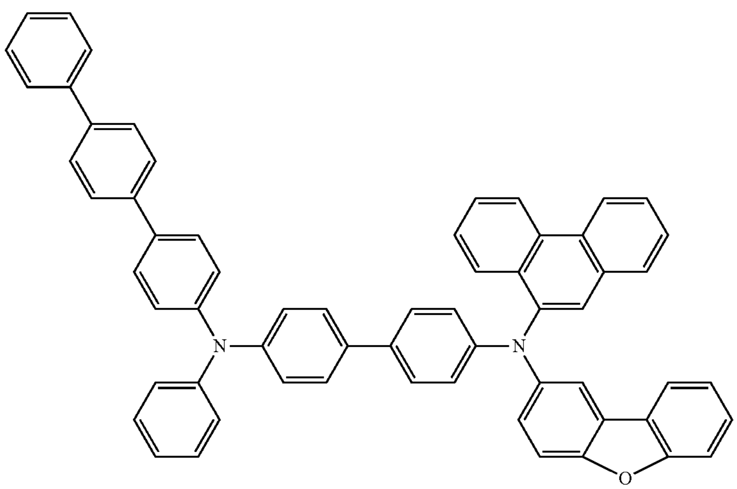
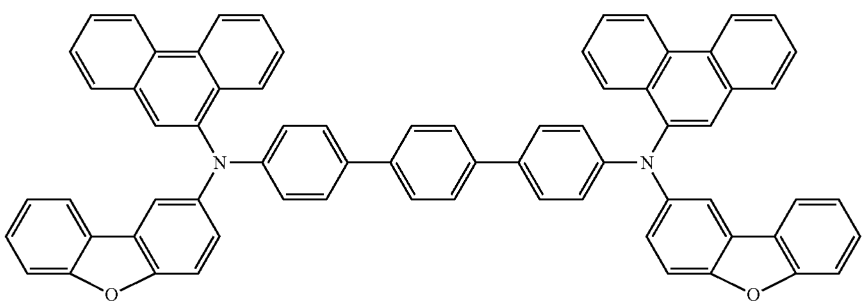
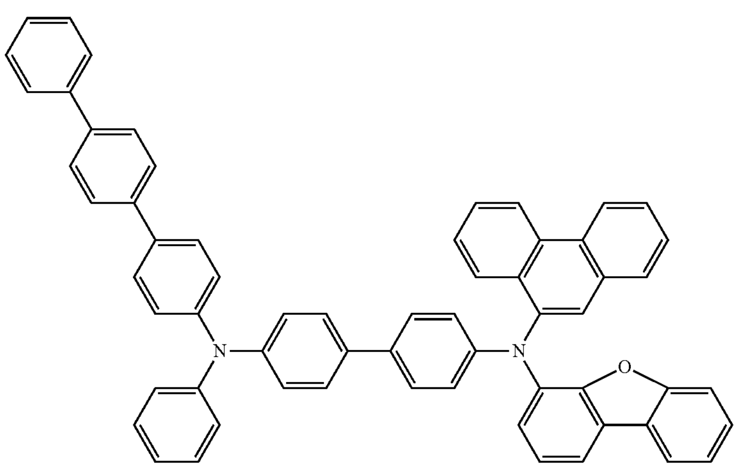

-continued
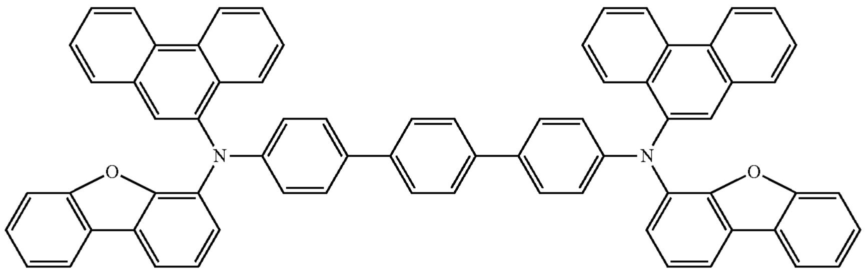
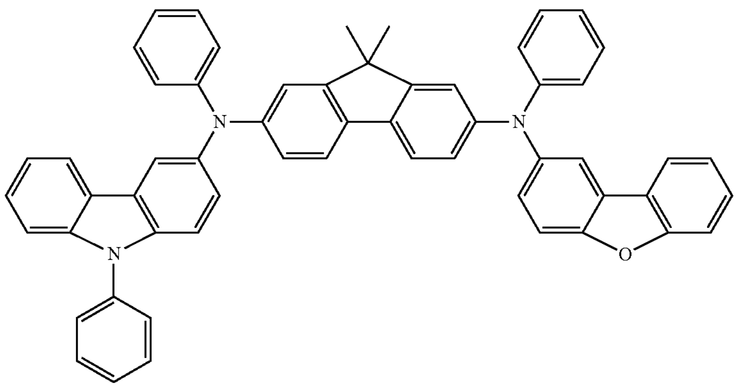
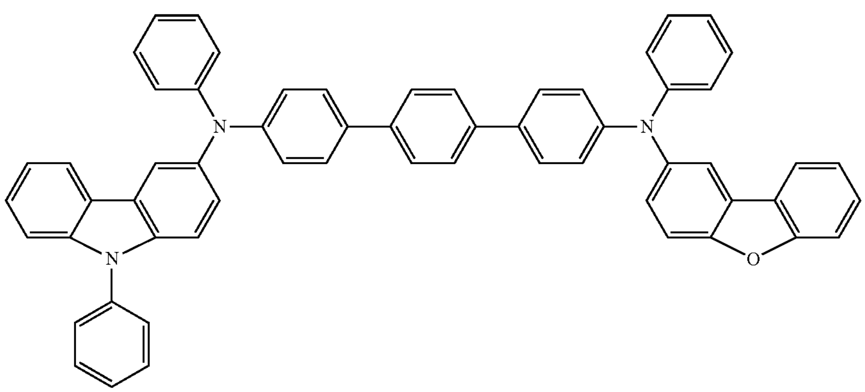
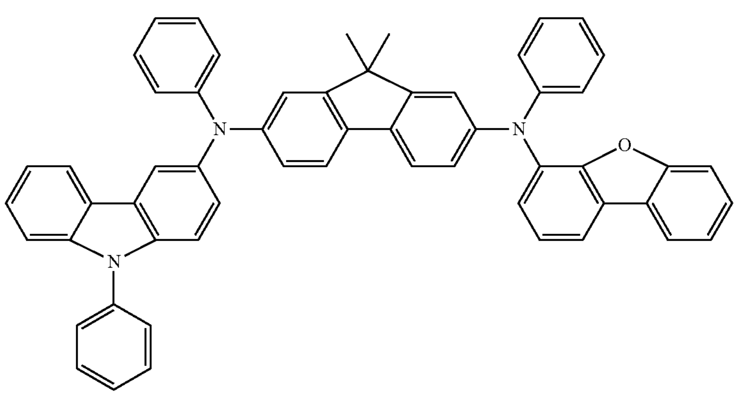

-continued
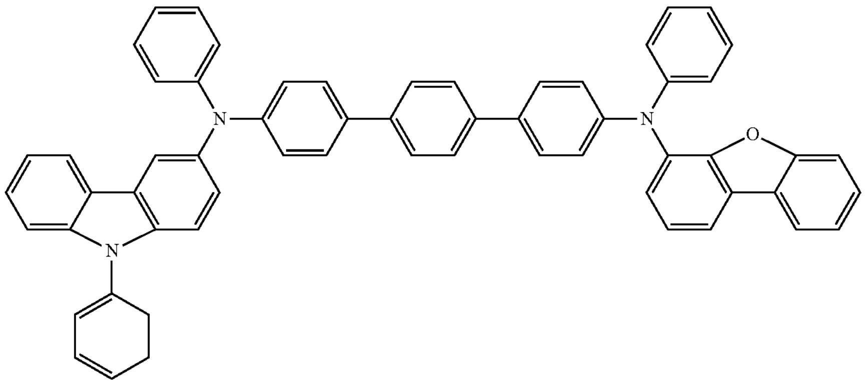
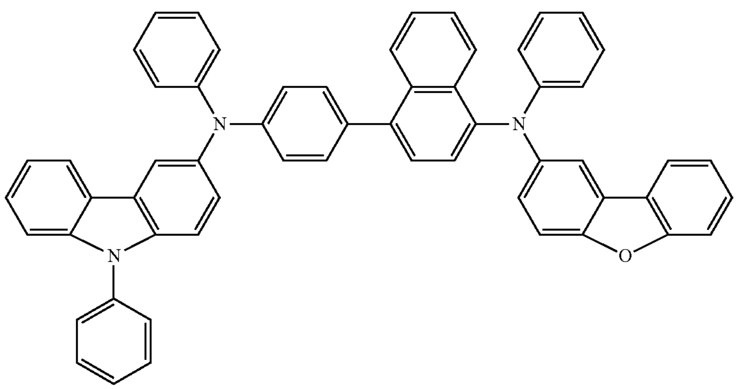
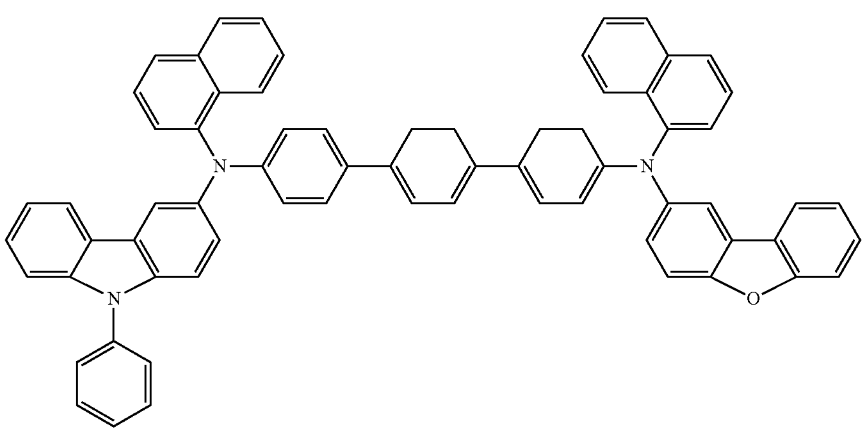

-continued
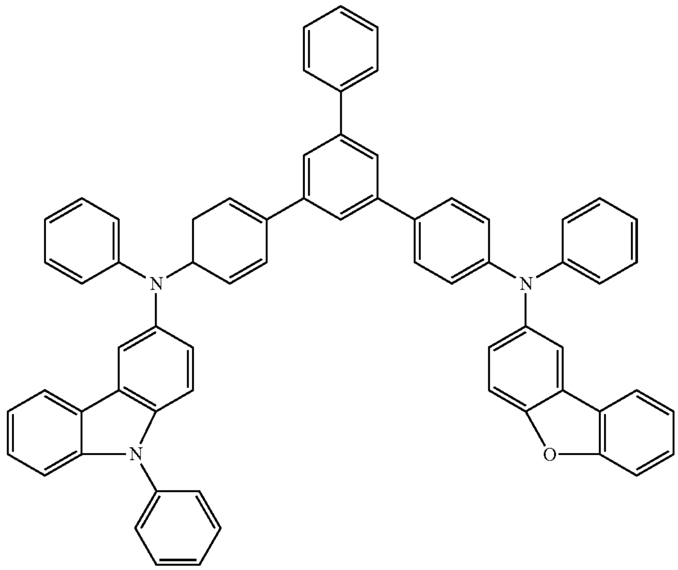
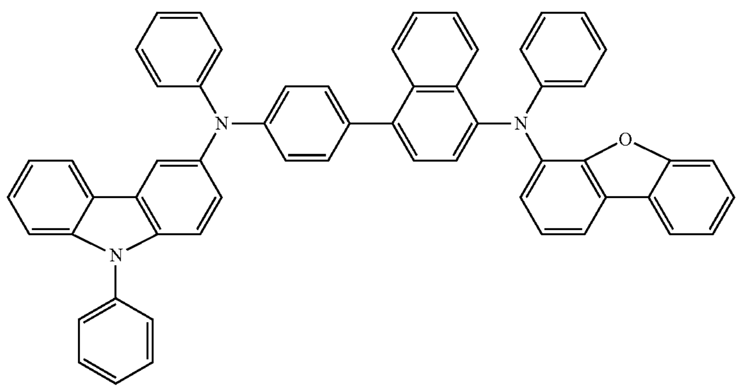
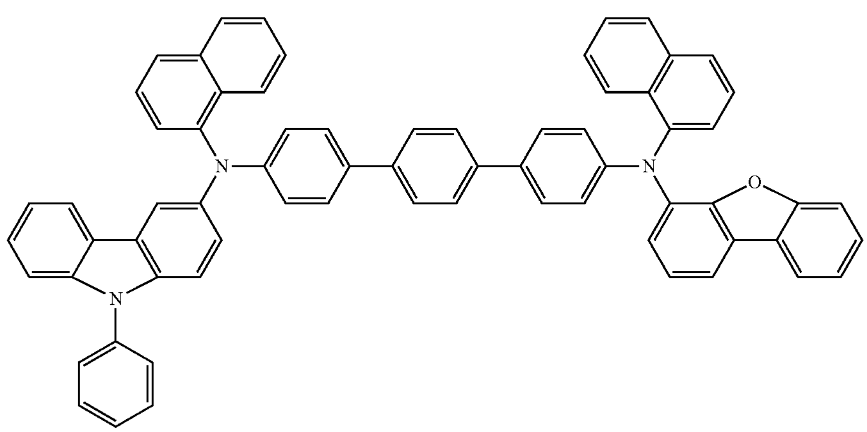

-continued
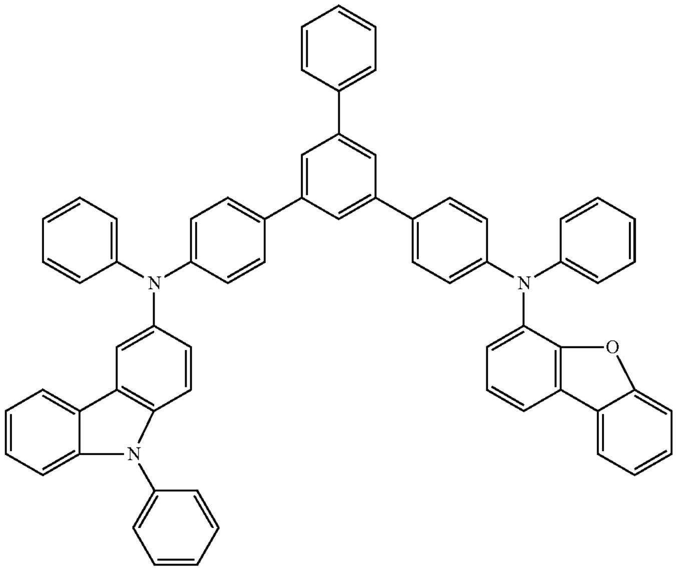
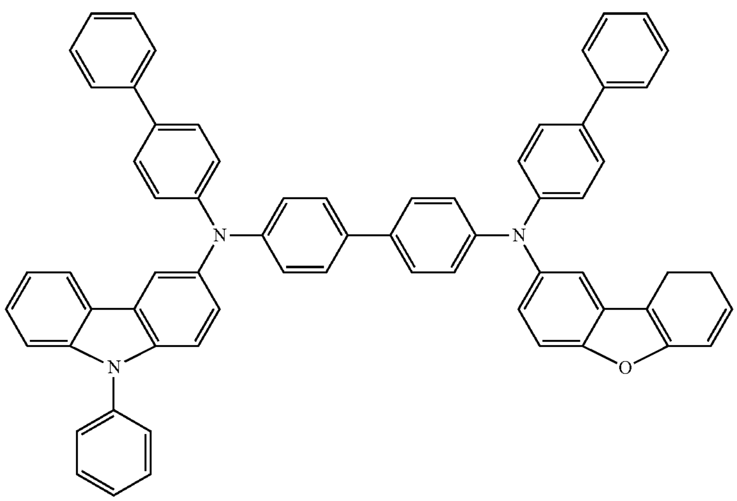
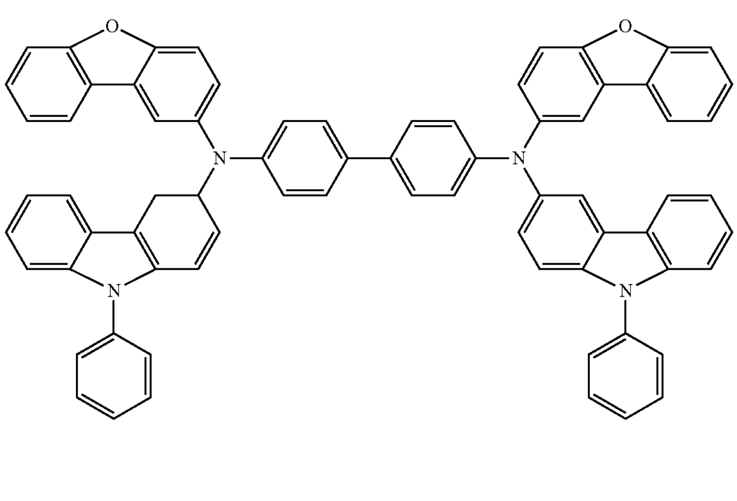

-continued
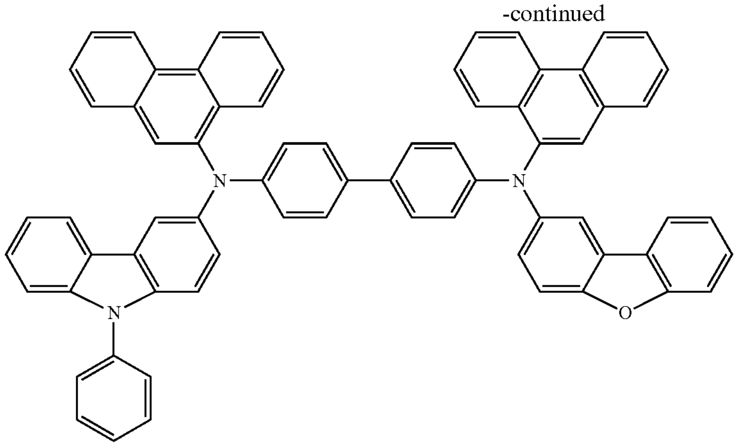
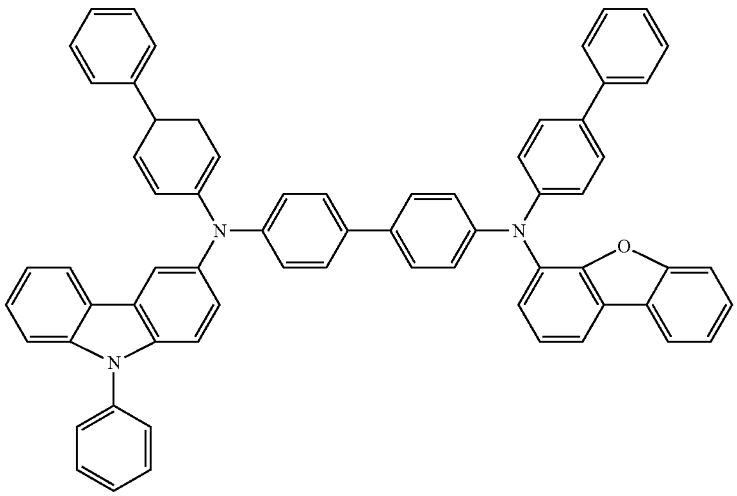
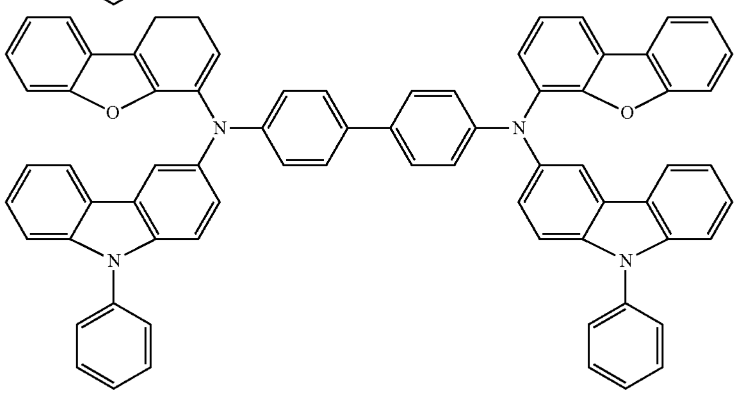
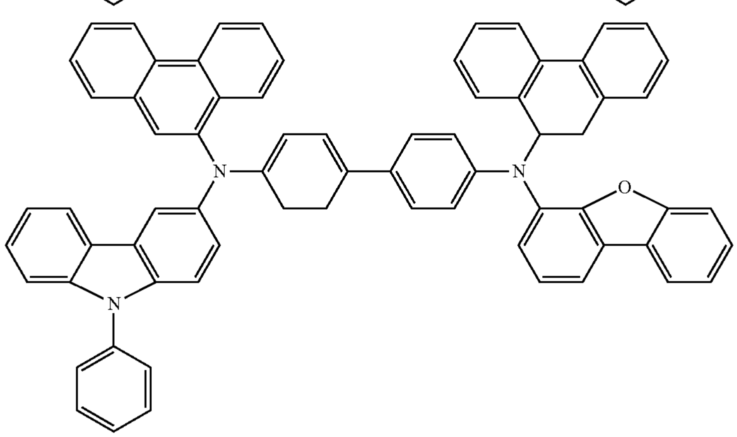

-continued
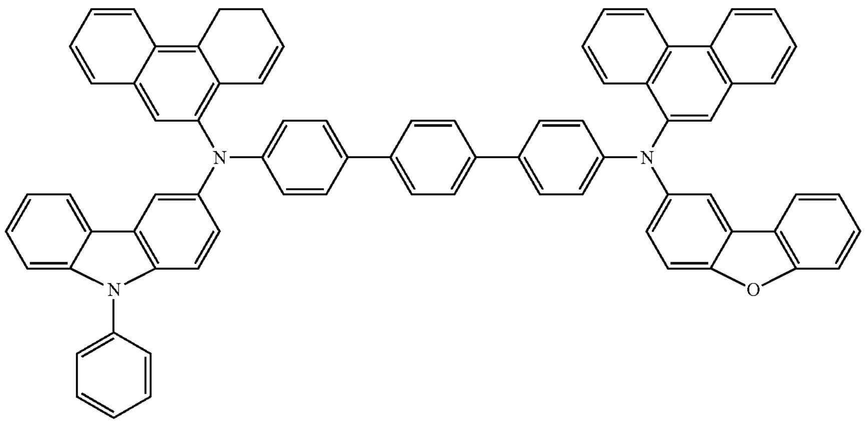
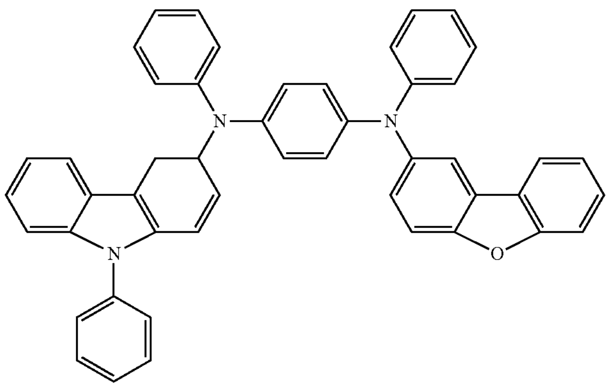
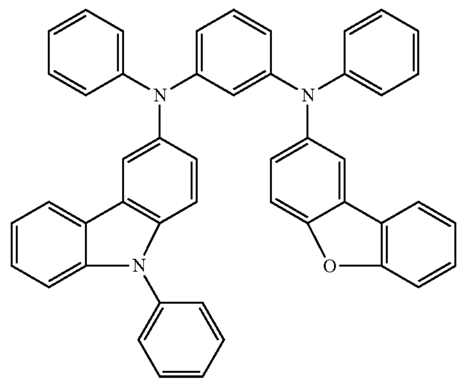
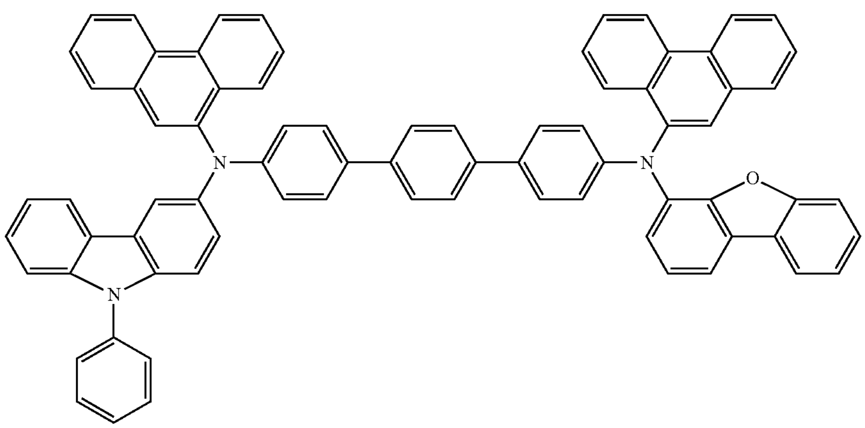
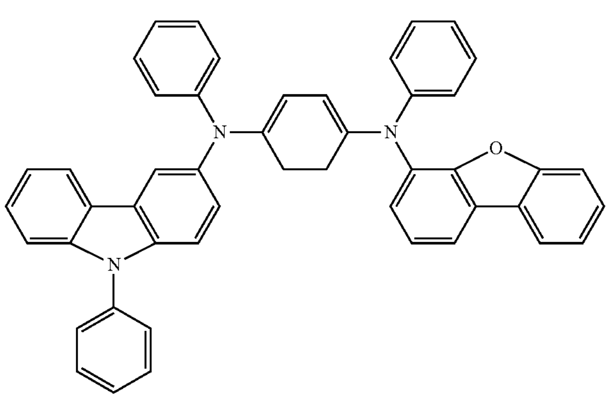
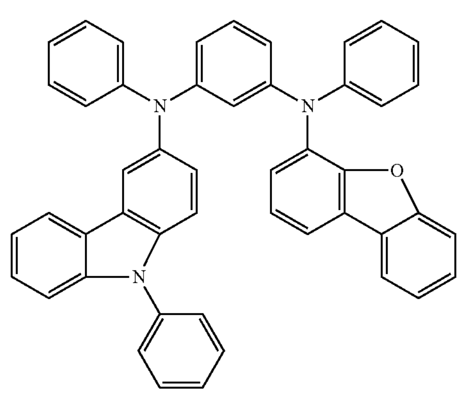

-continued
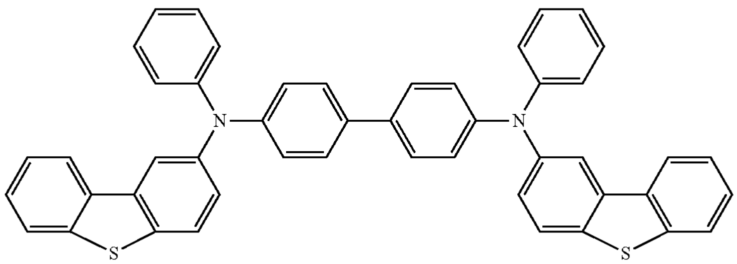
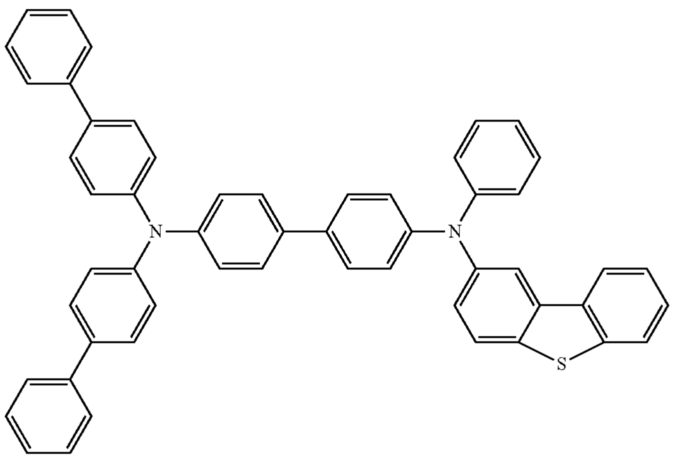
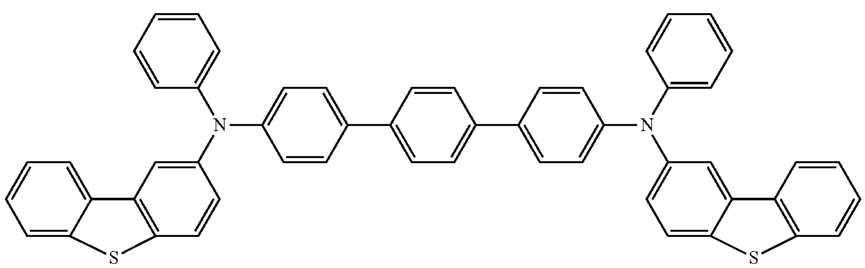
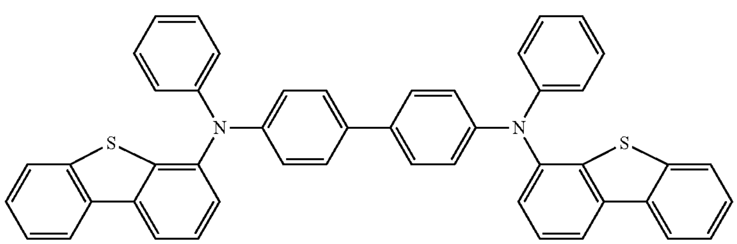
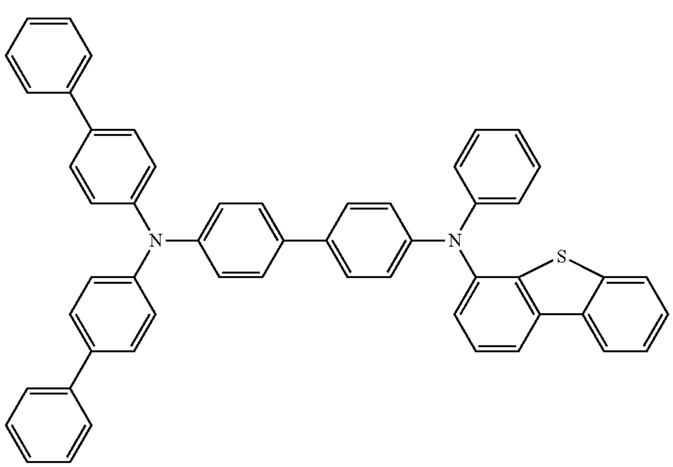

-continued
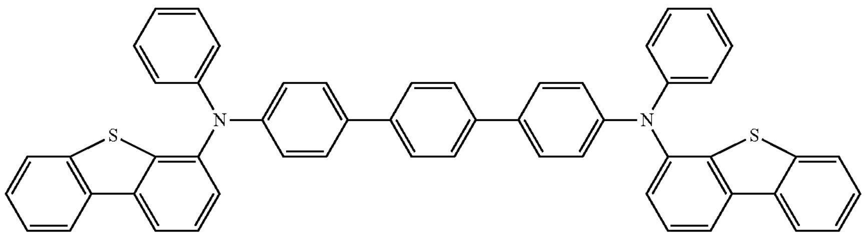
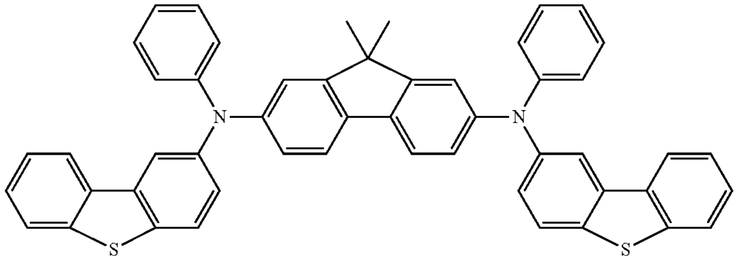
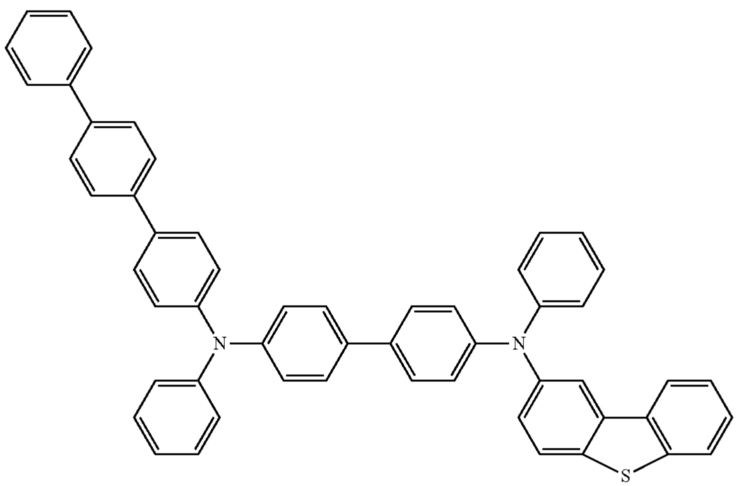
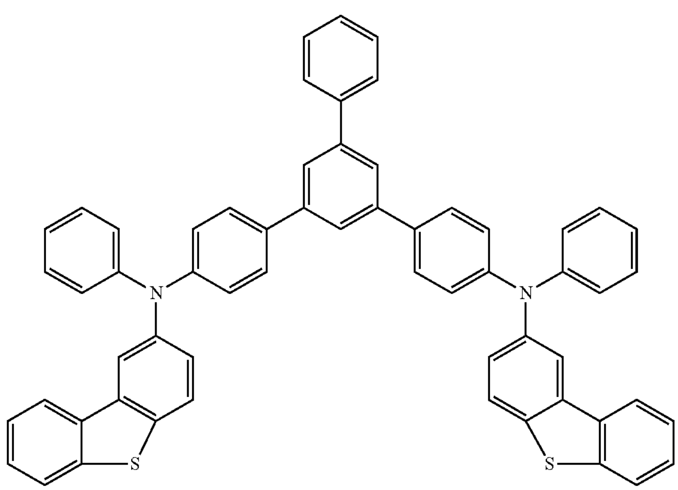
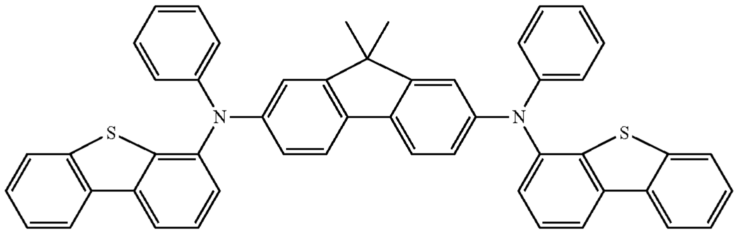

-continued
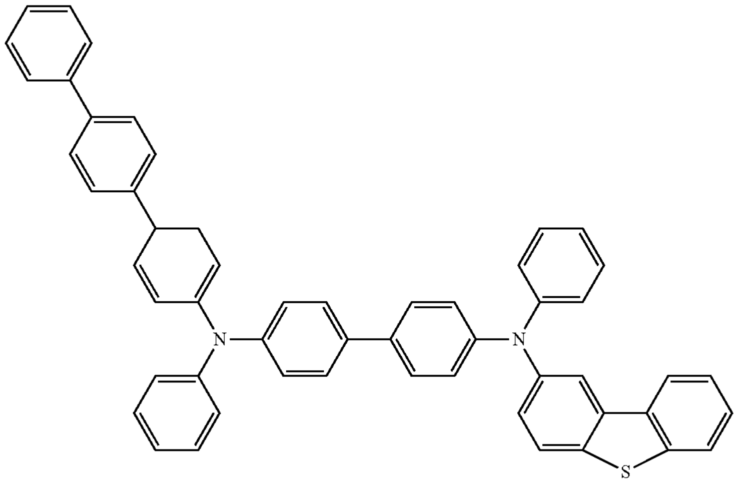
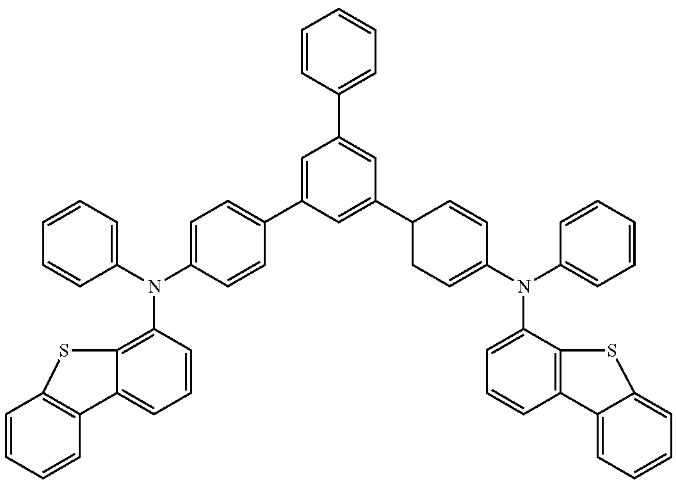
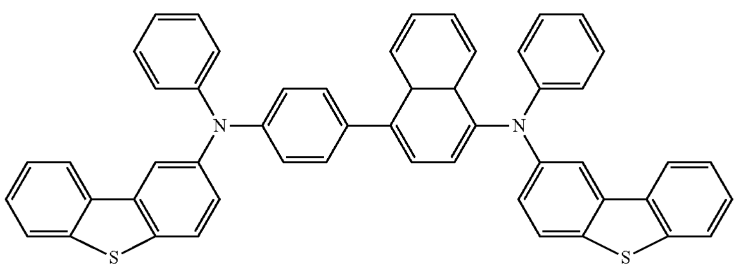
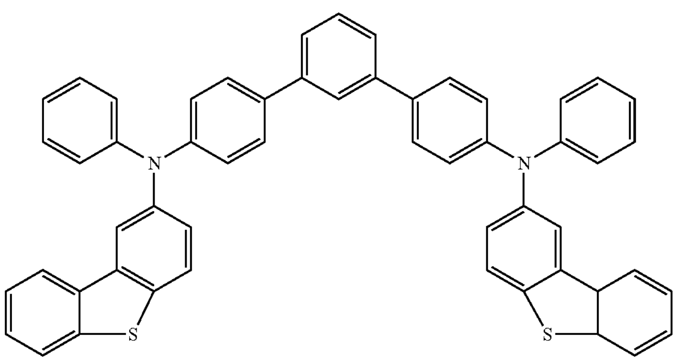

-continued
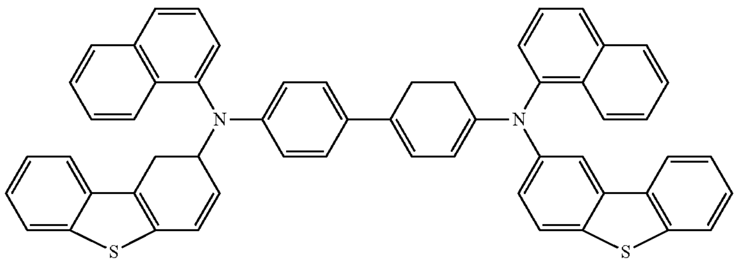
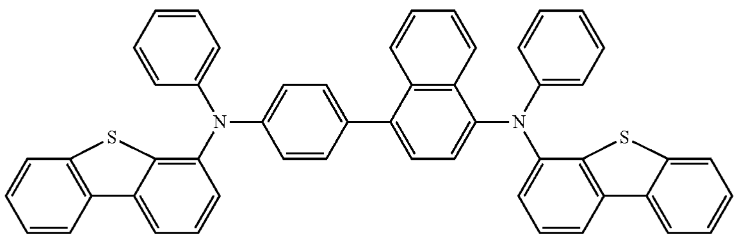
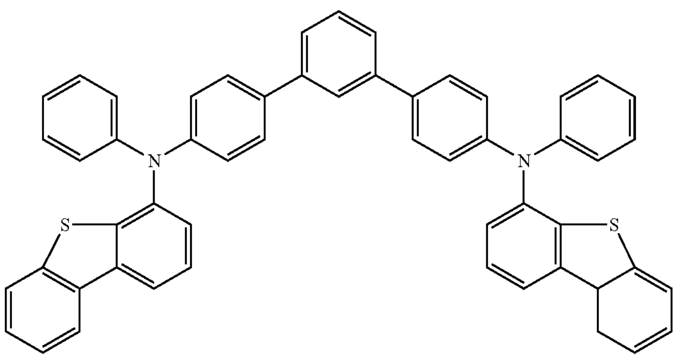
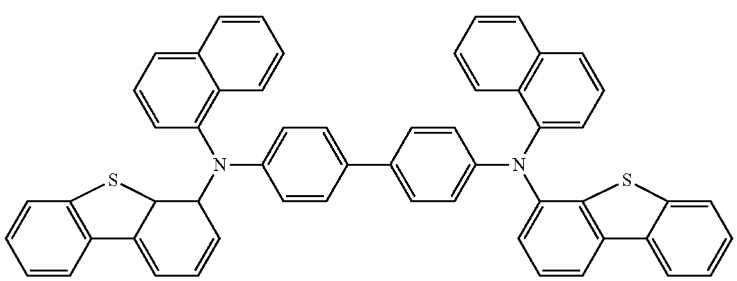
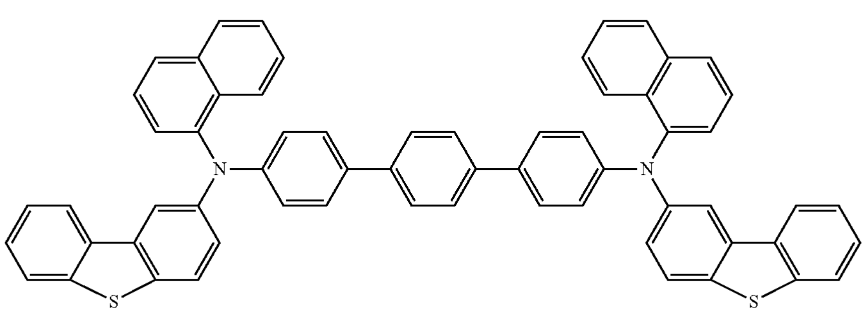

-continued
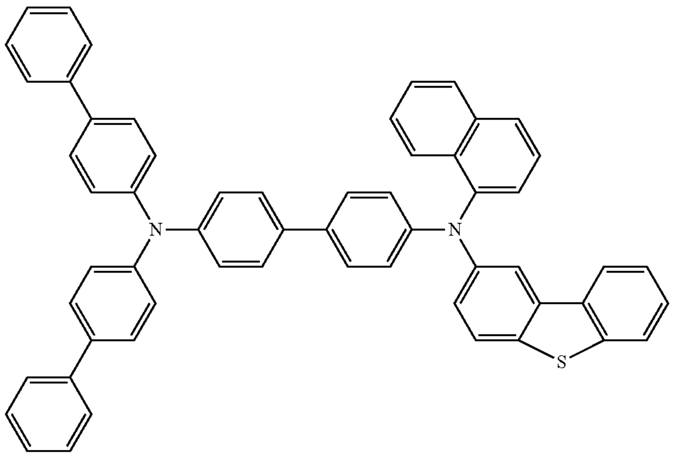
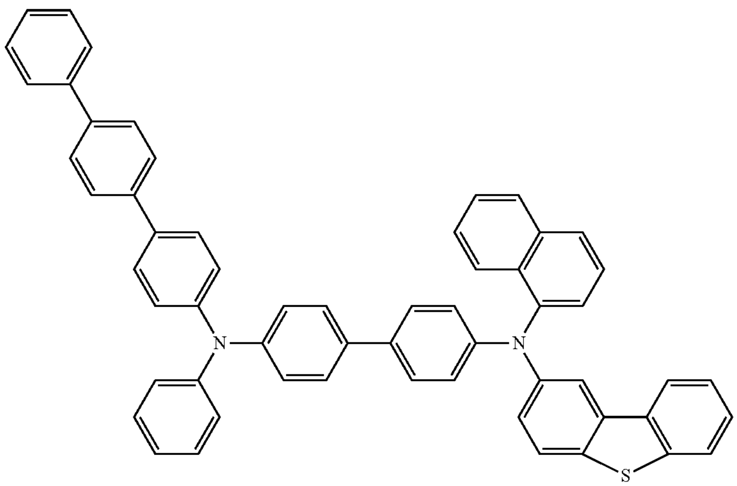
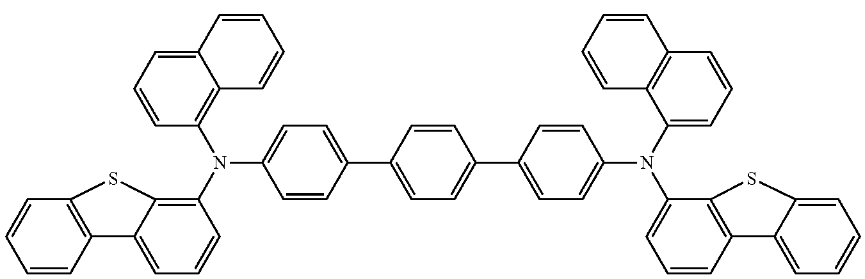
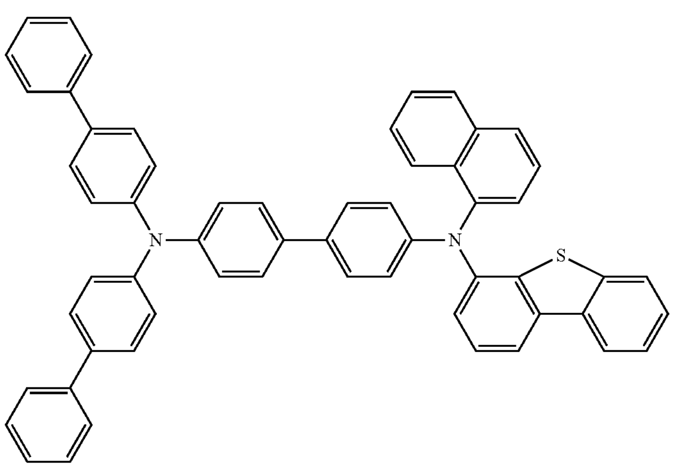

-continued
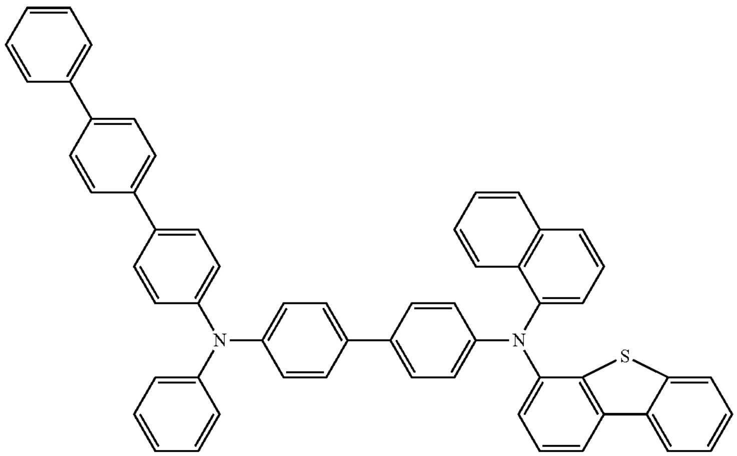
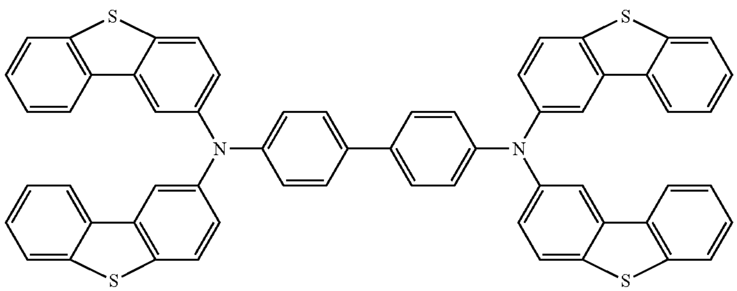
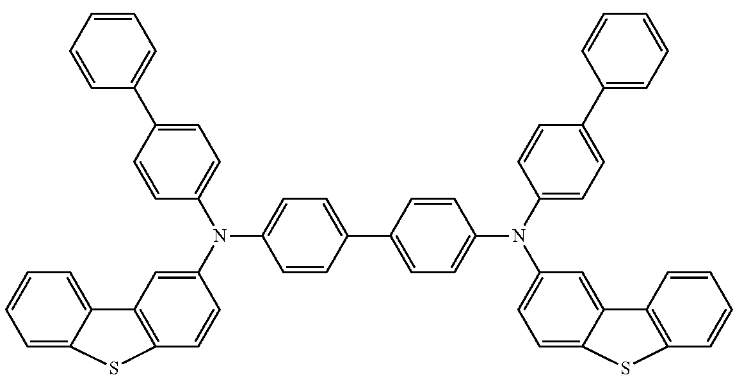
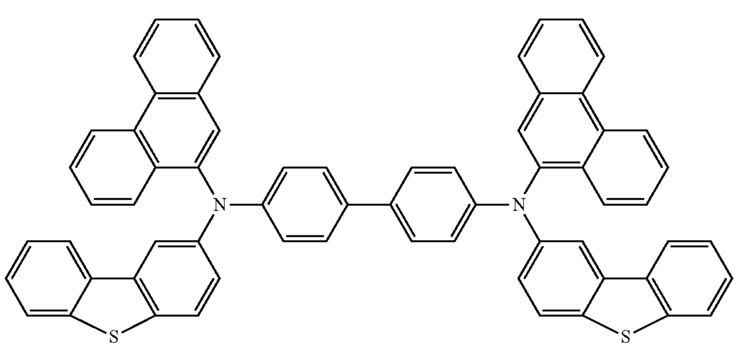
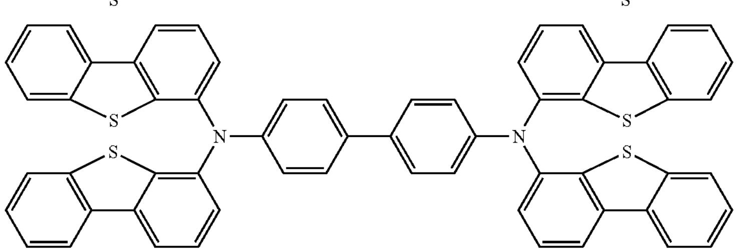

-continued
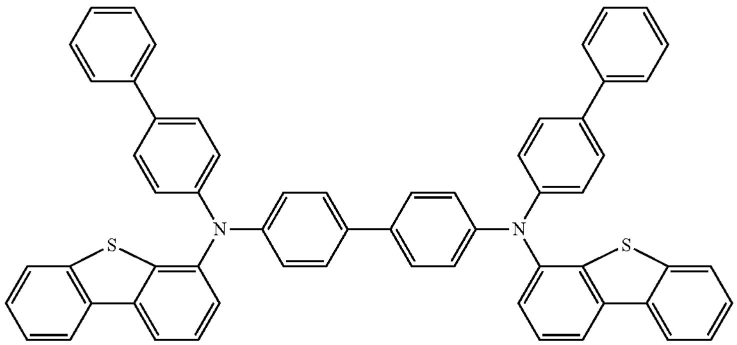
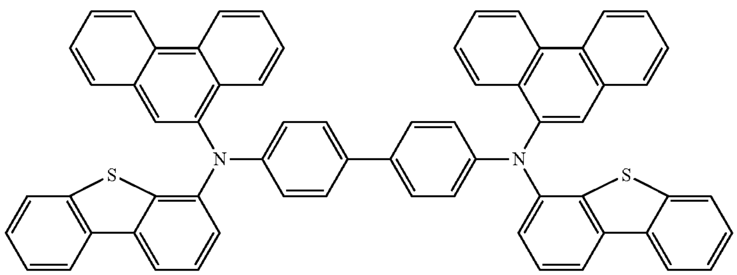
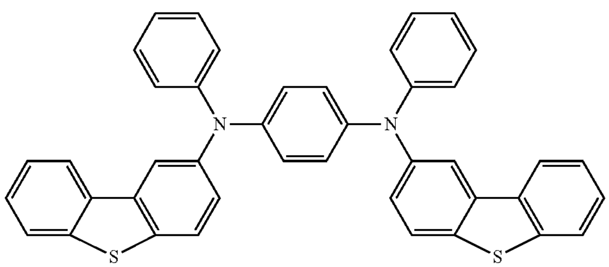
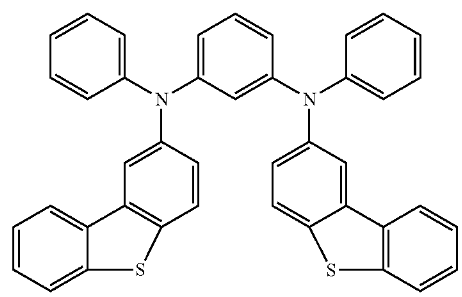
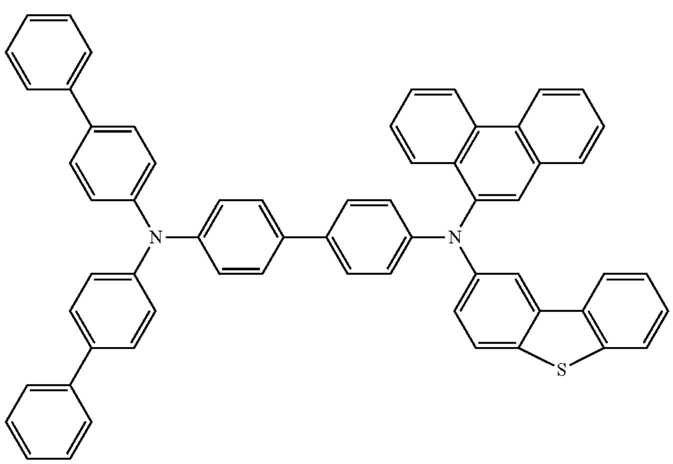
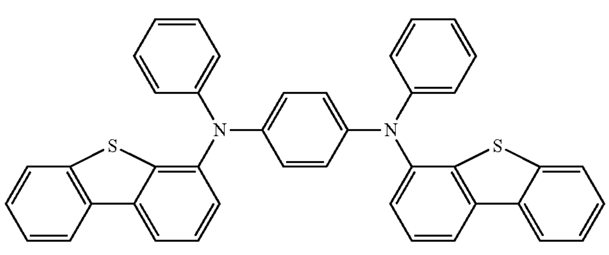
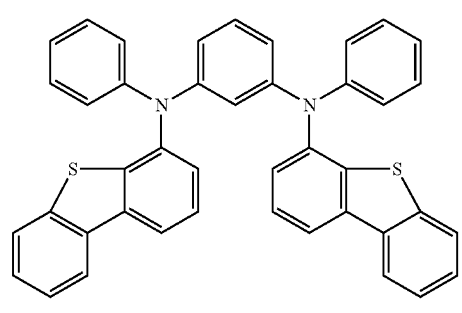

-continued
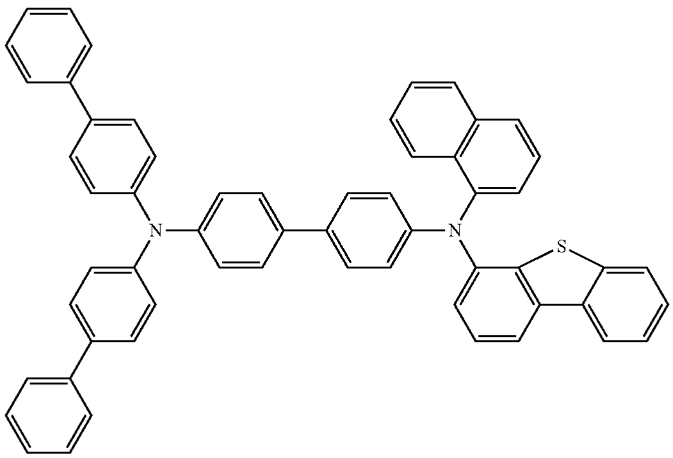
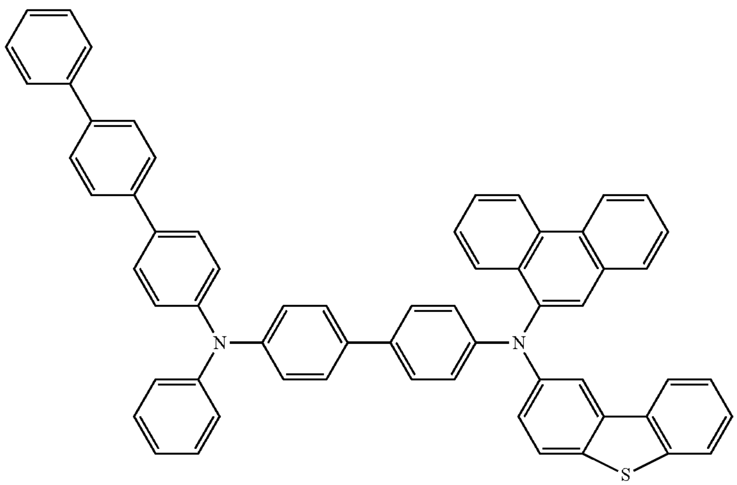
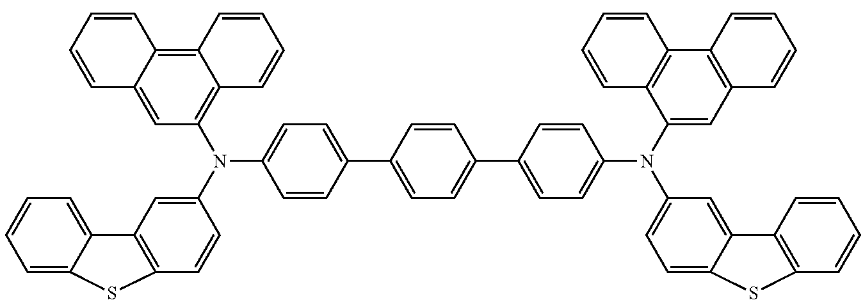
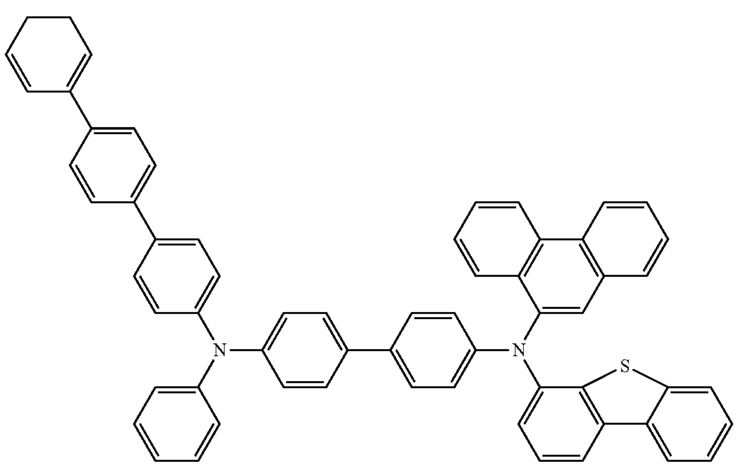

-continued
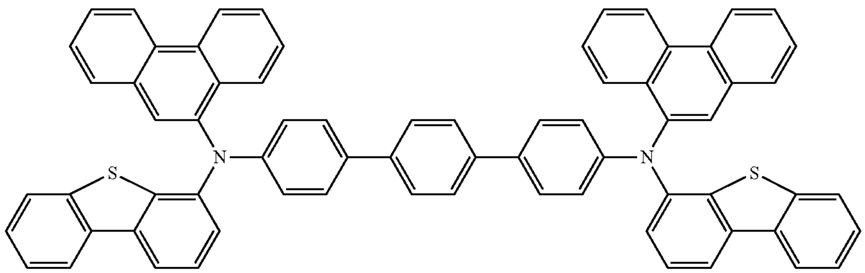
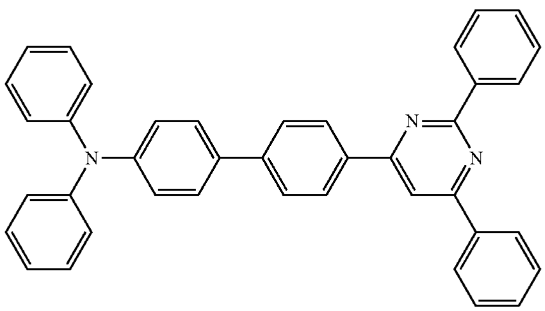
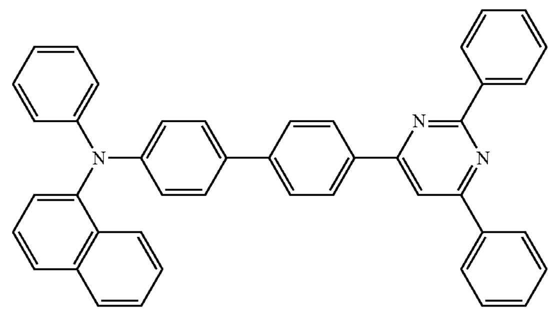
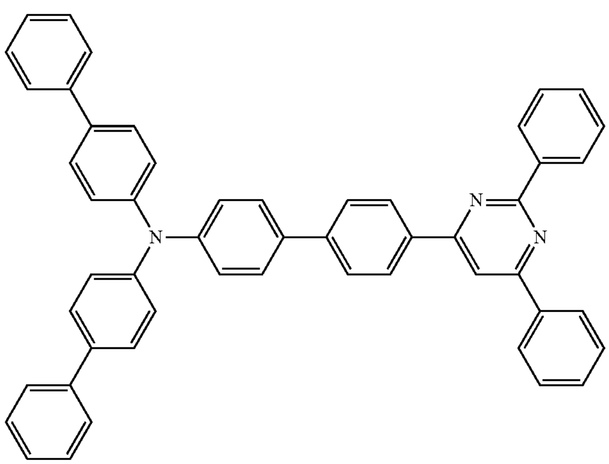
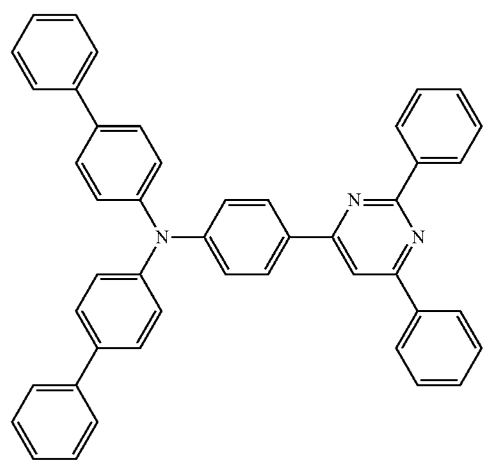
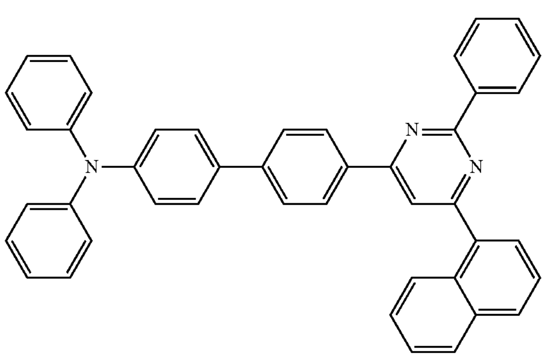

-continued
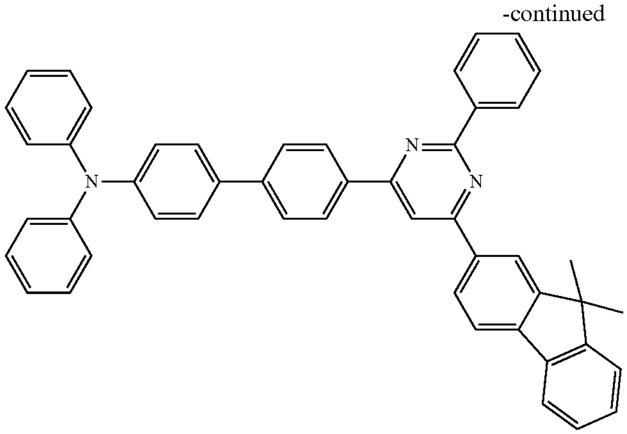
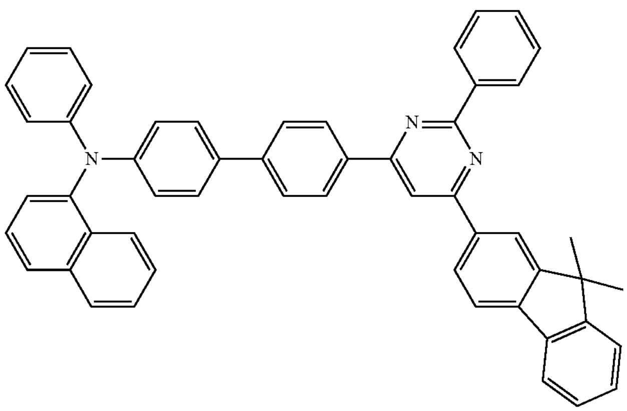
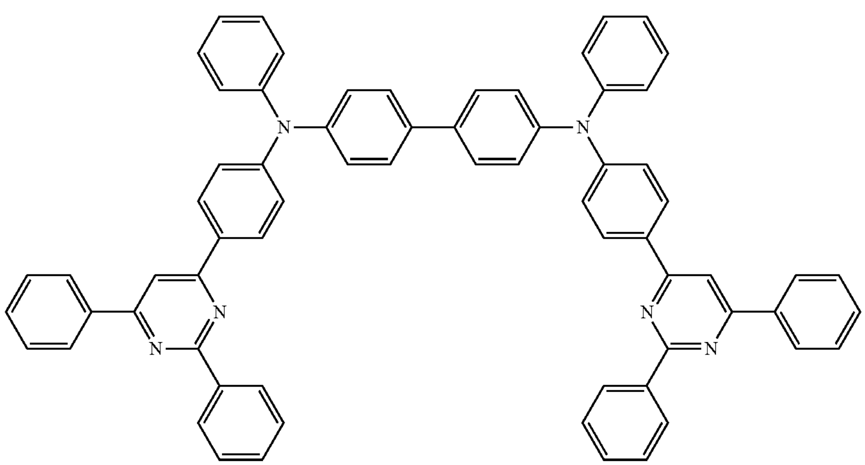

-continued
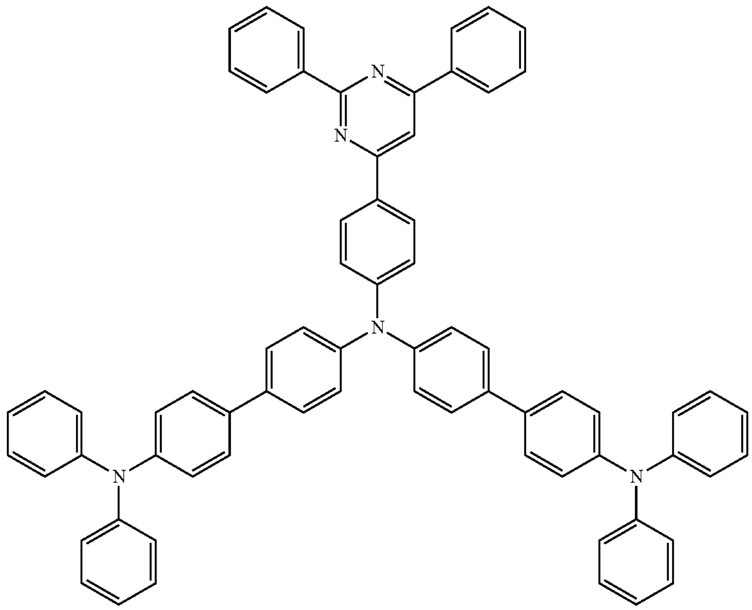
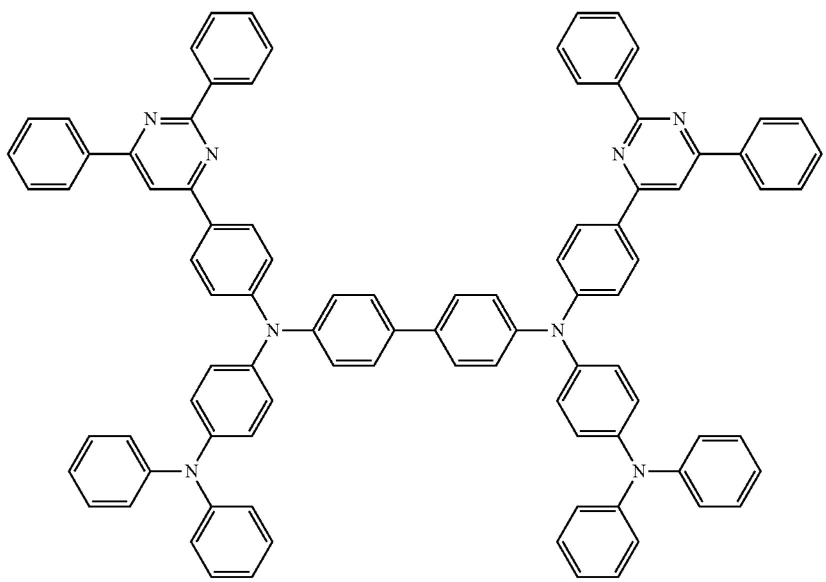
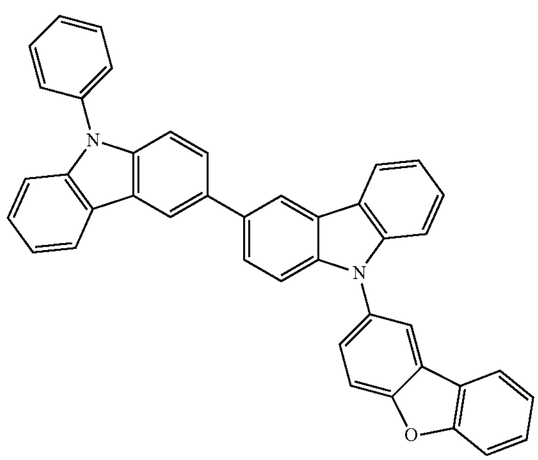
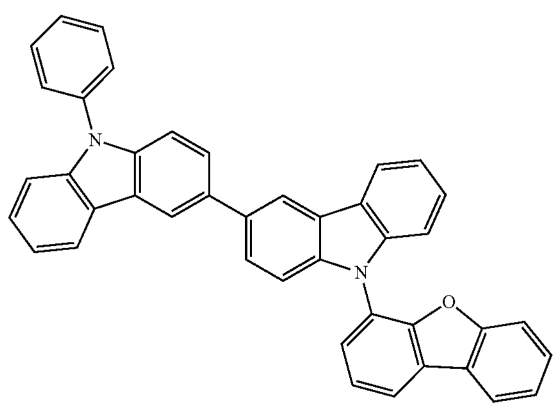

-continued
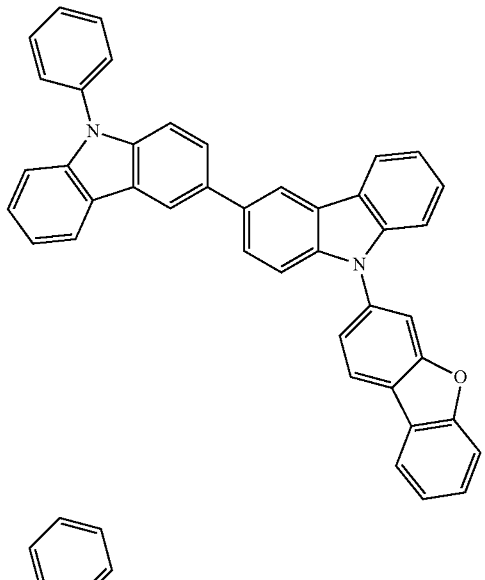
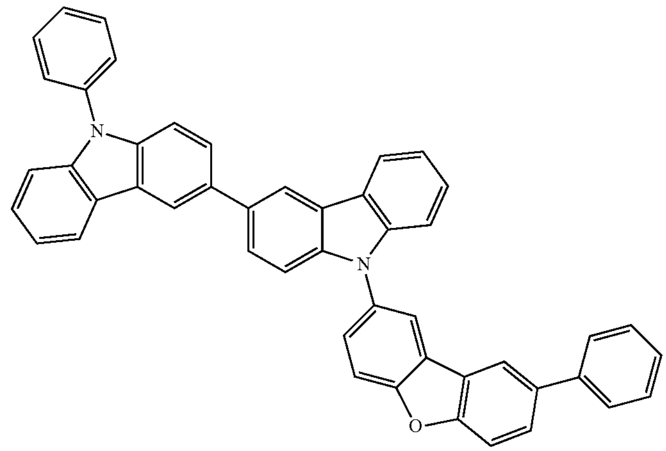
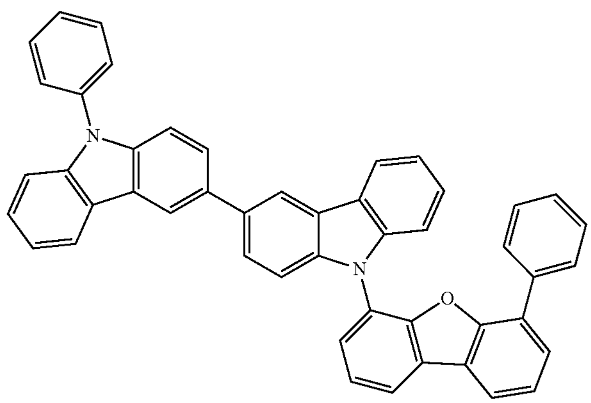
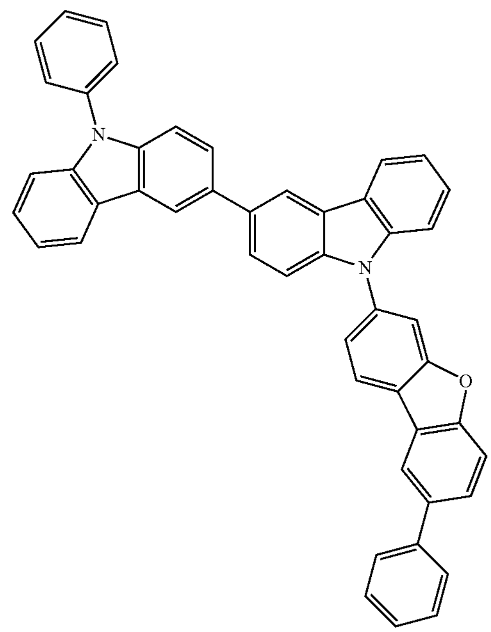
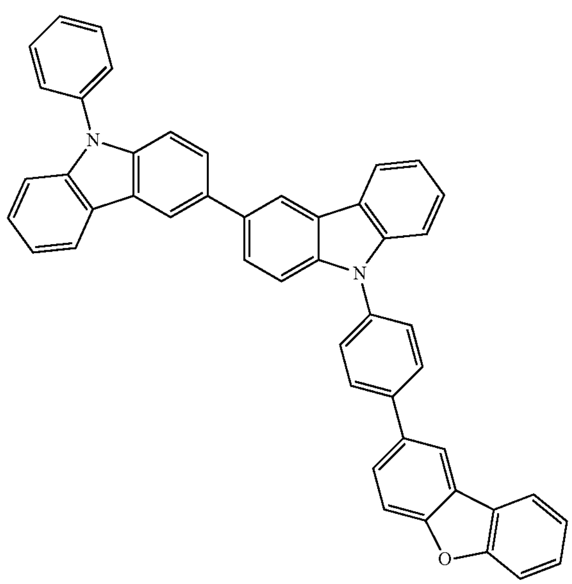

-continued
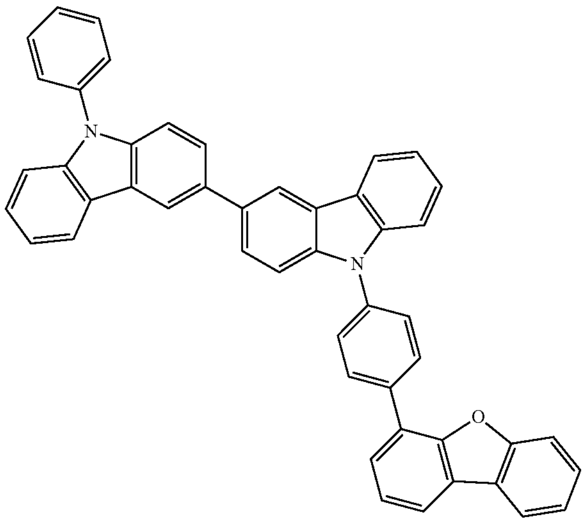
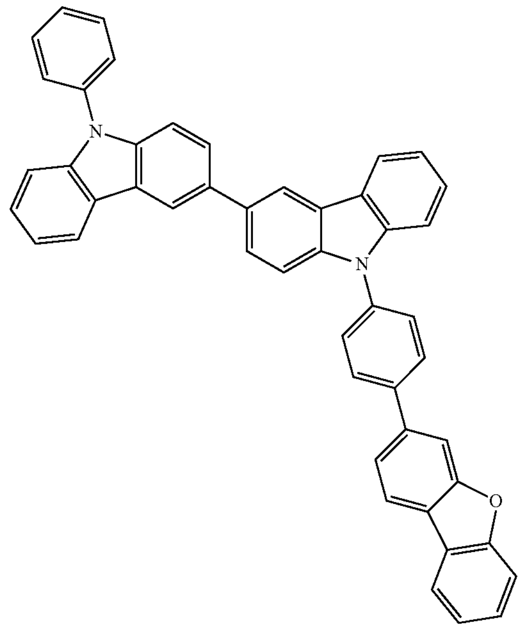
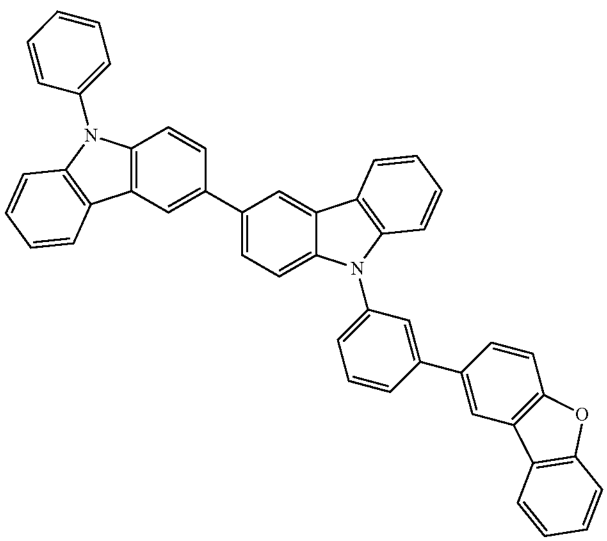
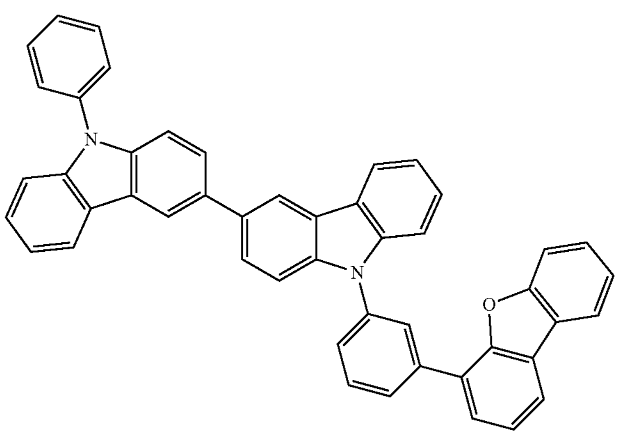

-continued
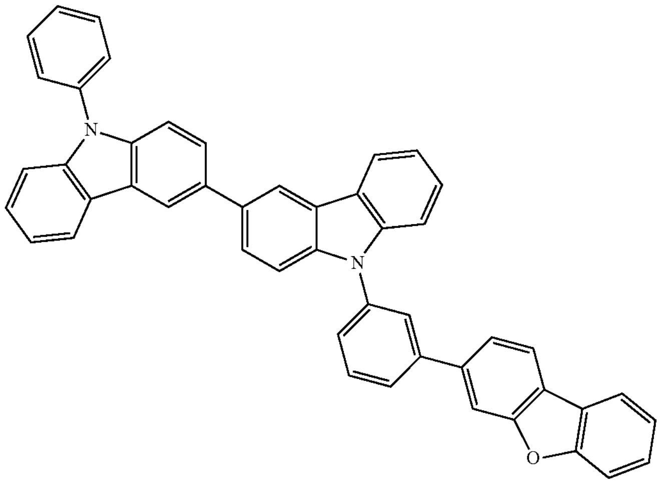
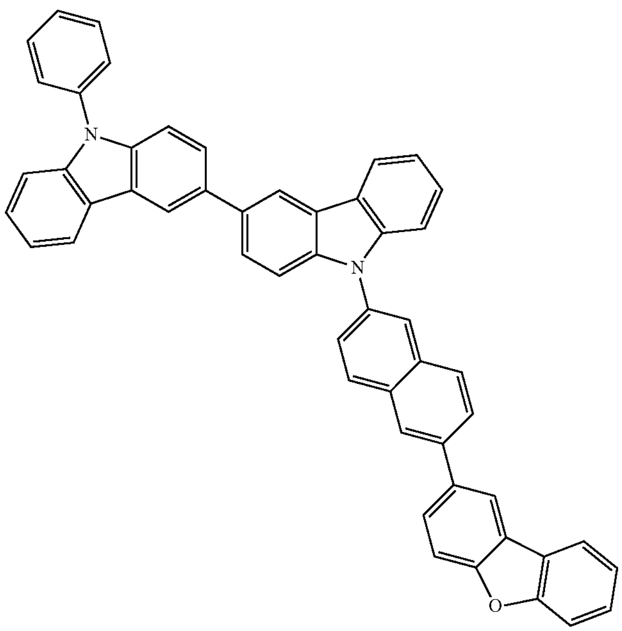
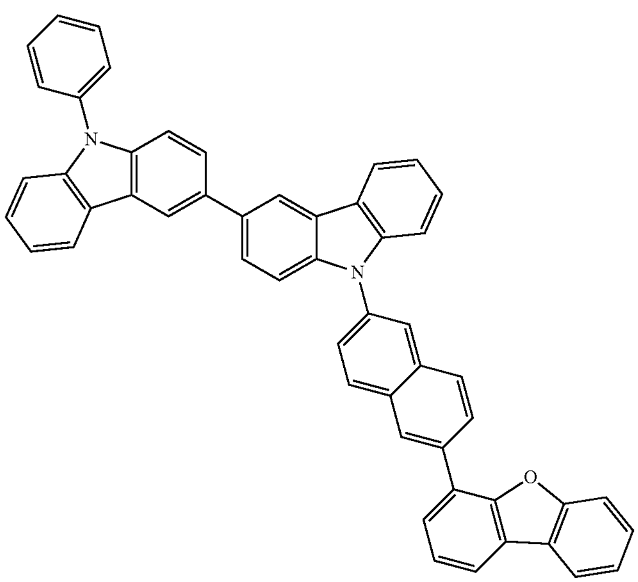

-continued
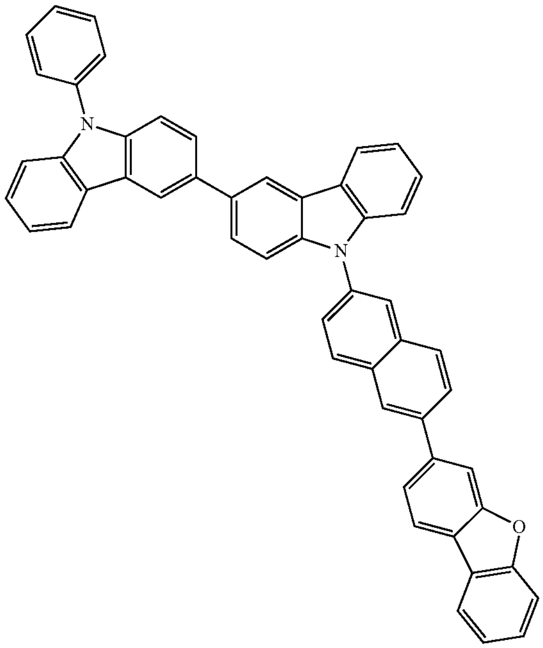
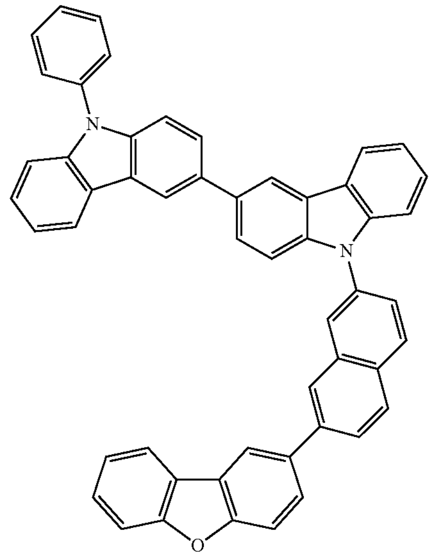
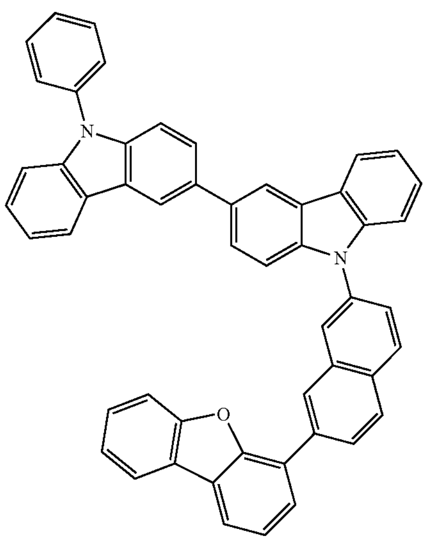
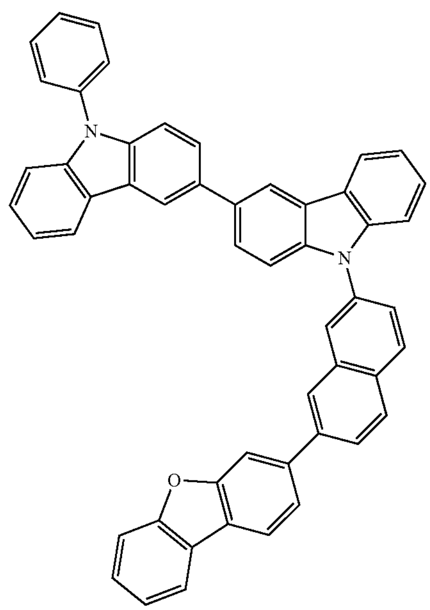
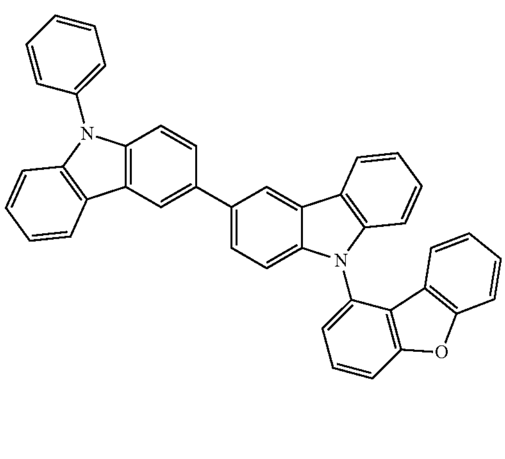
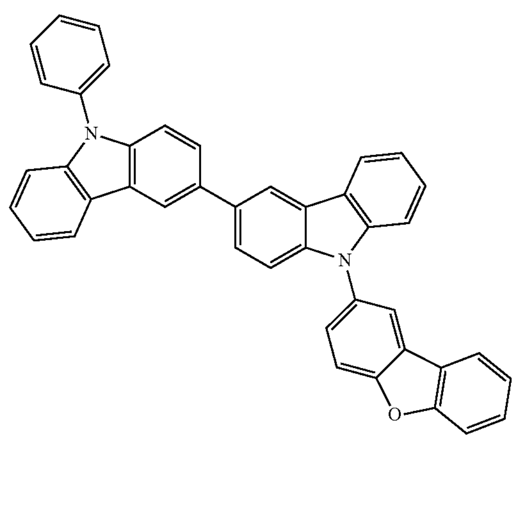

-continued
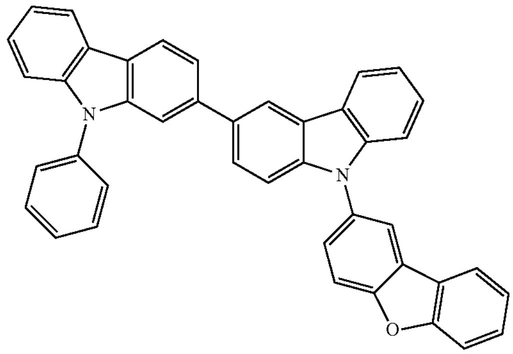
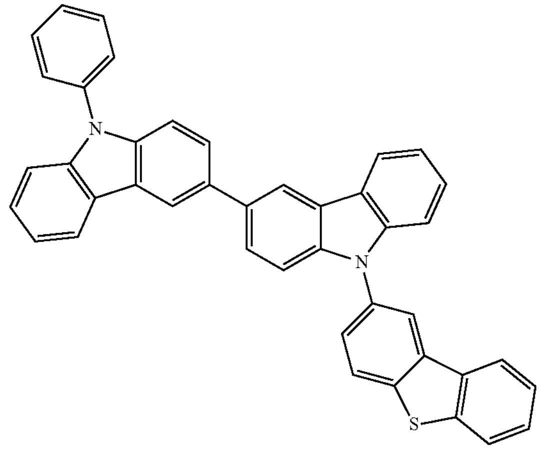
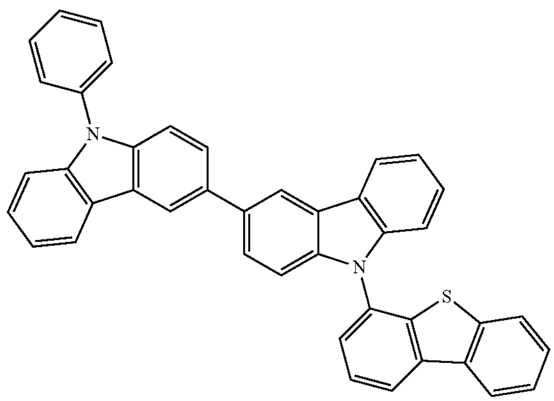
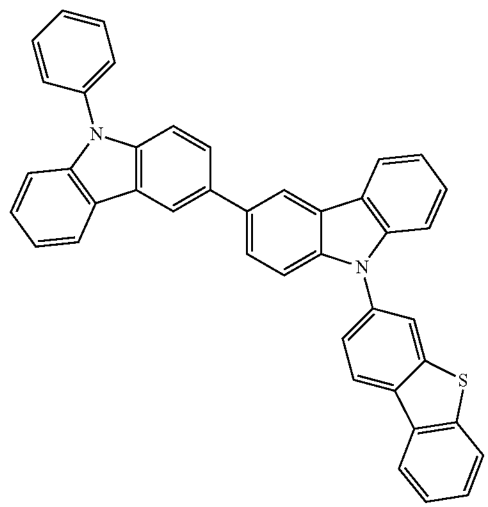
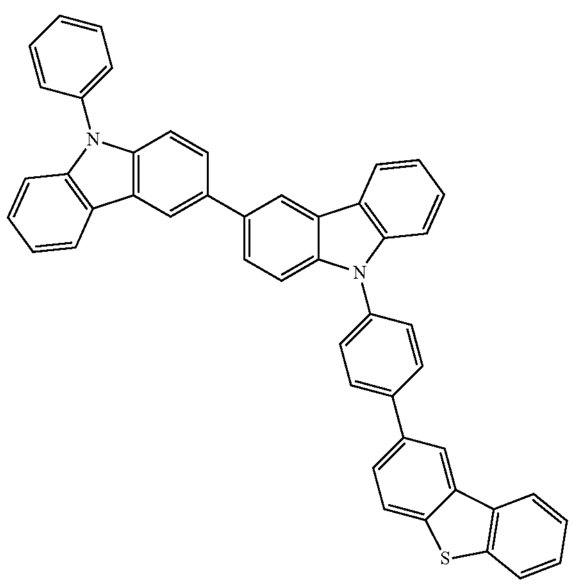

-continued
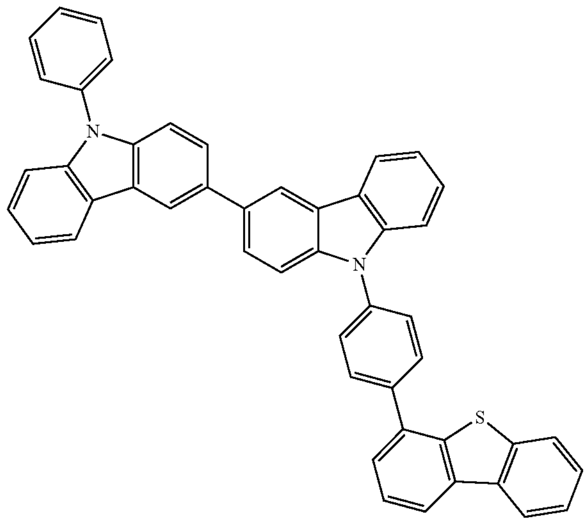
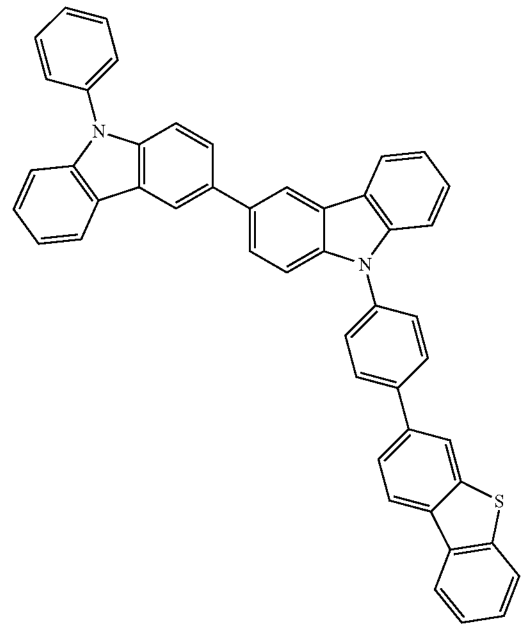
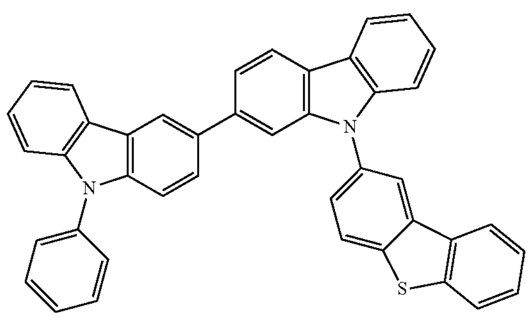
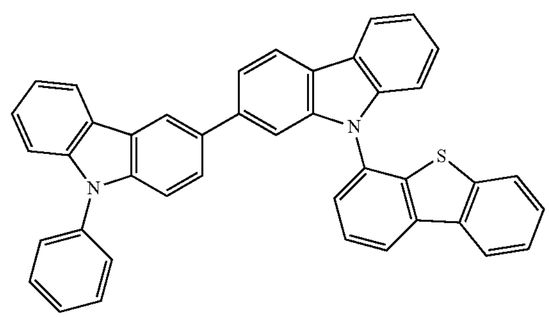
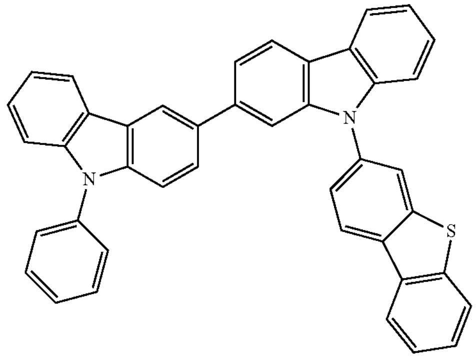
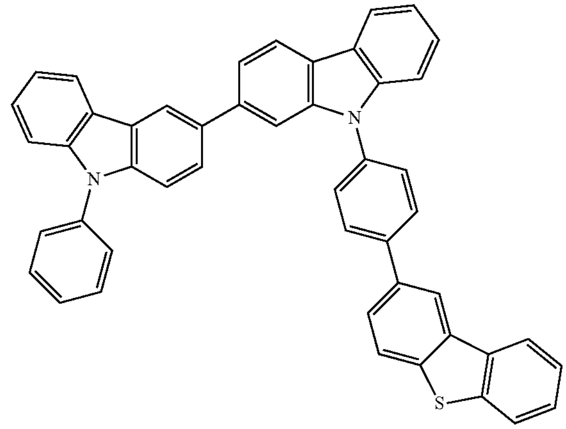

-continued
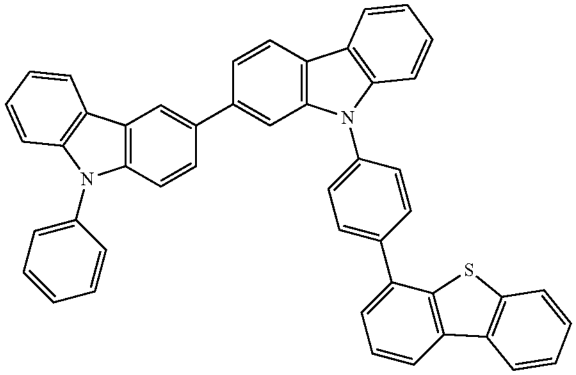
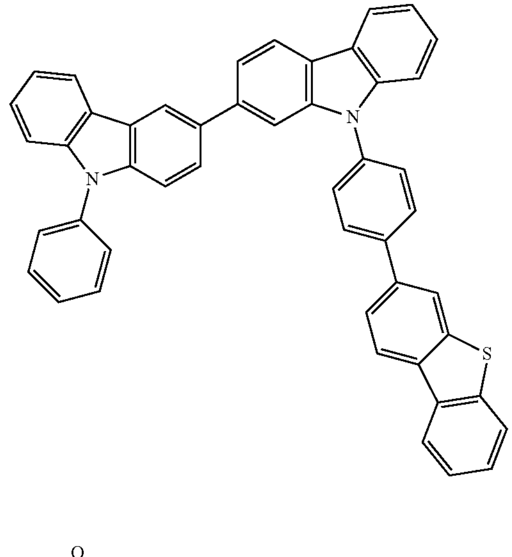
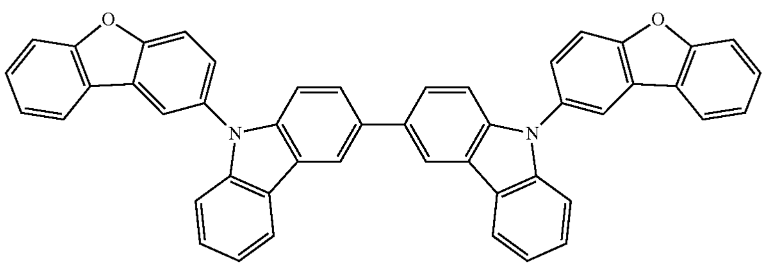
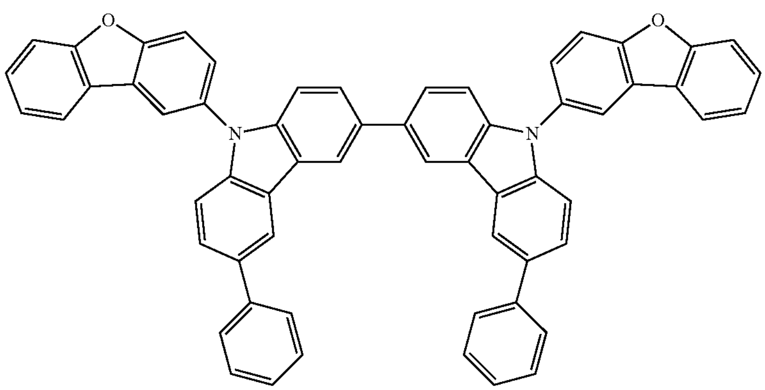
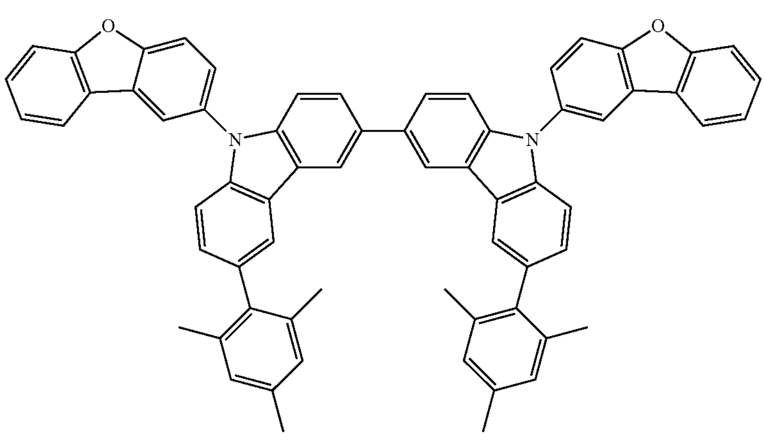

-continued
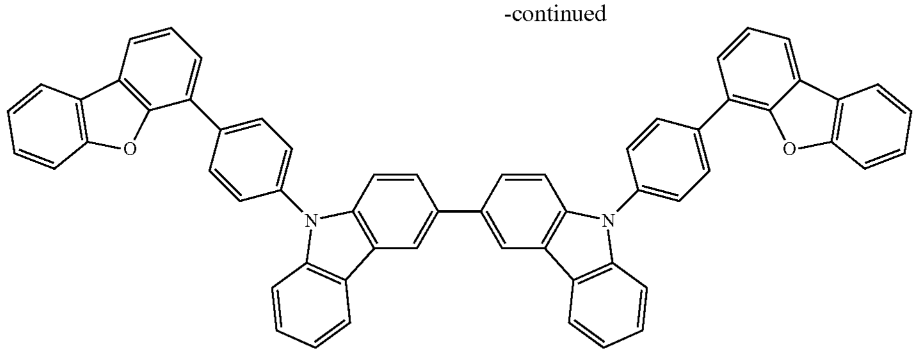
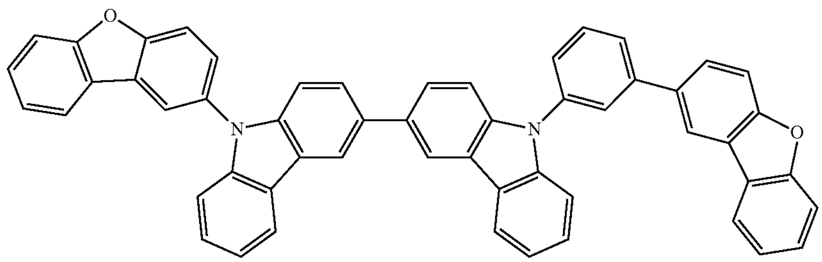
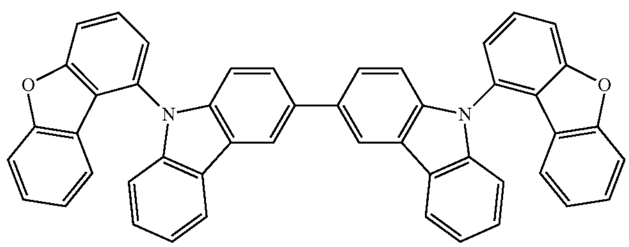
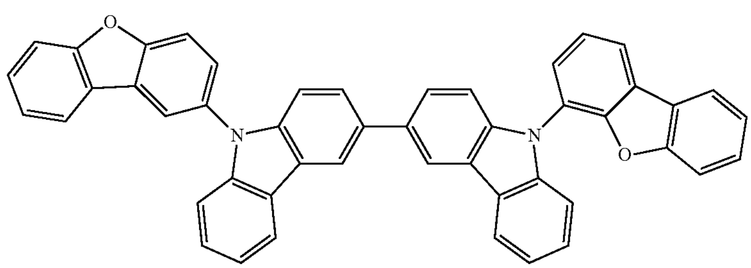
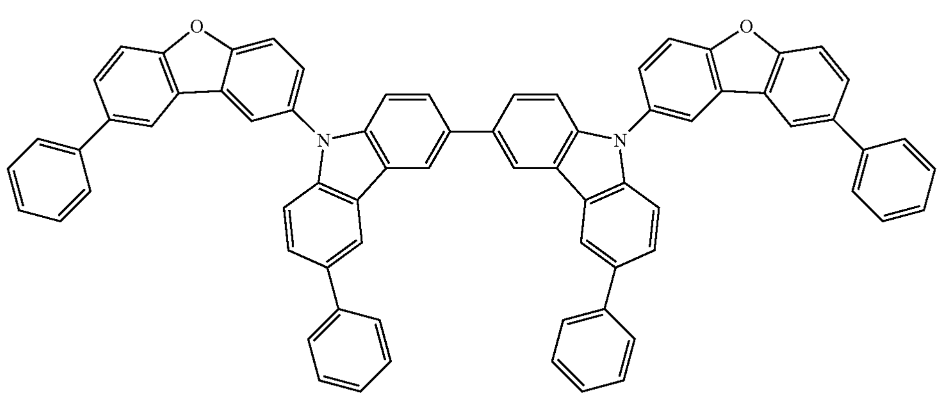

-continued
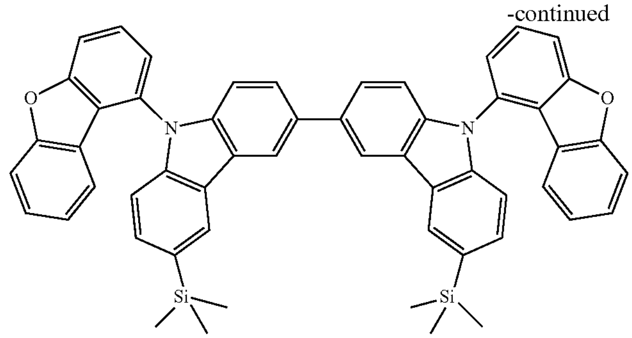
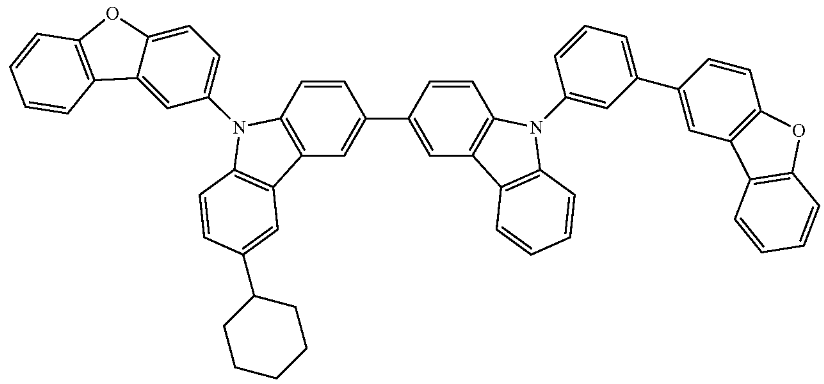
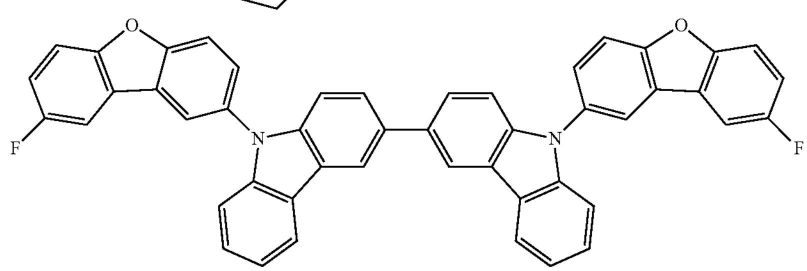
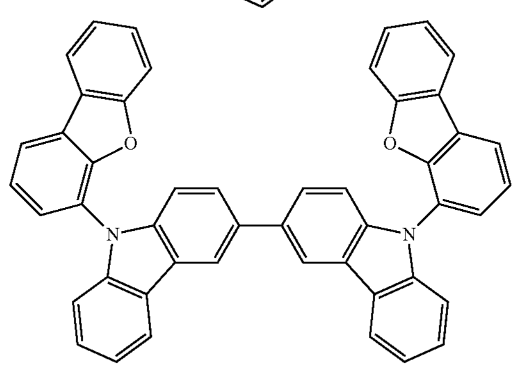
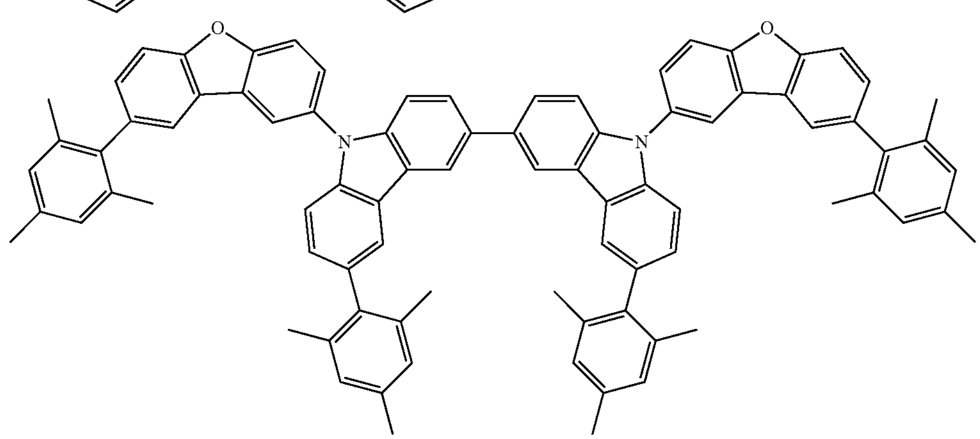

-continued
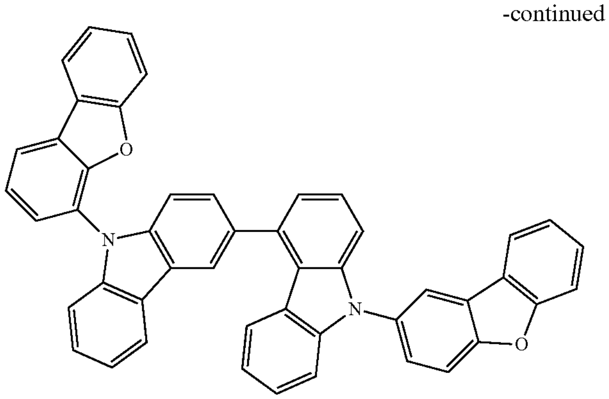
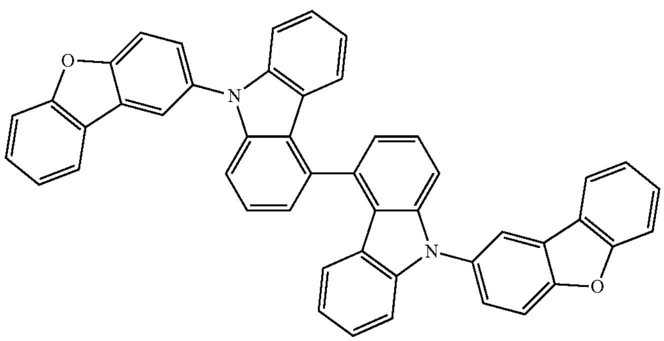
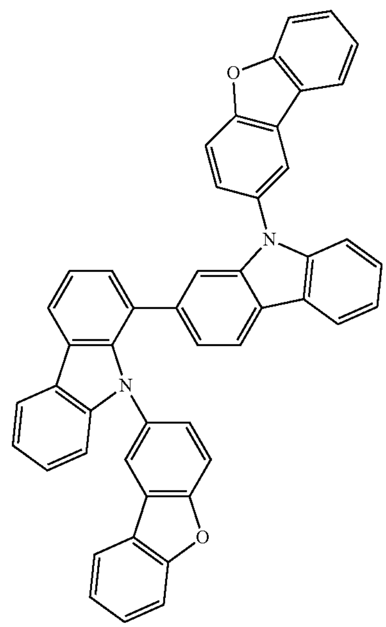
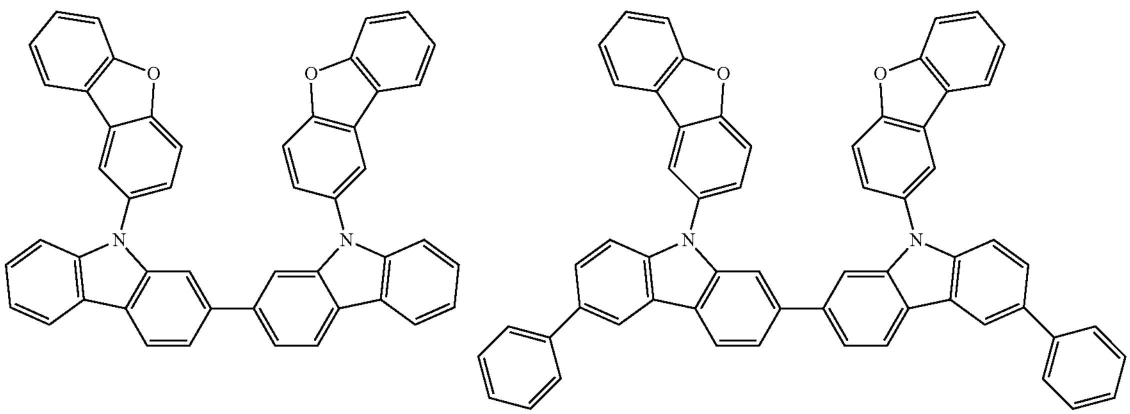

-continued
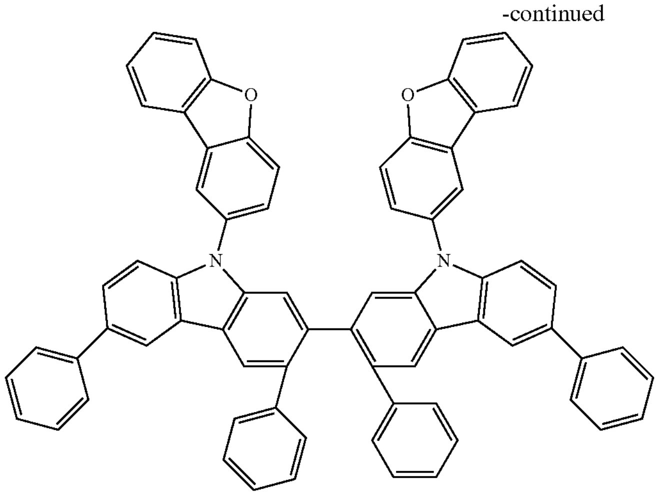
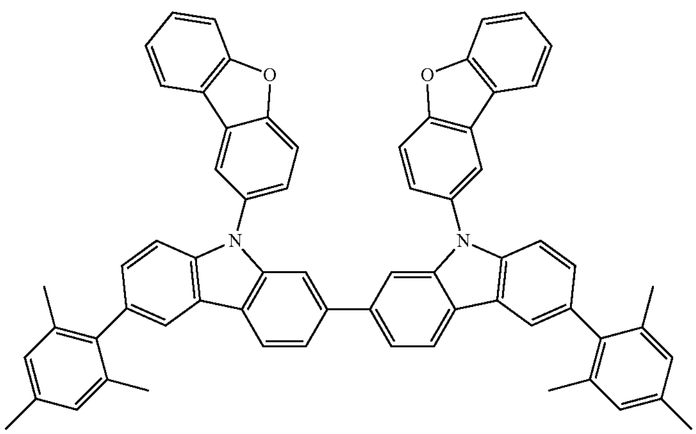
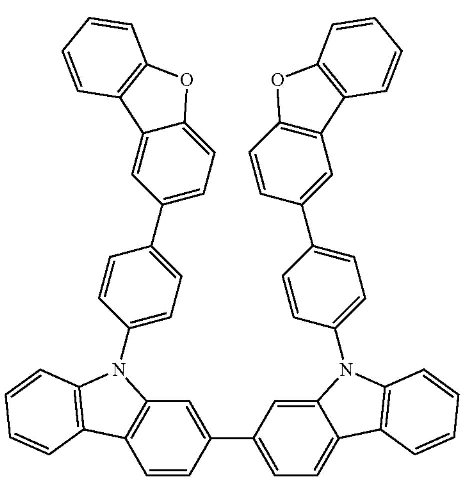
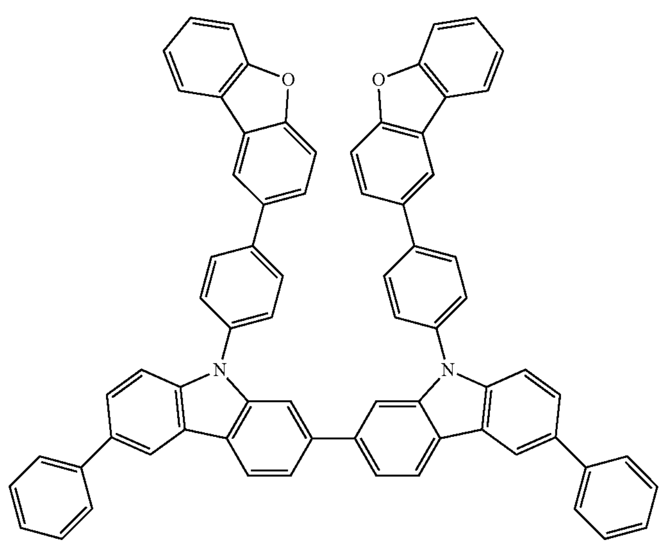

-continued
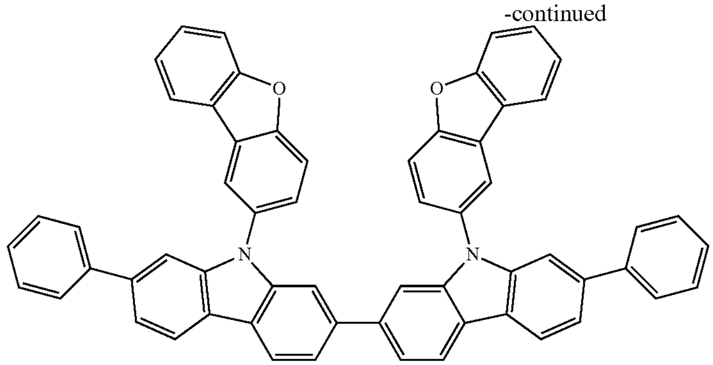
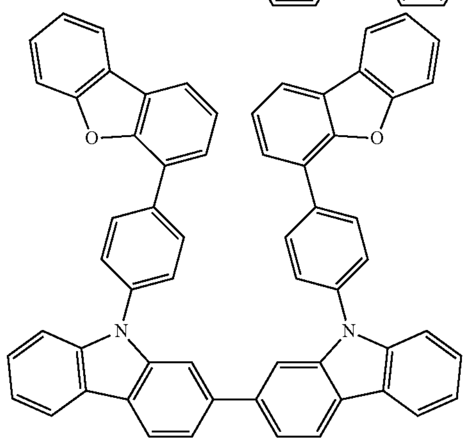
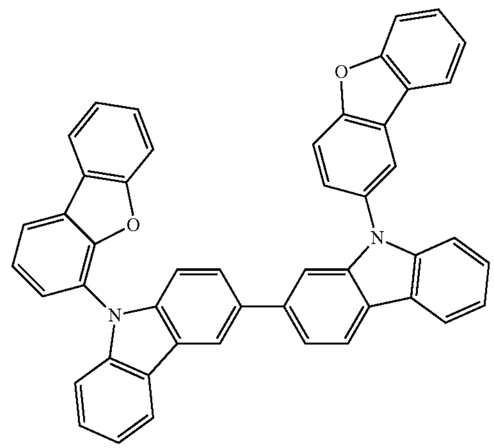
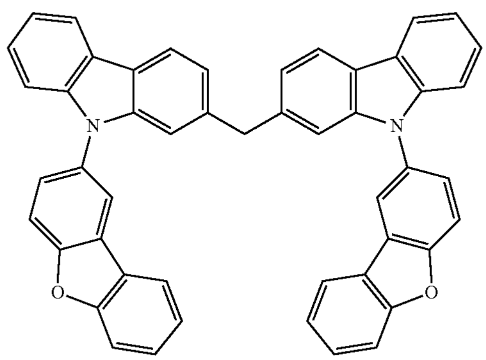
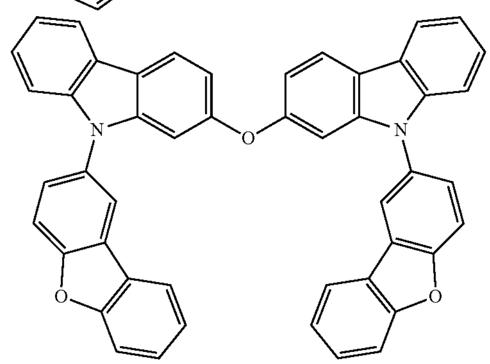
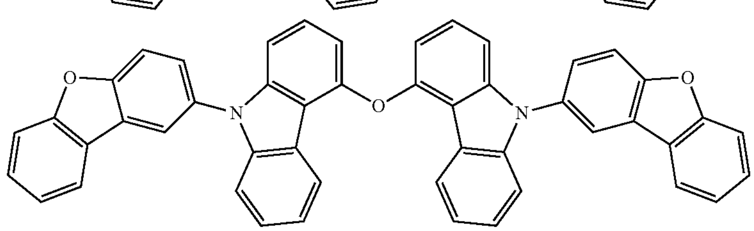
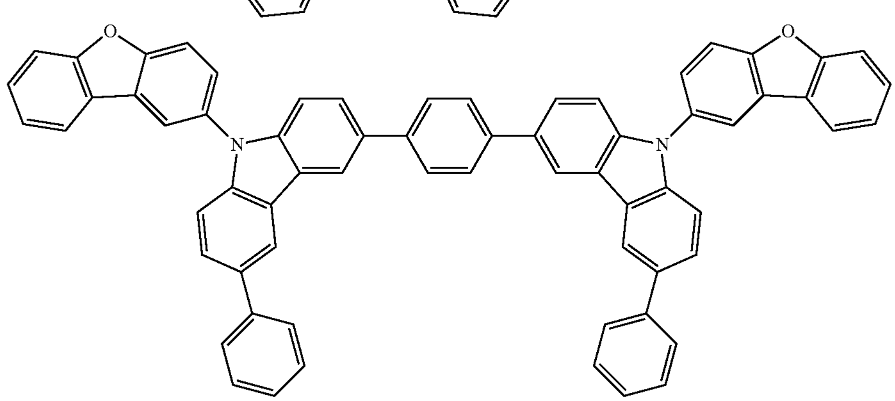

-continued
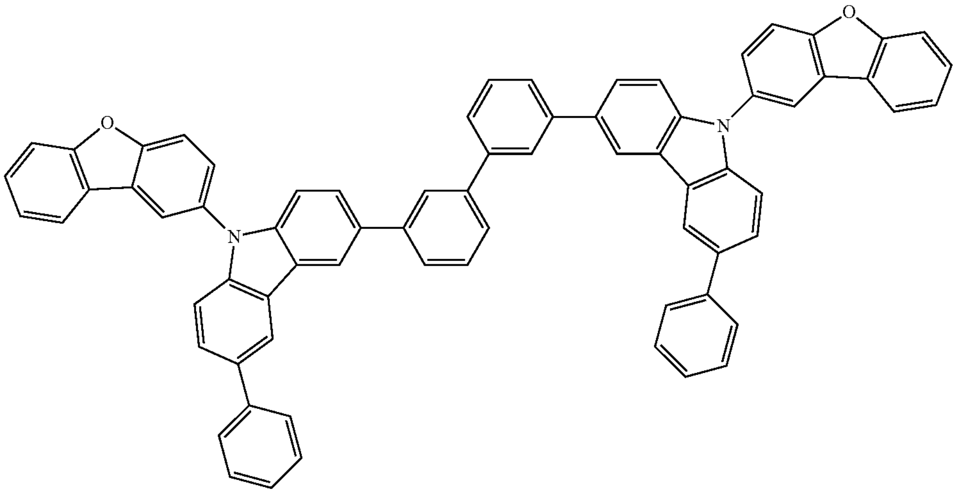
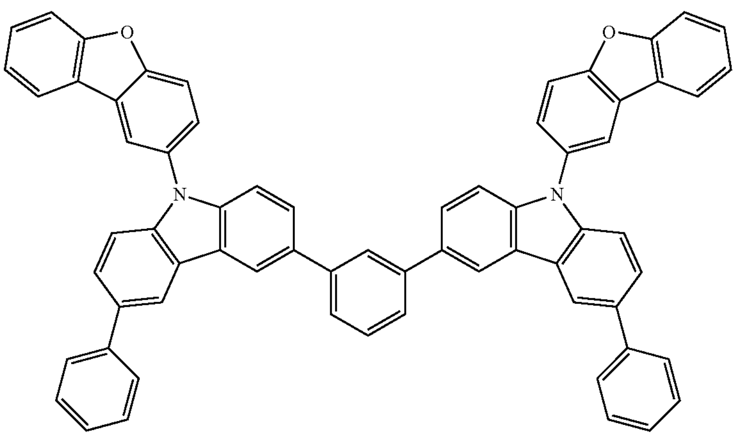
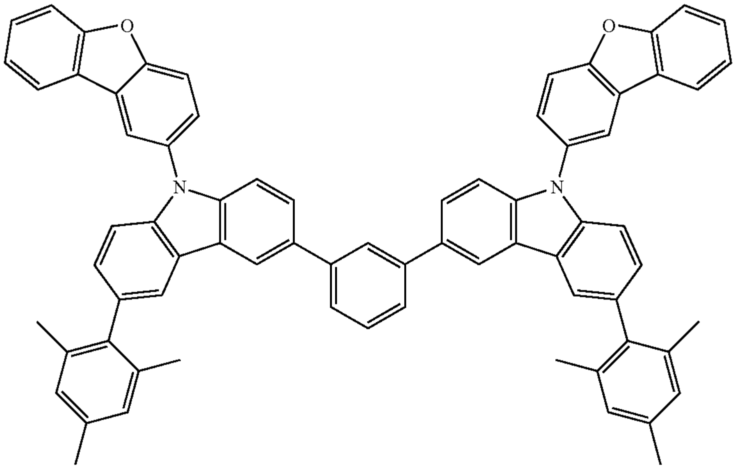

-continued
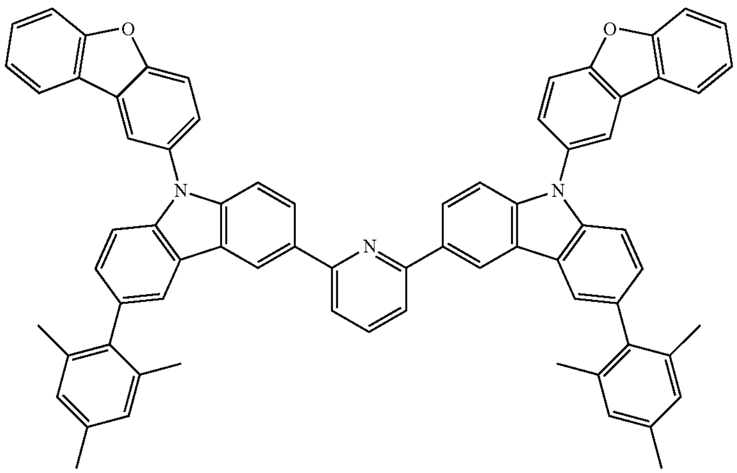
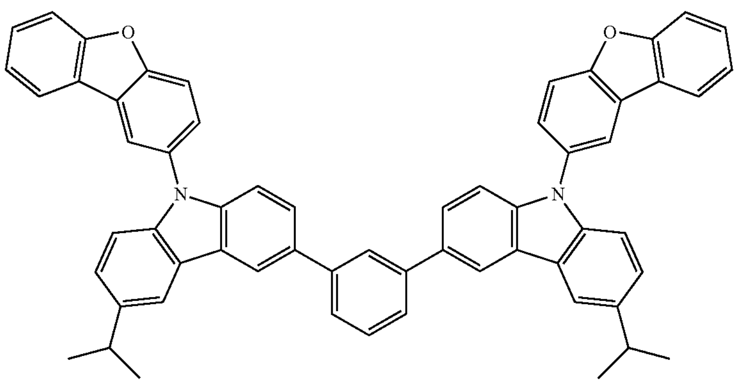
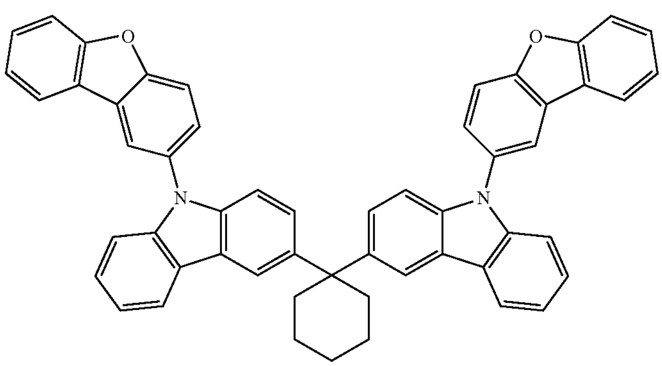
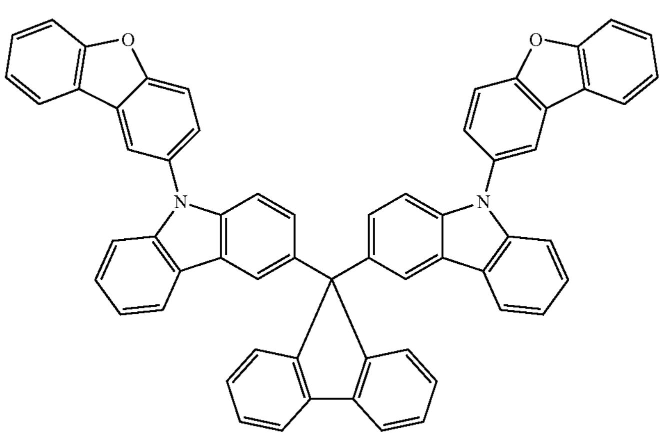

-continued
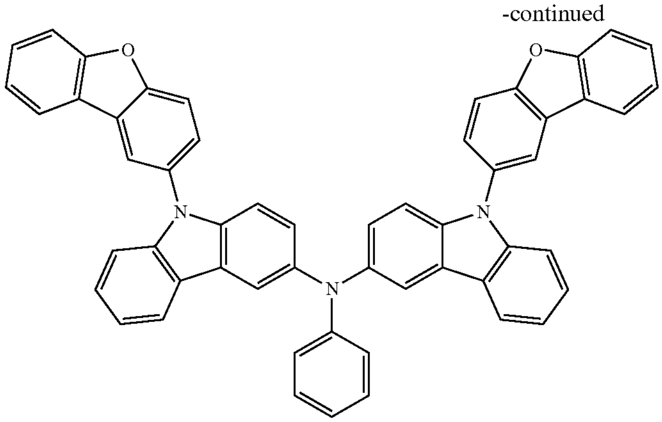
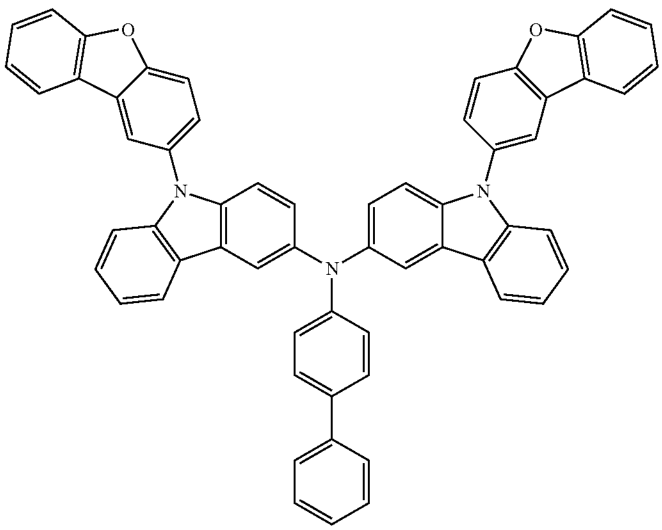
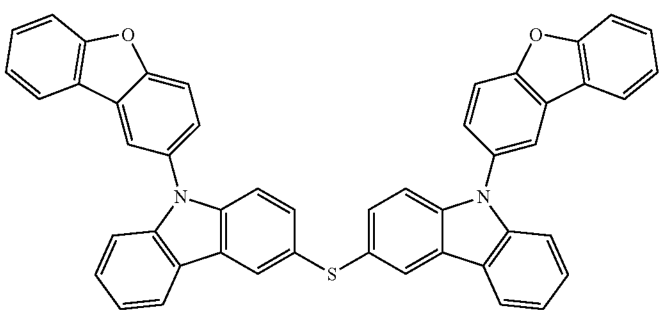
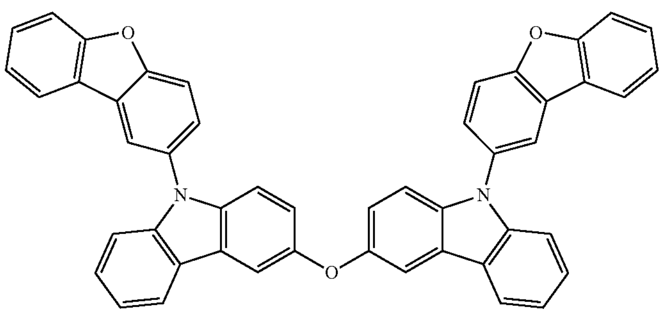

-continued
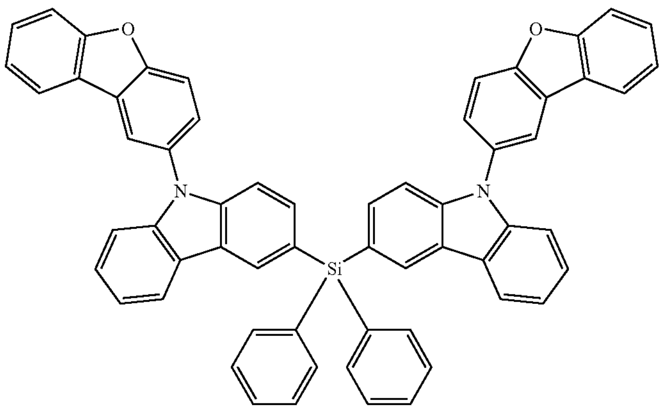
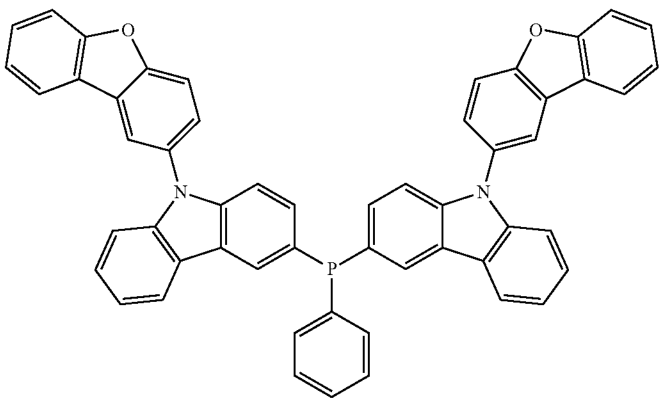
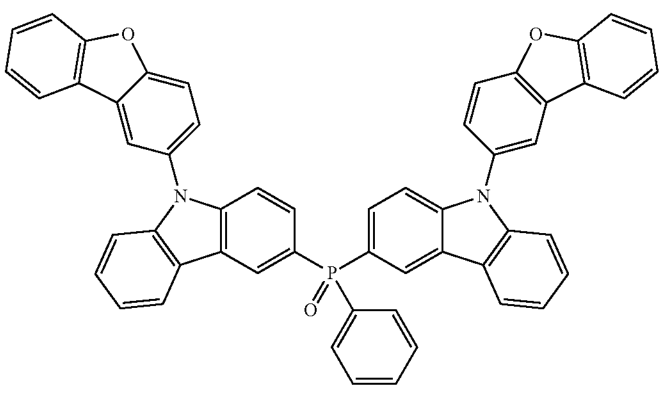
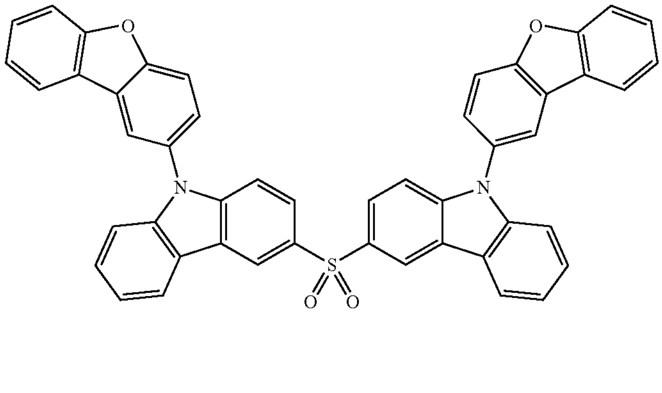

-continued
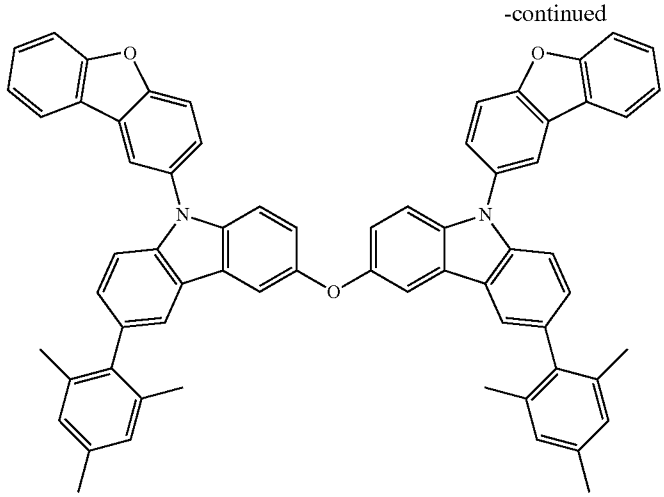
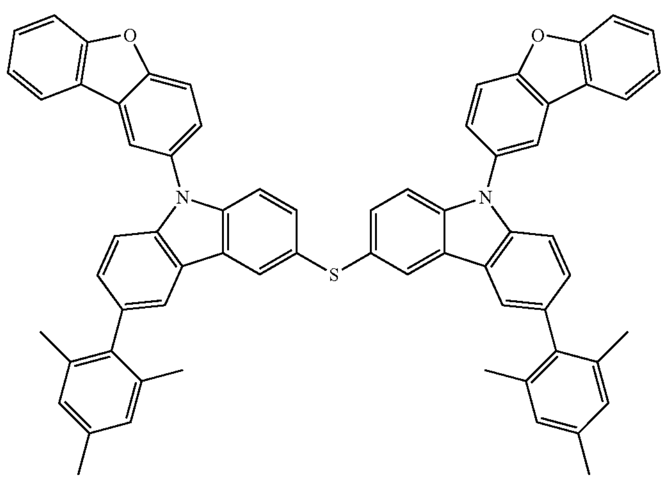
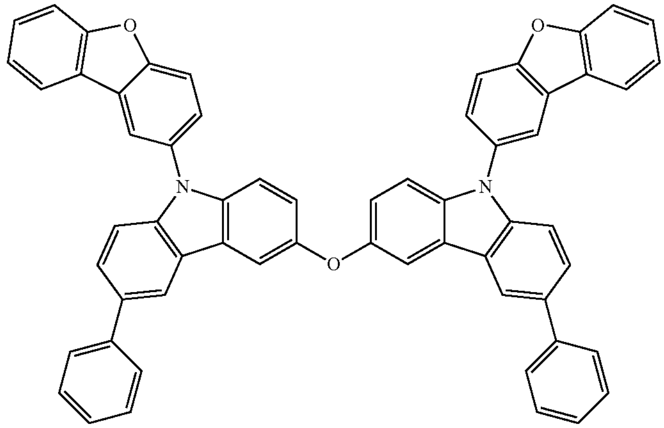

-continued
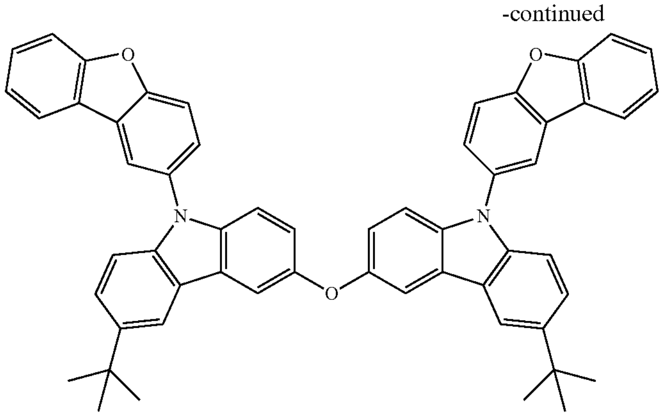
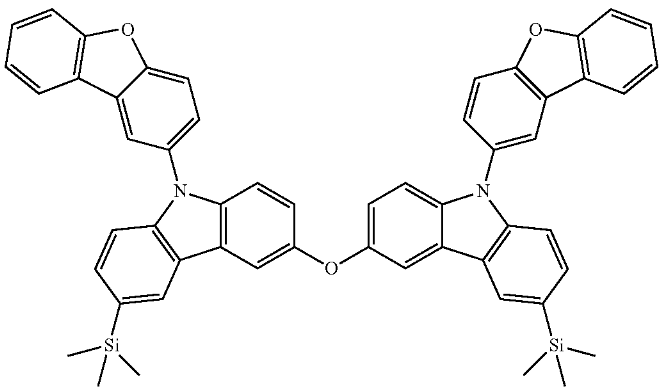
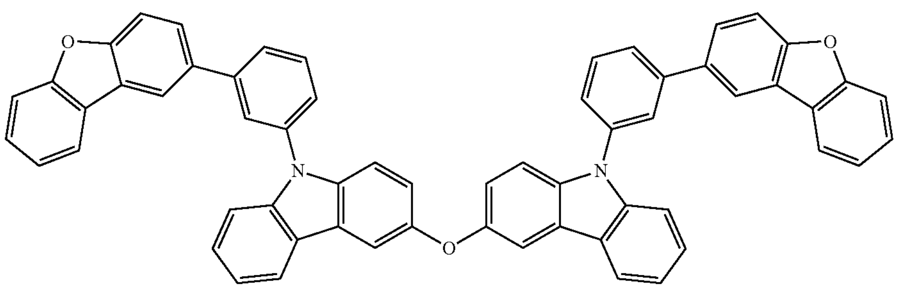
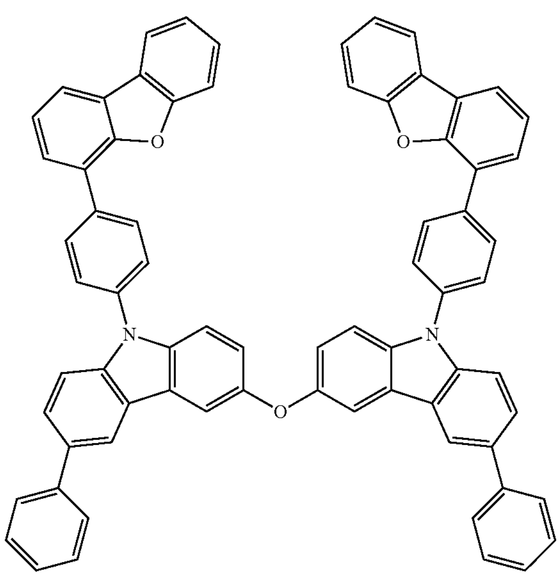
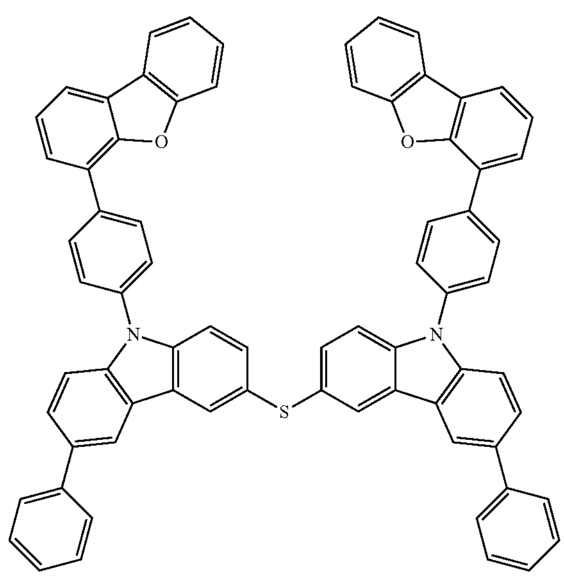

-continued
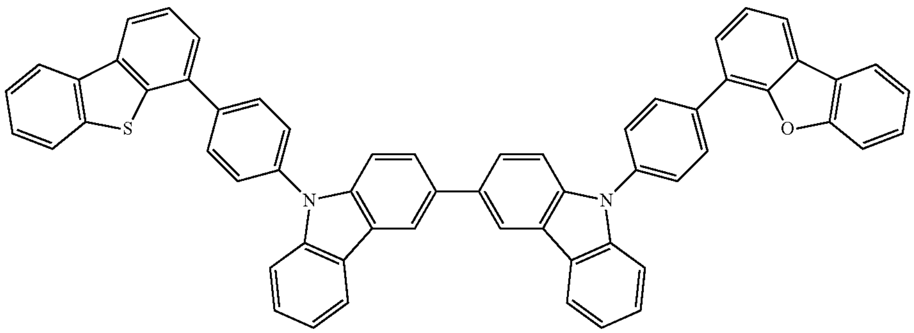
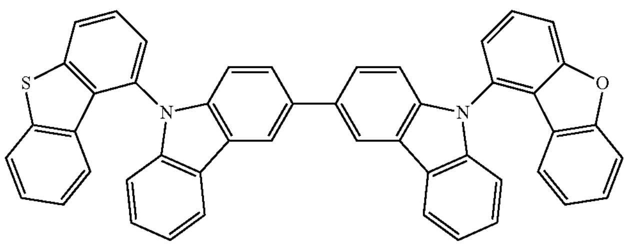
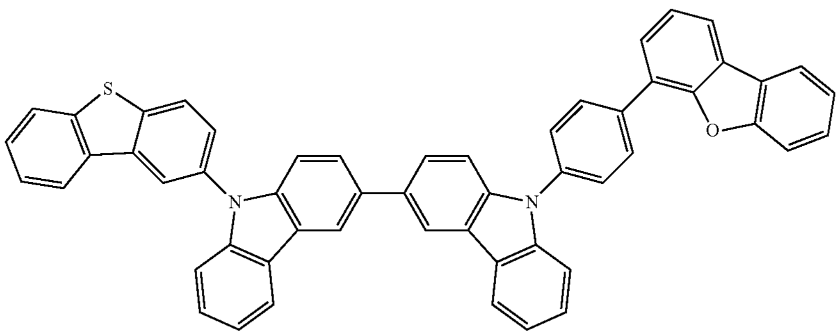
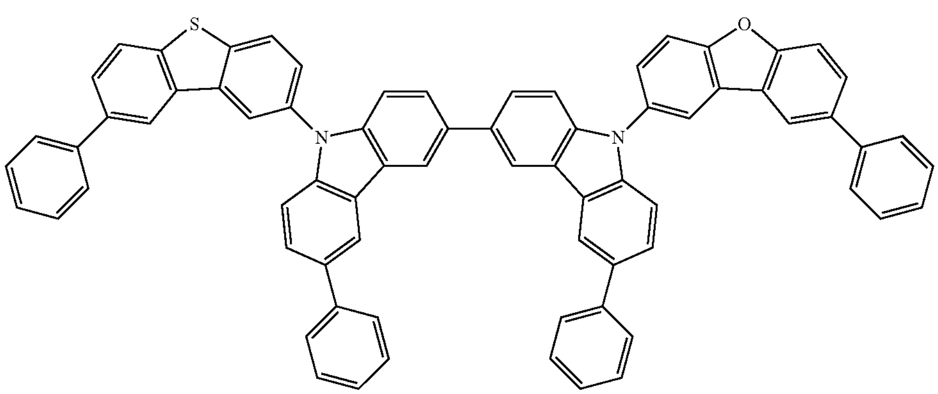
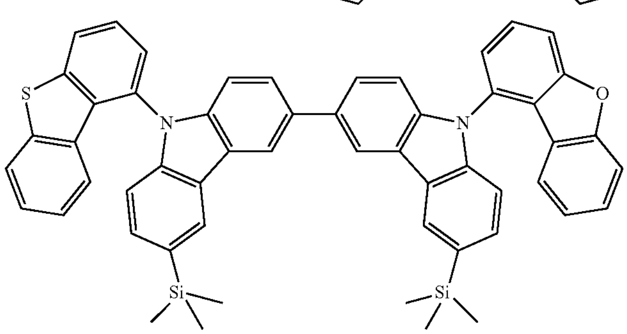

-continued
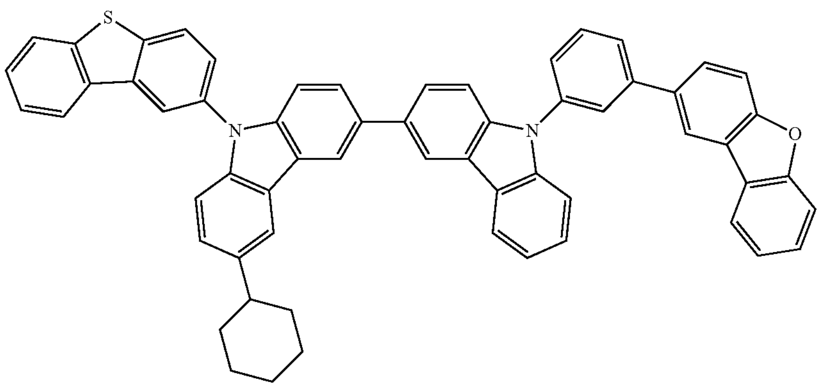
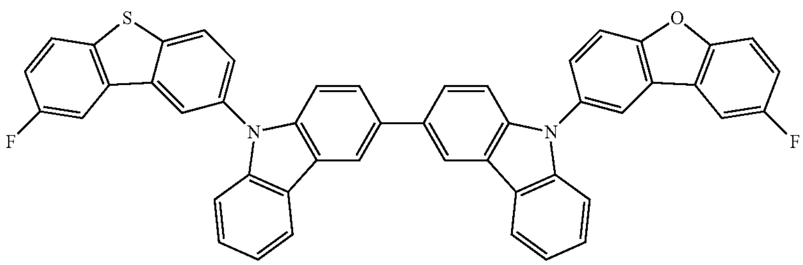
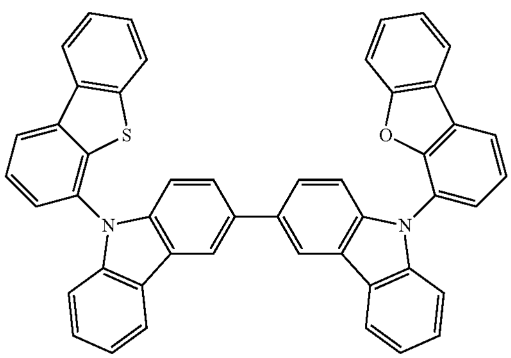
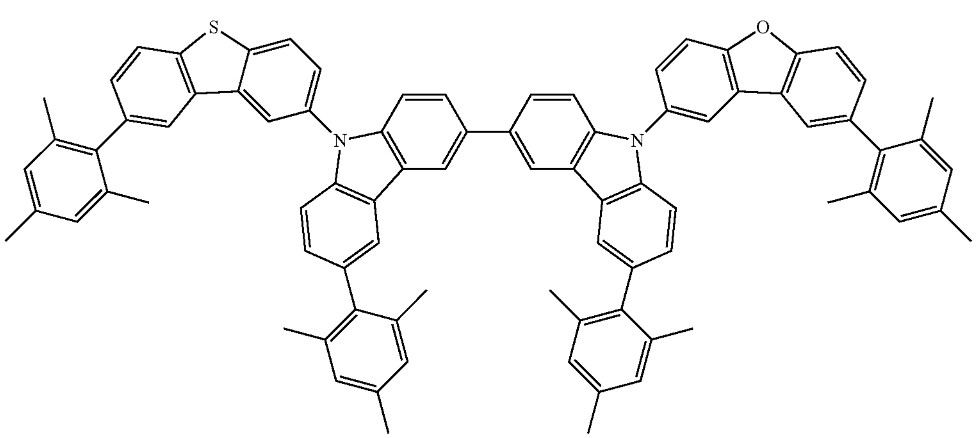

-continued
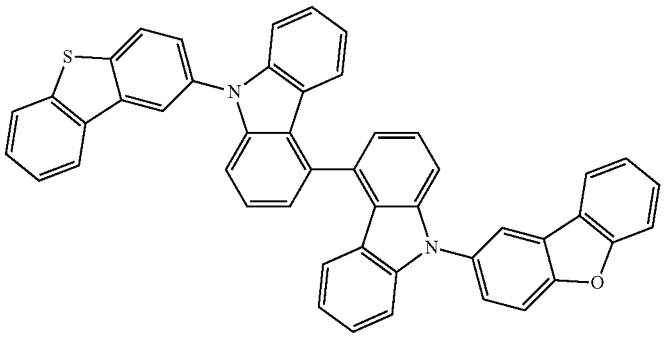
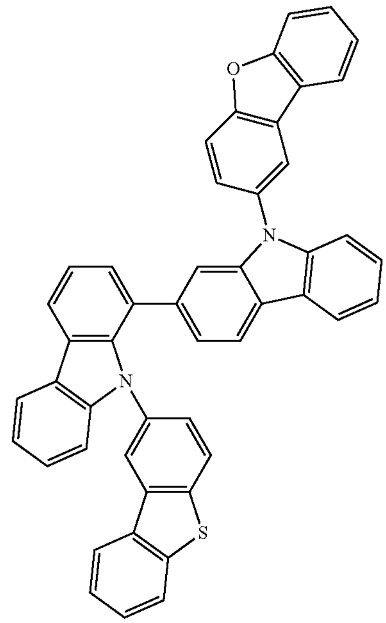
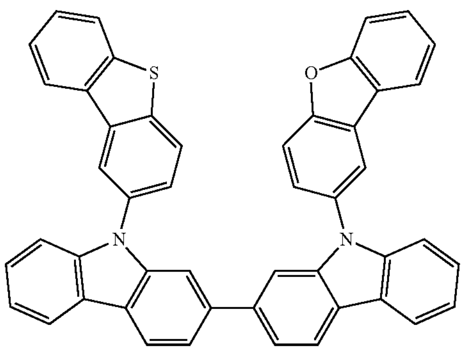
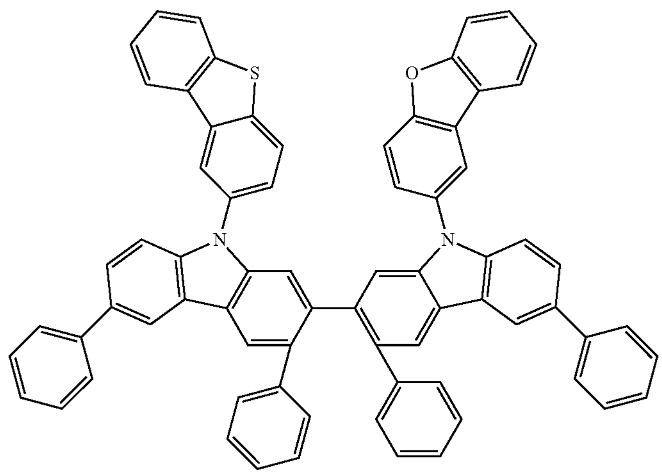
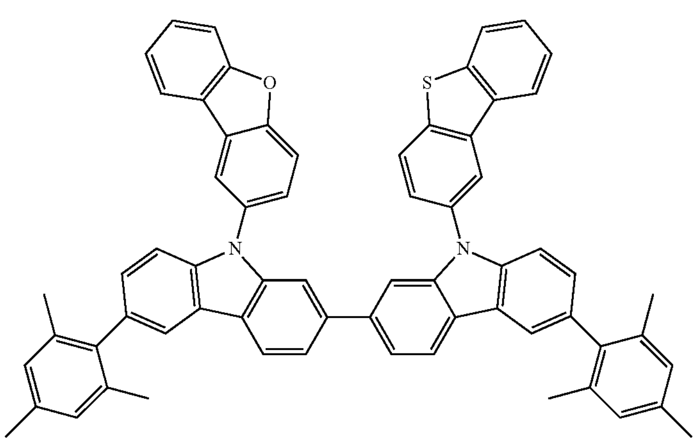

-continued
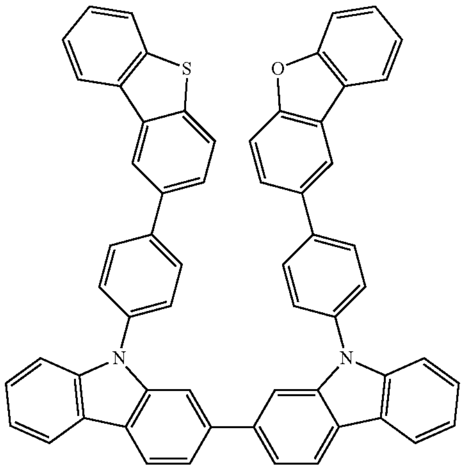
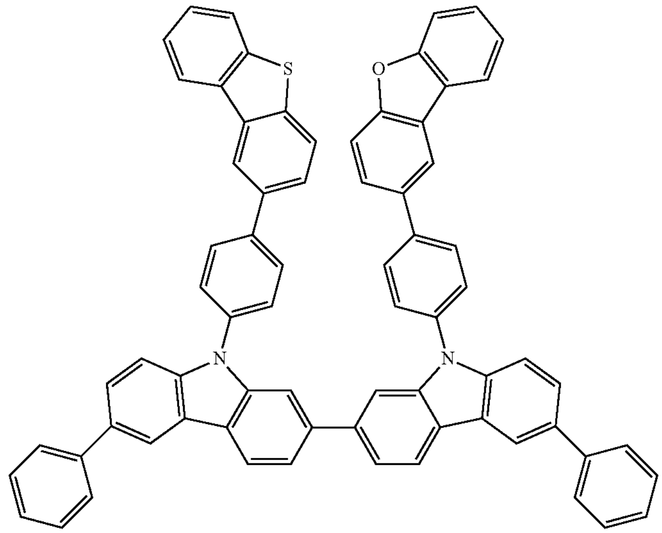
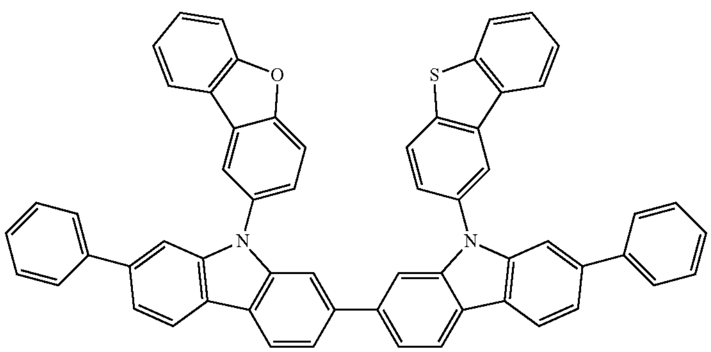
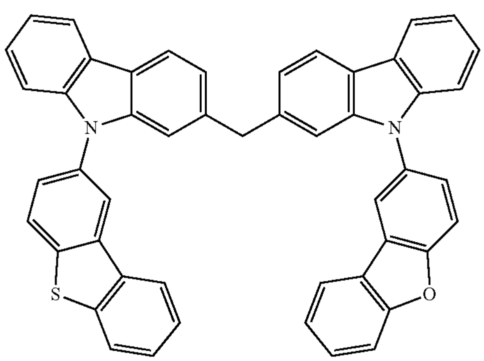
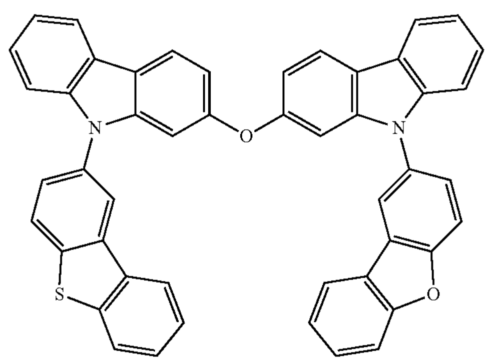
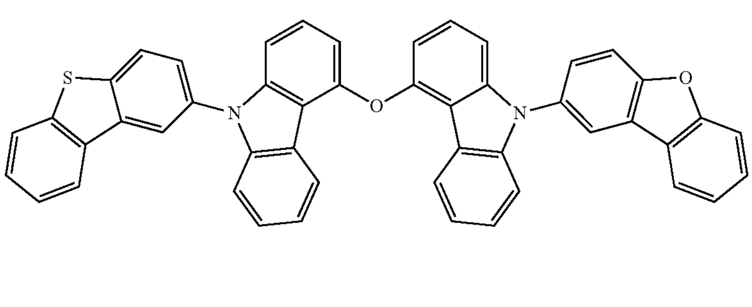

-continued
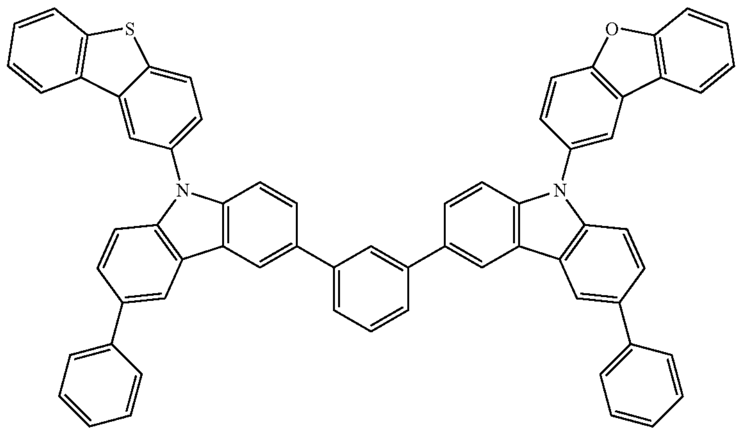
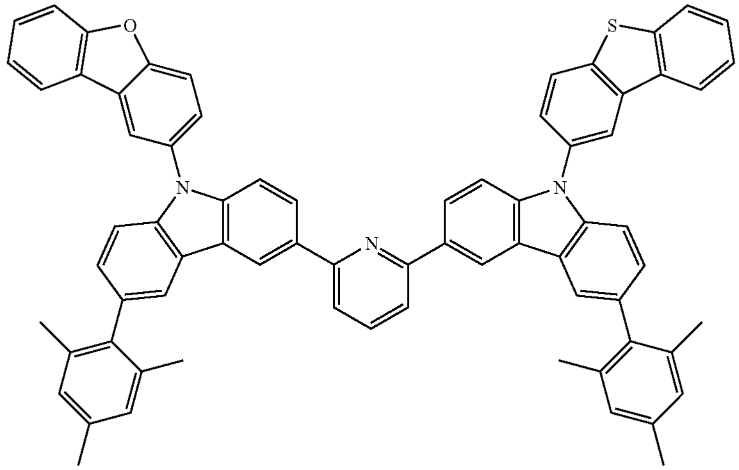
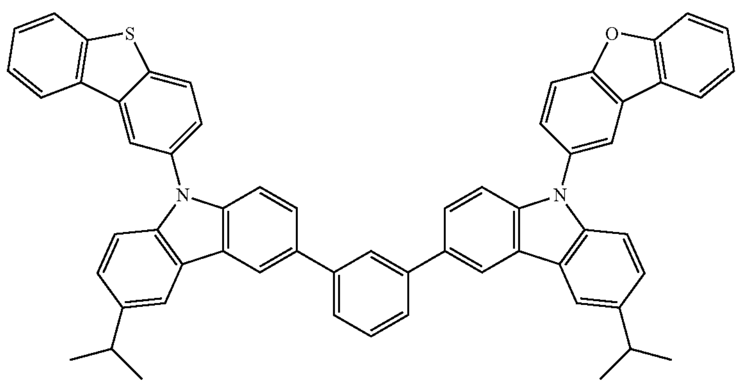
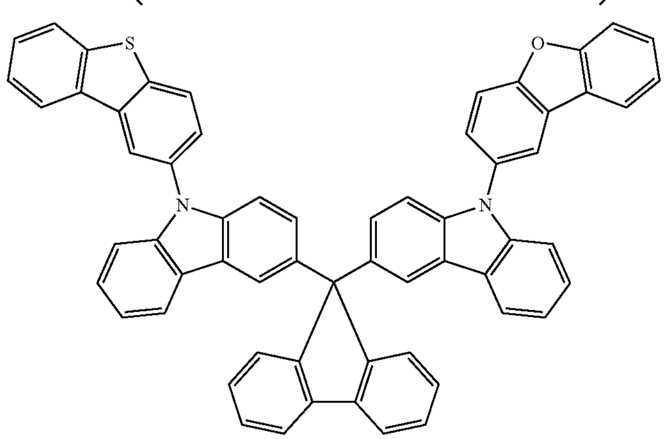

-continued
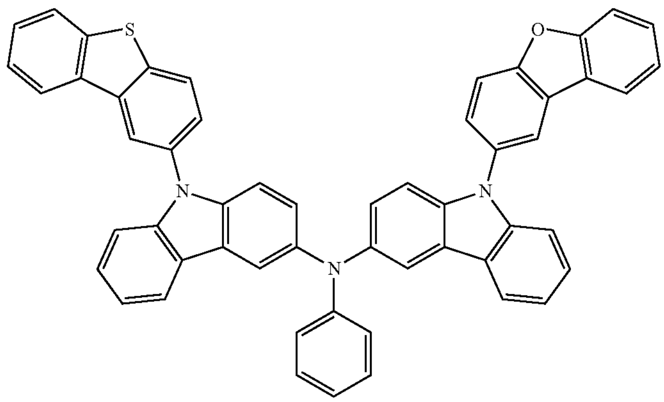
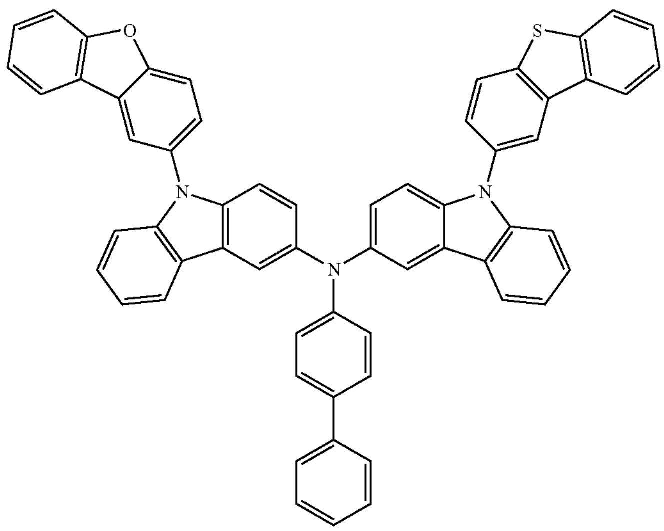
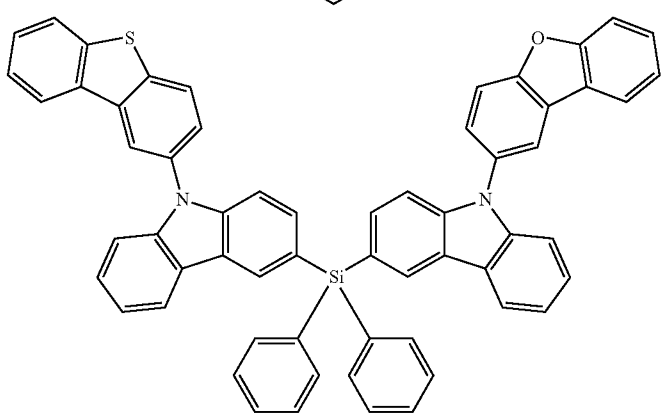
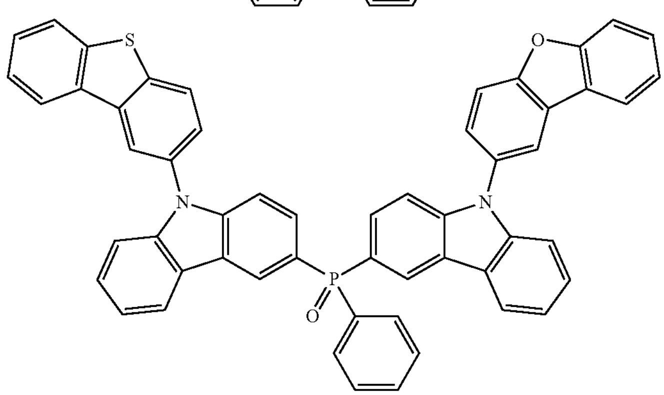

-continued
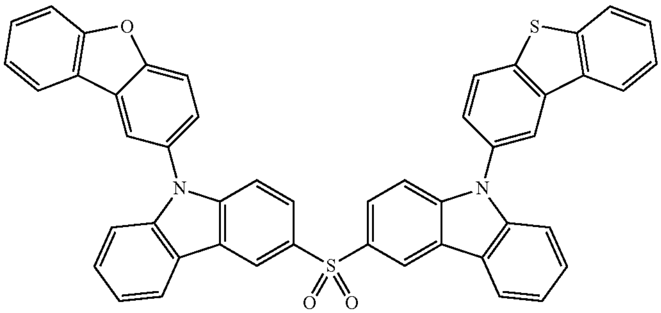
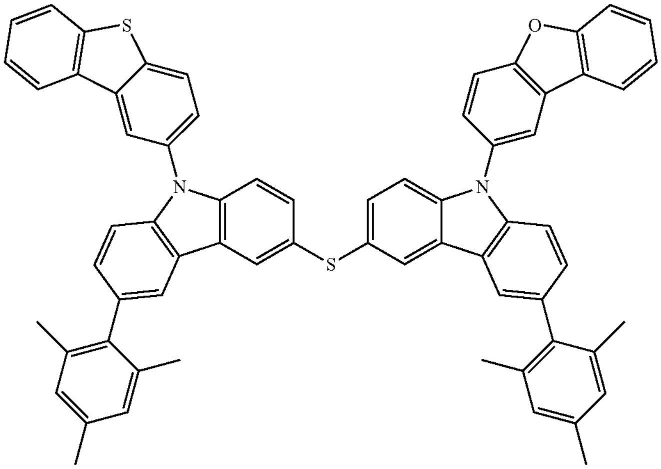
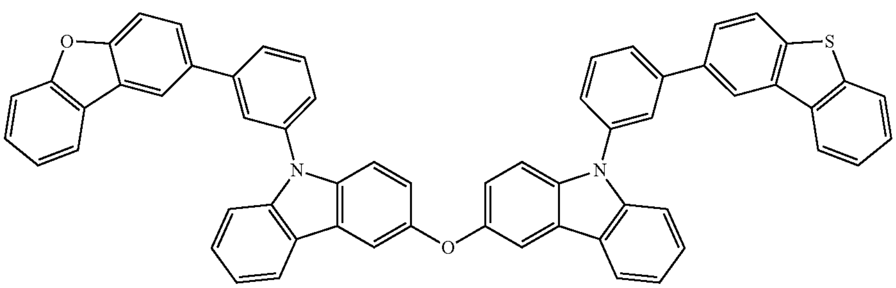
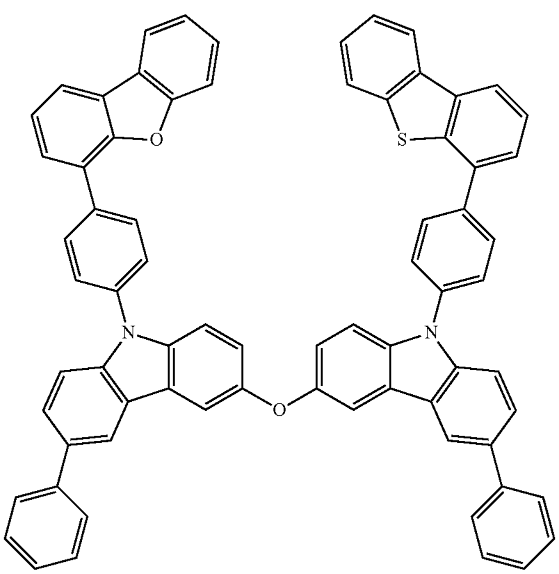
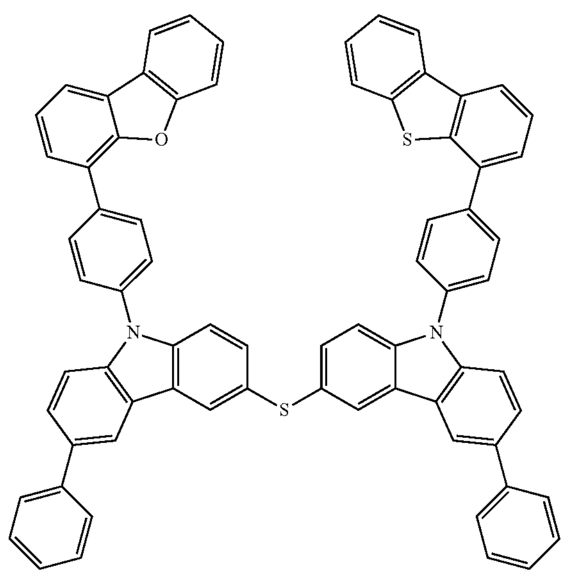

-continued
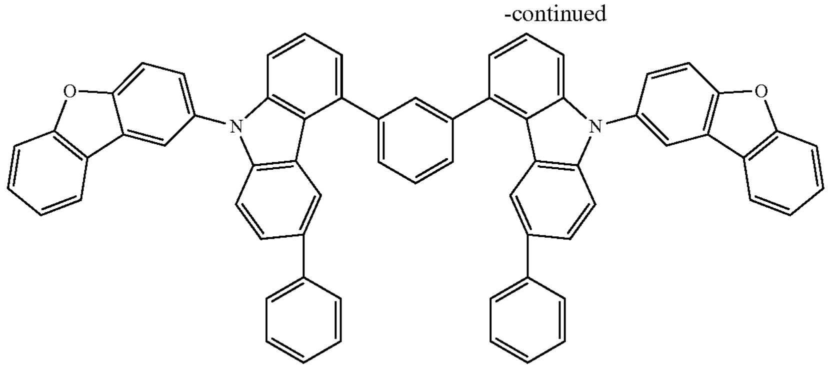
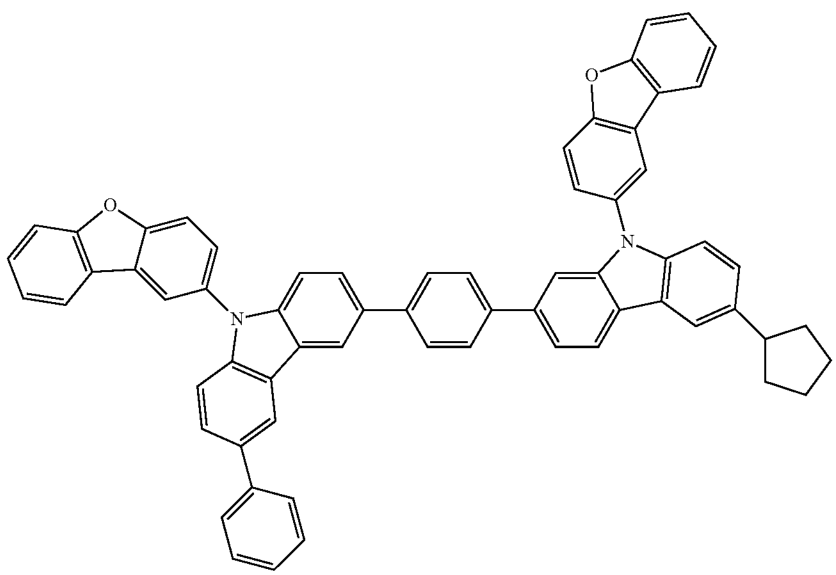
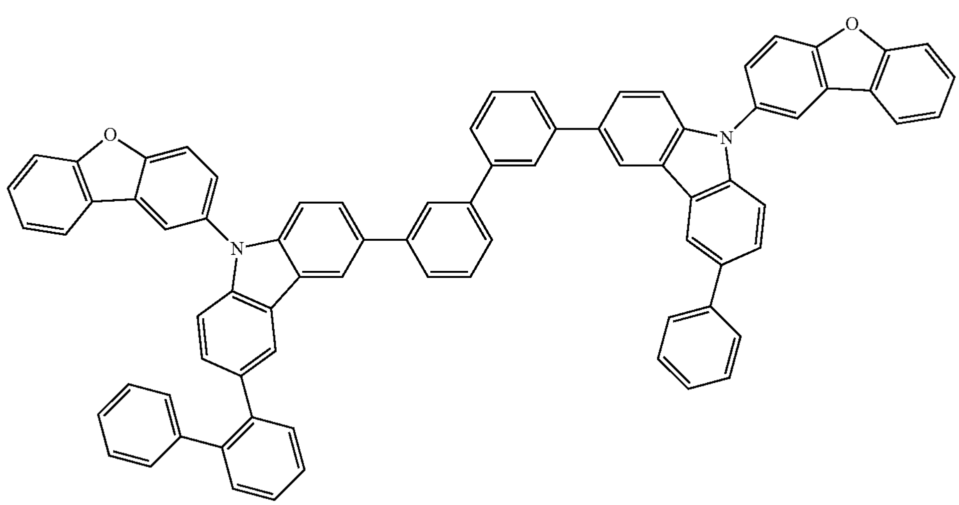

-continued
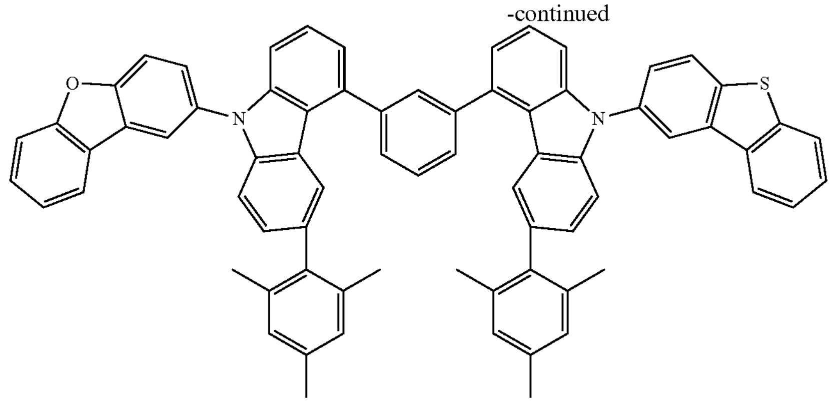
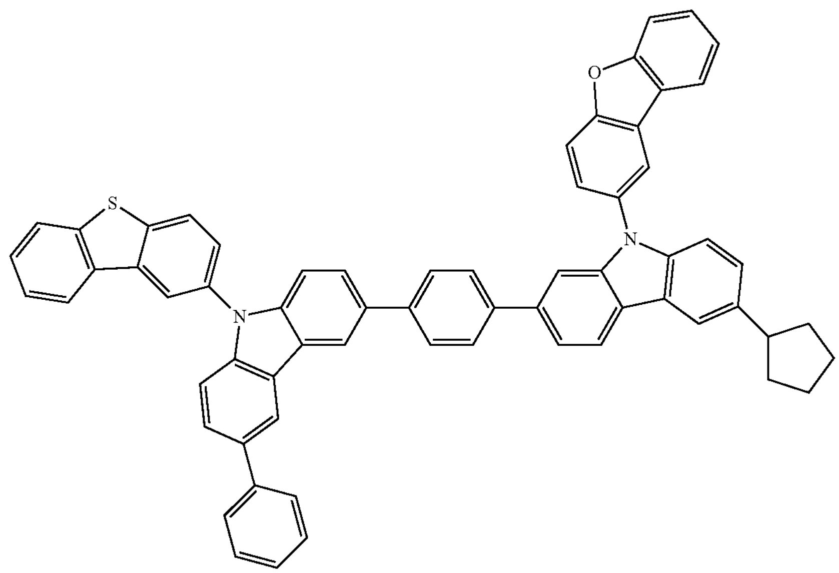
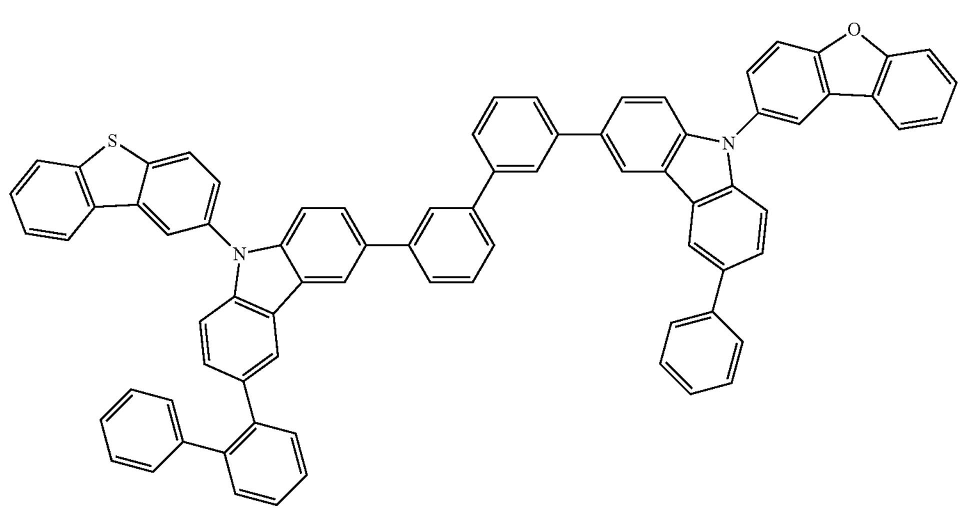

-continued
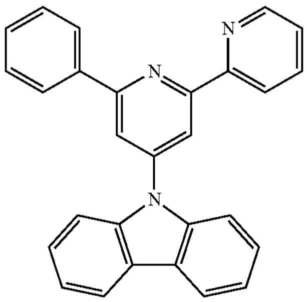
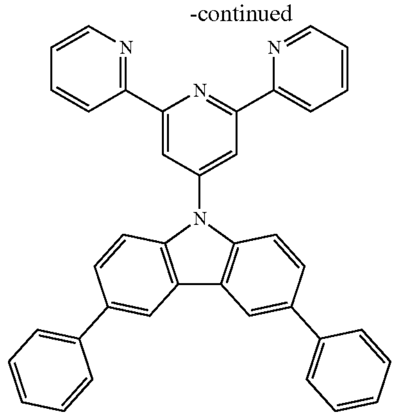
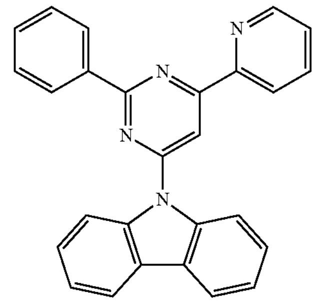
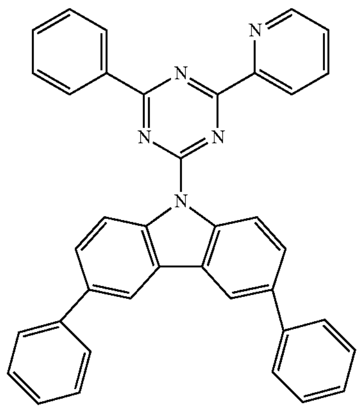
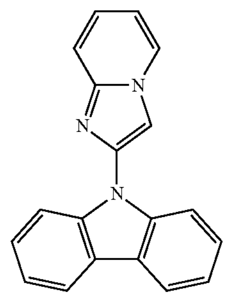
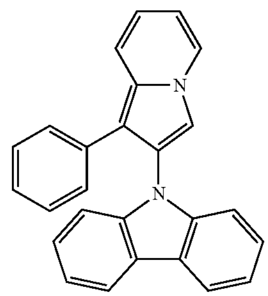
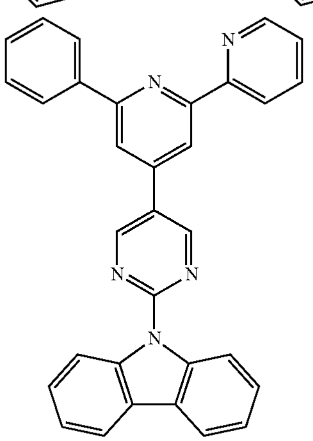
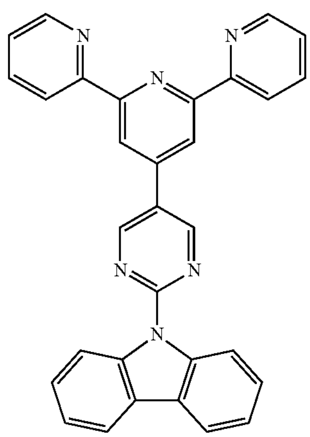
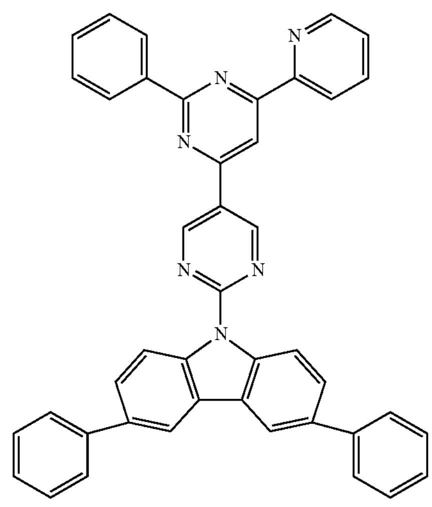
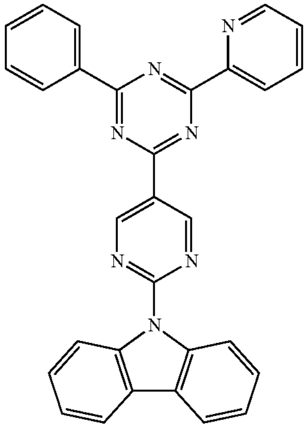
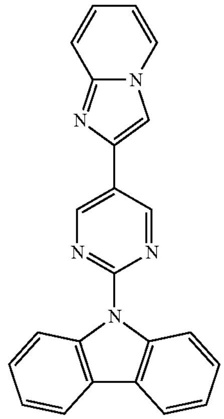
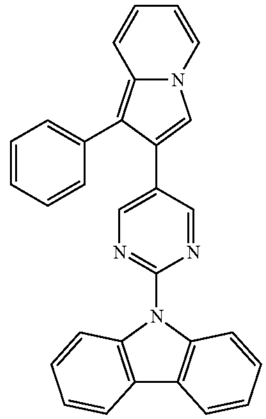
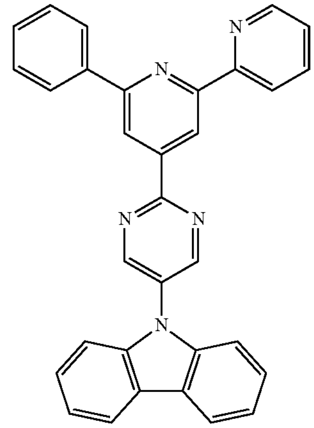

-continued
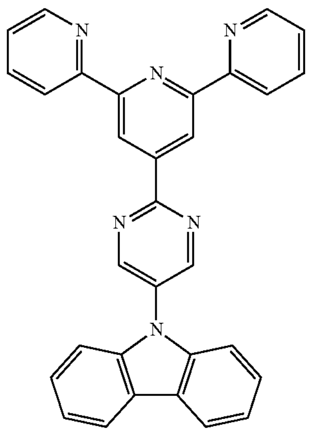
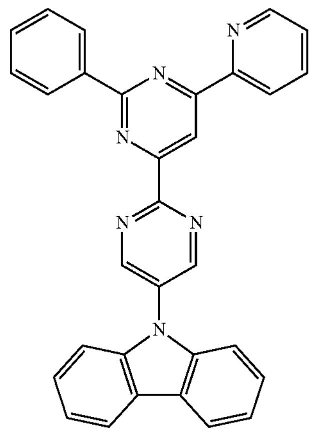
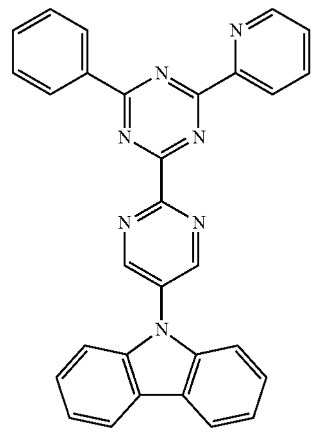
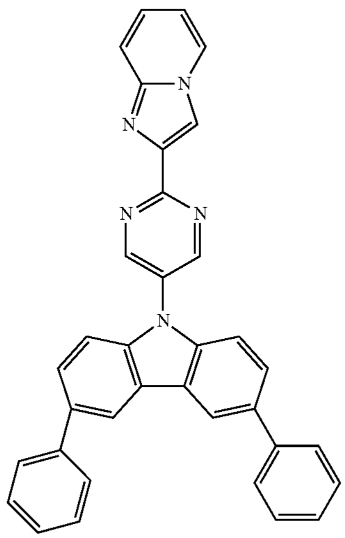
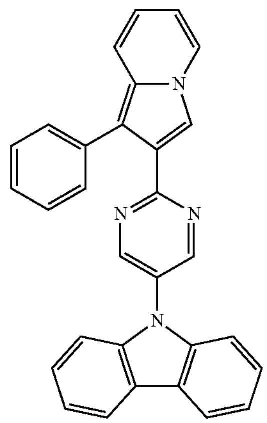
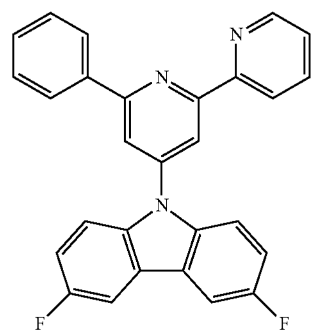
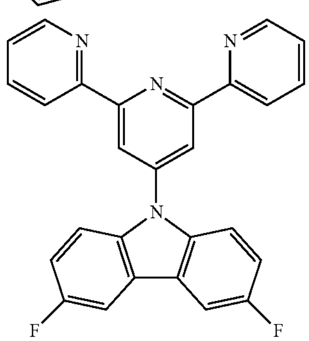
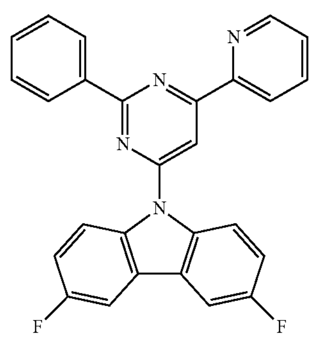
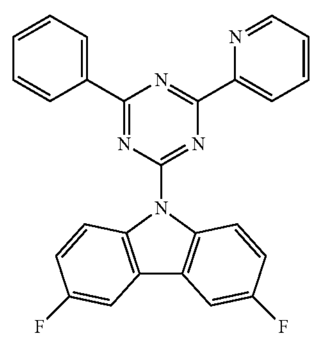
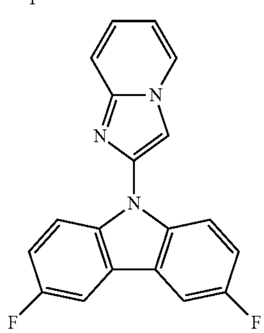
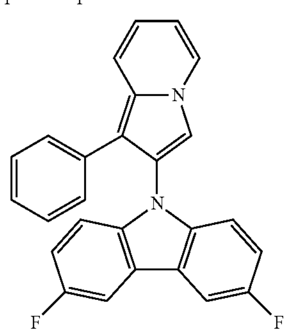
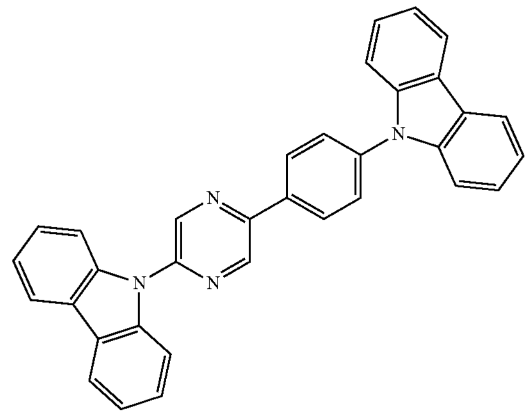

-continued
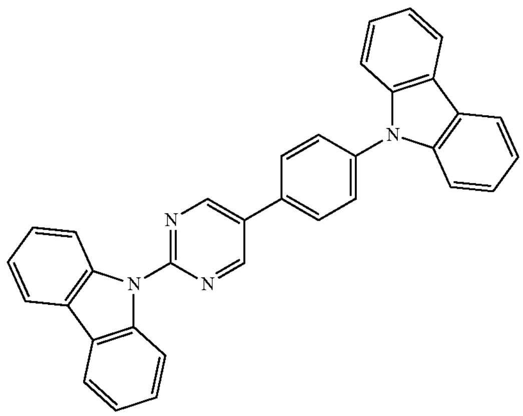
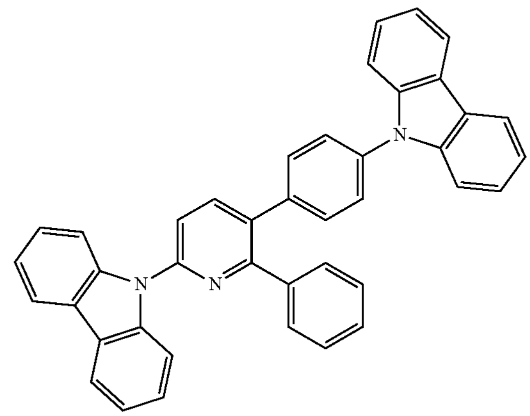
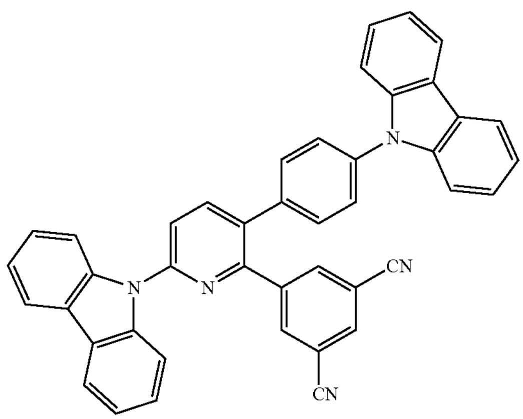
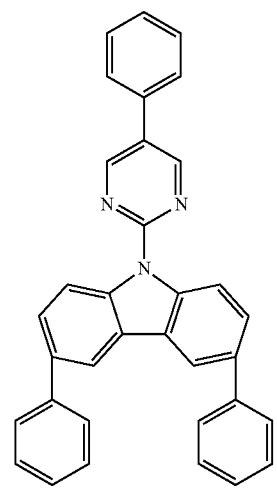
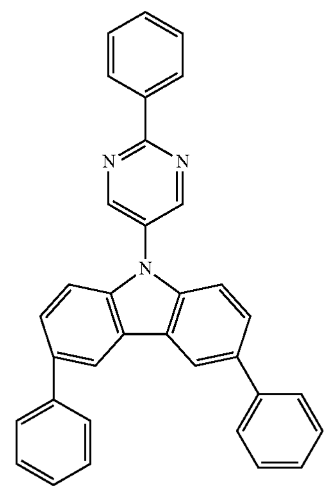
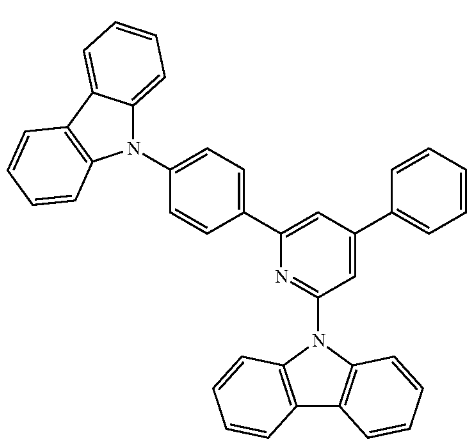
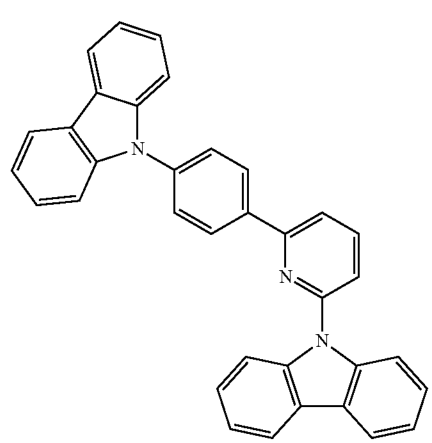

-continued
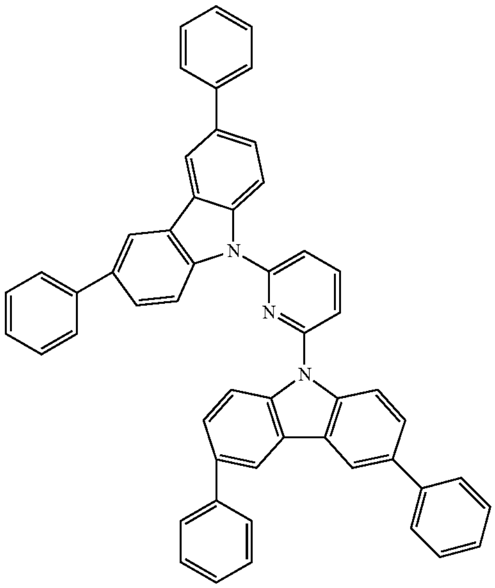
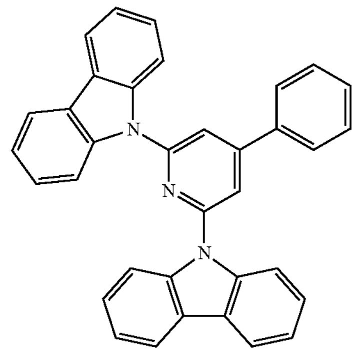
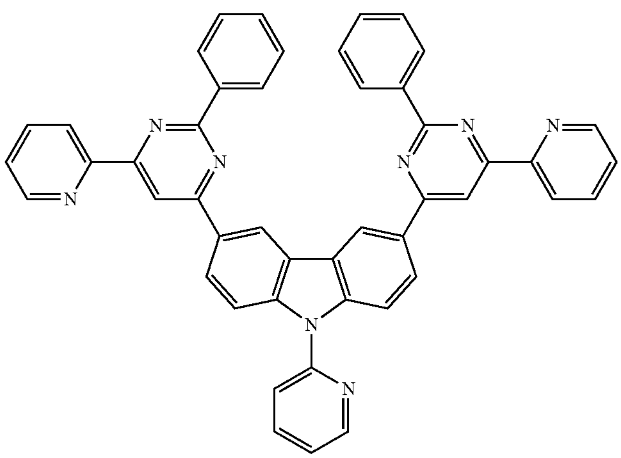
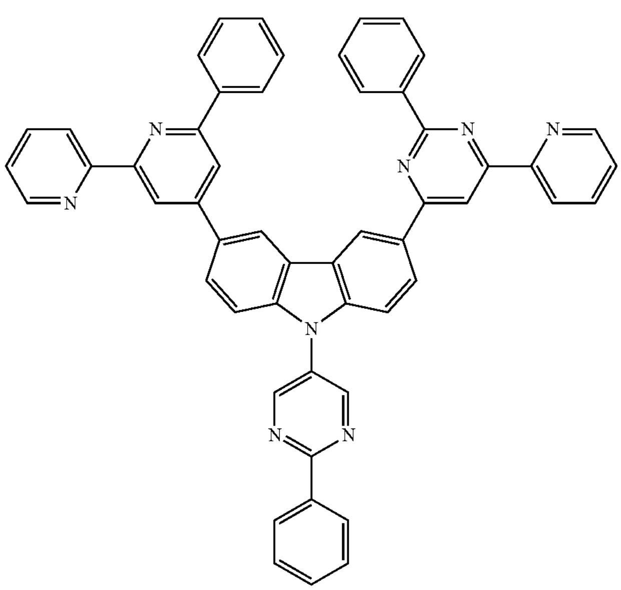

-continued
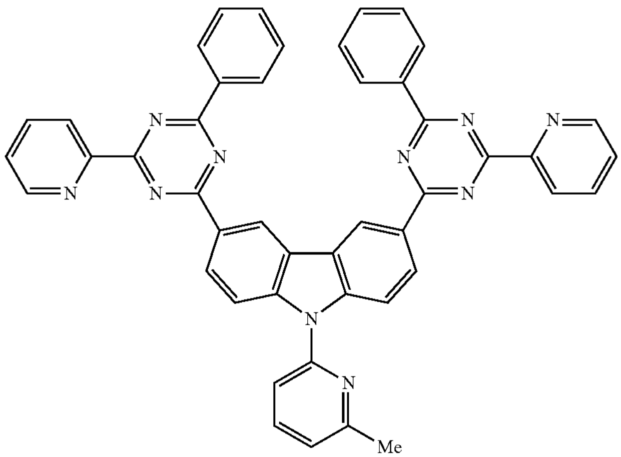
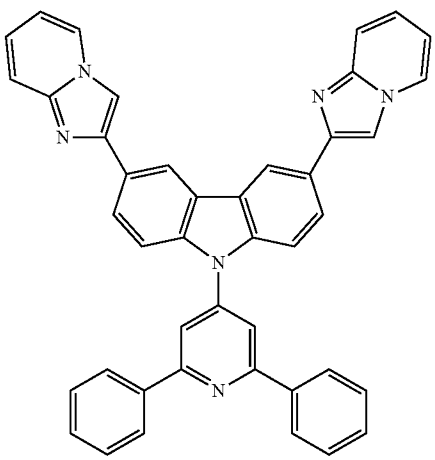
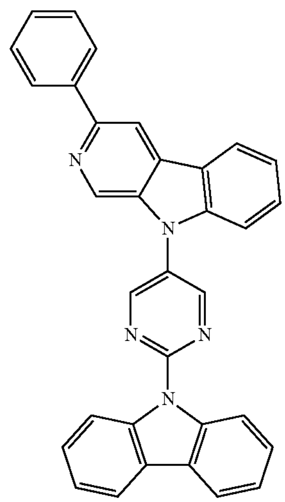
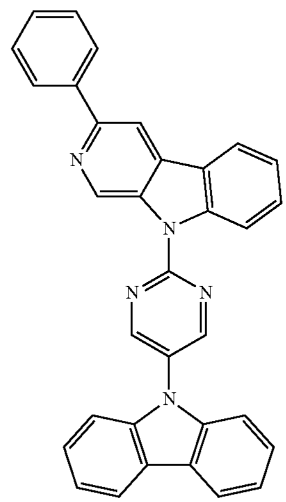
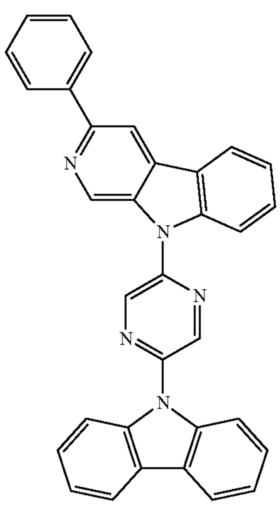
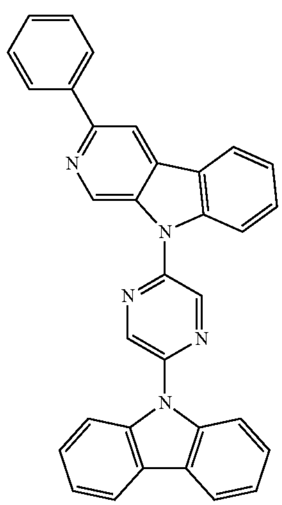
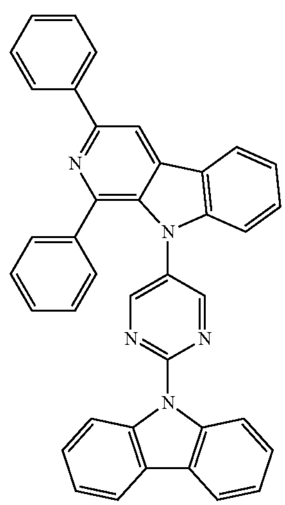

-continued
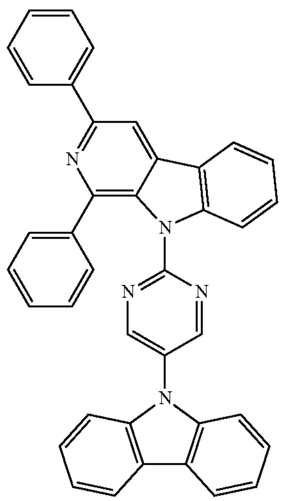
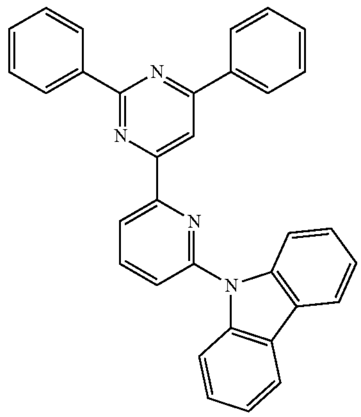
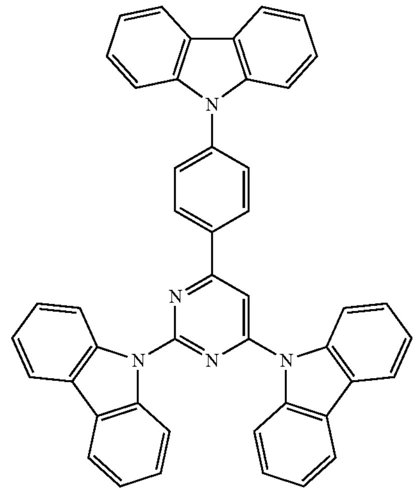
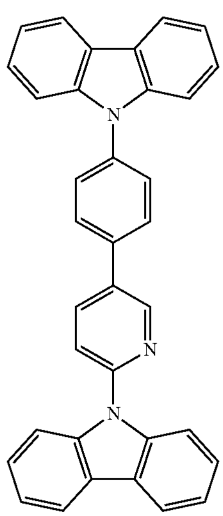
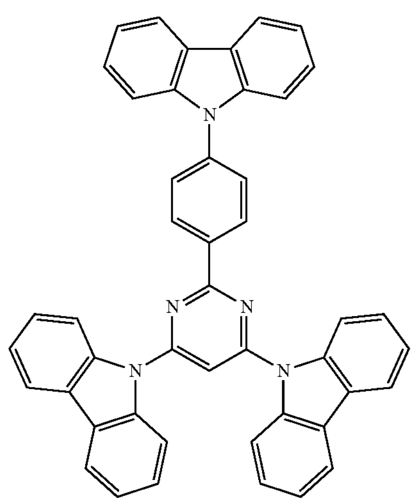
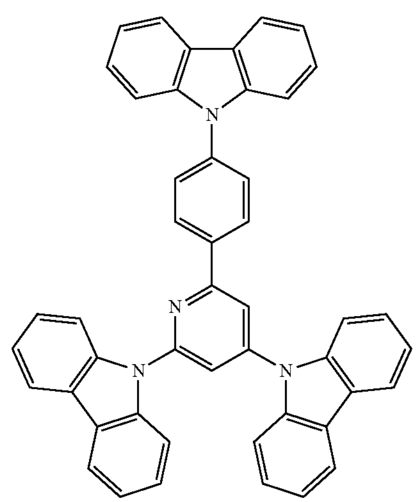
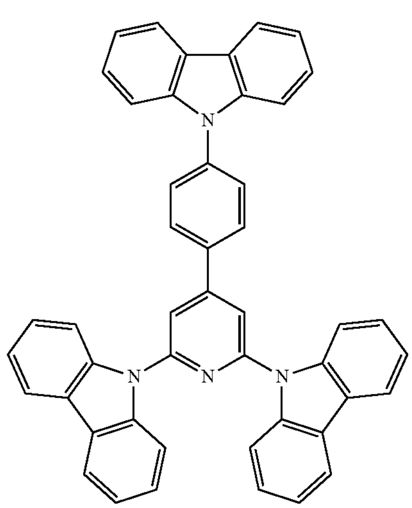
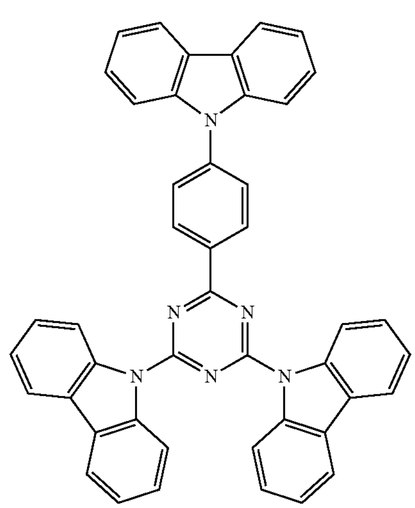
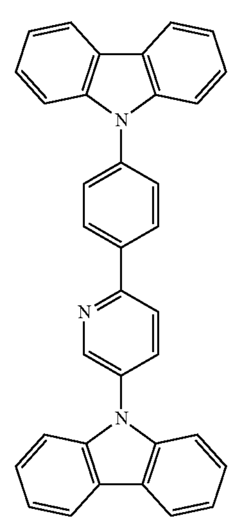

-continued
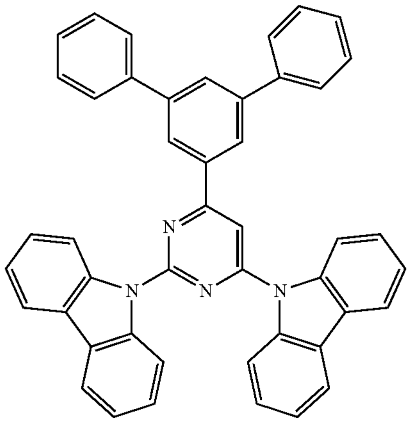
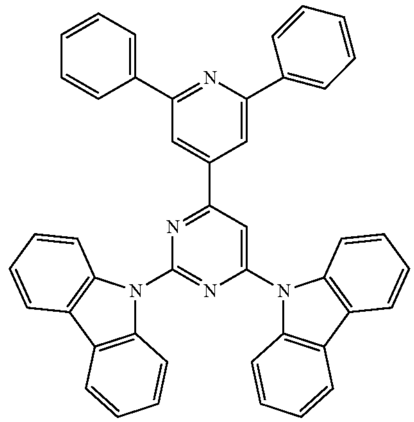
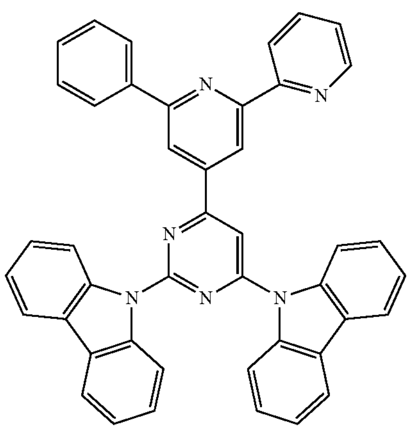
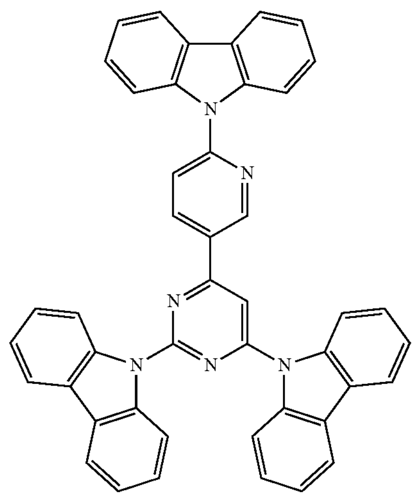
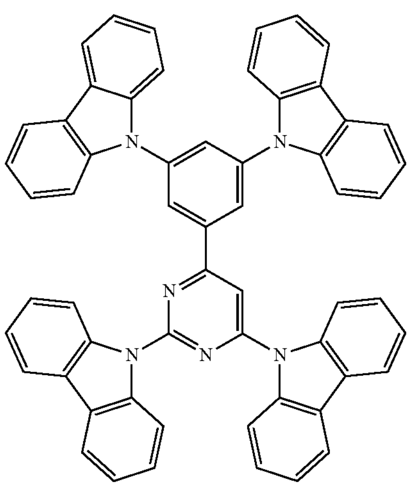
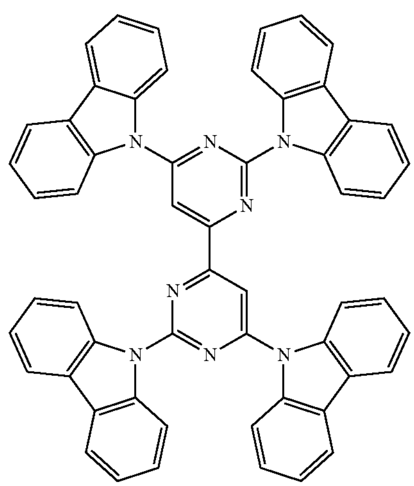

-continued
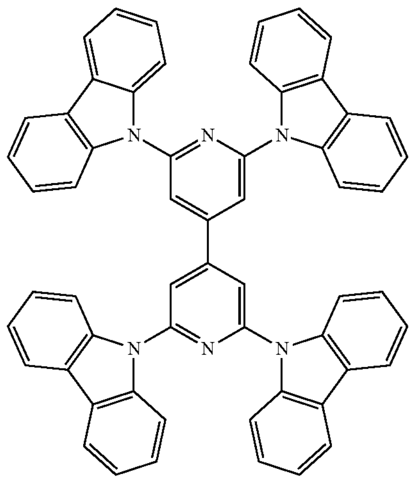
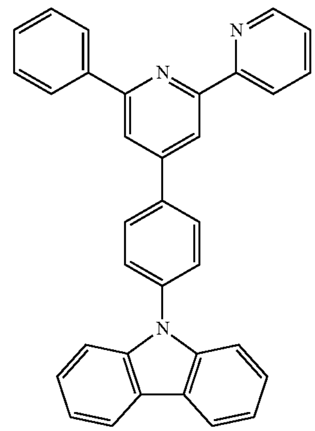
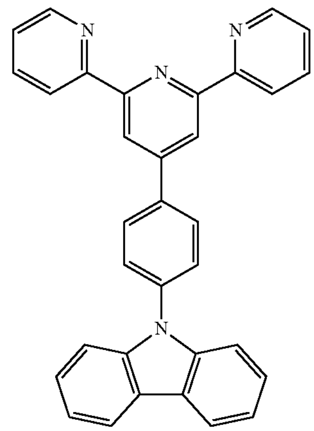
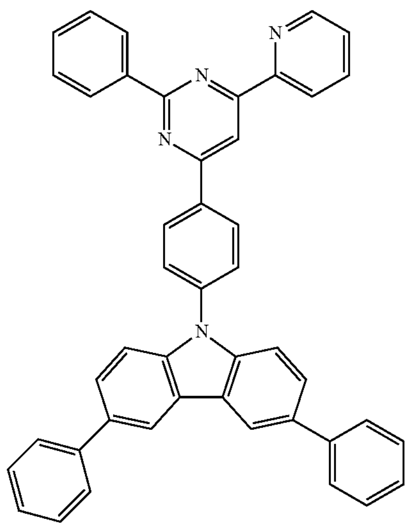
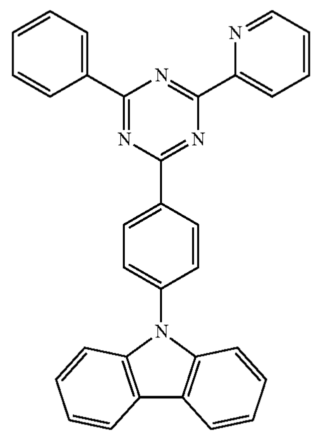
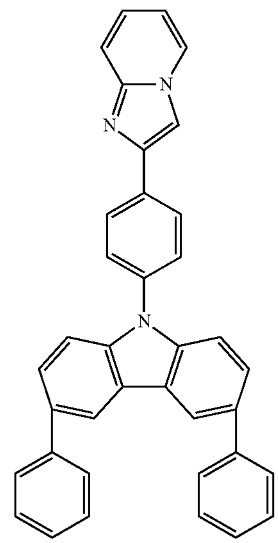
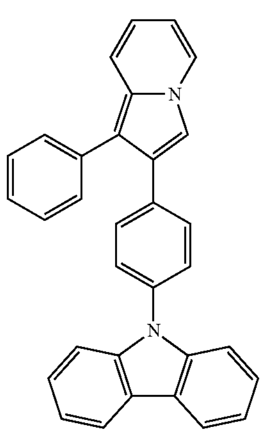
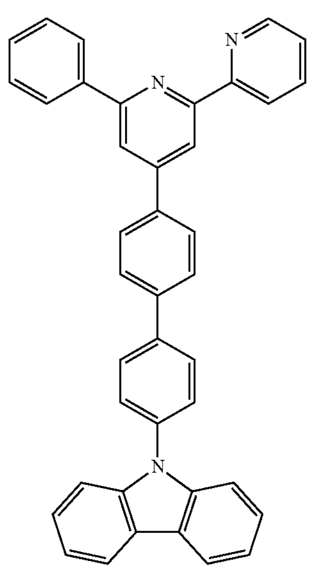
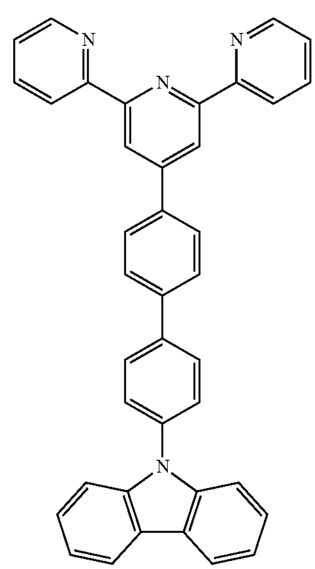

-continued
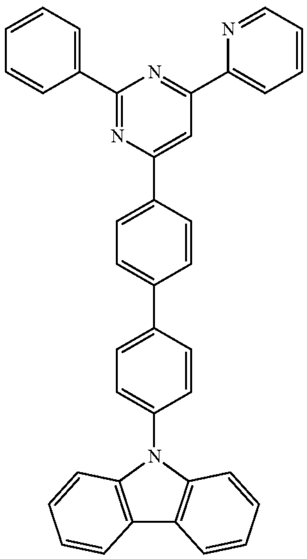
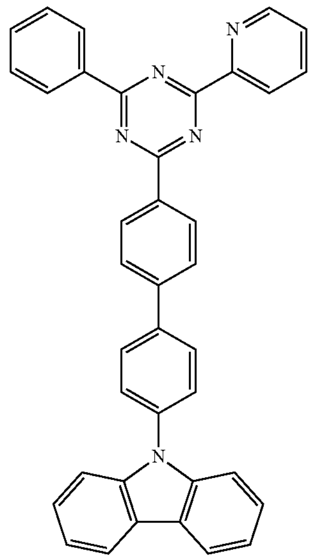
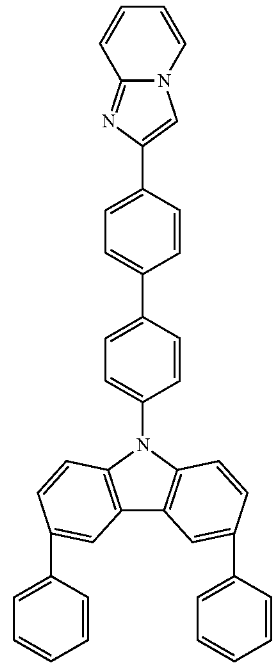
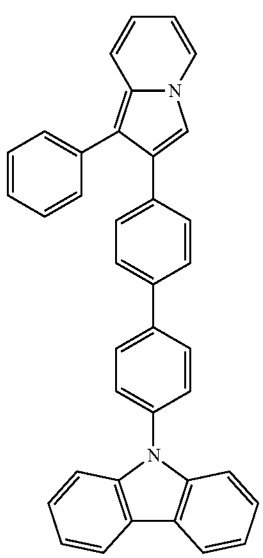
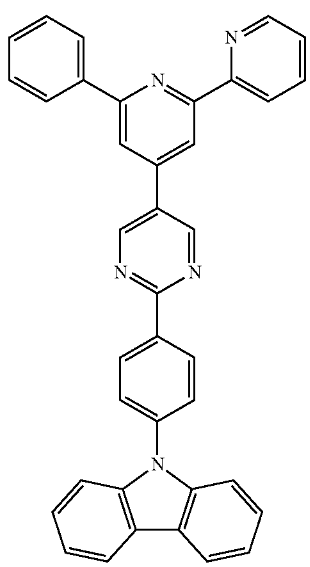
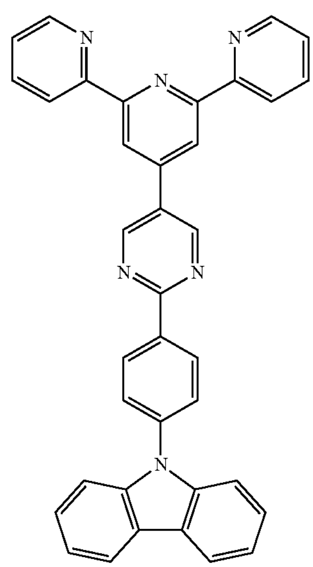

-continued
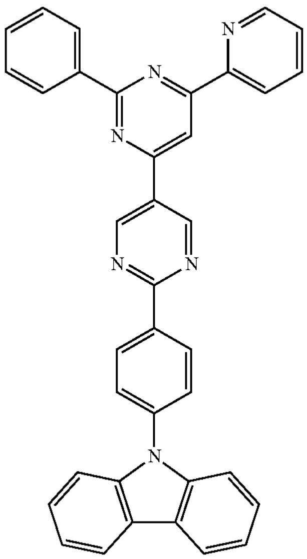
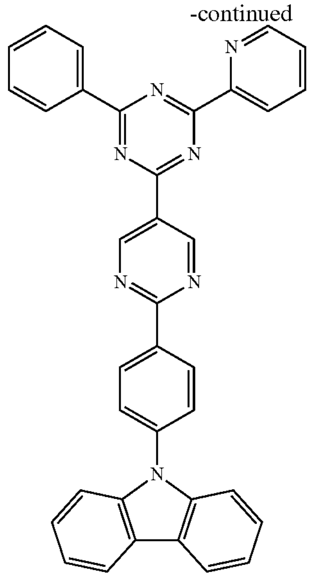
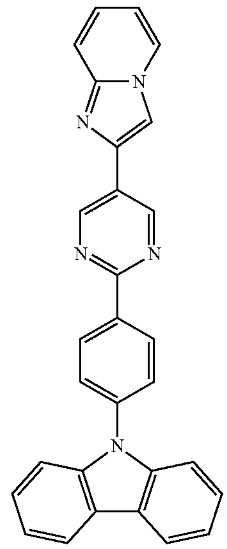
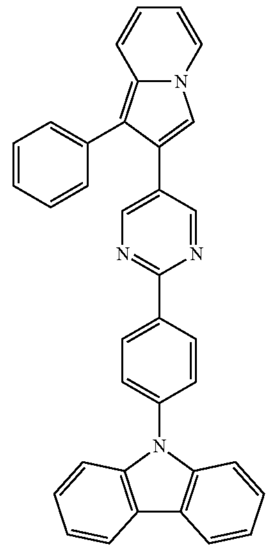
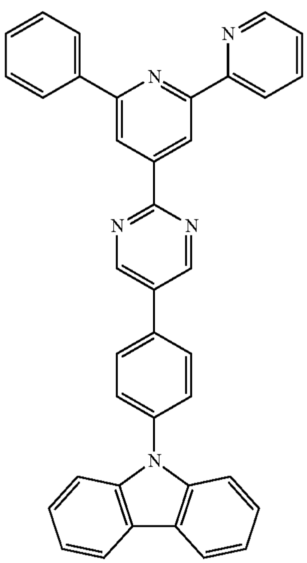
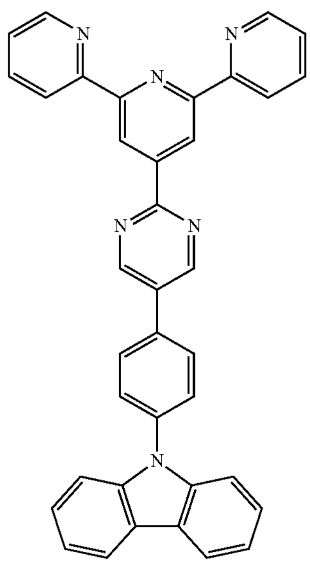
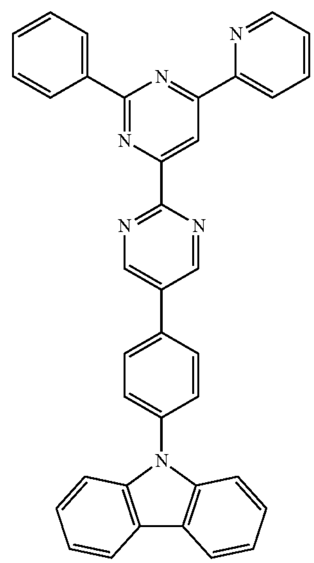
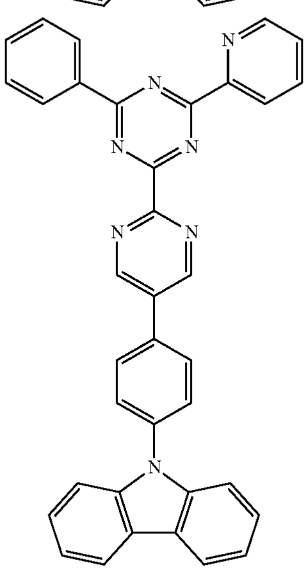
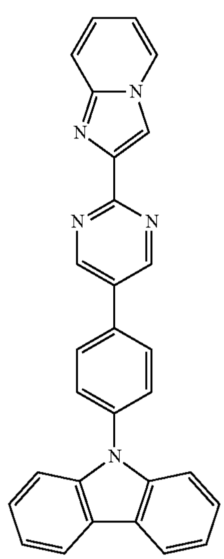
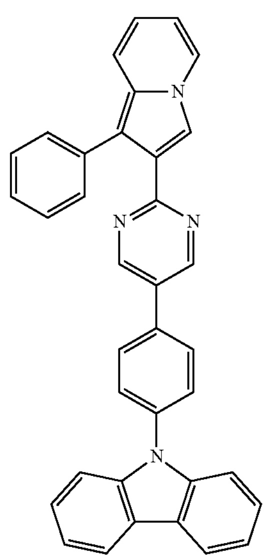
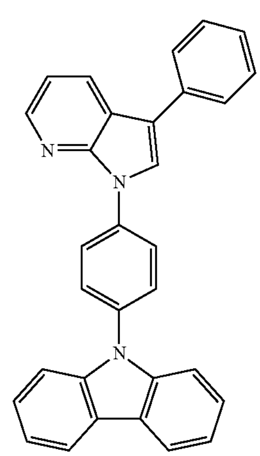

-continued
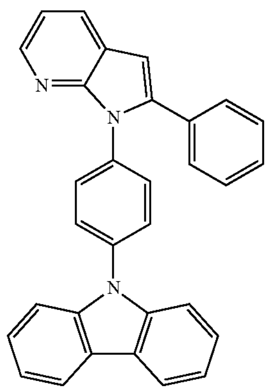
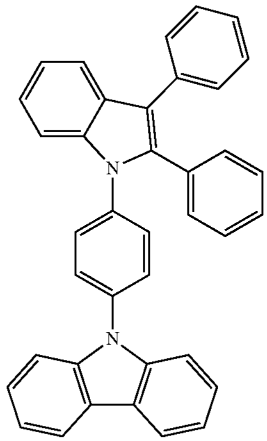
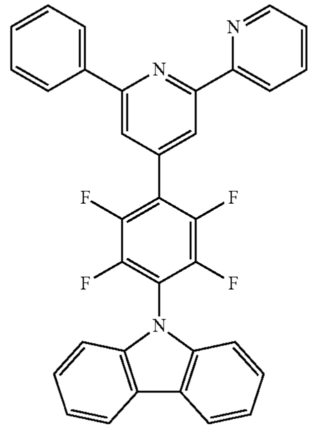
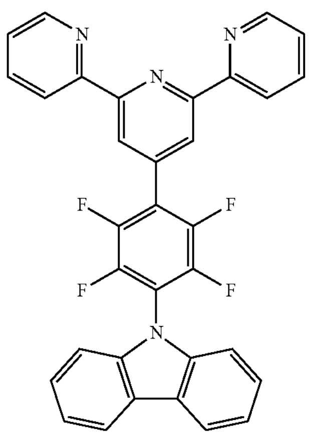
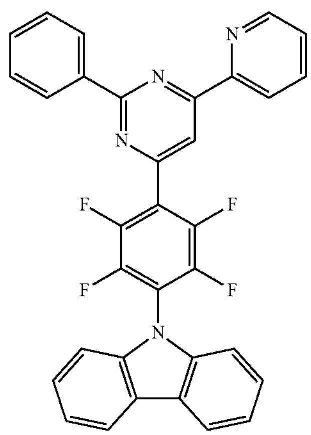
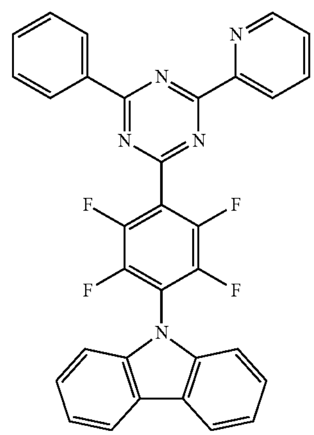
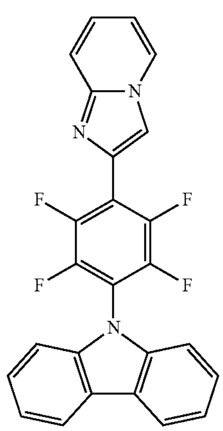
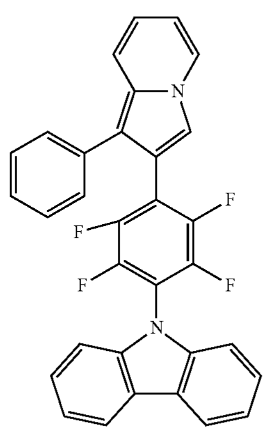
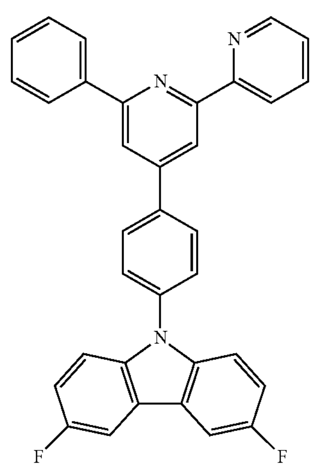
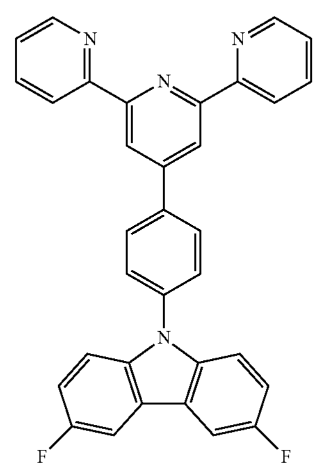

-continued
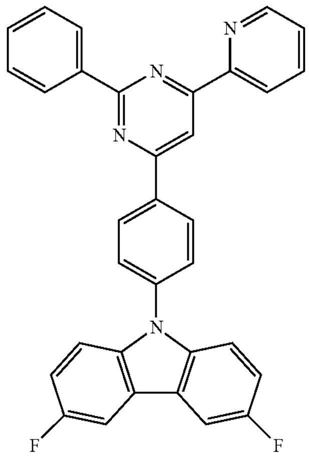
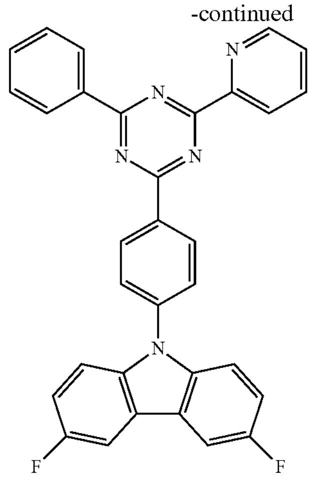
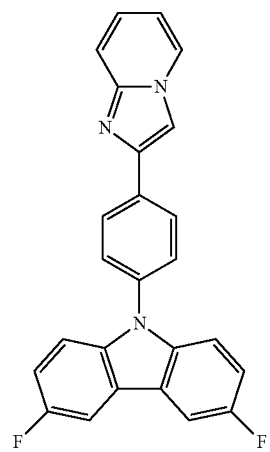
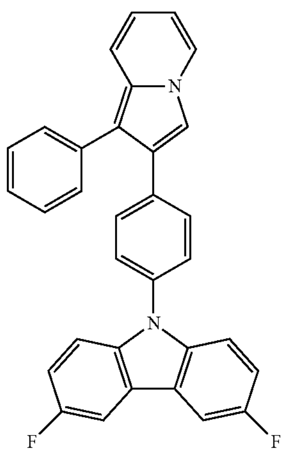
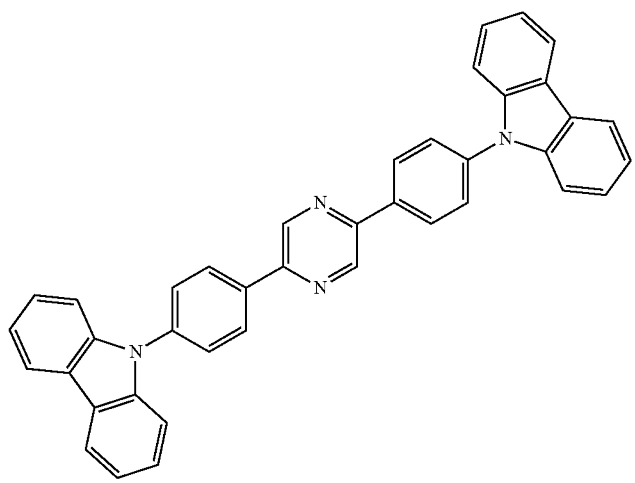
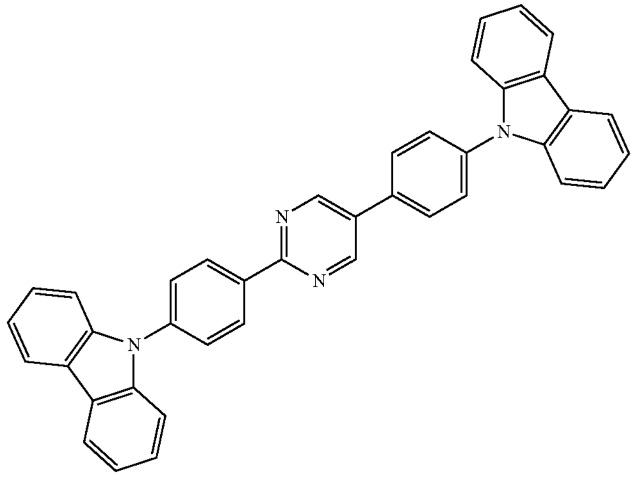

-continued
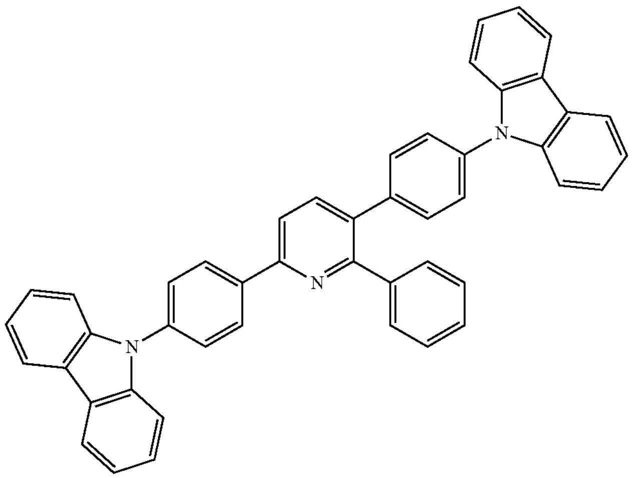
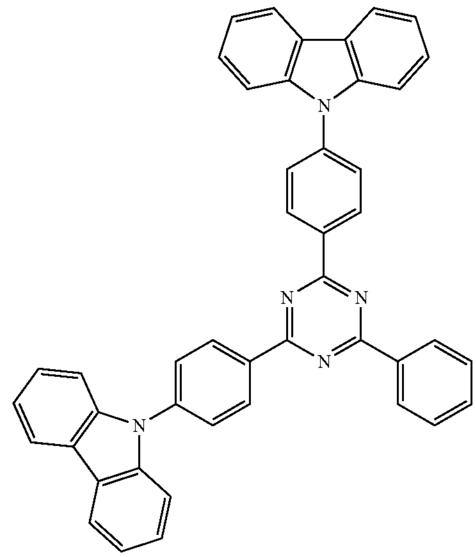
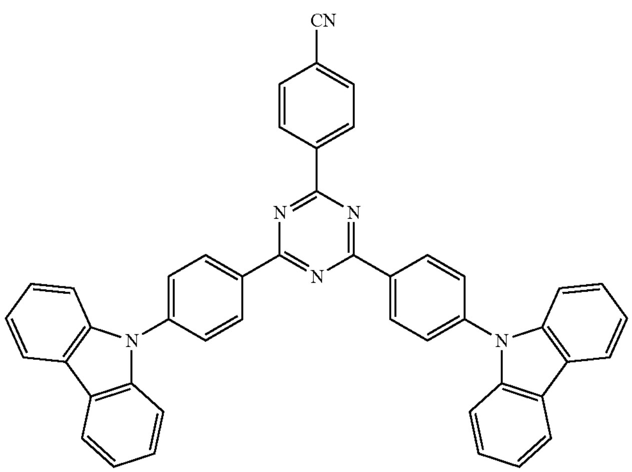
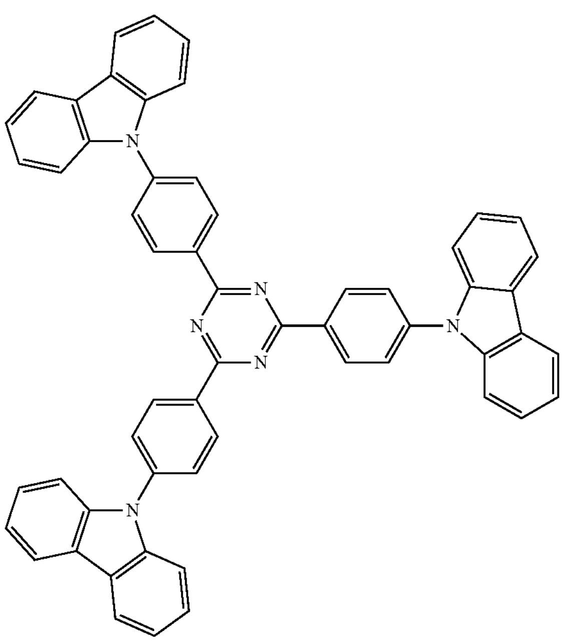

-continued
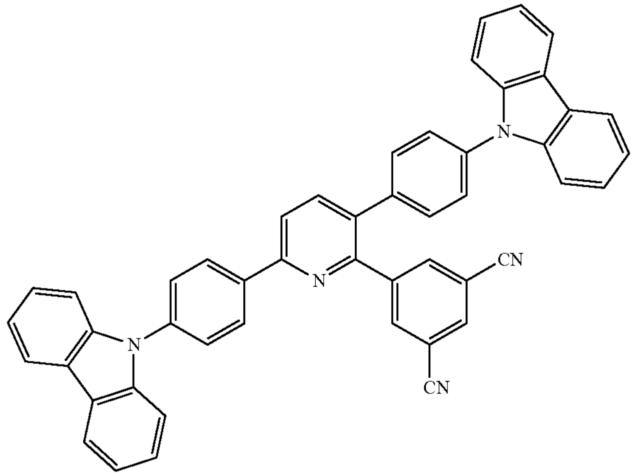
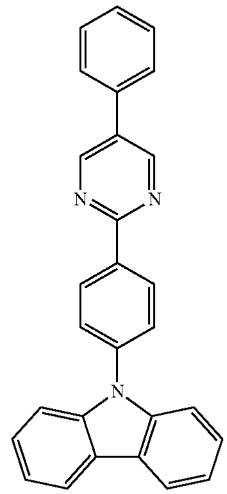
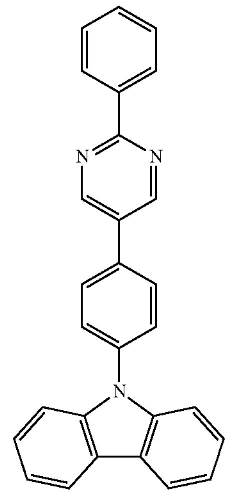
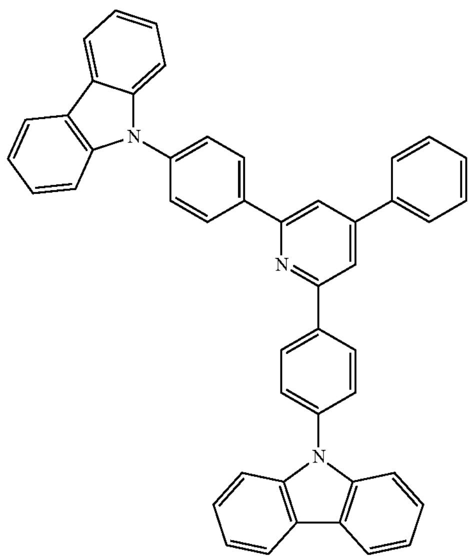
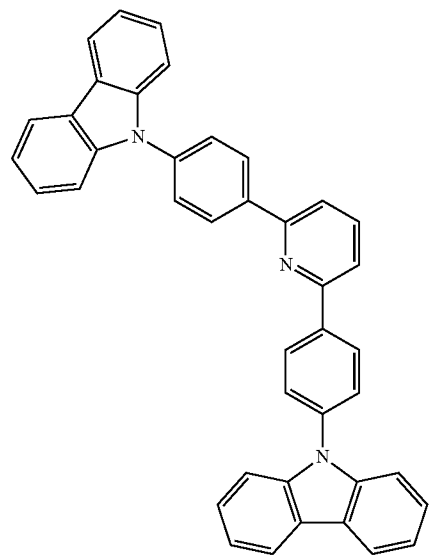
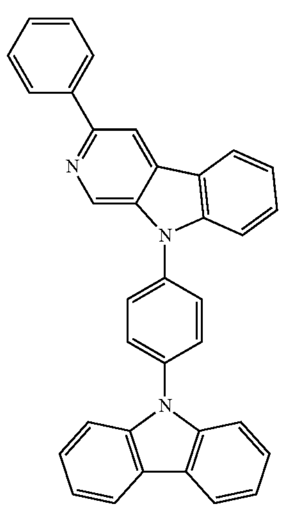
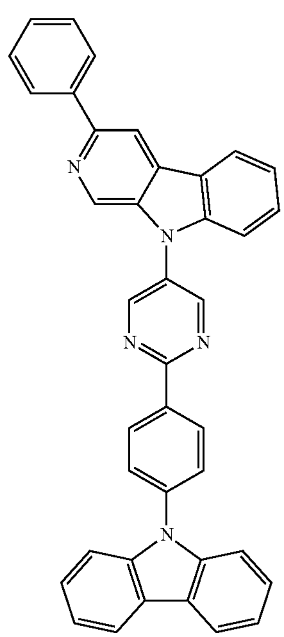
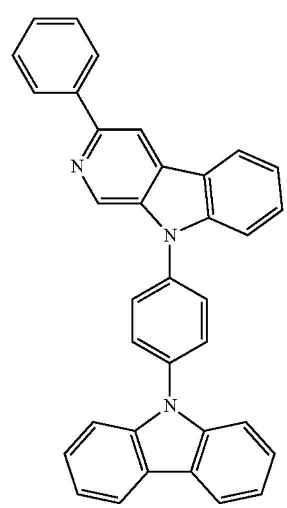
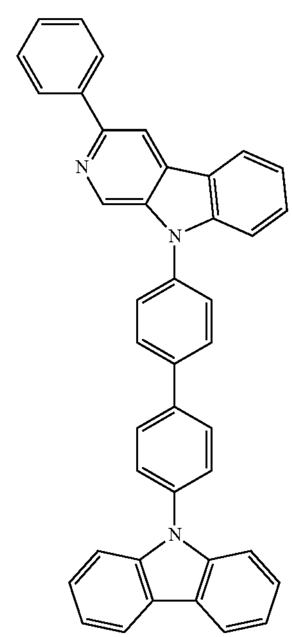

-continued
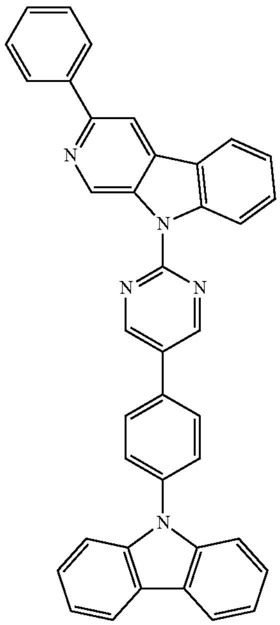
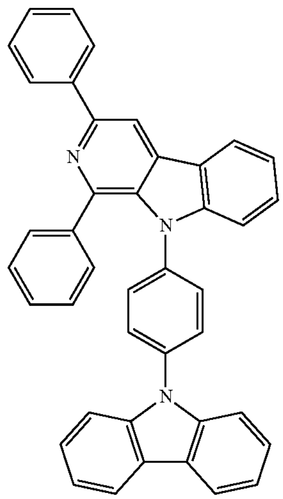
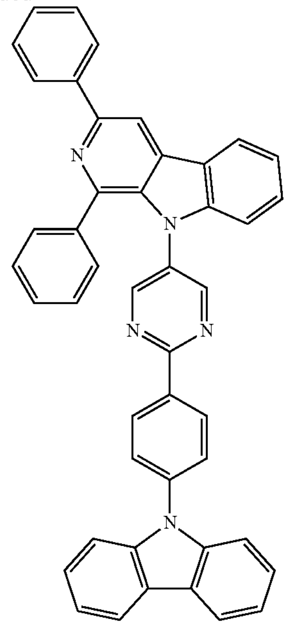
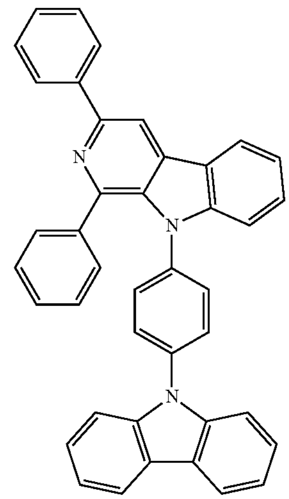
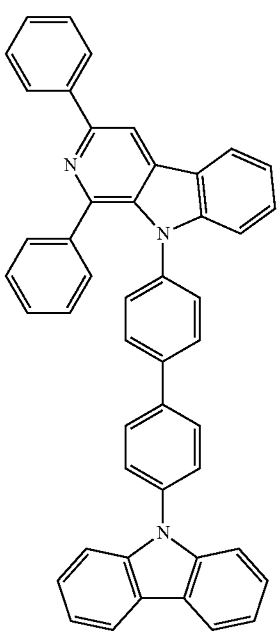
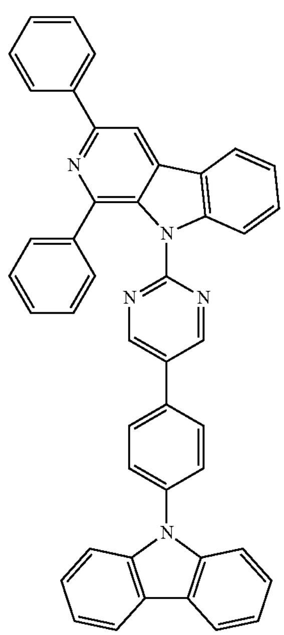
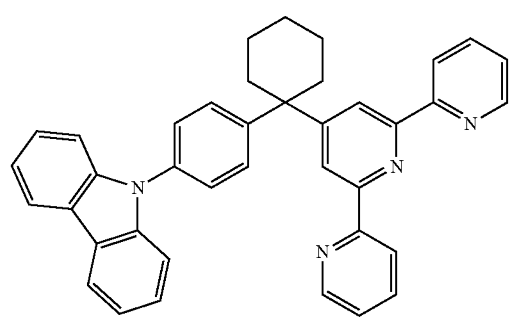

-continued
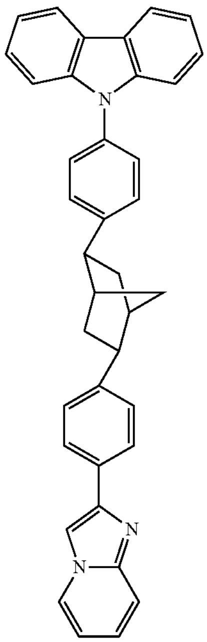
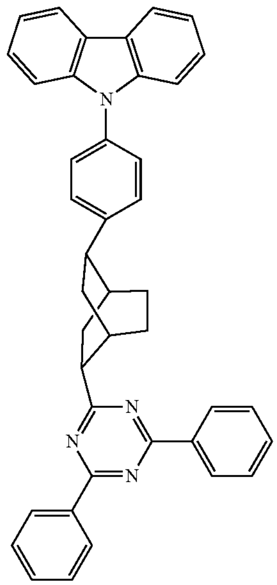
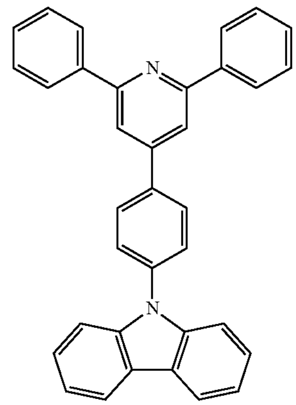
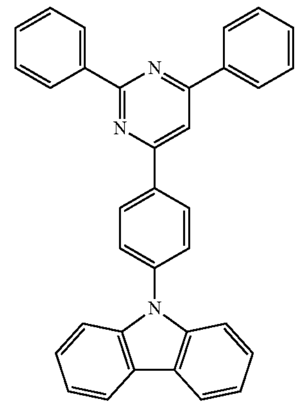
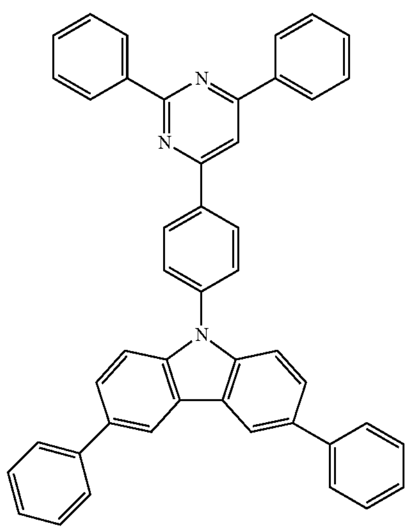
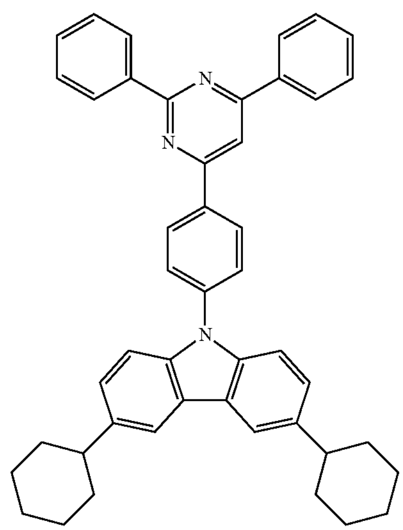
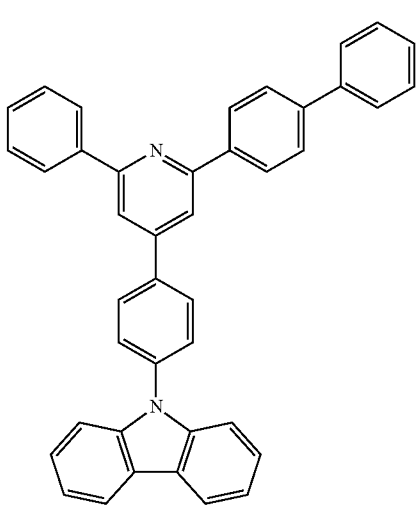
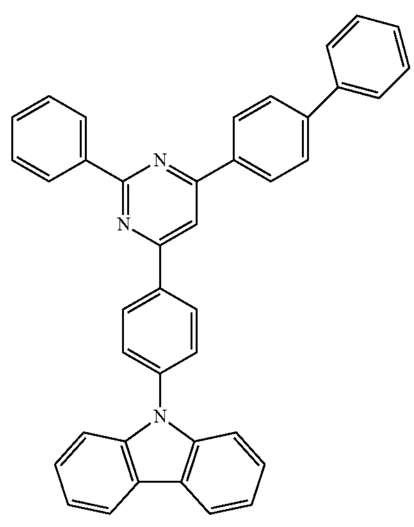

-continued
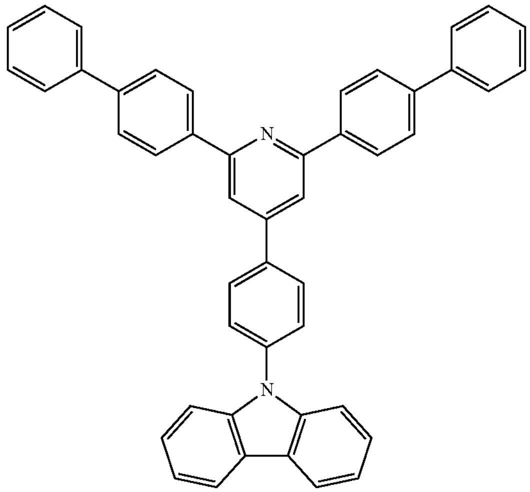
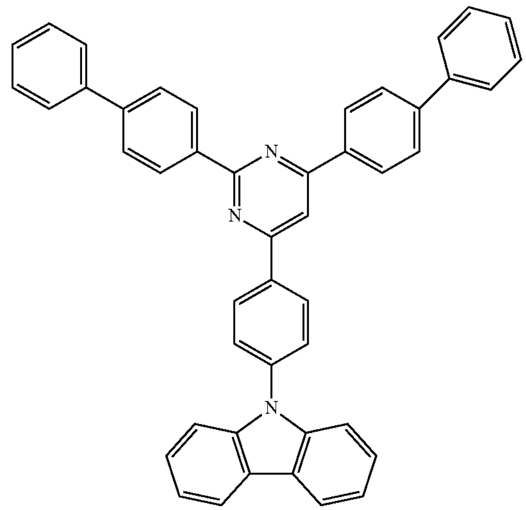
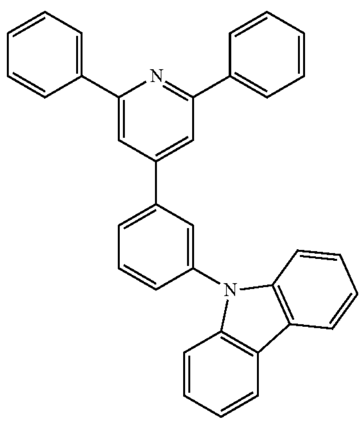
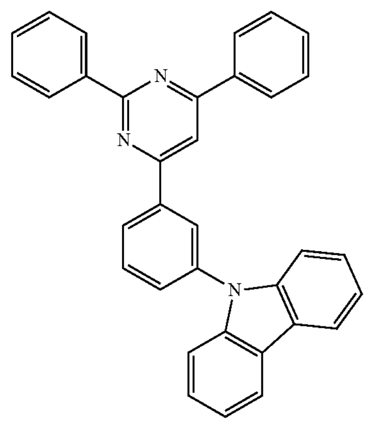
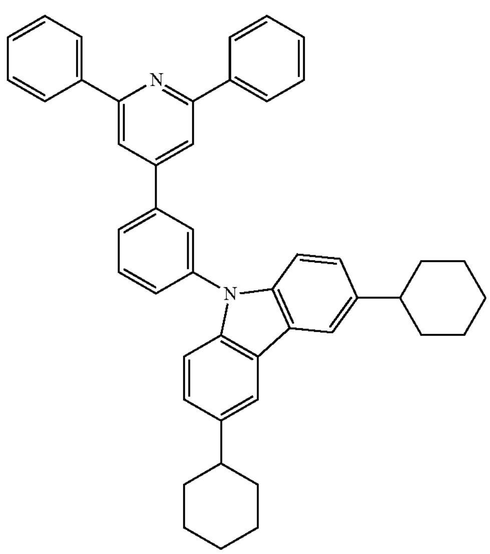
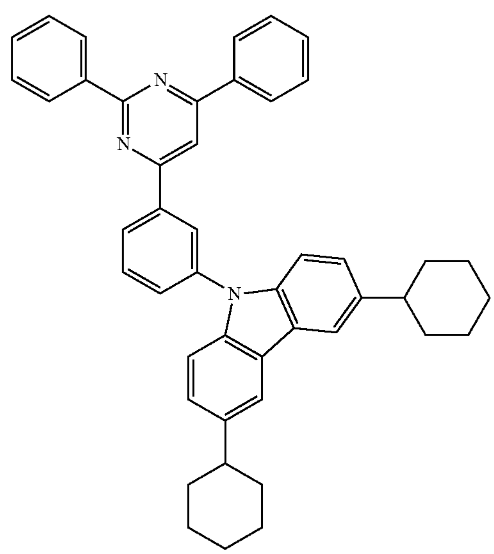

-continued
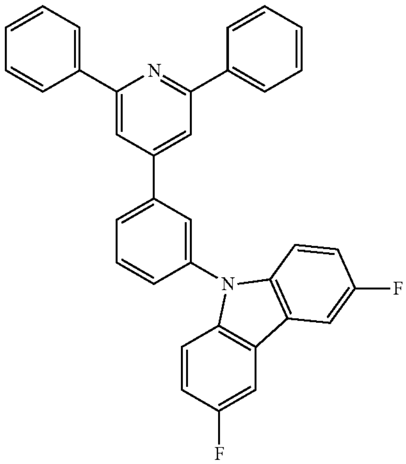
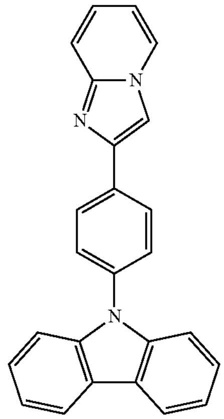
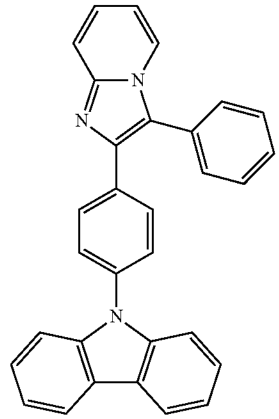
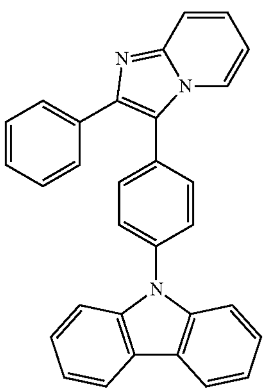
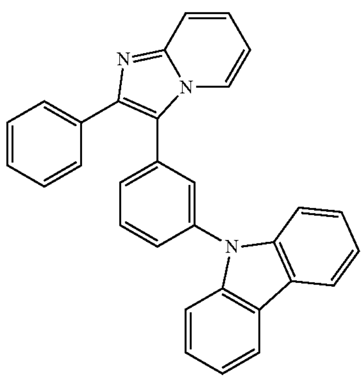
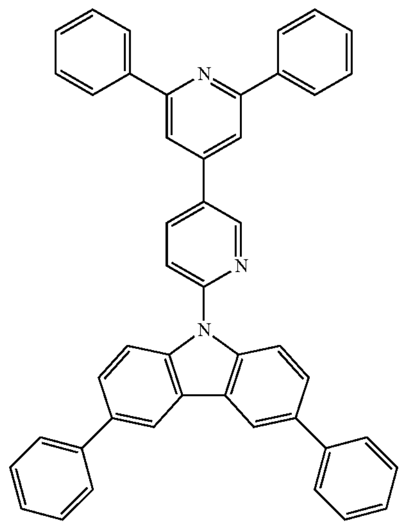
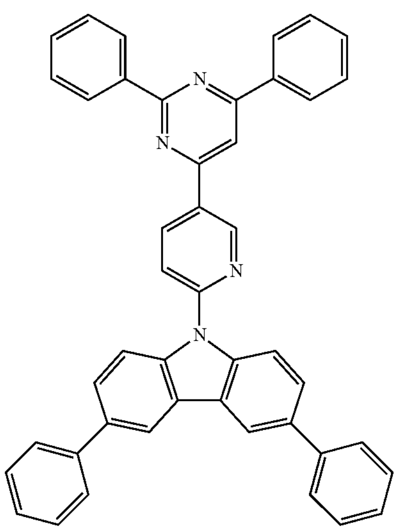
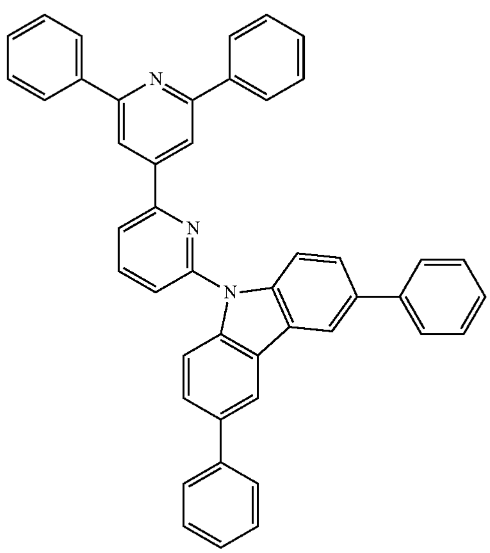

-continued
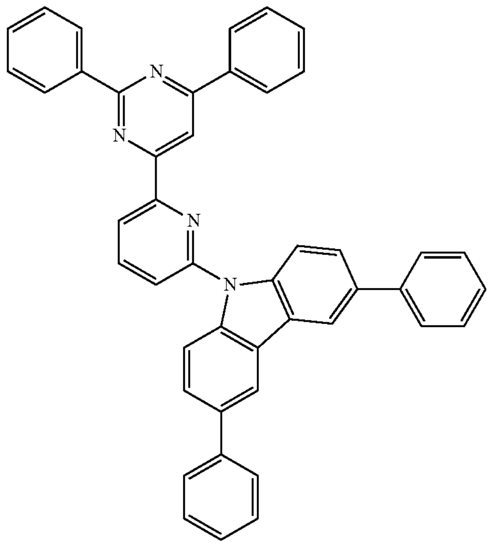
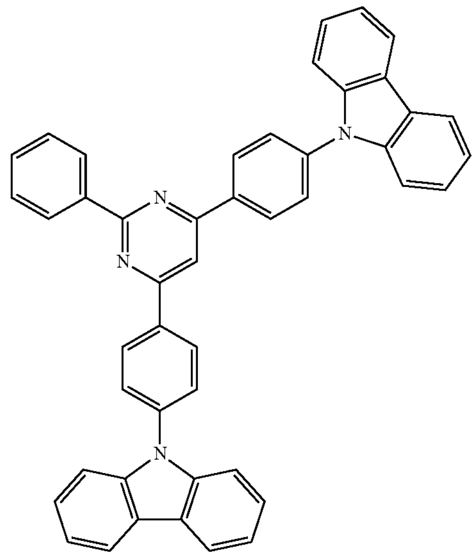
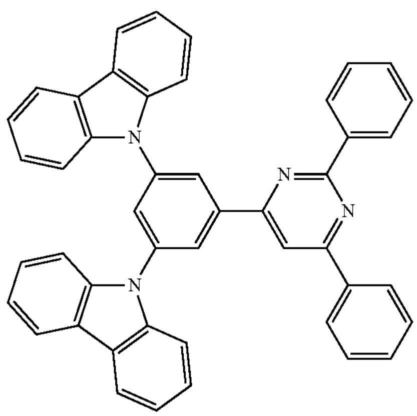
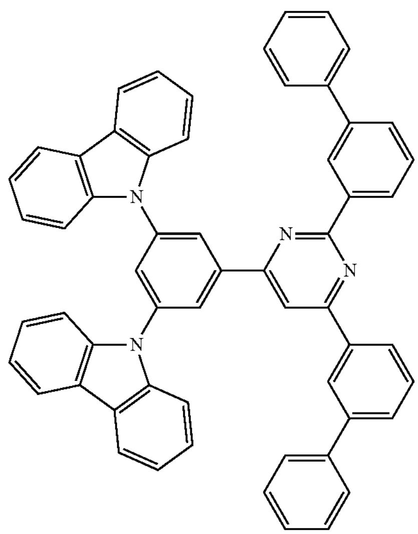
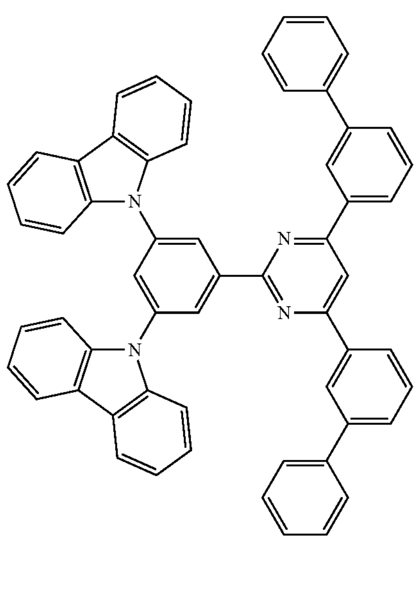
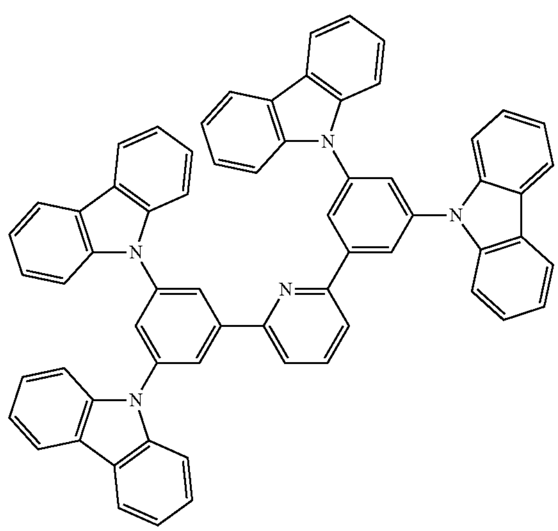

-continued
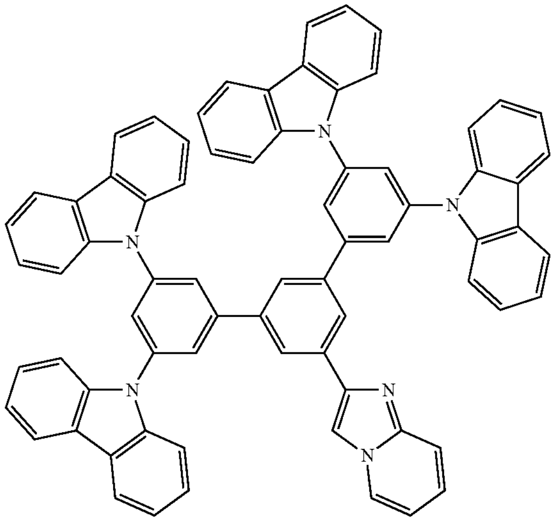
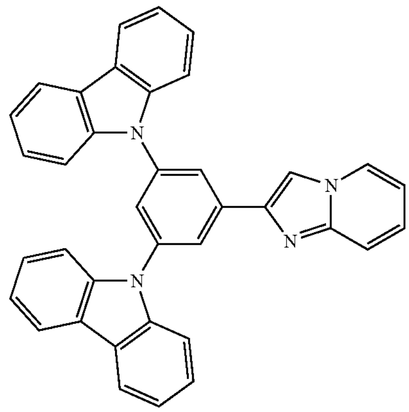
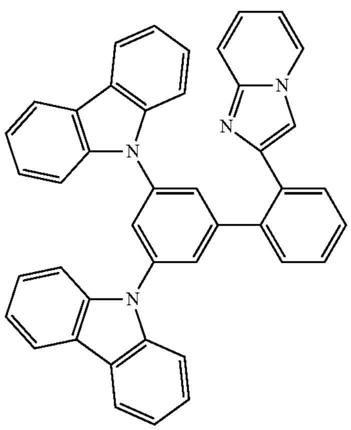
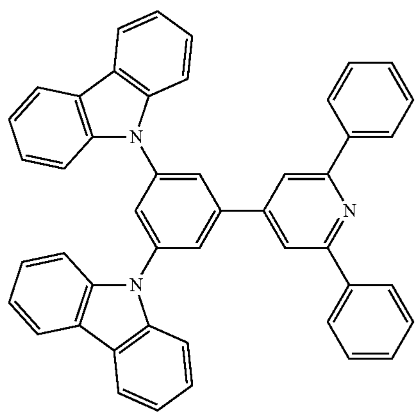
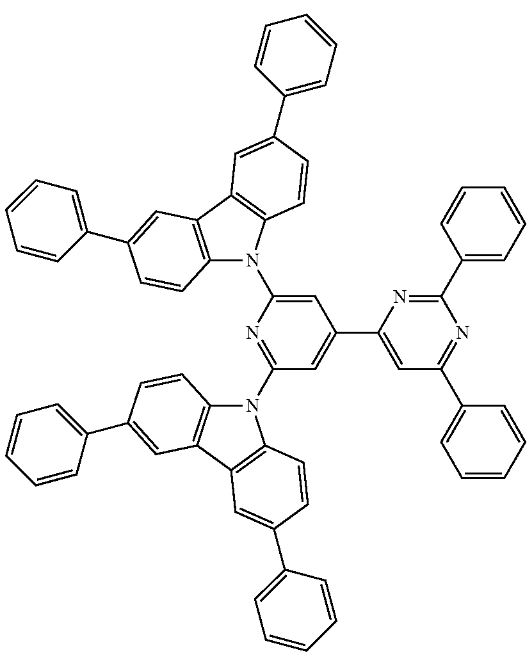
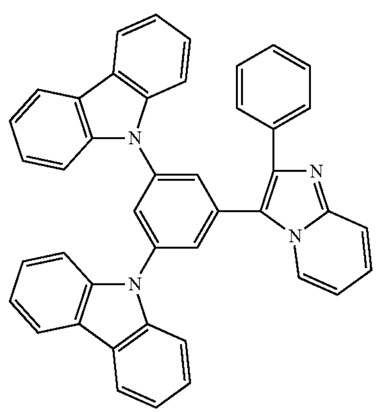

-continued
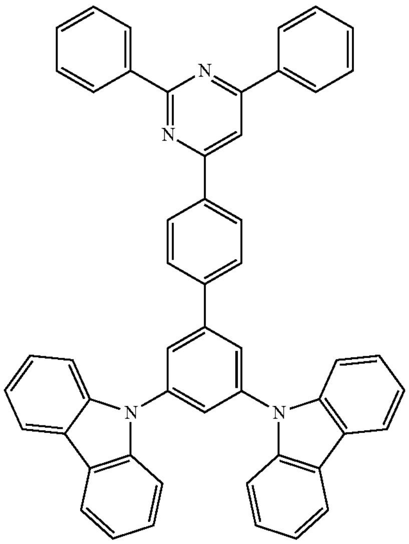
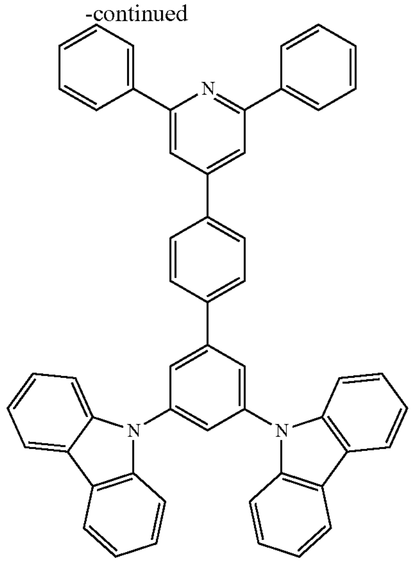
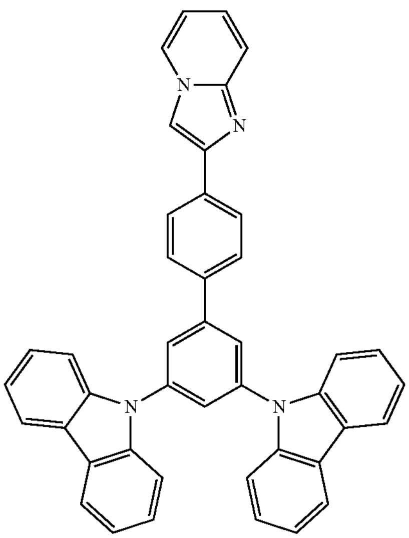
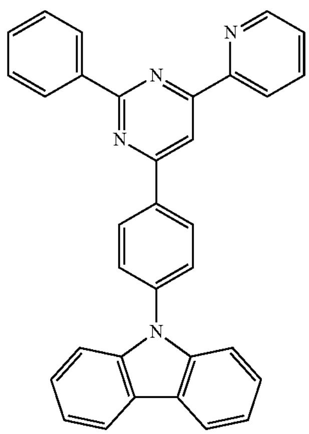
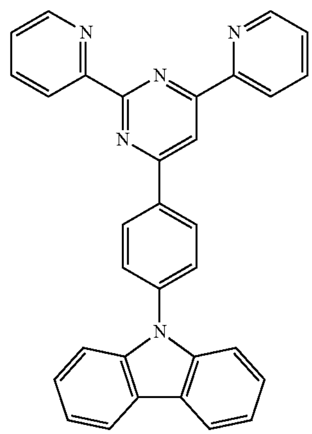
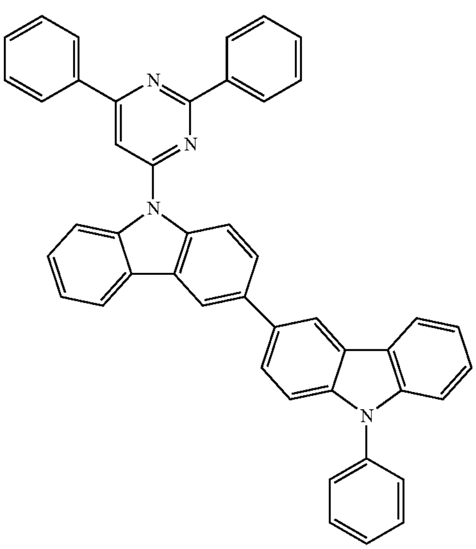
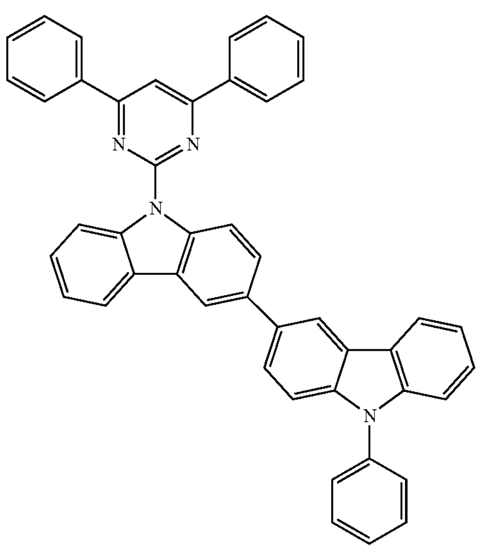

-continued
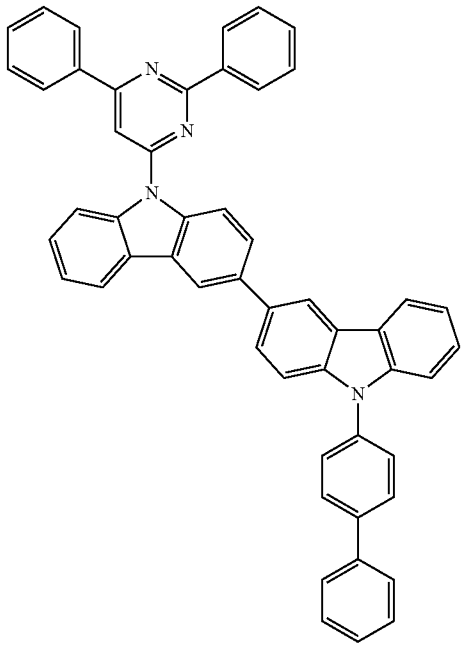
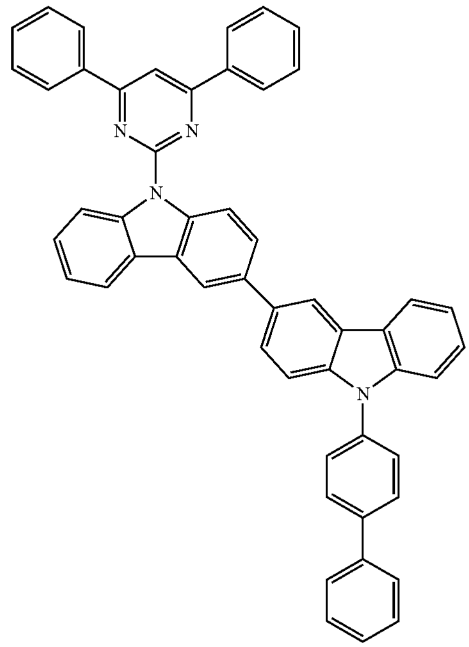
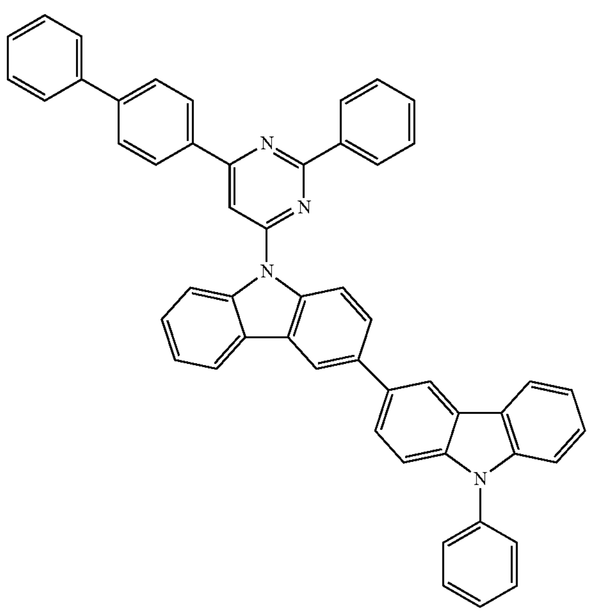

-continued
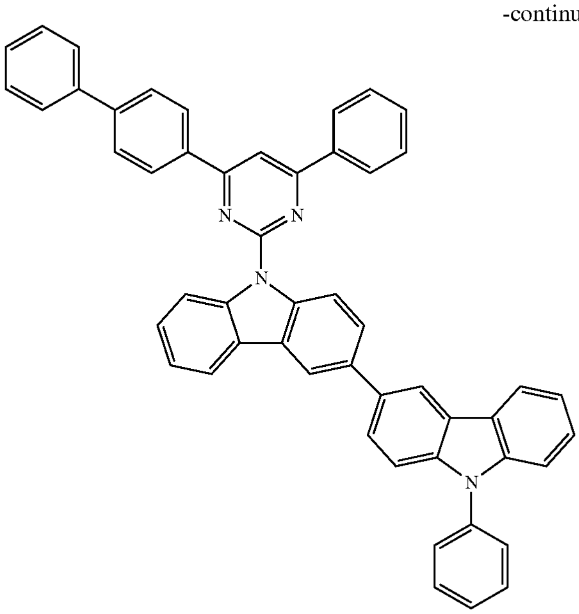
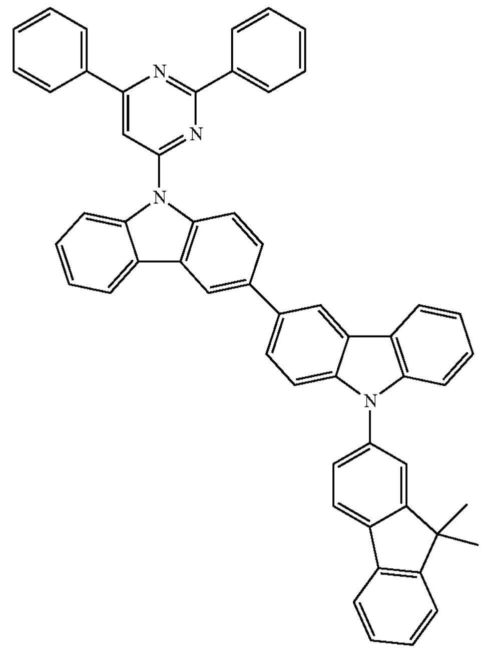
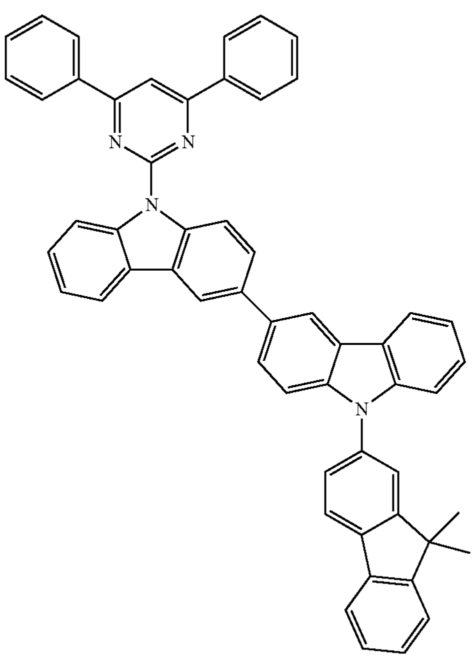
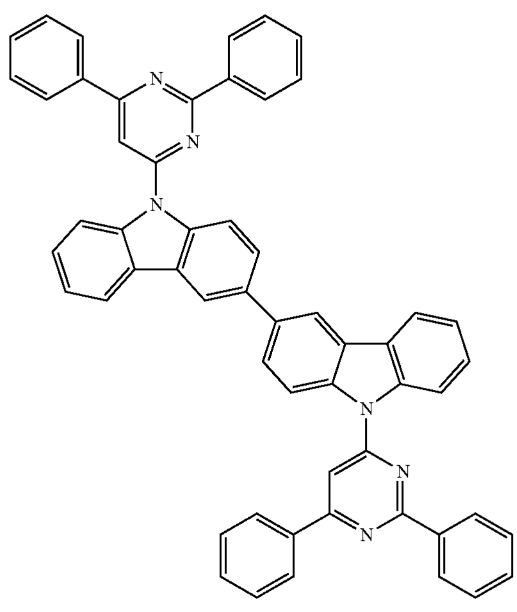

-continued
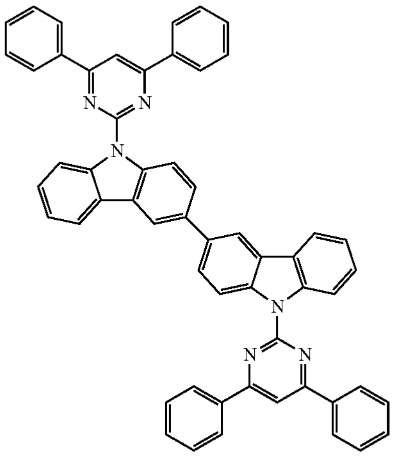
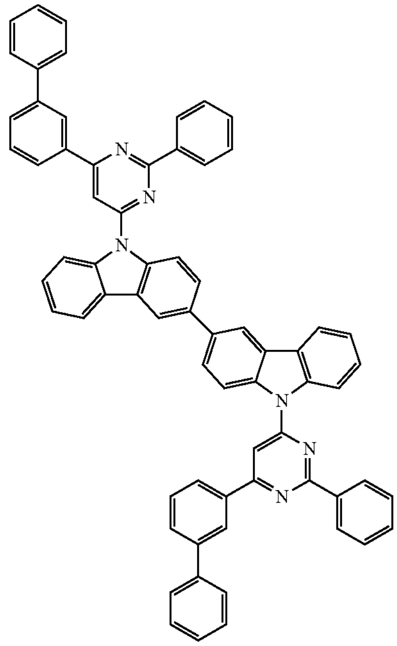
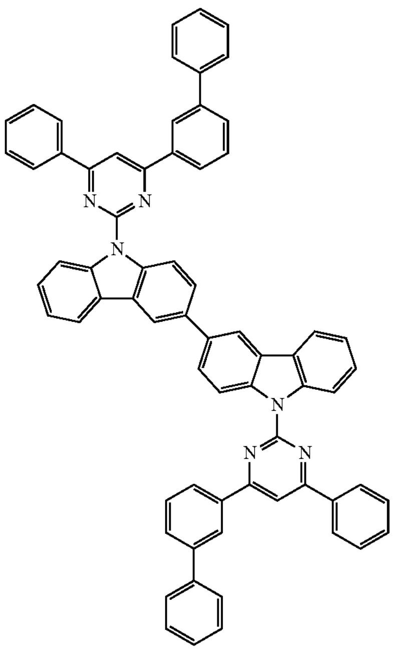
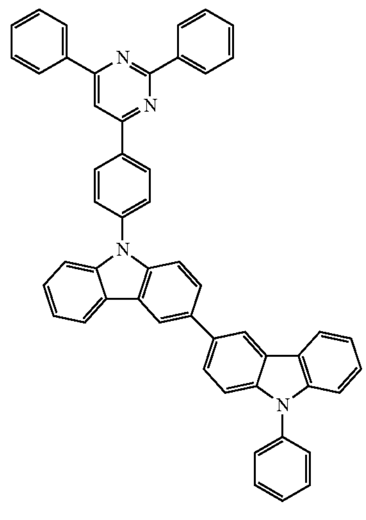
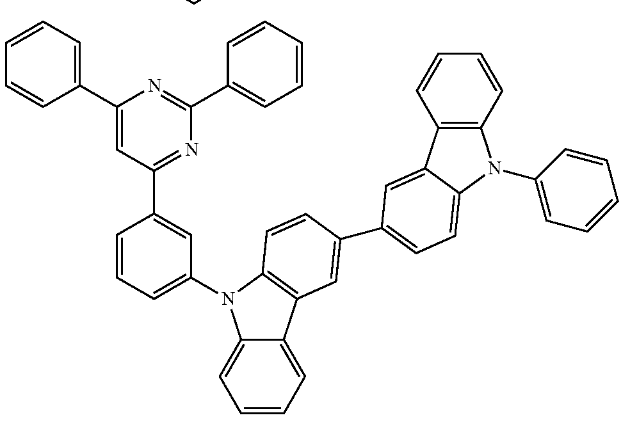

-continued
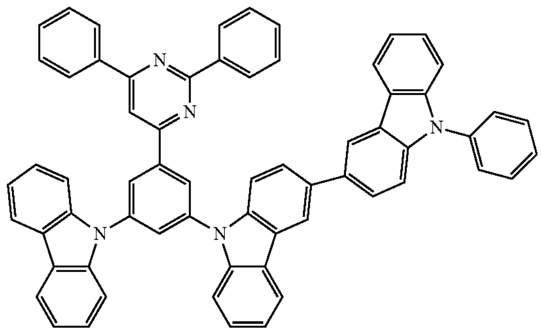
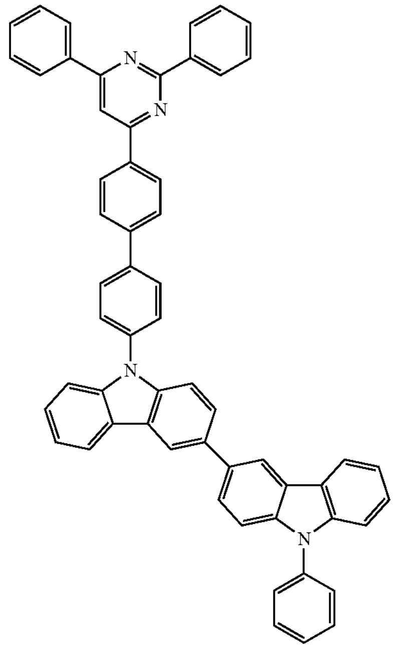
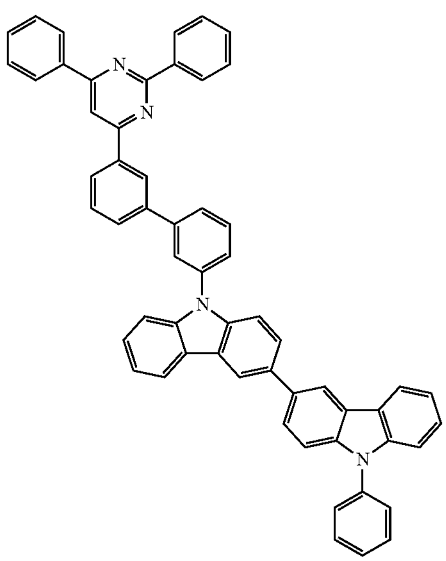
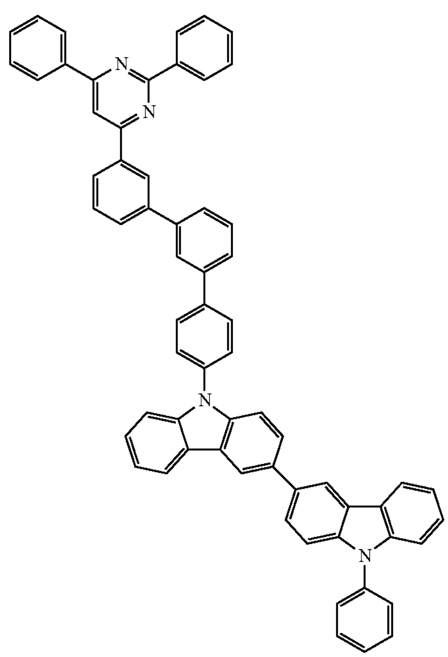

-continued
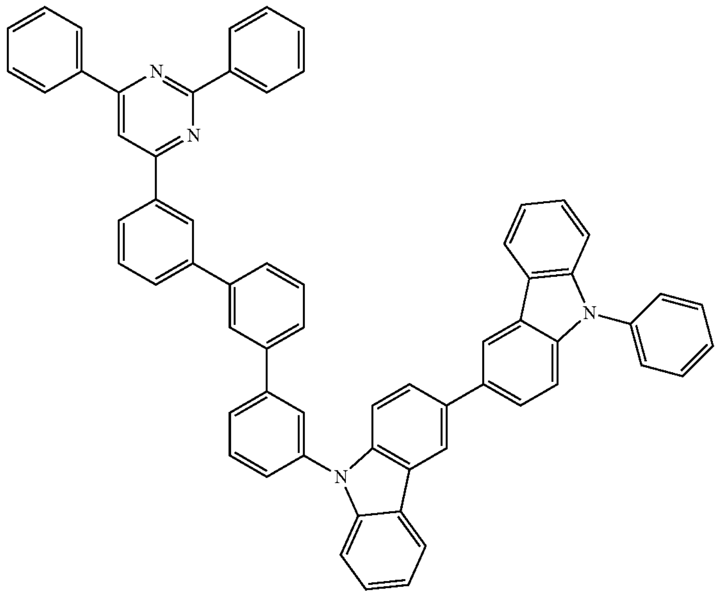
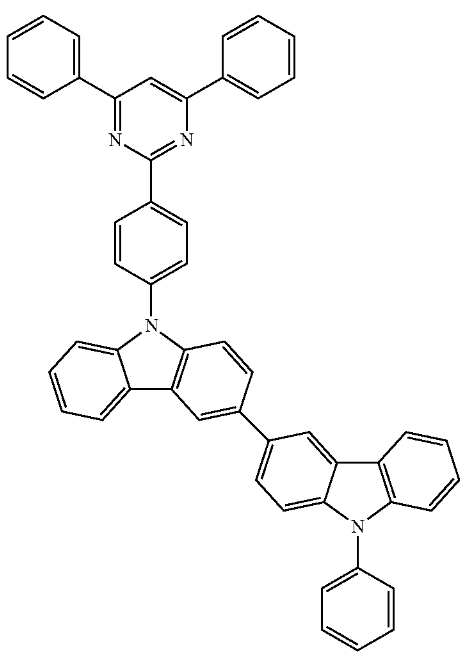
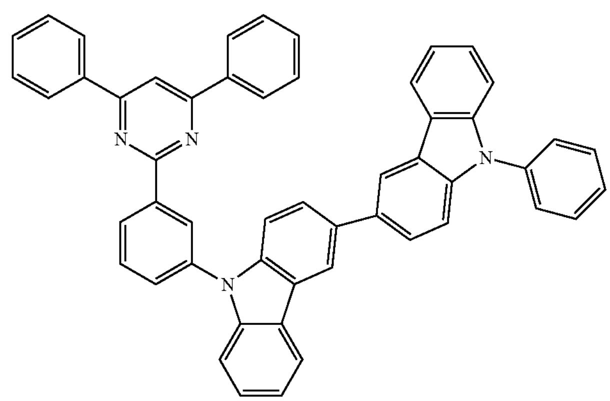

-continued
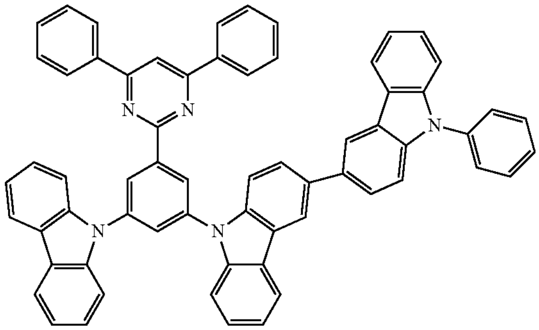
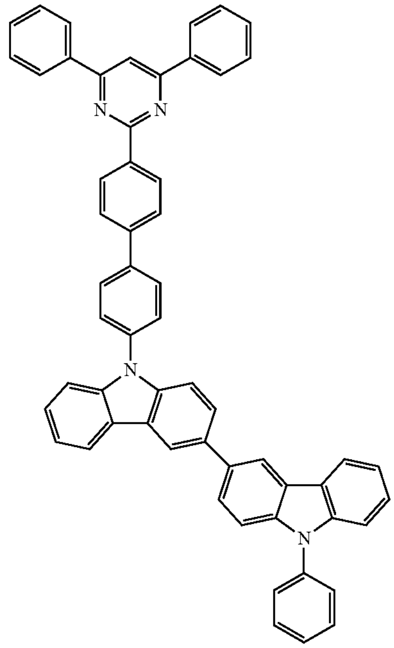
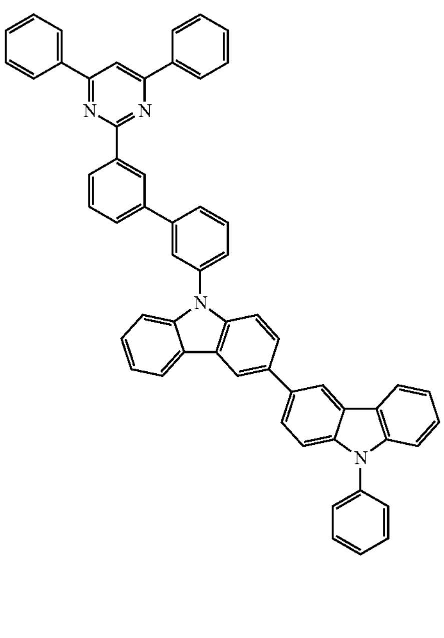
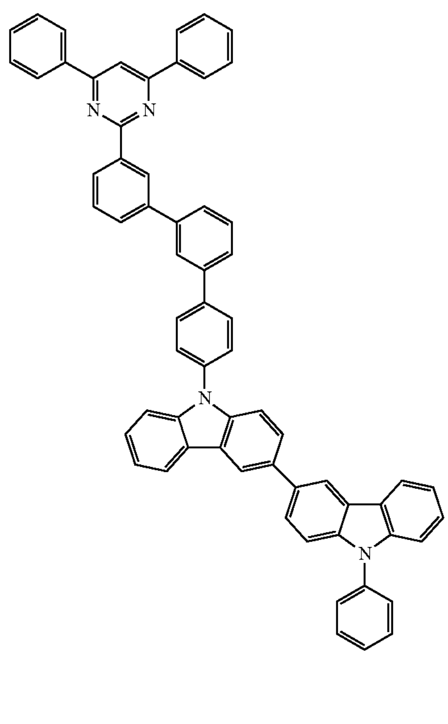

-continued
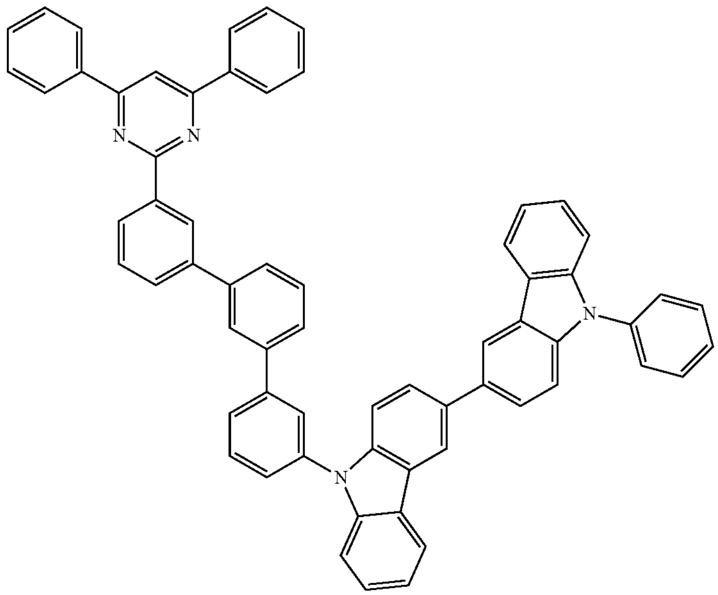
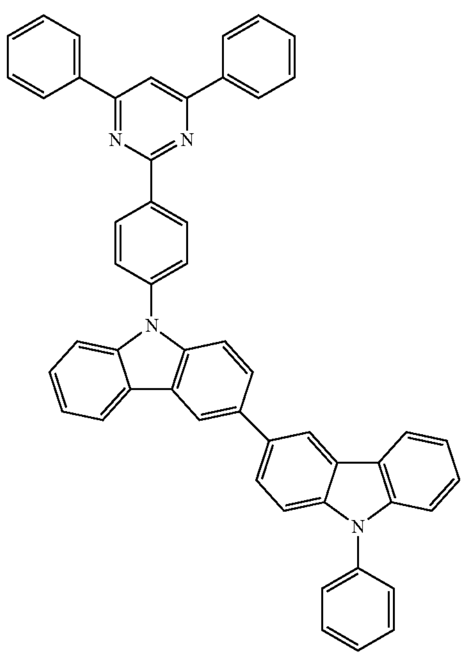
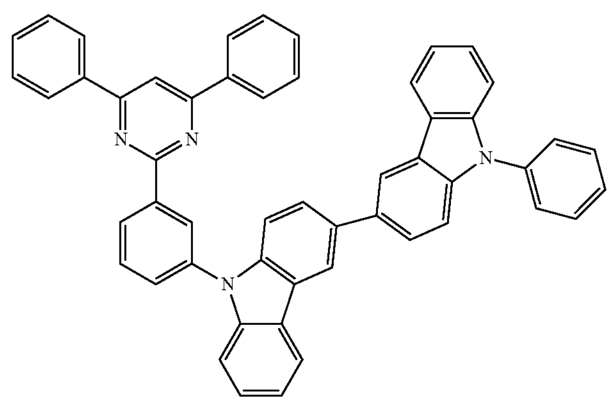

-continued
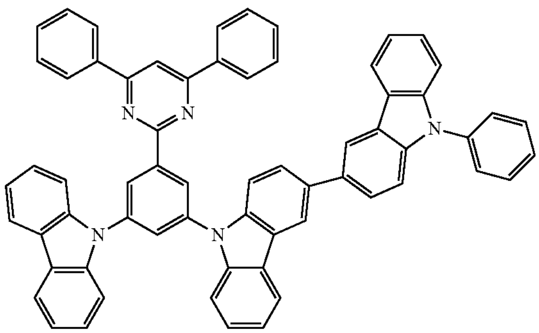
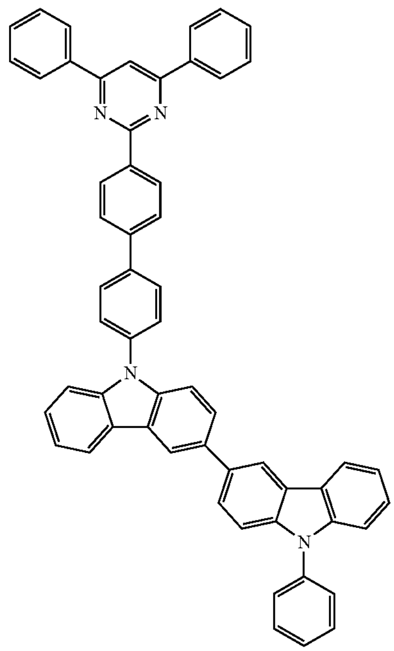
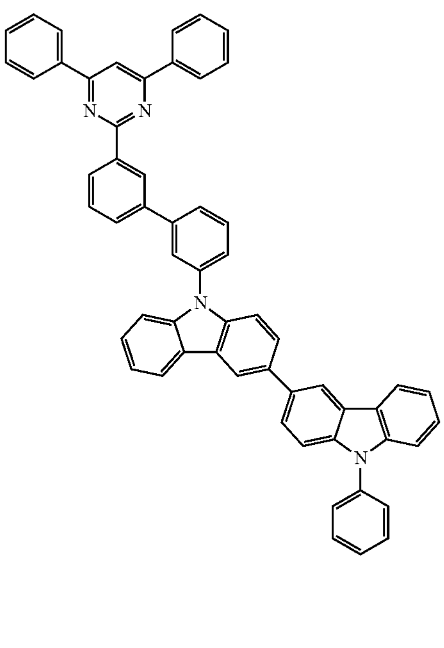
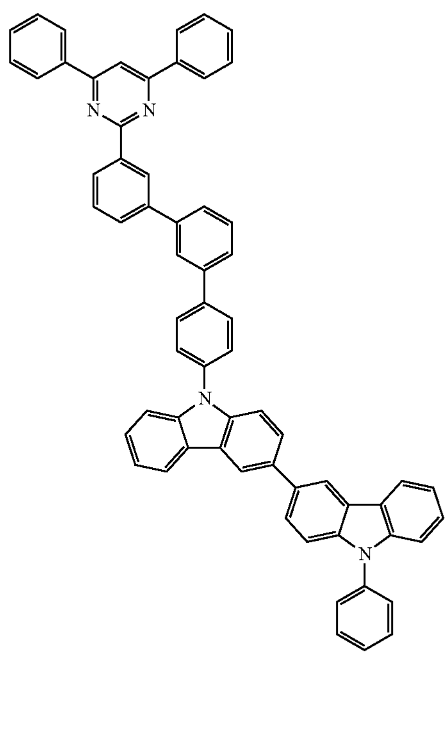

-continued
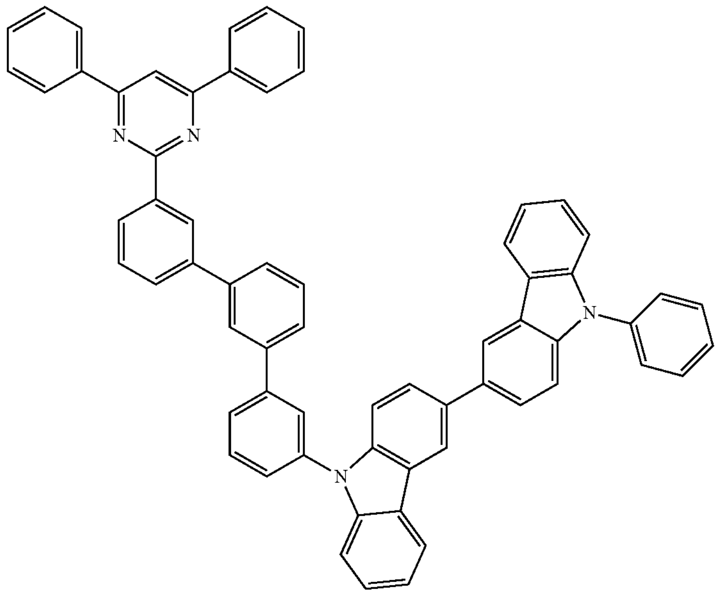
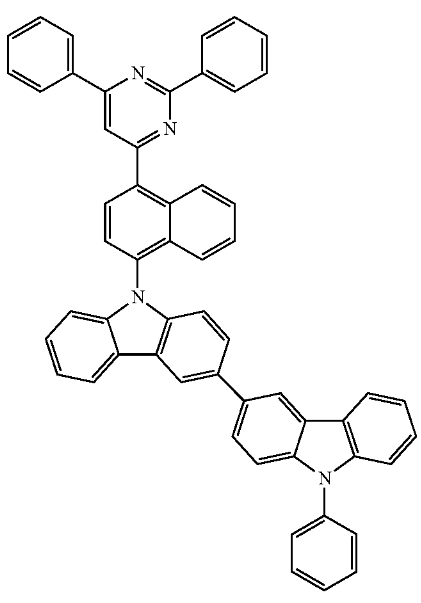
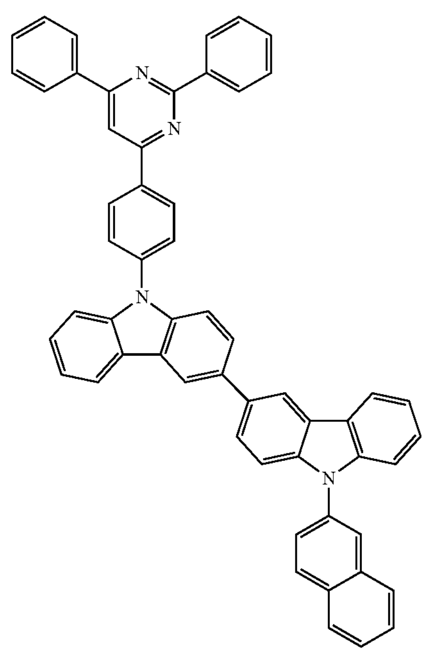

-continued
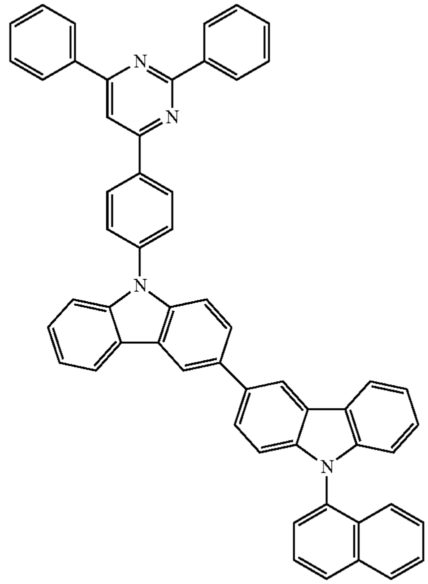
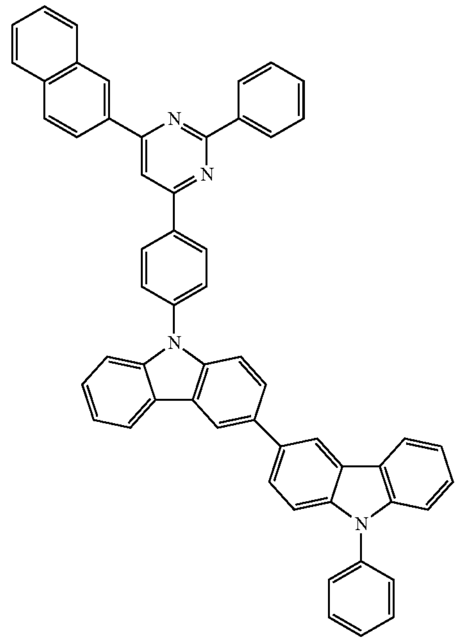
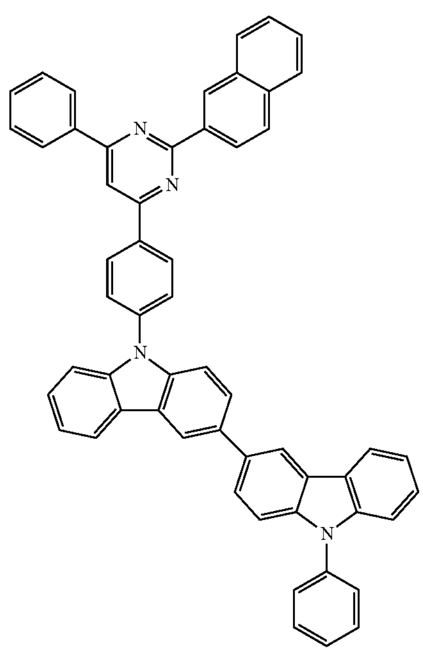
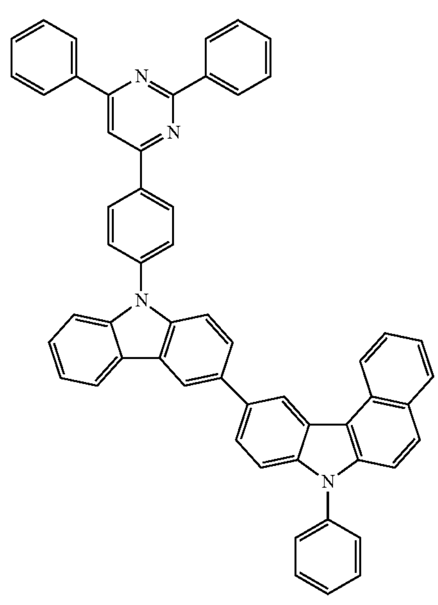

-continued
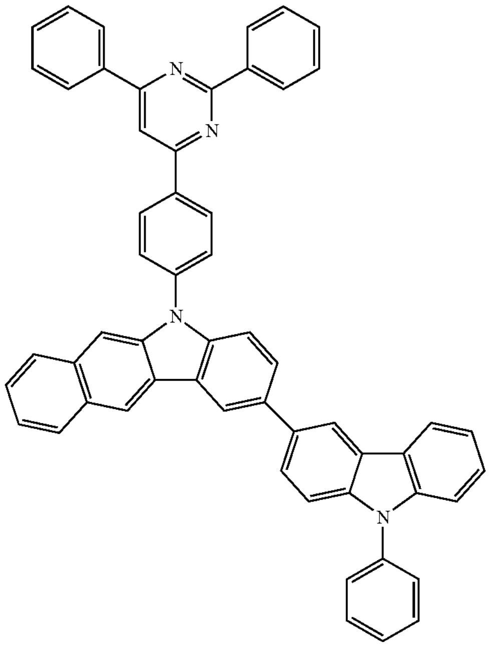
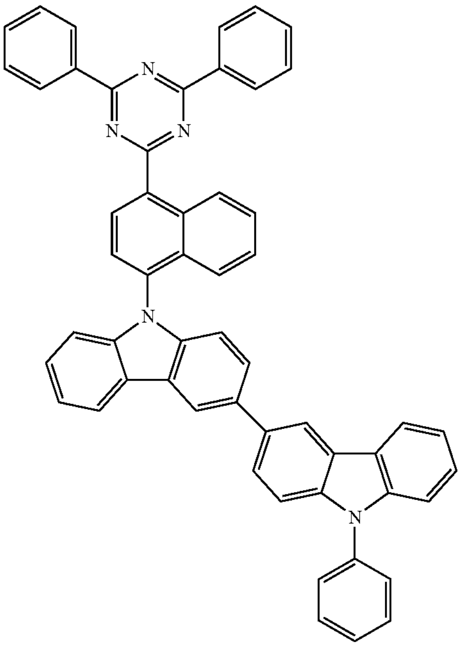
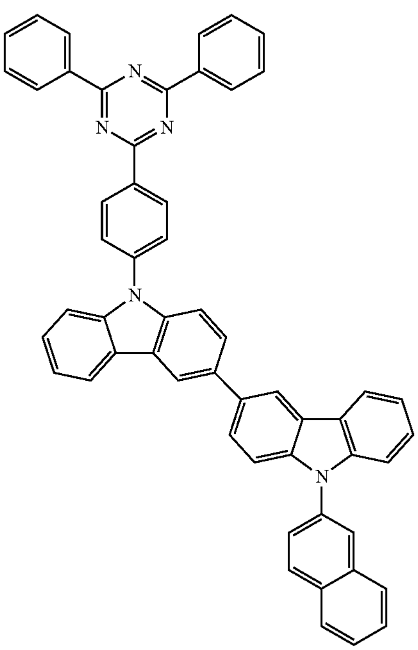
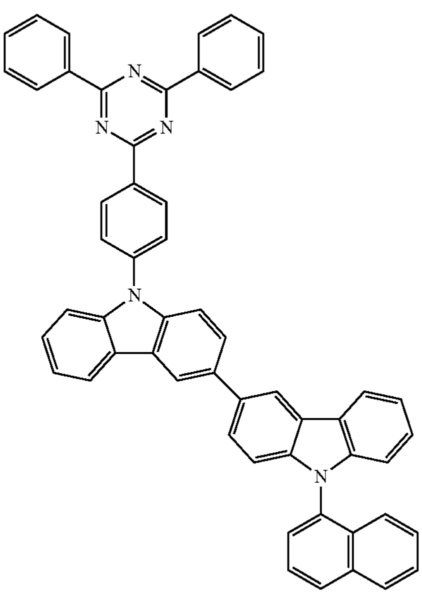

-continued
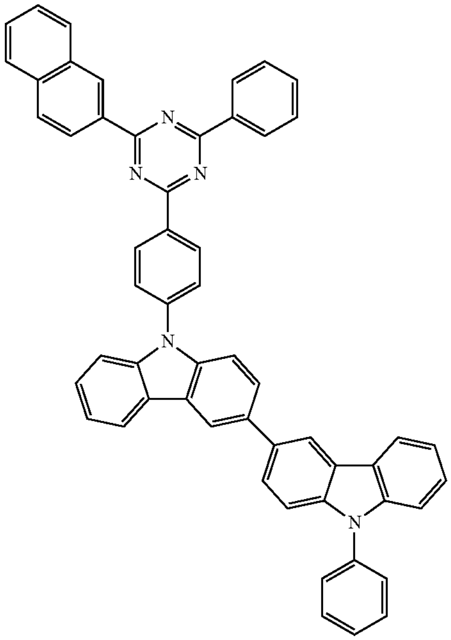
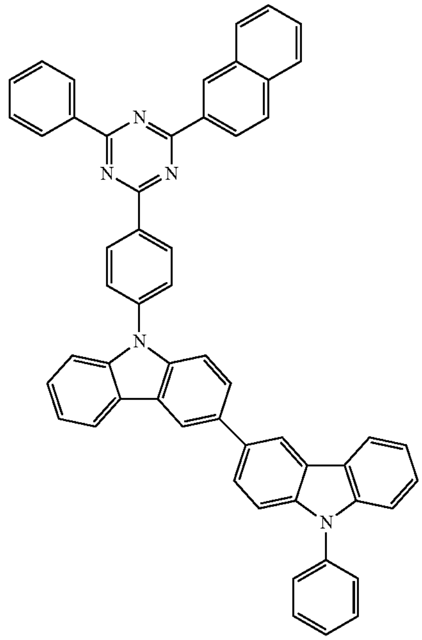
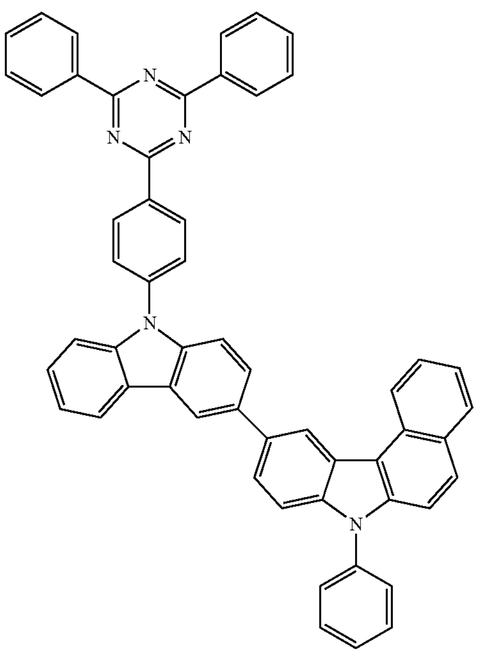
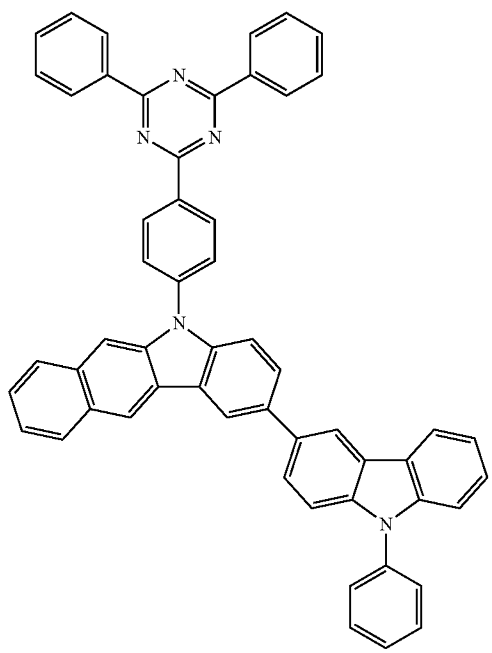
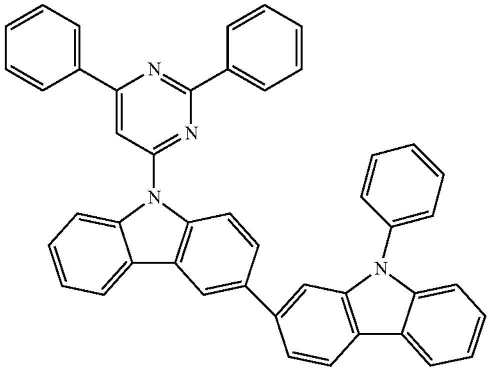
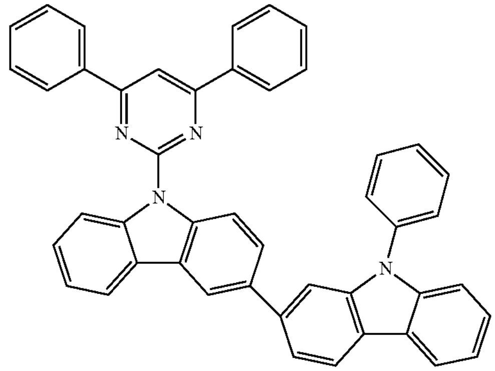

-continued
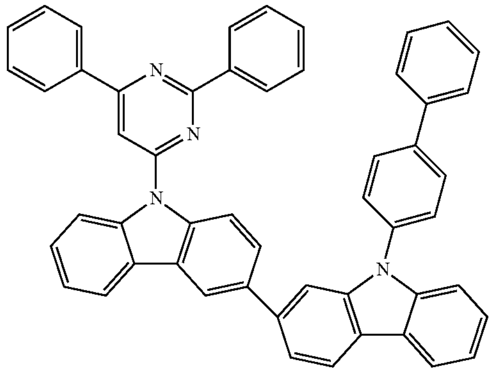
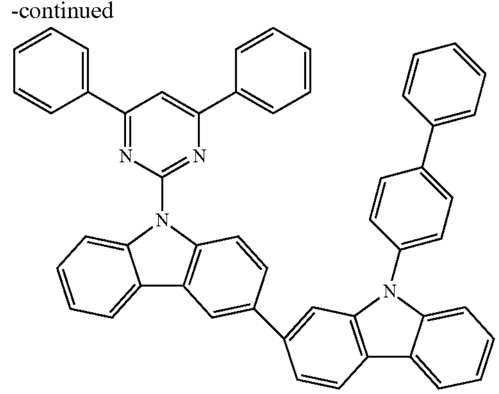
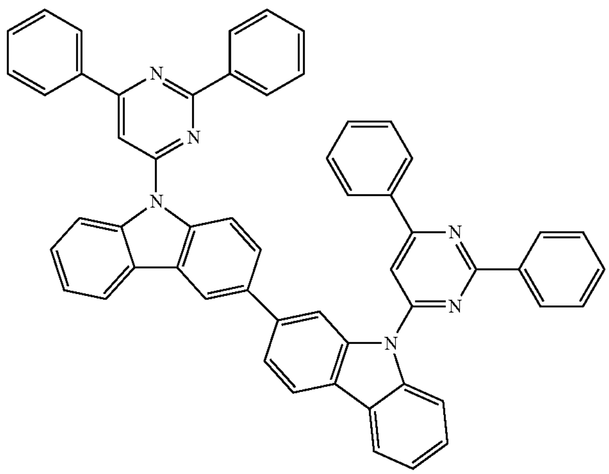
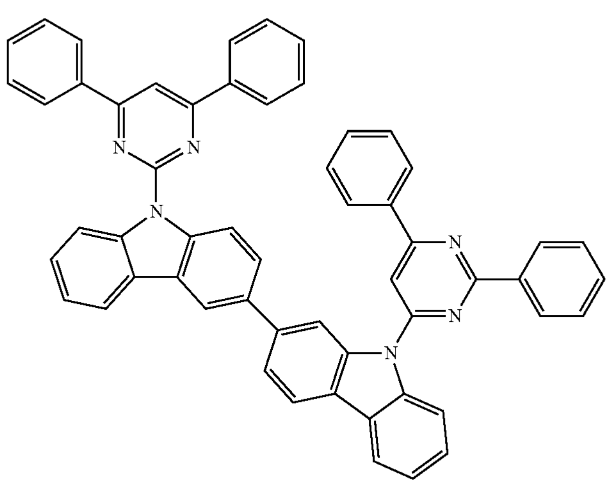
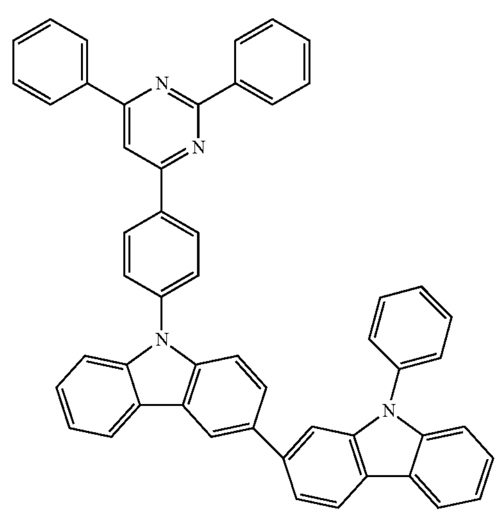

-continued
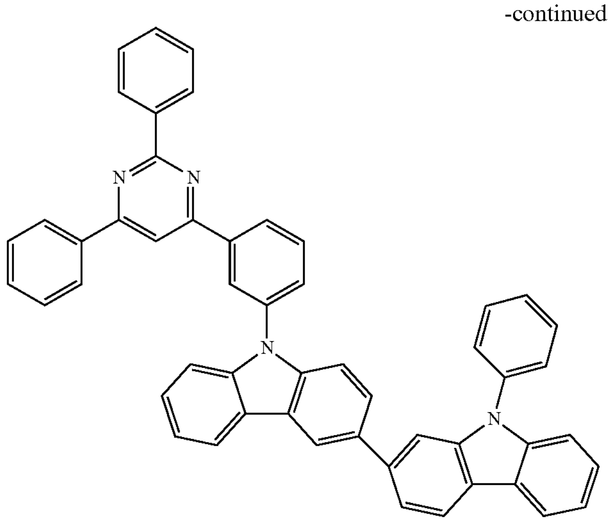
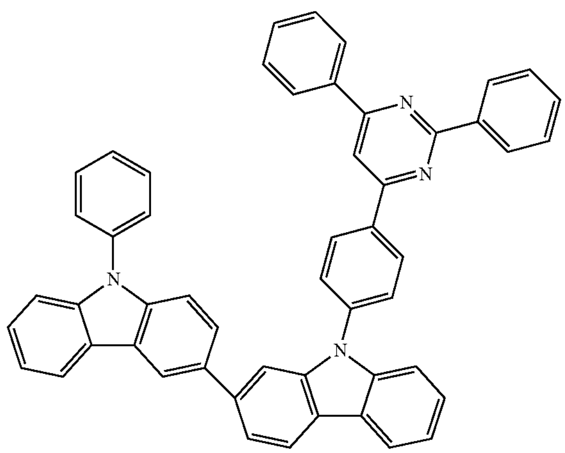
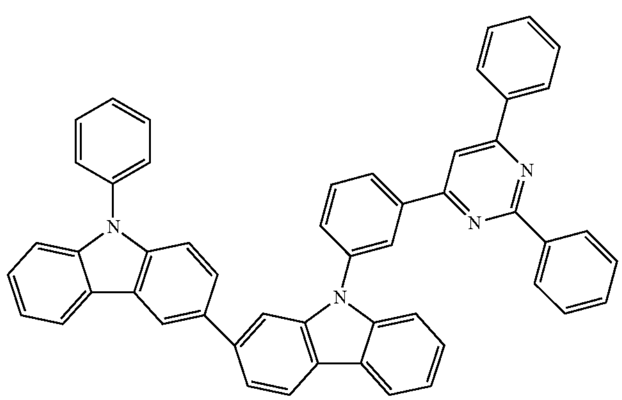
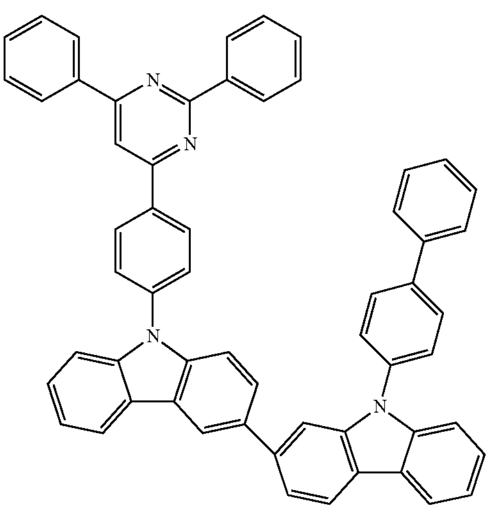

-continued
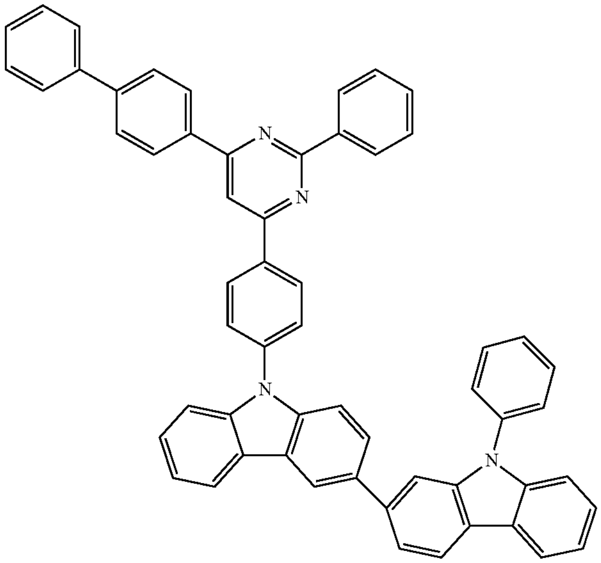
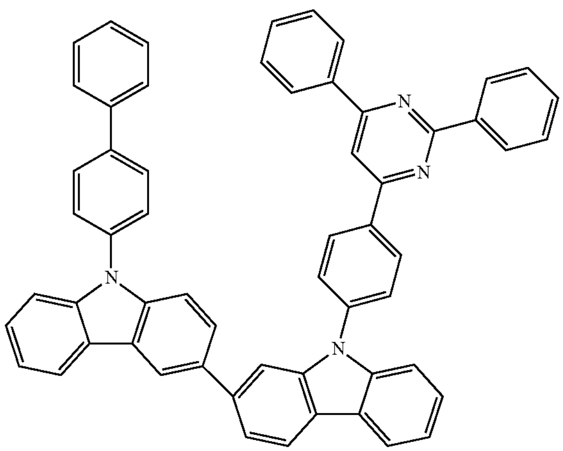
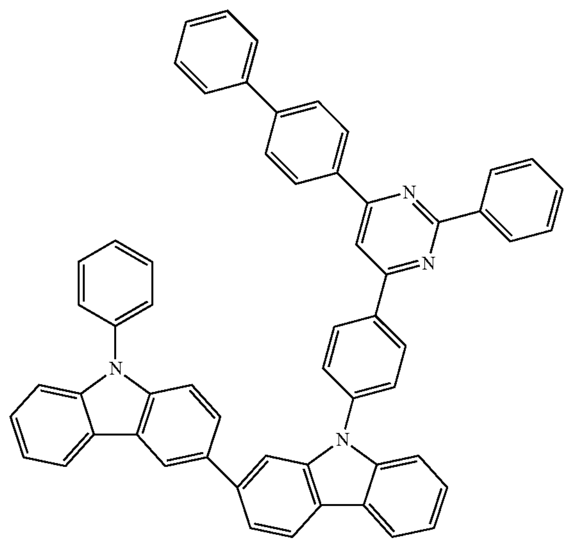
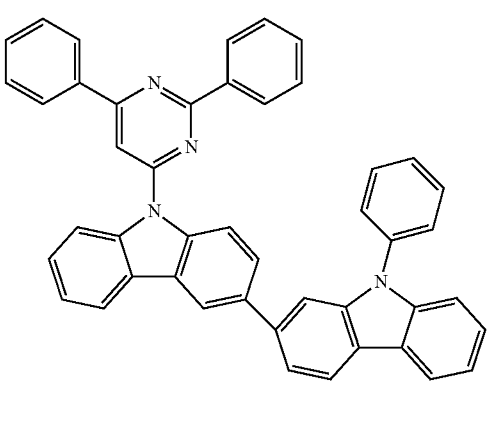
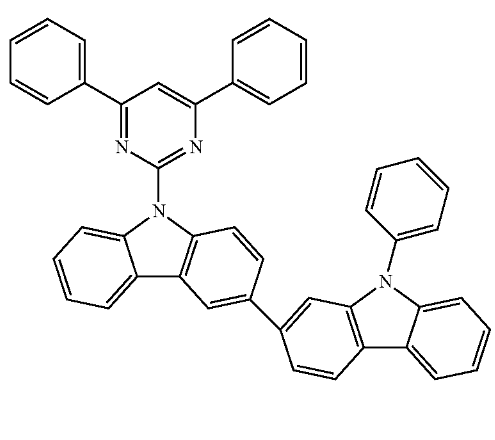

-continued
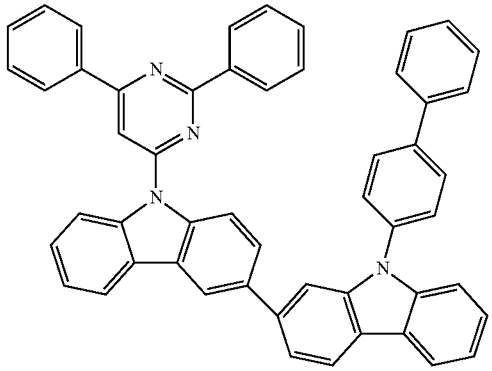
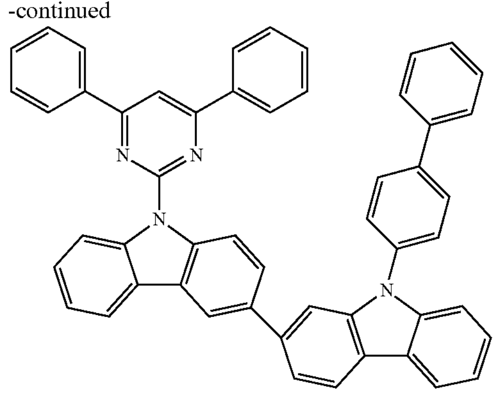
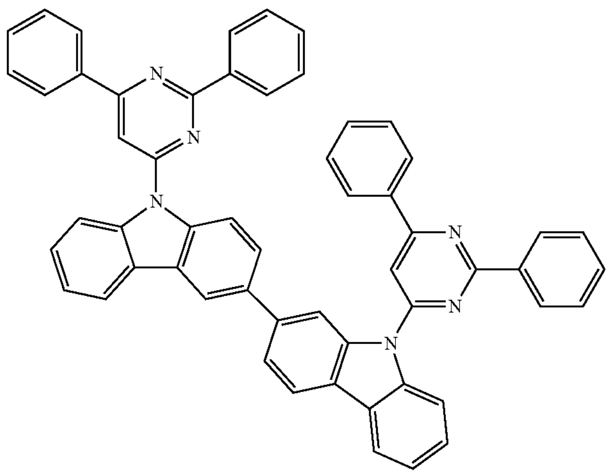
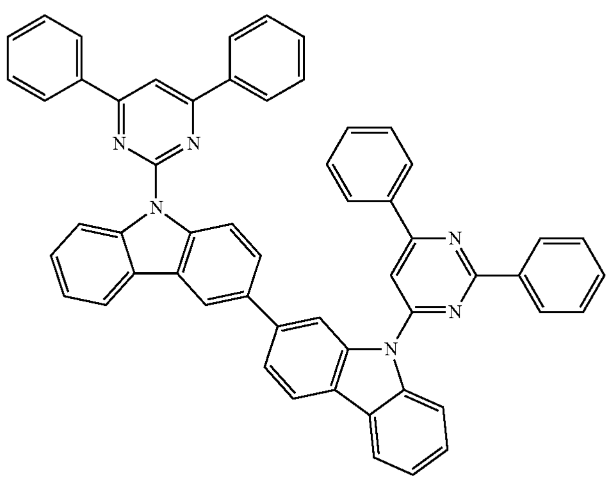
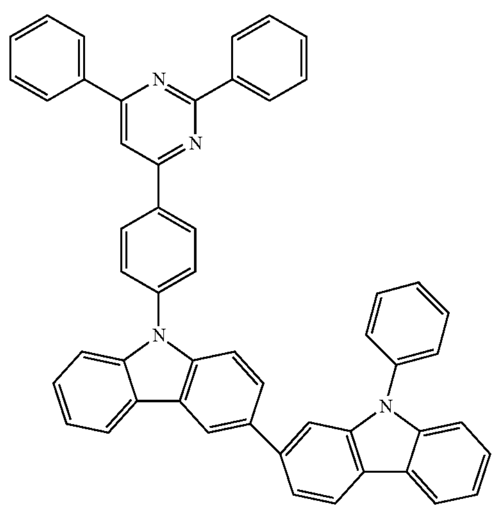

-continued
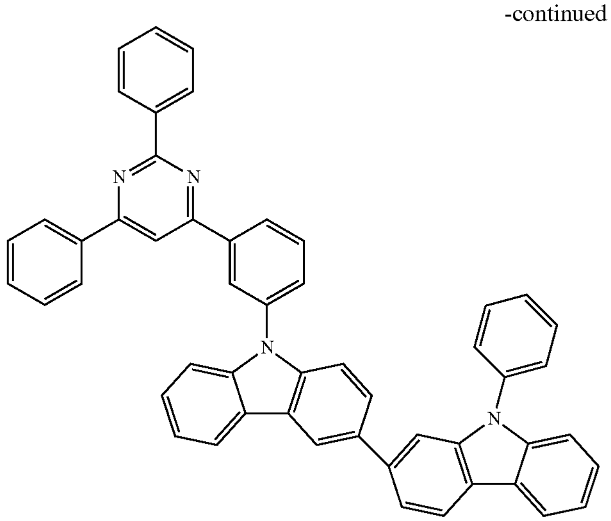
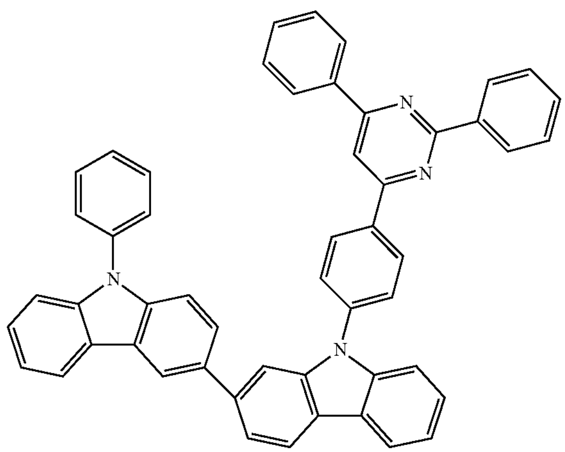
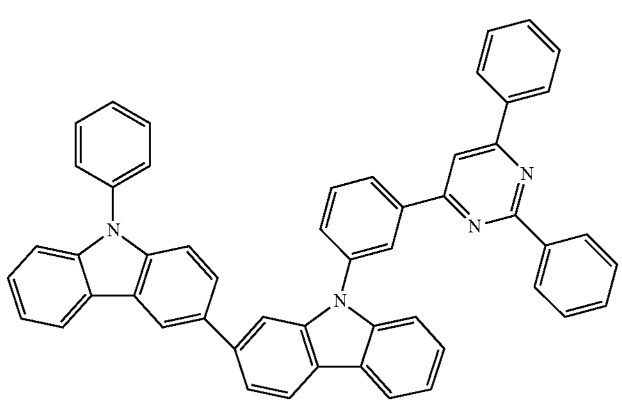
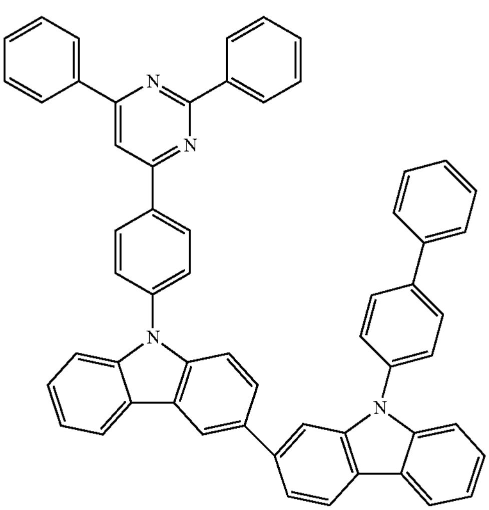

-continued
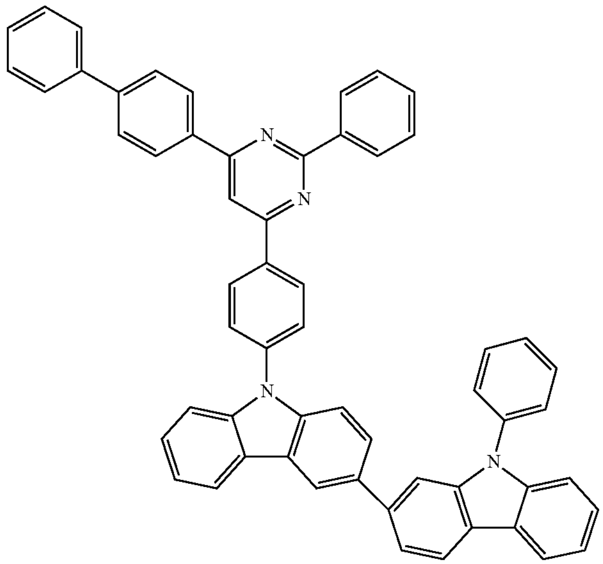
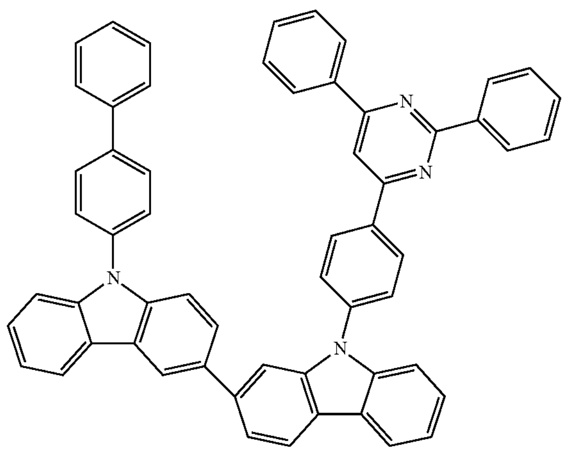
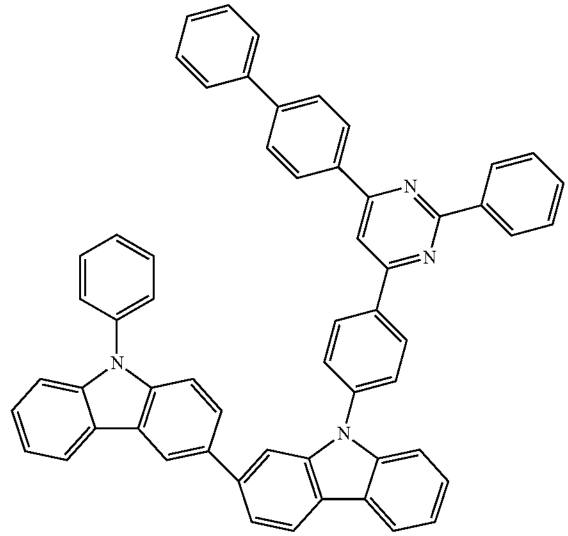
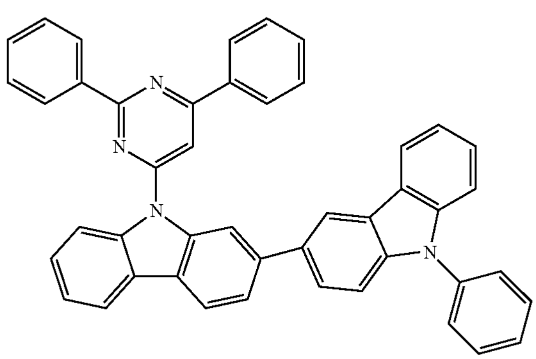
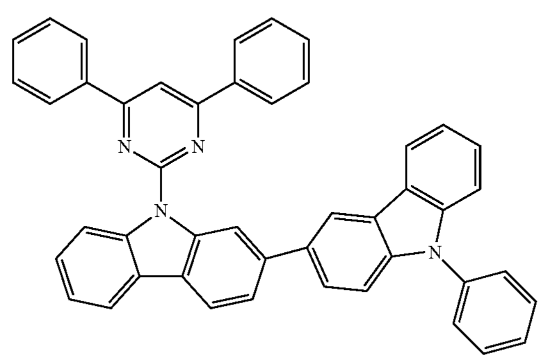

-continued
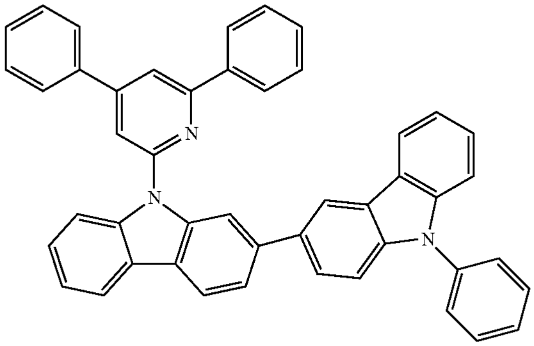
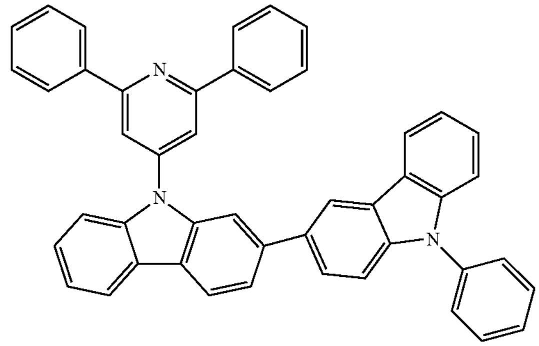
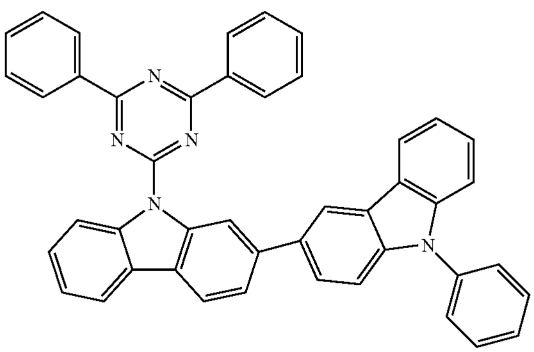
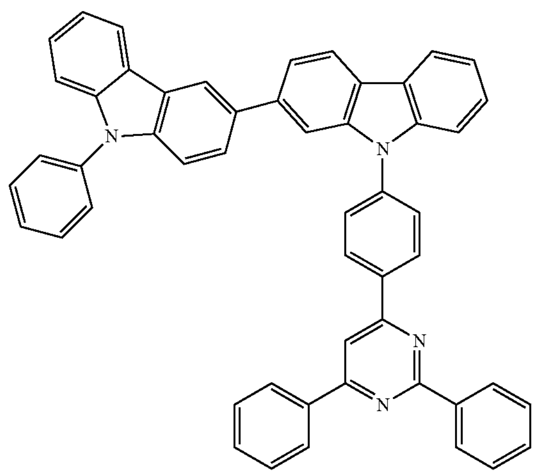
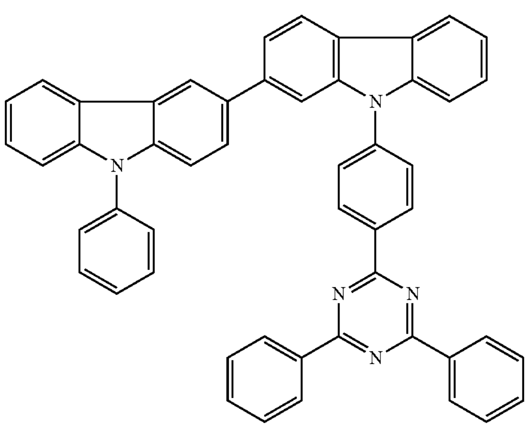

-continued
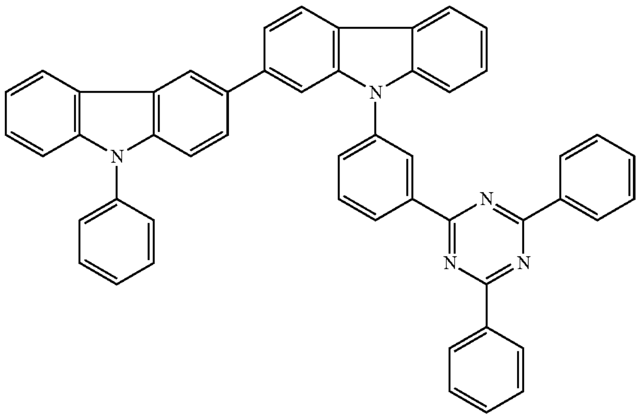
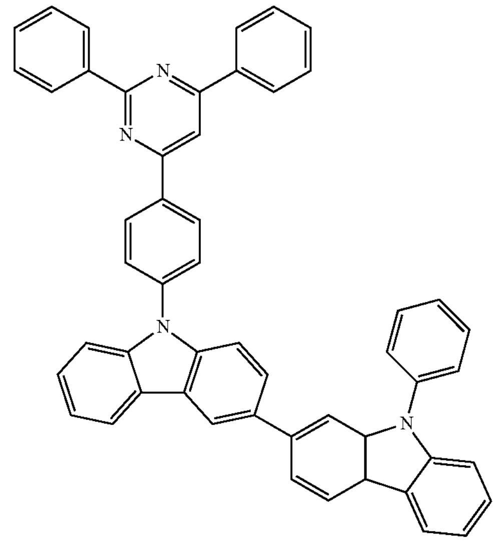
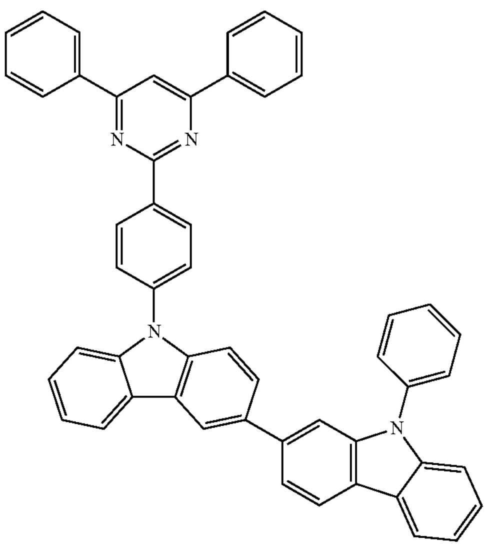
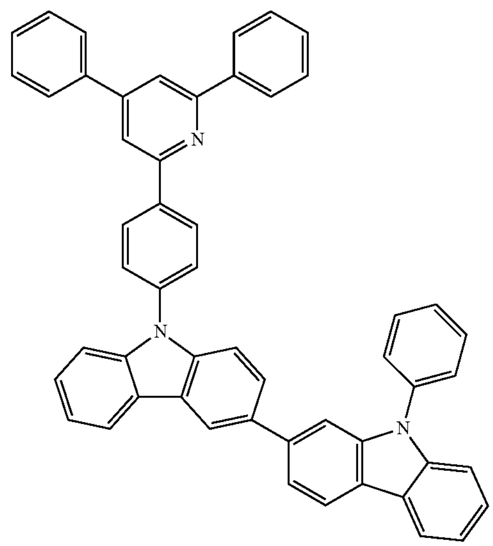
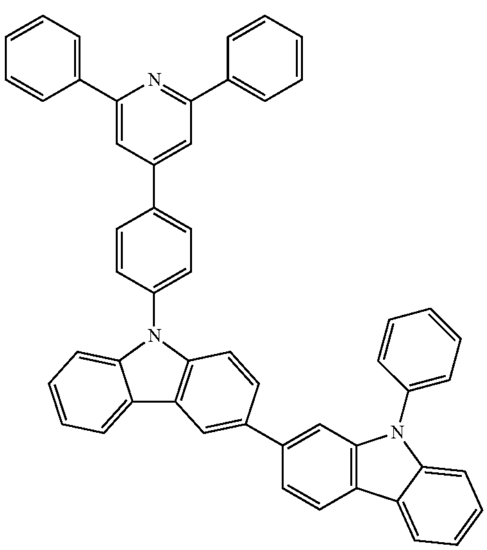
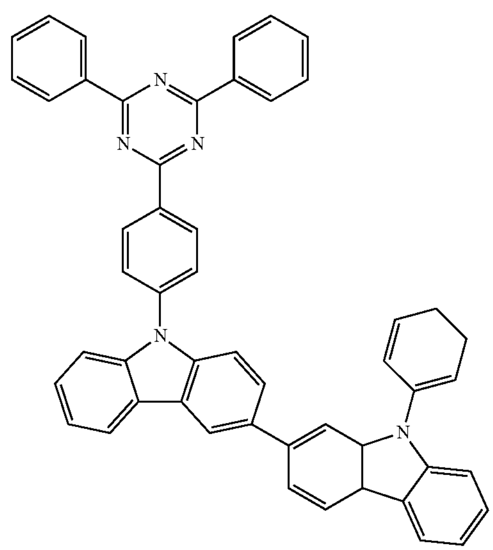

-continued
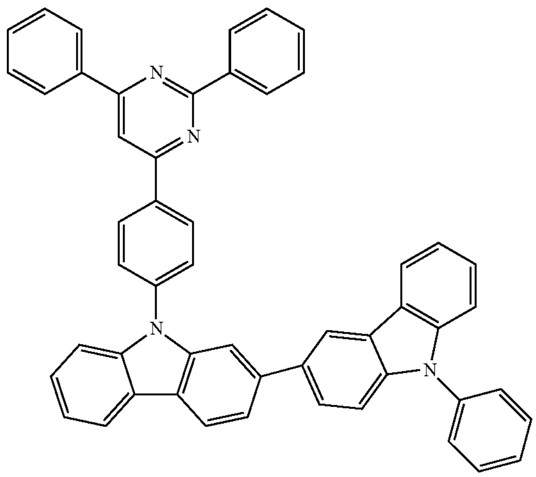
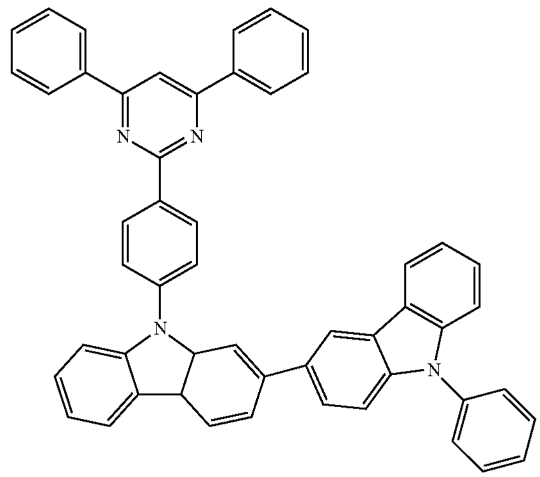
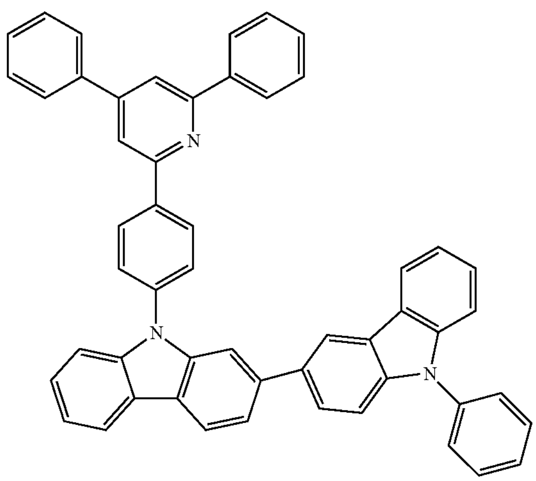
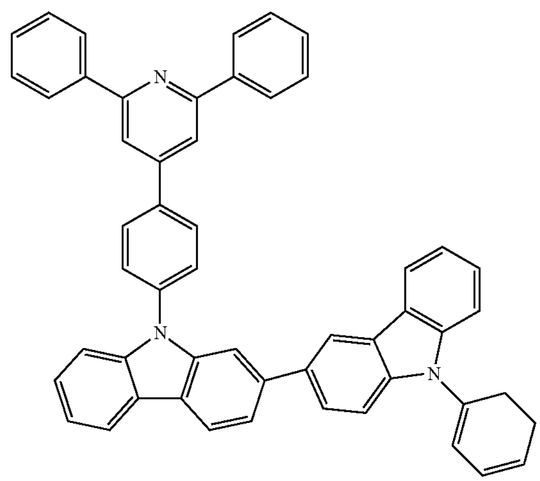
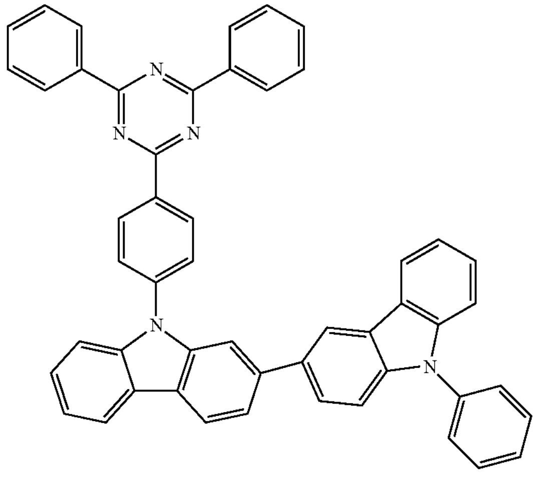
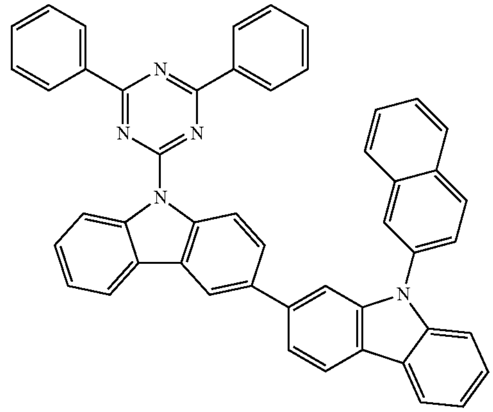

-continued
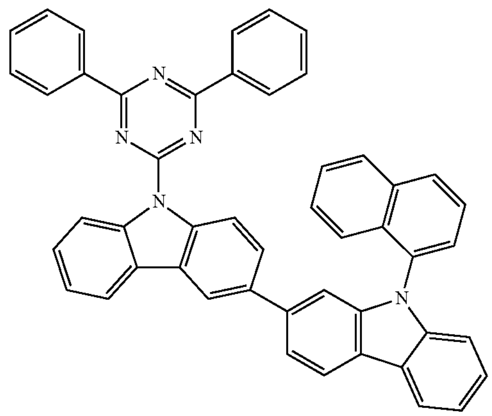
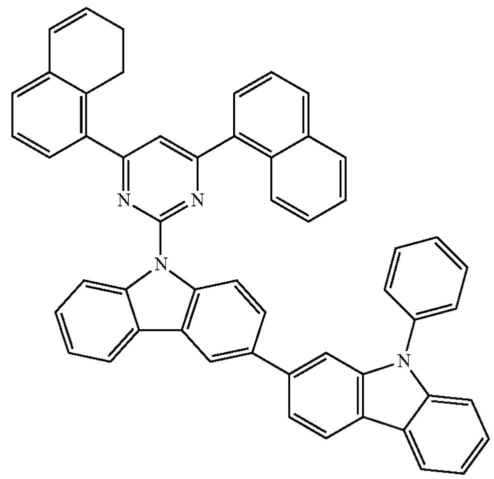
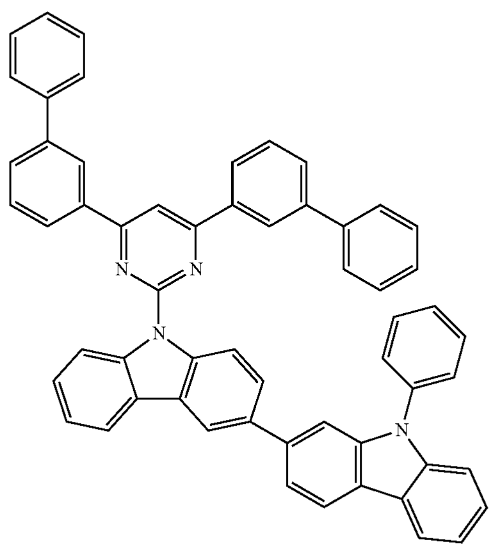
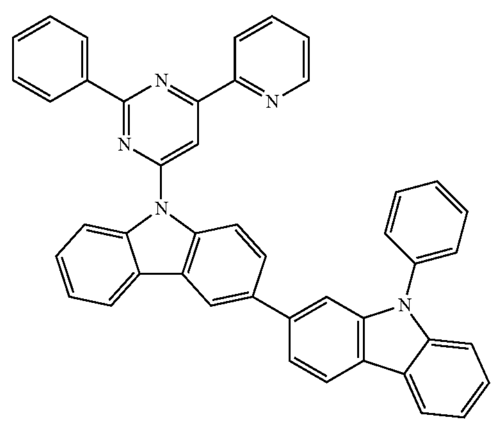
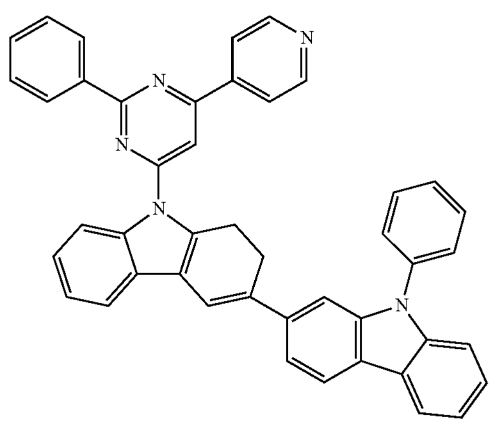
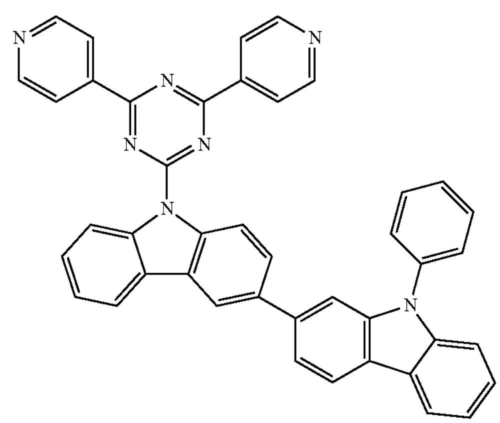

-continued
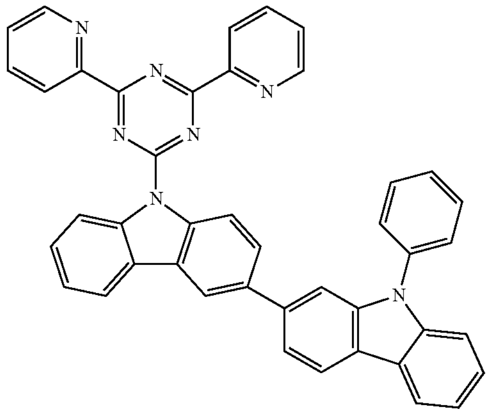
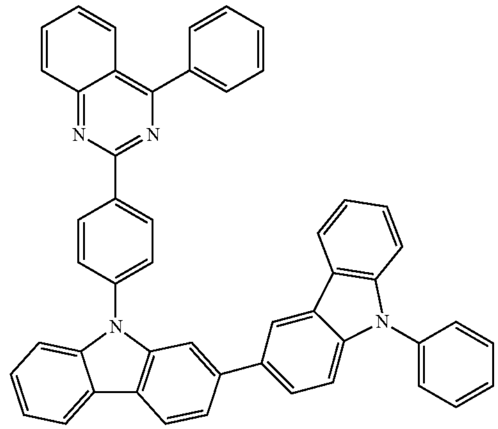
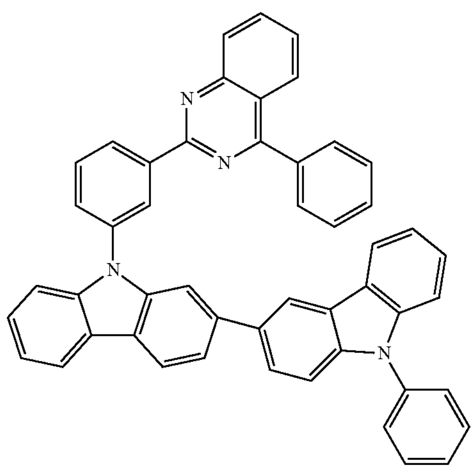
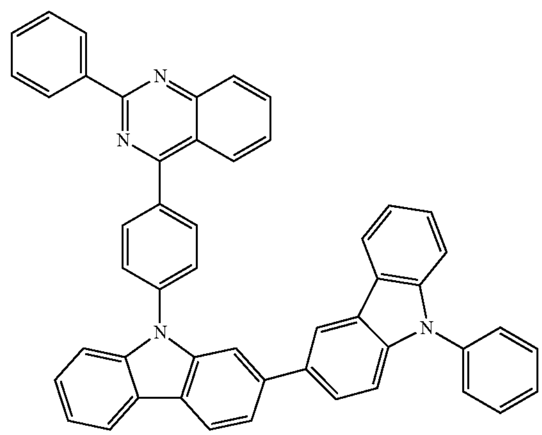
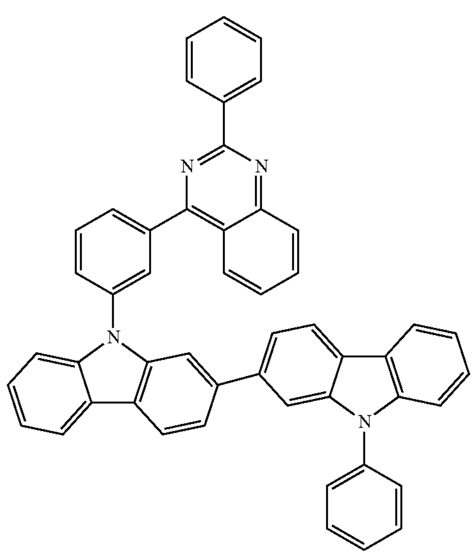
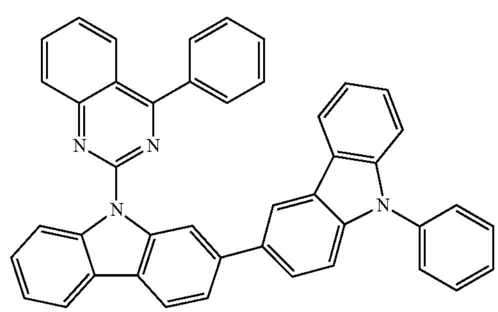

-continued
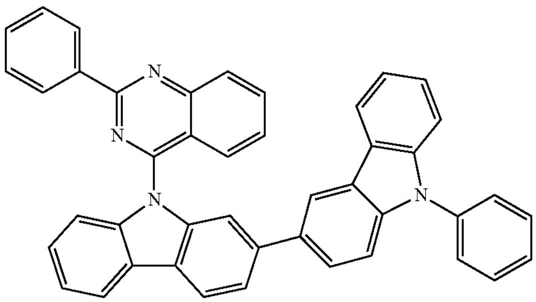
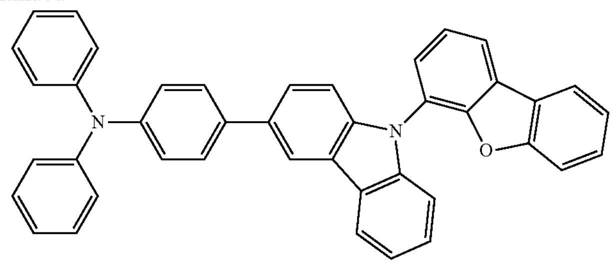
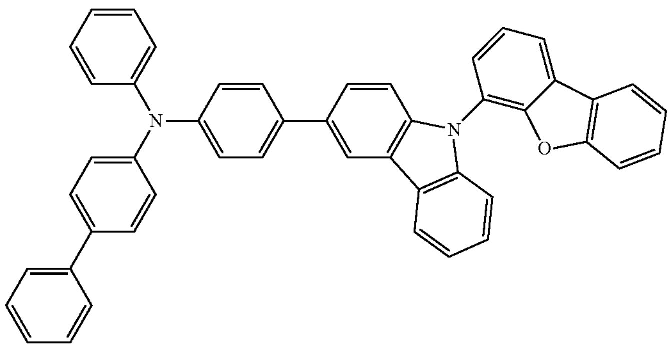
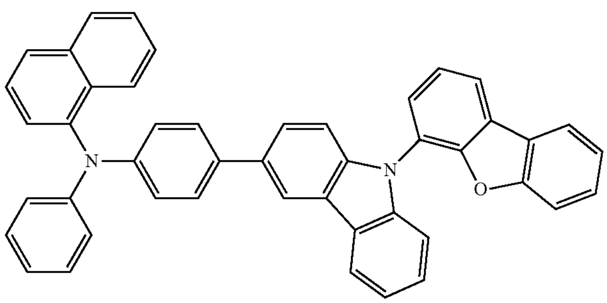
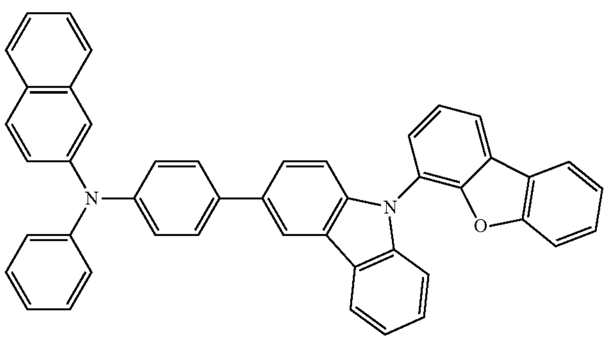
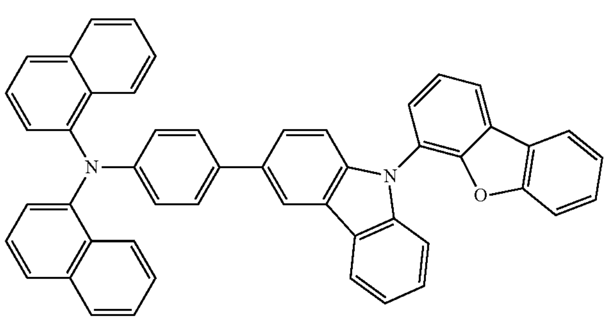

-continued
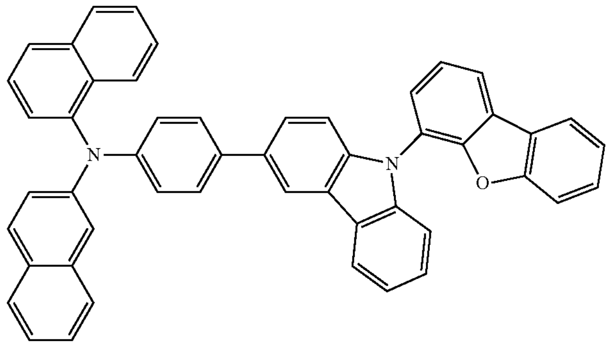
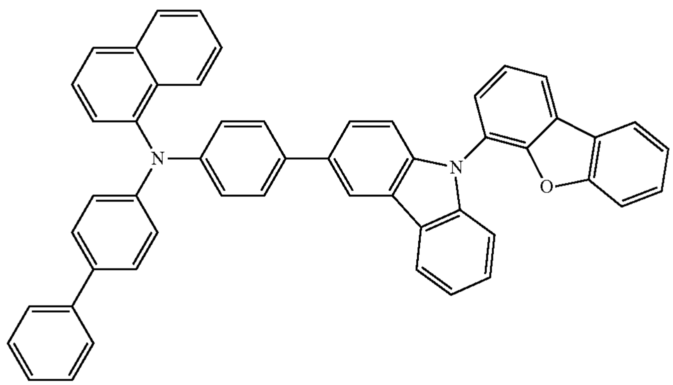
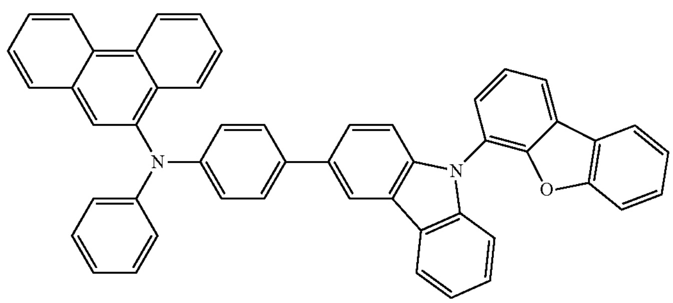
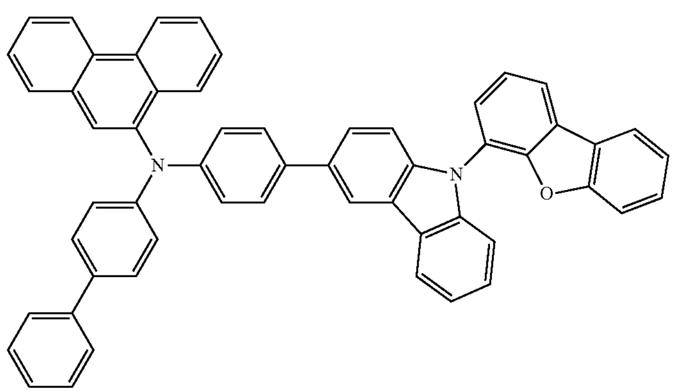

-continued
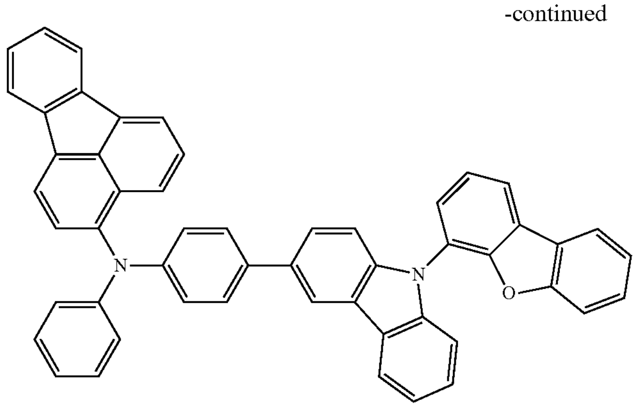
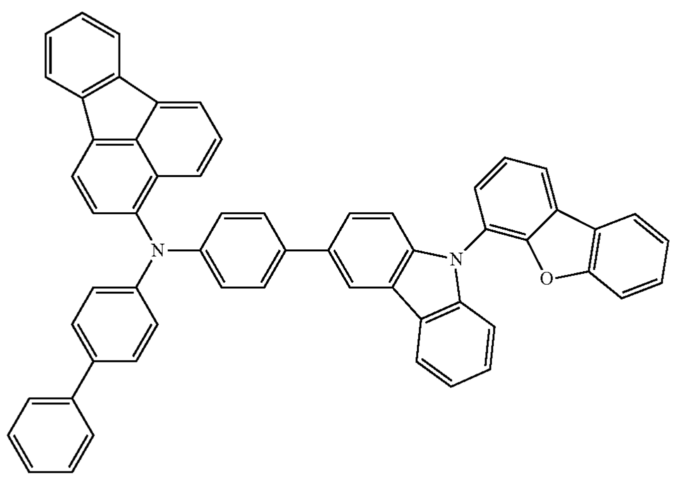
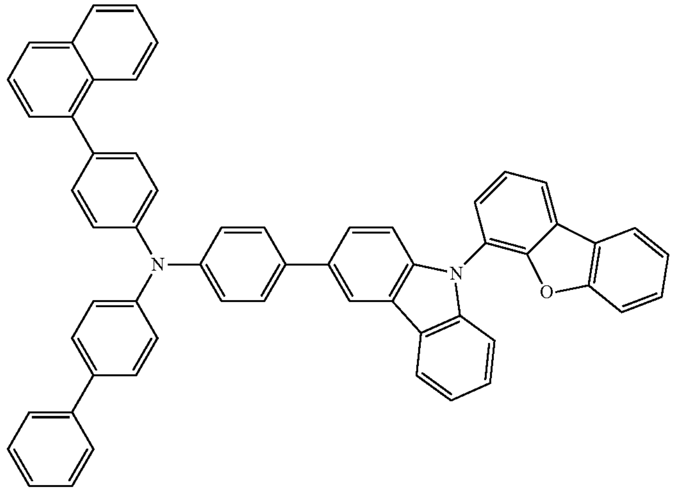

-continued
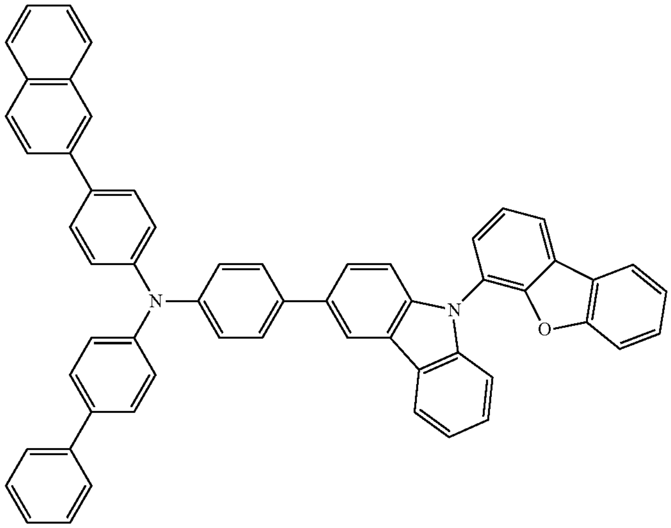
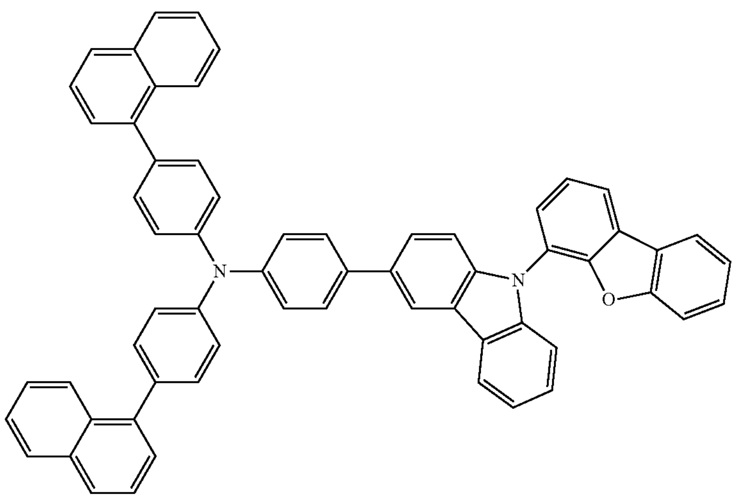
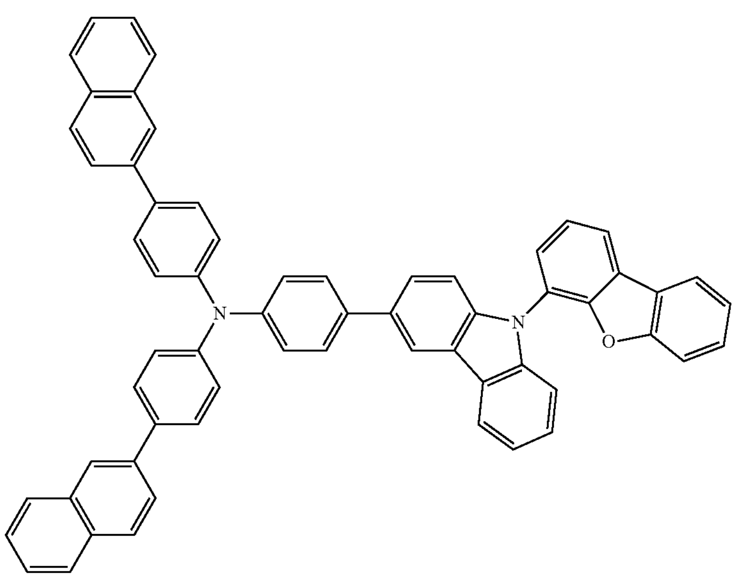

-continued
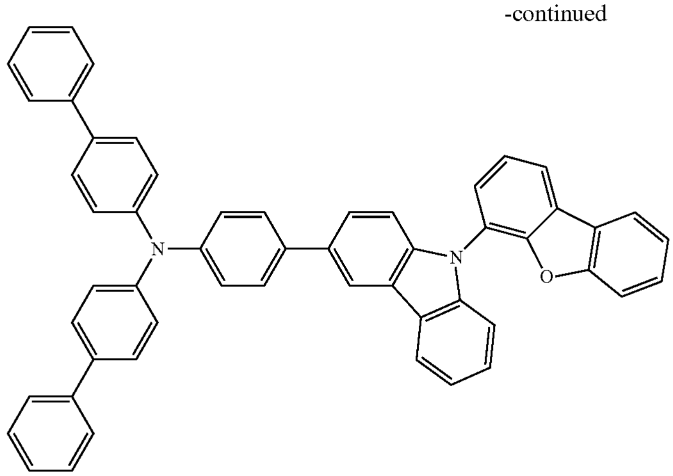
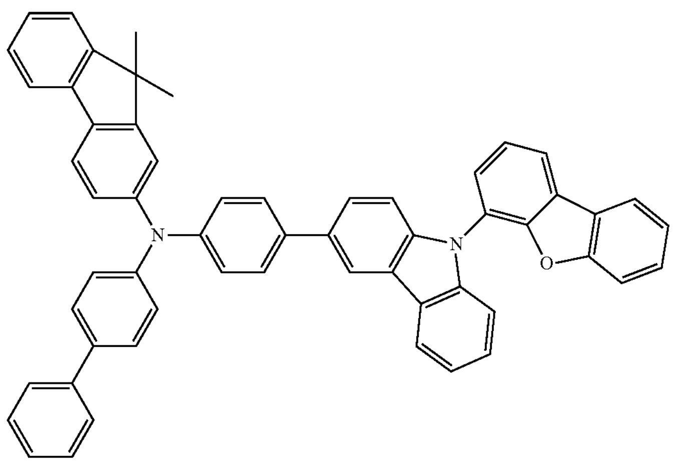
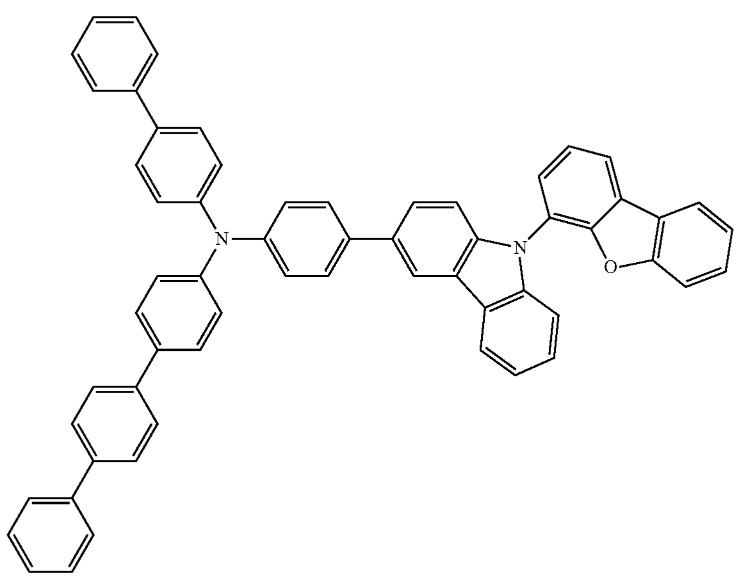

-continued
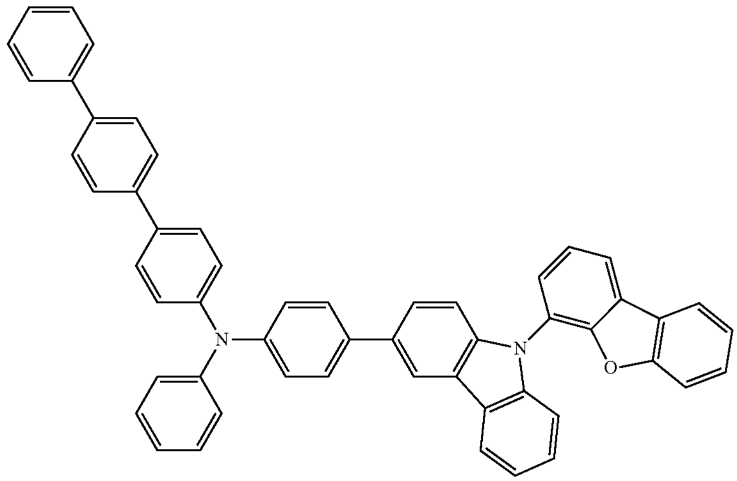
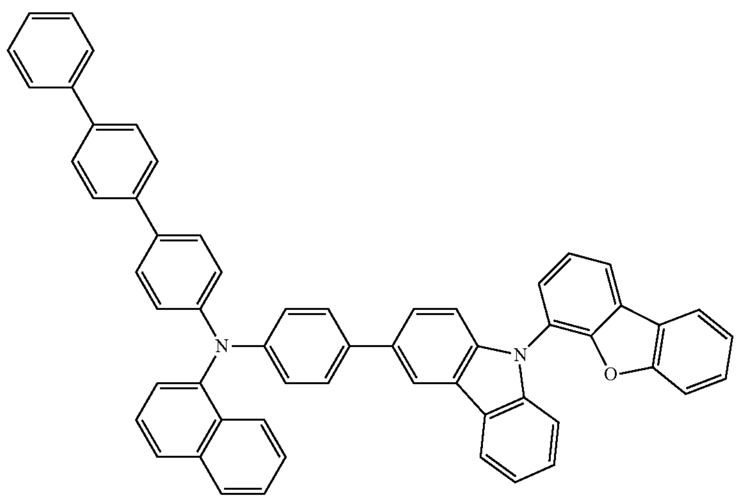
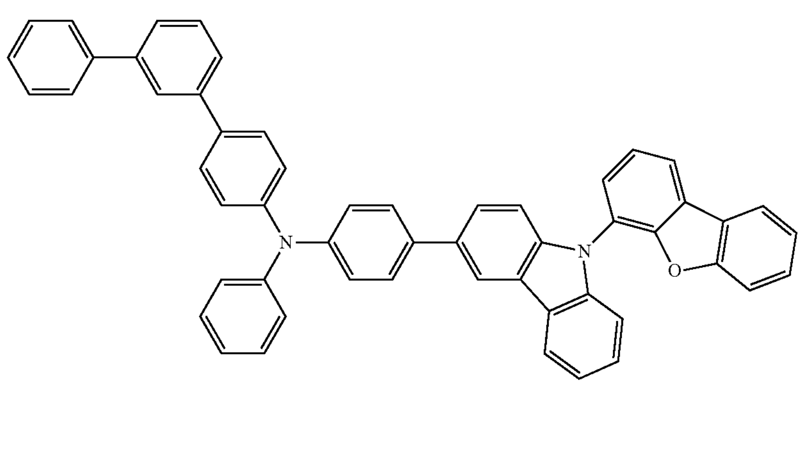

-continued
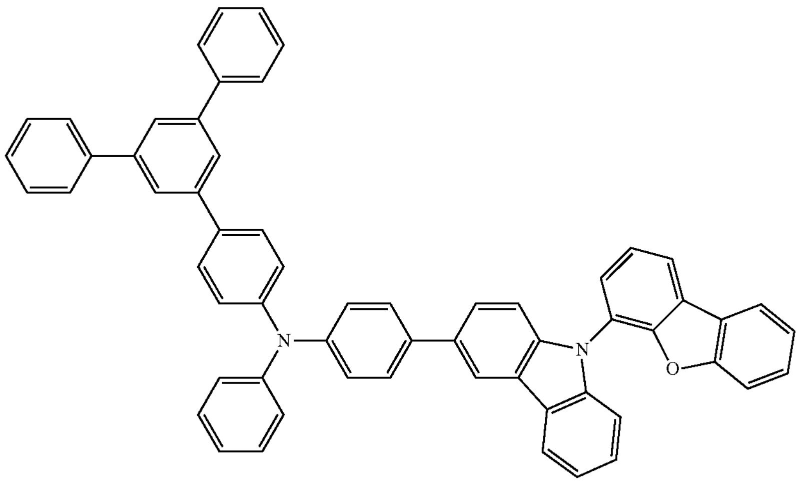
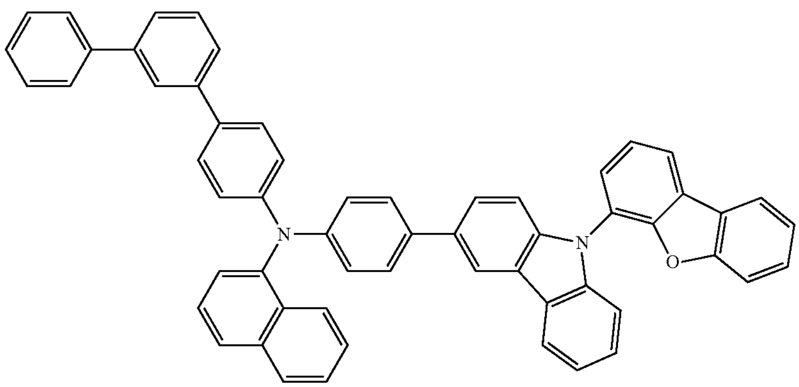
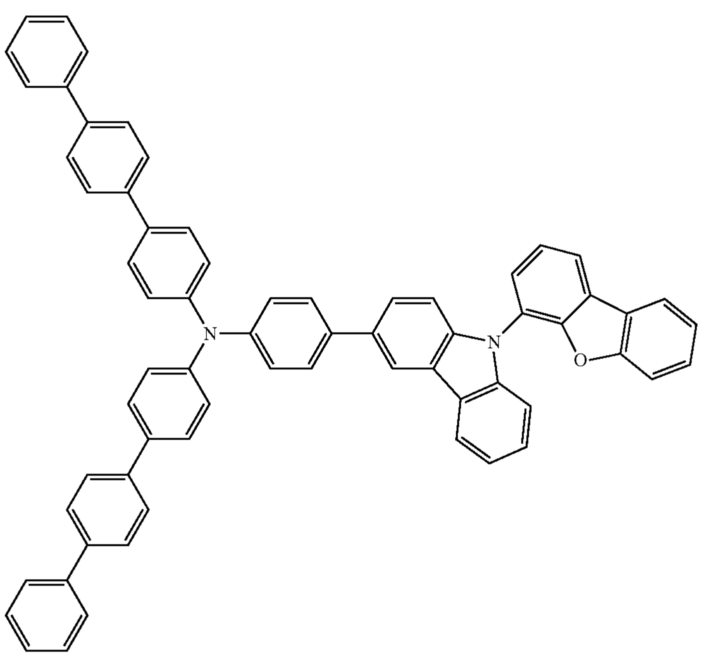

-continued
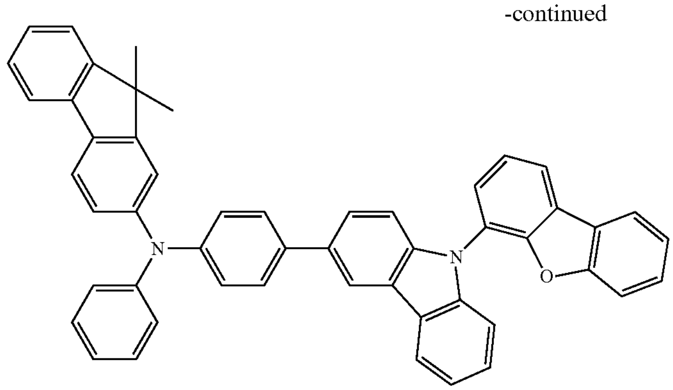
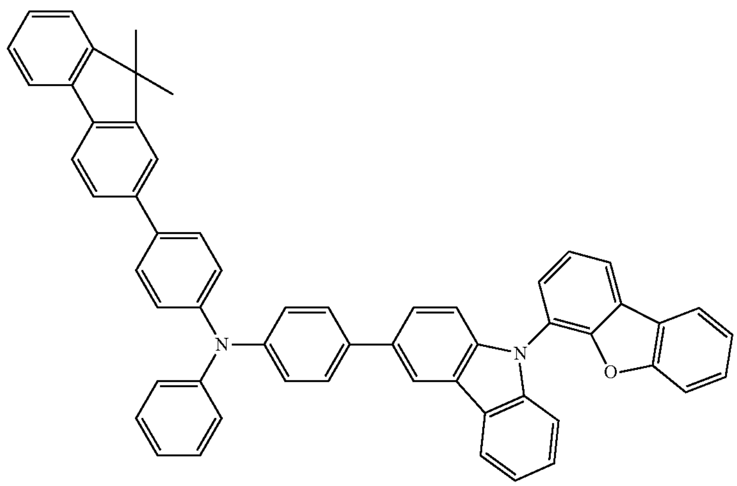
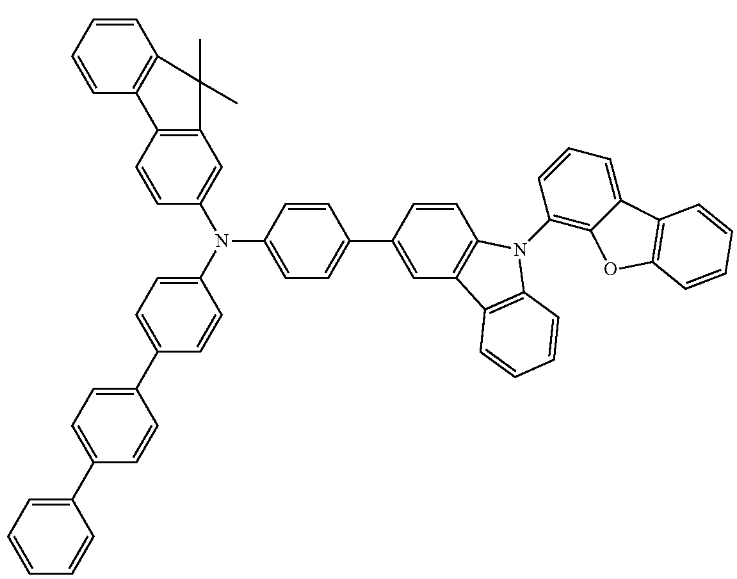

-continued
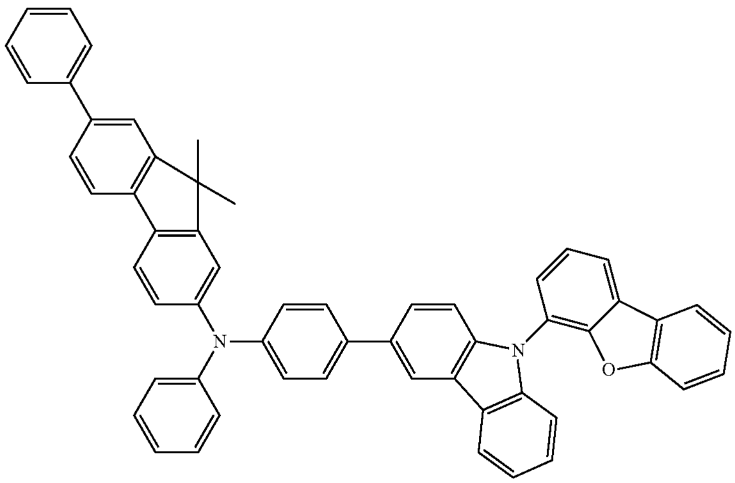
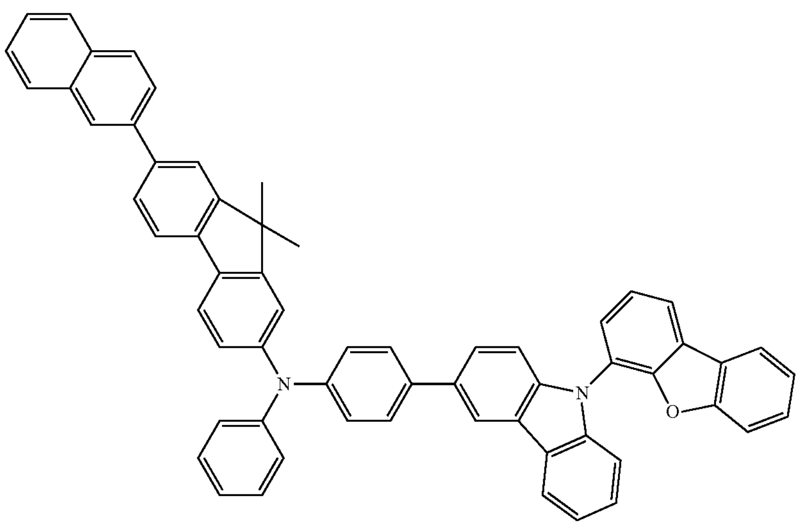
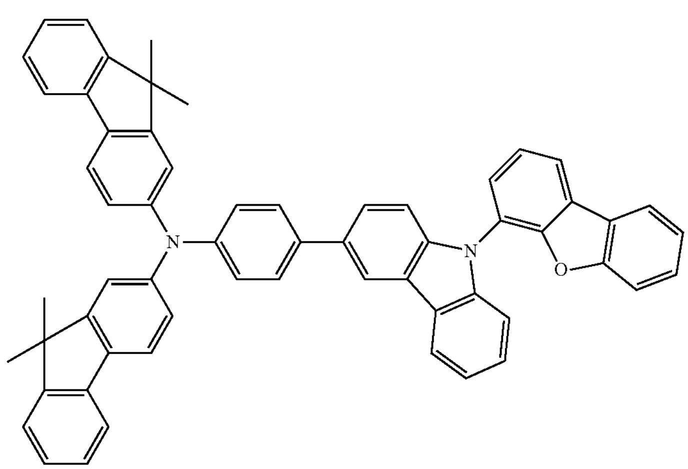

-continued
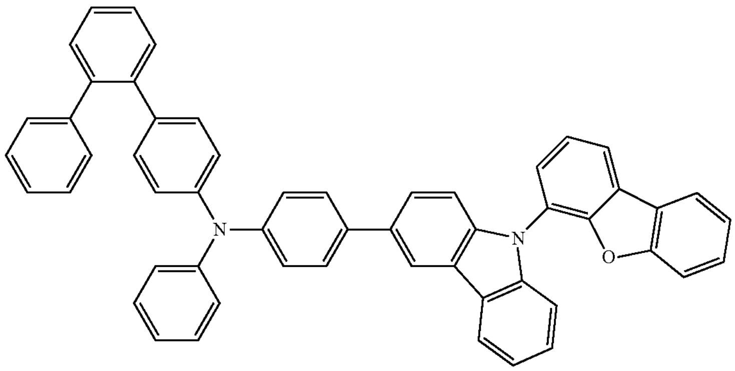
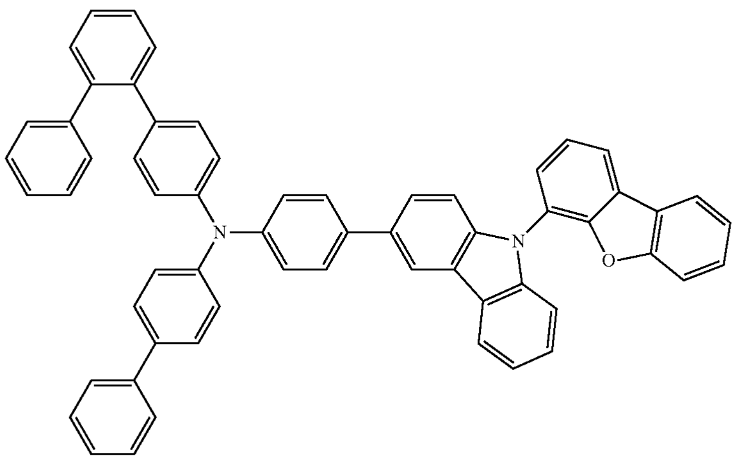
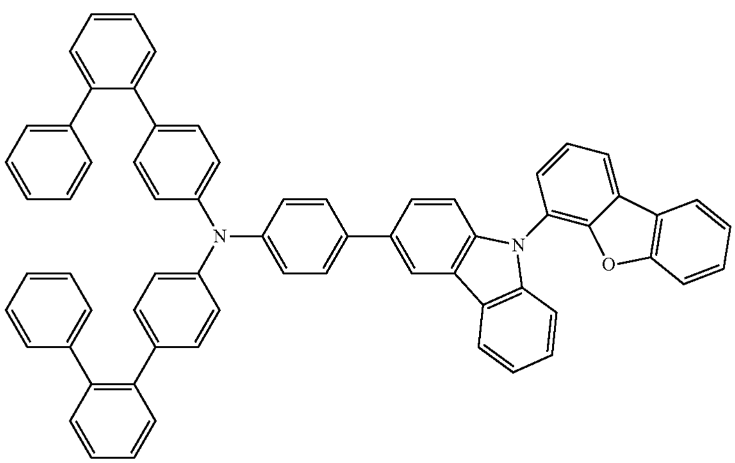
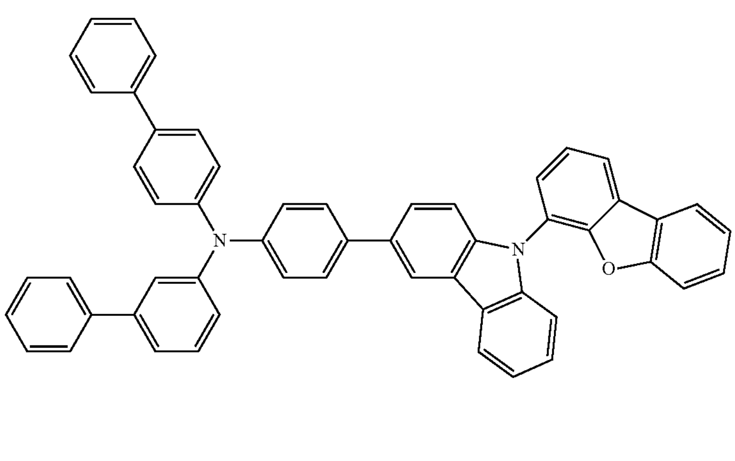

-continued
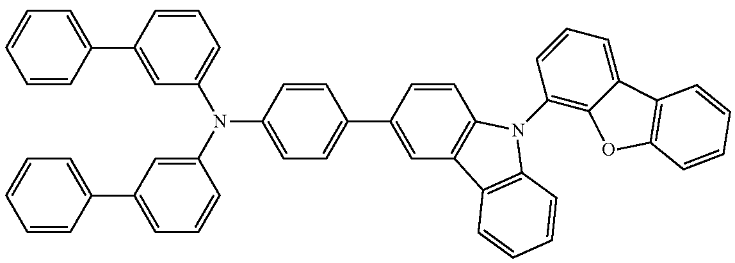
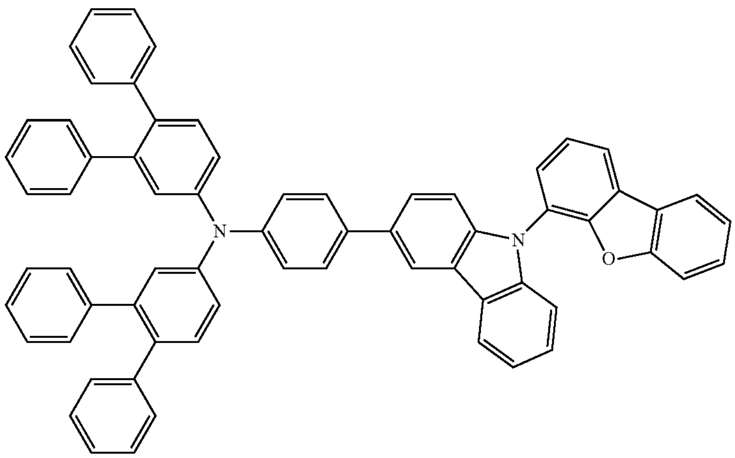
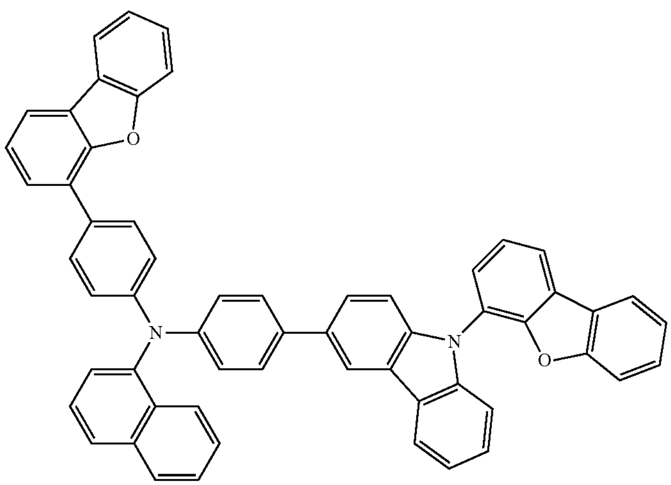
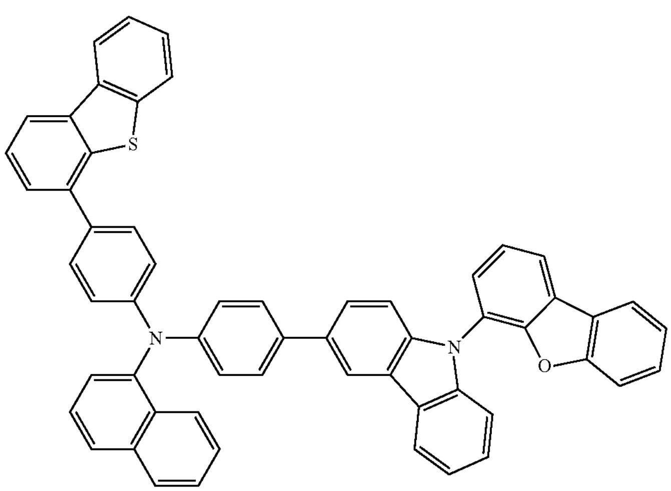

-continued
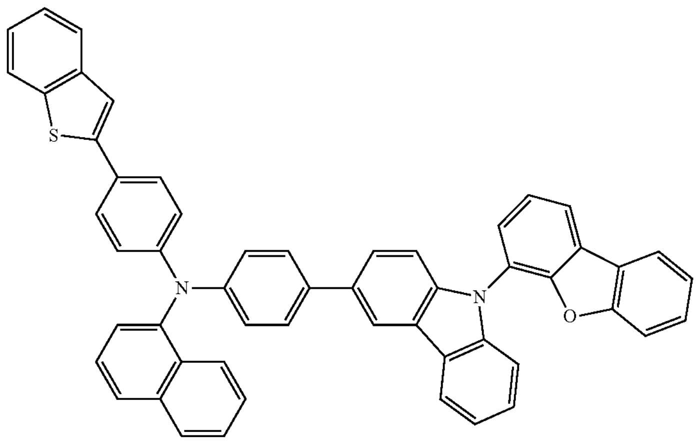
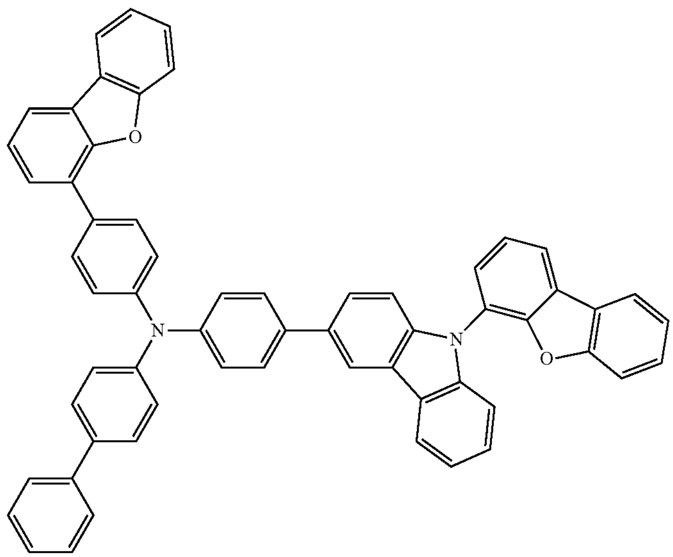
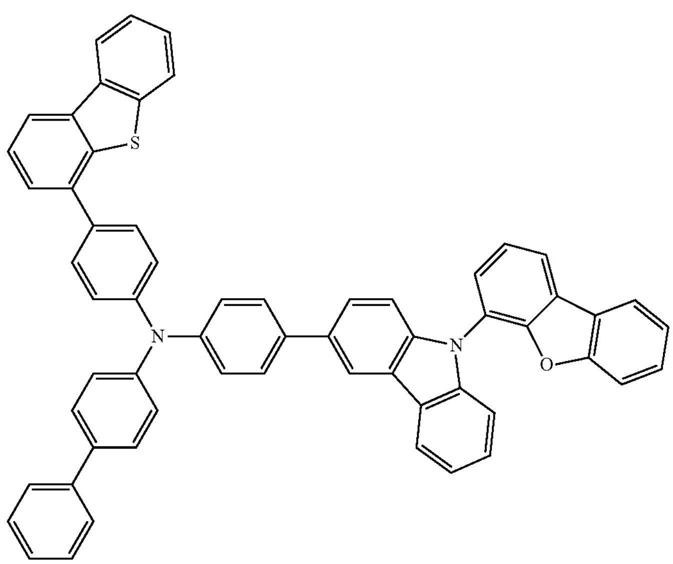

-continued
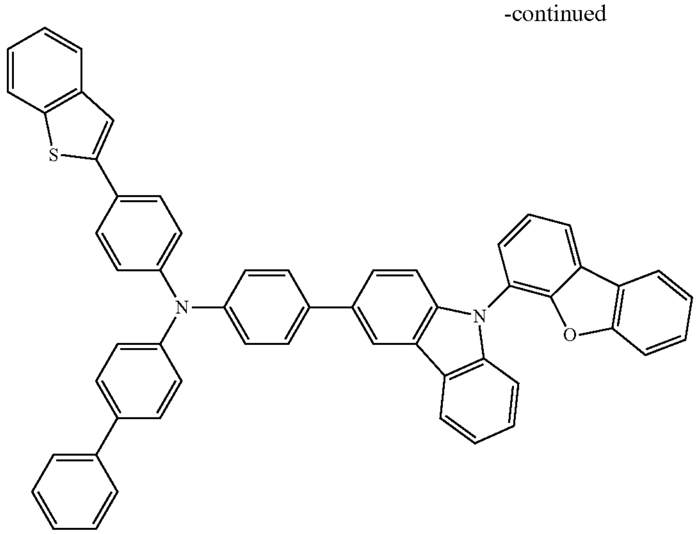
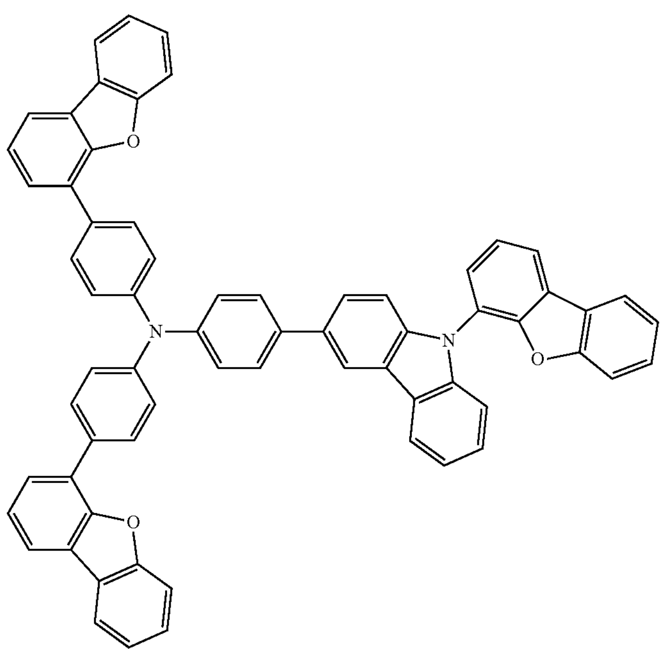

-continued
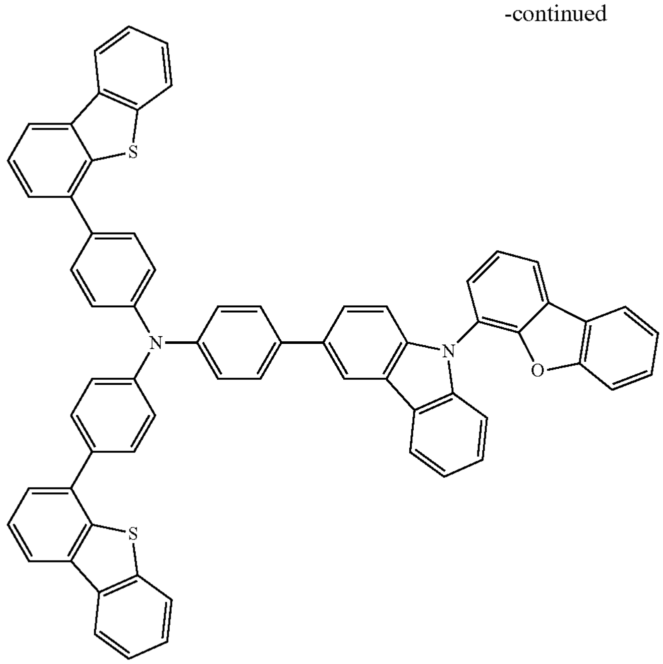
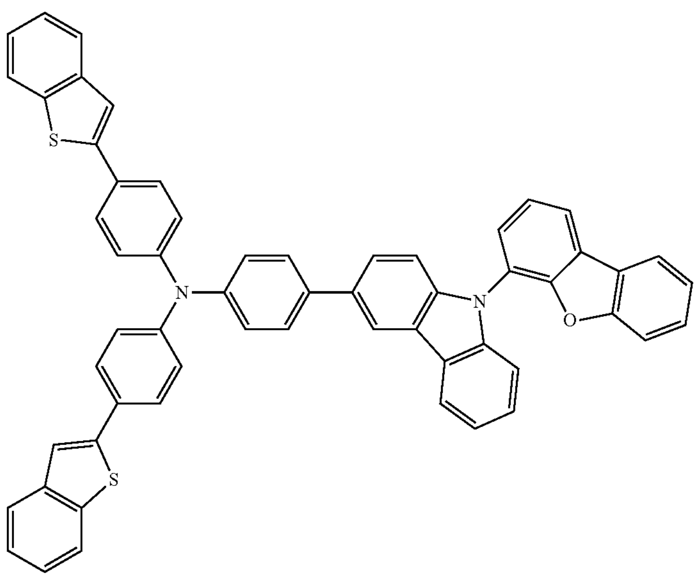
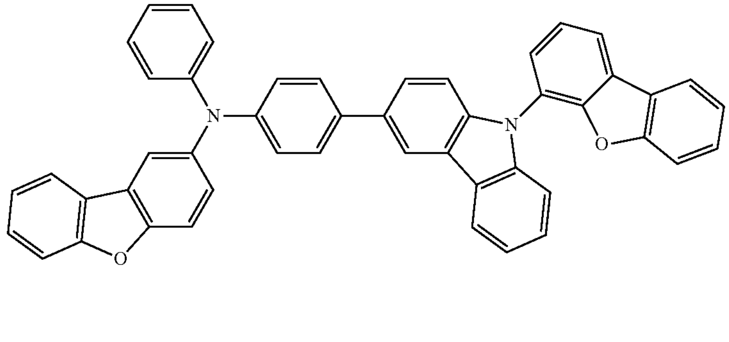

-continued
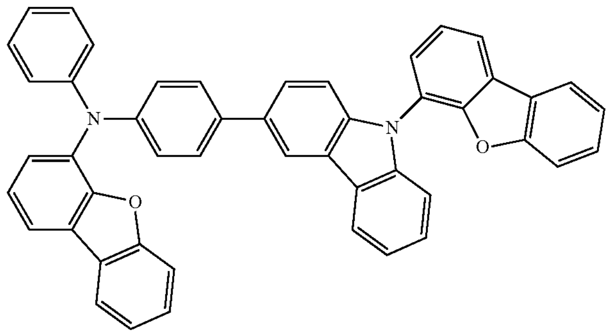
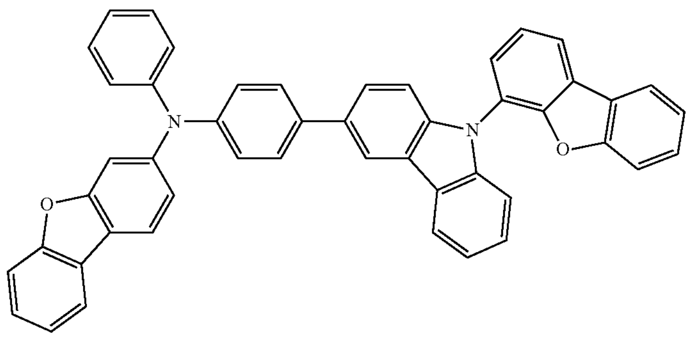
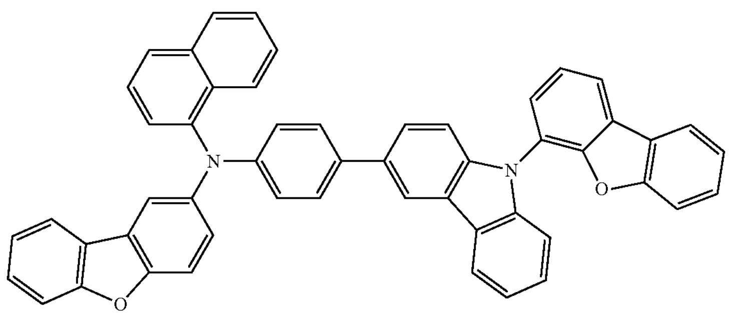
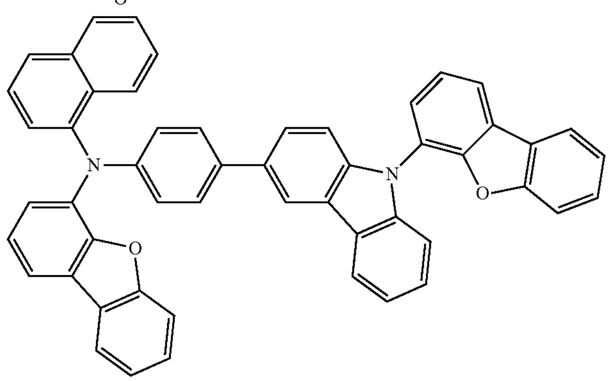
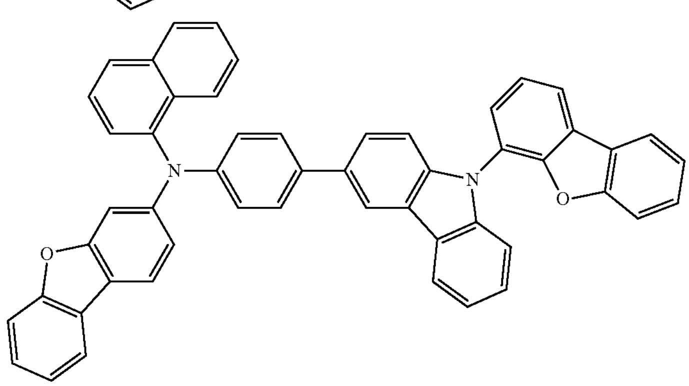

-continued
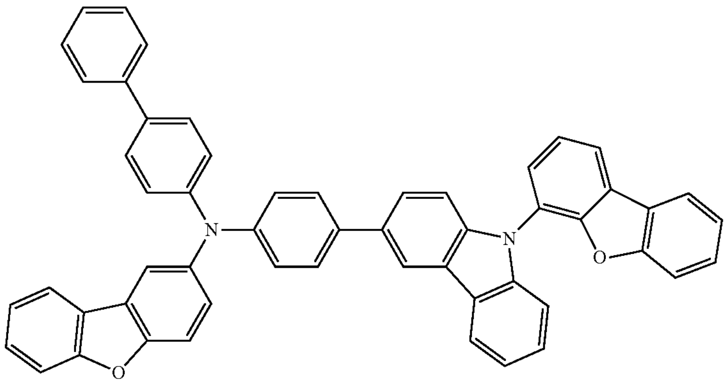
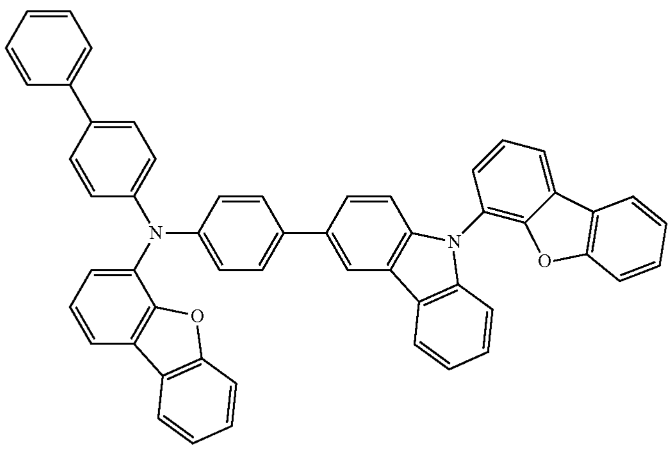
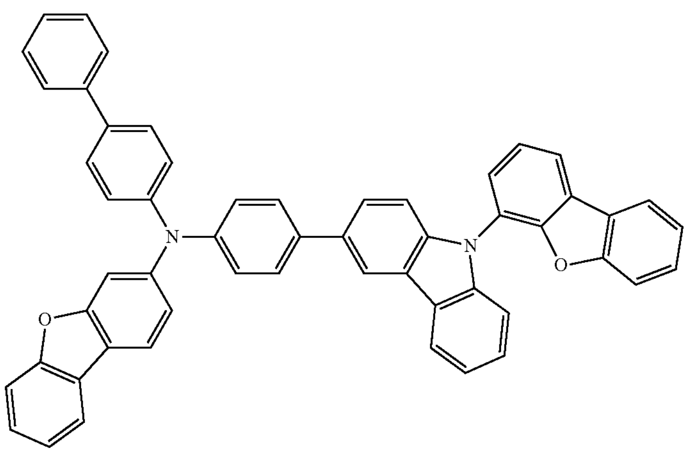
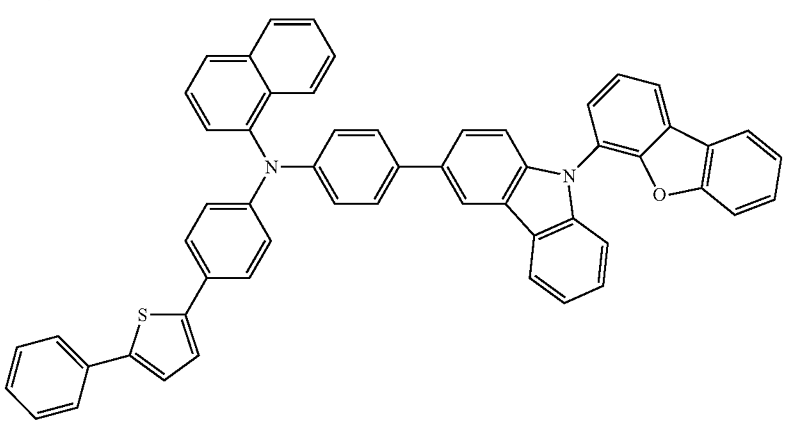

-continued
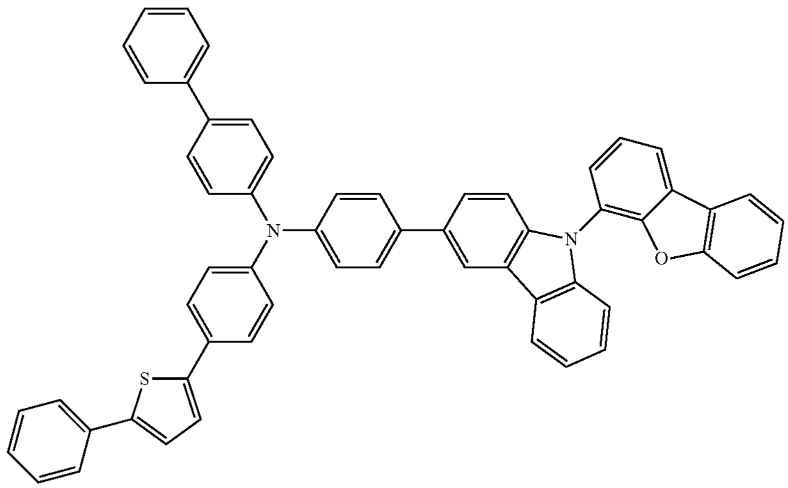
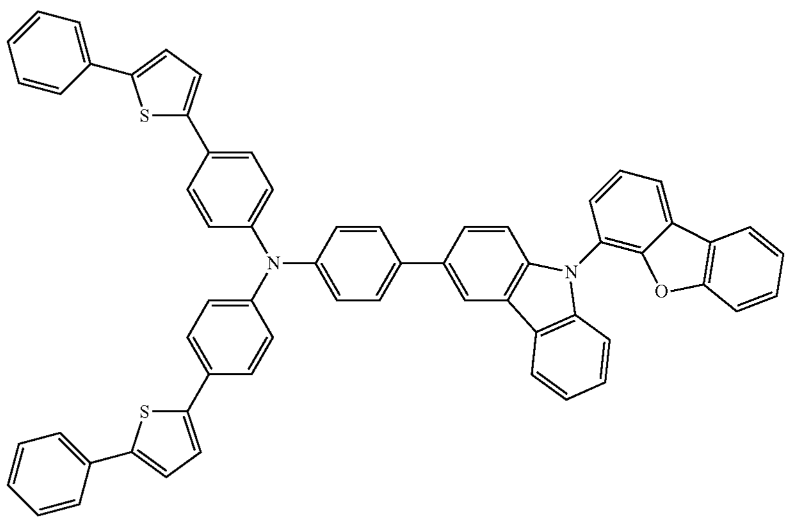
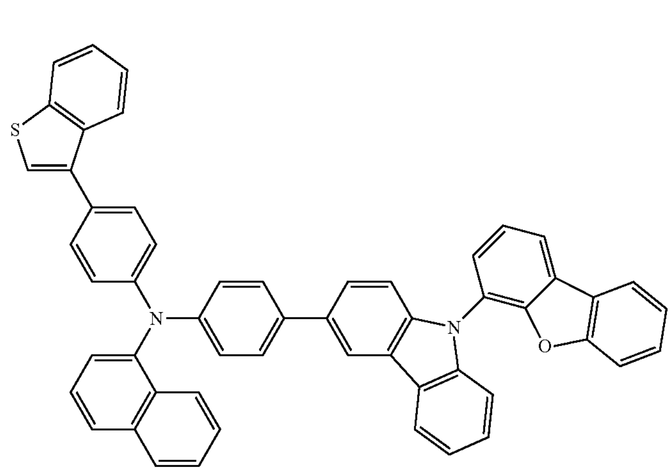

-continued
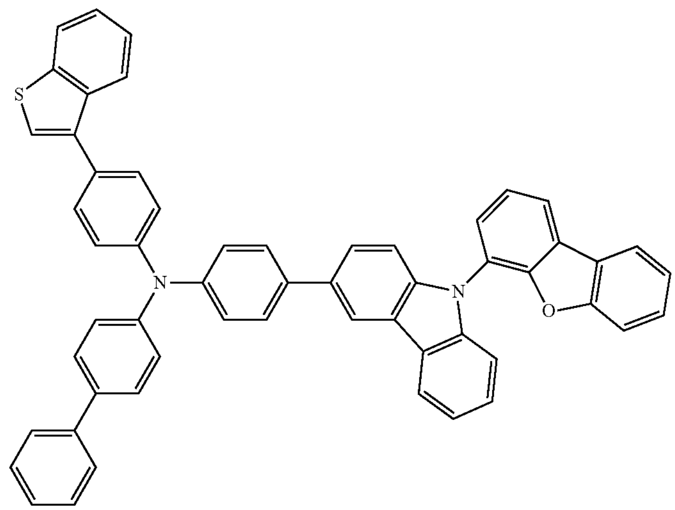
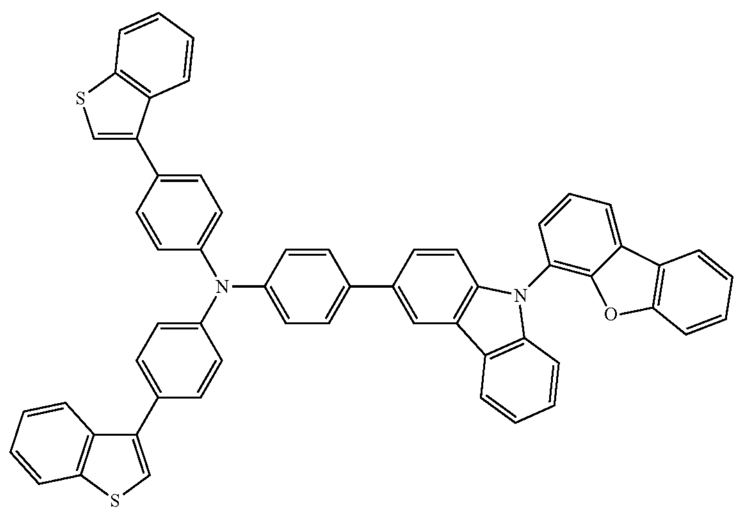
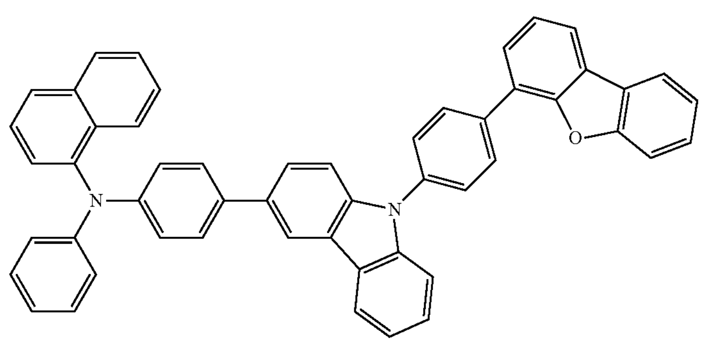
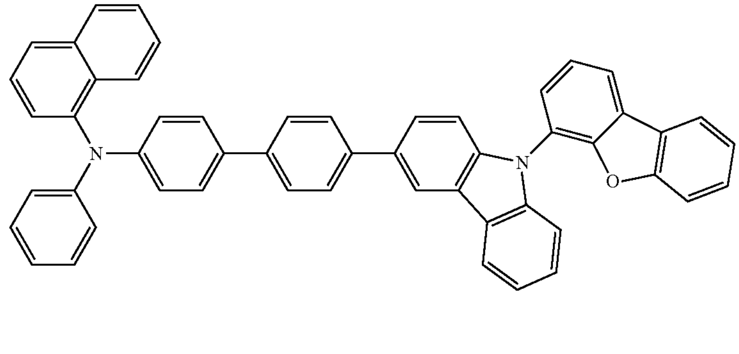

-continued
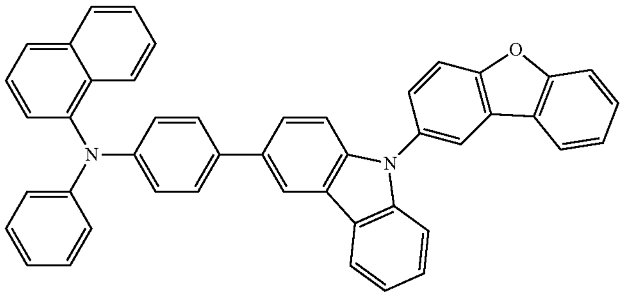
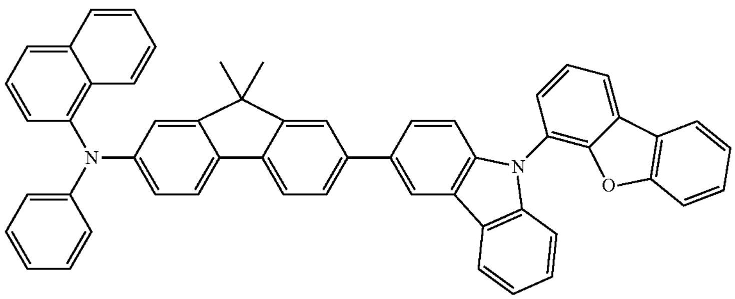
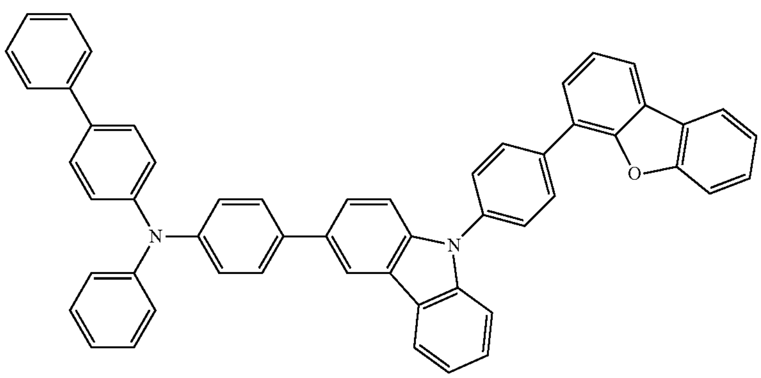
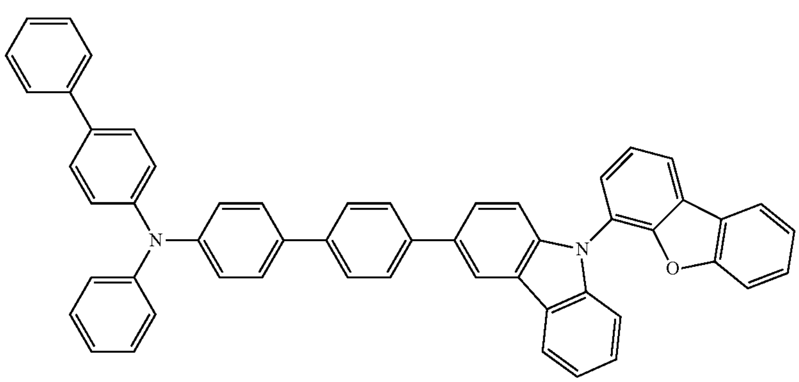

-continued
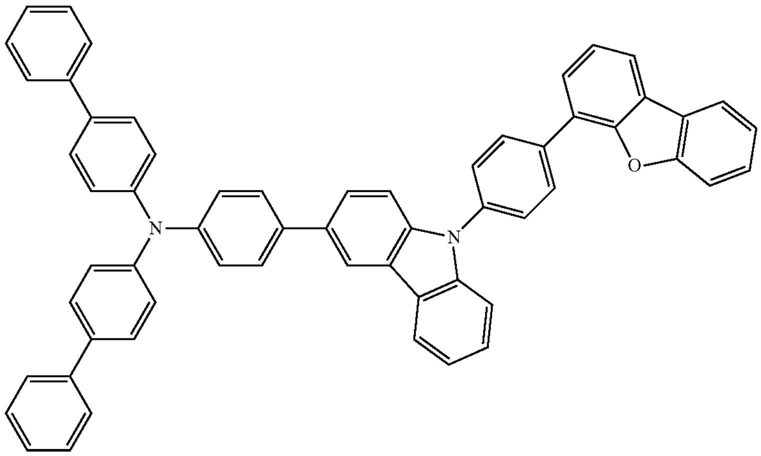
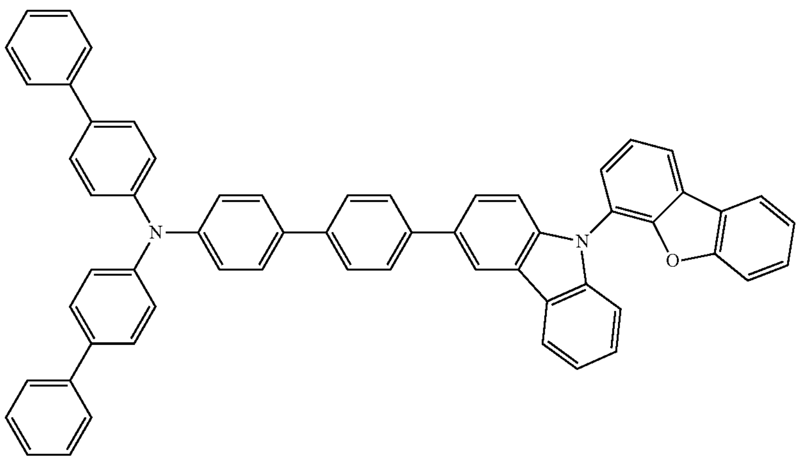
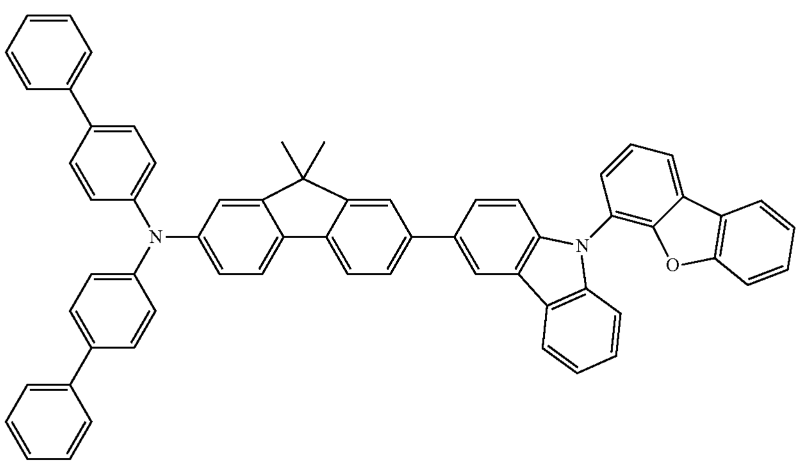

-continued

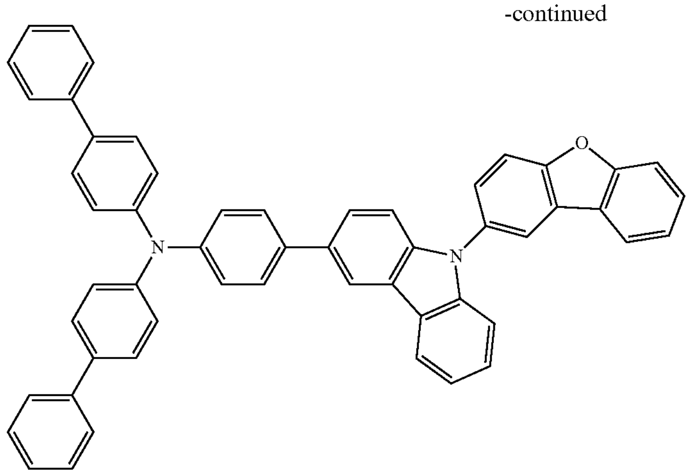

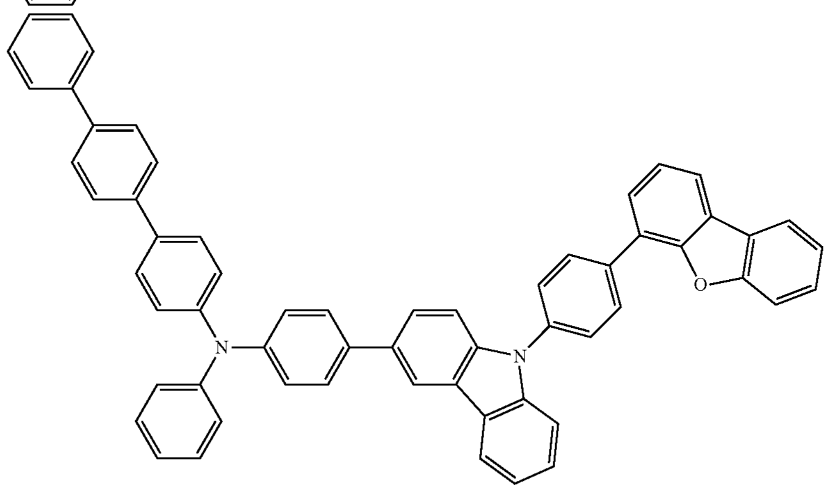

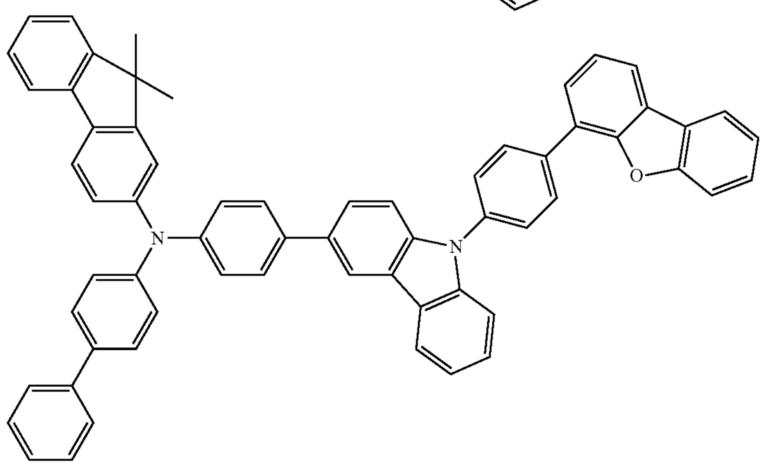

It suffices that the first adjacent layer and the second adjacent layer comprise the above-mentioned adjacent layer compound. The first adjacent layer and the second adjacent layer preferably are composed substantially of the adjacent layer compound, more preferably are composed only of the adjacent layer compound. Here, the "substantially" means that the content of the adjacent layer compound is 90 wt % or more, 95 wt % or more, 98 wt % or more or 99 wt % or more, for example.

The first adjacent layer and the second adjacent layer may further contain a constitution material of a hole-injecting/transporting layer, mentioned later.

It is preferred that the first adjacent layer and the second adjacent layer have the same film thickness. By allowing the first adjacent layer to have the same film thickness as that of the second adjacent layer, the first adjacent layer and the second adjacent layer can be formed simultaneously, whereby the production of an organic EL multi-color emitting device can be conducted by a simplified process and at a low cost.

When the first adjacent layer and the second adjacent layer have the same film thickness, the thickness thereof is 5 nm to 20 nm, for example, preferably 7 to 15 nm.

If the thickness of the adjacent layer is less than 5 nm, the adjacent layer does not fully function, and as a result, a sufficient luminous efficiency or a prolonged life of the first light-emitting element (for example, a green phosphorescent emitting element, a red phosphorescent emitting element) or the second light-emitting element (for example, a blue fluorescent emitting element) cannot be obtained. On the other hand, when the thickness of the adjacent layer exceeds 20 nm, the voltage of the light-emitting element may be increased, the carrier balance may be deteriorated, and as a result, a sufficient efficiency or a prolonged life may not be obtained.

As for the first adjacent layer and the second adjacent layer, it is preferred that the first adjacent layer be in contact with the first emitting layer and contain the compound containing a substituent represented by the formula (b) or the second adjacent layer be in contact with the second emitting layer and contain the compound containing a substituent represented by the formula (a).

Due to the presence of the compound containing a substituent represented by the formula (b) in the first adjacent layer which is in contact with the first emitting layer (for example, a red or yellow phosphorescent emitting layer or a green phosphorescent emitting layer), transportation or injection of electrons to the first emitting layer and diffusion of triplet energy from the red or yellow phosphorescent emitting layer or the green phosphorescent emitting layer can be prevented.

Due to the presence of the compound containing a substituent represented by the formula (a) in the second adjacent layer which is in contact with the second emitting layer (for example, a blue fluorescent emitting layer), transportation and injection of holes to the second emitting layer are promoted, whereby the luminous efficiency of blue emission can be increased and the life can be prolonged.

Further, regarding the first adjacent layer and the second adjacent layer, it is preferred that the first adjacent layer be in contact with the first emitting layer and contain the compound represented by the formula (C) or (D), or it is preferred that the second adjacent layer be in contact with the second emitting layer and contain the compound represented by the formula (A) or (B).

Due to the presence of the compound represented by the formula (C) or (D) in the first adjacent layer which is in contact with the first emitting layer (for example, a red or yellow phosphorescent emitting layer or a green phosphoresent emitting layer), transportation and injection of electrons to the first emitting layer are promoted and diffusion of triplet energy from the red or yellow phosphorescent emitting layer or the green phosphorescent emitting layer can be prevented.

Due to the presence of the compound represented by the formula (A) or (B) in the second adjacent layer which is in contact with the second emitting layer (for example, a blue fluorescent emitting layer), transportation and injection of holes to the second emitting layer is promoted, whereby the luminous efficiency of the blue emission can be increased and the life can be prolonged.

The adjacent layer may be of a single layer structure or may be a stack. If the adjacent layer is a single layer, it is formed of one or two or more compounds selected from the compounds represented by the formulas (A) to (D). When two or more compounds are used, for example, two or more compounds having a substituent represented by the formula (a), two or more compounds having a substituent represented by the formula (b) or a mixture of the compound having a substituent represented by the formula (a) and the compound represented by the formula (b) is used. Further, within the layer, the concentrations of the two or more compounds may be varied.

If the adjacent layer has a configuration in which two or more different layers are stacked, each layer is formed of the two or more compounds mentioned above. When the adjacent layer has a multi-layer stack configuration, of the plurality of layers, forming a layer which is in contact with the first organic layer (first emitting layer) of the first light-emitting element of a compound having a triplet energy higher than other layers ((compound represented by the formula (C) or (D), e.g. a compound having a carbazole site and a dibenzofuran site) is preferable, since diffusion of triplet energy from the first organic layer (first emitting layer) can be prevented.

Similarly, when the adjacent layer is allowed to be a single layer containing two or more compounds with a concentration gradient, it is preferred that the concentration of a compound having a higher triplet energy be higher on the side of the first organic layer (first emitting layer) of the first light-emitting element.

[Light-Emitting Element]

As for a first light-emitting element and a second light-emitting element arranged in parallel on the substrate of the organic EL multi-color emitting device of the invention, the first light-emitting element has a structure of anode/hole-injecting layer/hole-transporting layer/first emitting layer/first adjacent layer/second electron-injecting/transporting layer/first electron-injecting/transporting layer/cathode, for example, and the second light-emitting element has a structure of anode/hole-injecting layer/hole-transporting layer/second adjacent layer/second emitting layer/first electron-injecting/transporting layer/cathode, for example.

Here, the material for the first adjacent layer and the material for the second adjacent layer are respectively any of the above-mentioned compounds (A) to (D).

Further, if the second emitting layer is a blue emitting layer, the second emitting layer may be the same as the second electron-injecting/transporting layer of the first light-emitting element.

Emission from the first emitting layer and the second emitting layer can be outcoupled from the anode side, the cathode side or both sides.

[Emitting Layer]

An emitting layer has a function of providing a site in which electrons and holes are re-combined to cause emission.

Note that electrons and holes may be injected into the emitting layer with different degrees, or the transportation capabilities indicated by the mobility of holes and electrons may differ. It is preferable that the emitting layer move either electrons or holes.

The first emitting layer (corresponding to the first organic layer) comprises the first light-emitting dopant, preferably a phosphorescent dopant, and can function as a phosphorescent emitting layer (for example, the red or yellow phosphorescent emitting layer or the green phosphorescent emitting layer). The phosphorescent emitting layer is preferably a phosphorescent emitting layer comprising a phosphorescent host and a phosphorescent dopant.

As the phosphorescent host, a compound comprising a carbazole skeleton and an aromatic ring or a nitrogen-containing aromatic ring within the same molecule; a compound comprising a plurality of carbazole skeletons within the same molecule; a compound obtained by linking an aromatic ring, a fused aromatic ring and an aromatic-containing heterocyclic ring in a plurality of numbers, or the like can be given. The host may be used singly or in combination of two or more.

As the phosphorescent dopant, a metal complex compound can be given. The metal complex compound is preferably a compound comprising a metal atom selected from Ir, Pt, Os, Au, Cu, Re and Ru and a ligand. It is preferred that the ligand have an ortho-metalated bonding.

In respect of high phosphorescent quantum yield and further improvement in external quantum yield efficiency of a light-emitting element, it is preferred that the phosphorescent dopant be a compound comprising a metal element selected from Ir, Os and Pt. The phosphorescent dopant is further preferably a metal complex such as an iridium complex, an osmium complex and a platinum complex. Of these, an iridium complex and a platinum complex are more preferable, and an ortho-metalated iridium complex is most preferable. The dopant may be used singly or in combination of two or more.

The first emitting layer may comprise an adjacent layer compound, a hole-transporting material and an electron-transporting material, if necessary.

The second emitting layer (corresponding to the third organic layer) comprises the second light-emitting dopant, preferably a fluorescent dopant, and can function as a fluorescent emitting layer (for example, a blue fluorescent layer). The fluorescent emitting layer is preferably a fluorescent emitting layer comprising the following fluorescent host and the following fluorescent dopant.

As the fluorescent host, various fused aromatic ring compounds can be given. For example, one or more selected from the following compounds (2) to (12) can be used.

(2)

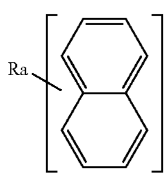

(3)

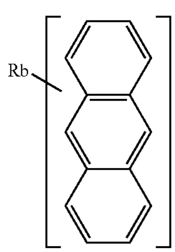

(4)

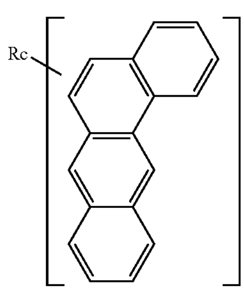

-continued (5)

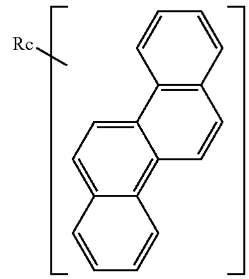

(6)

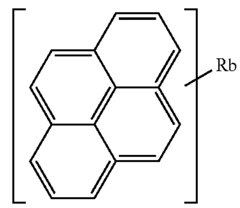

(7)

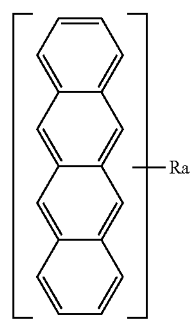

(8)

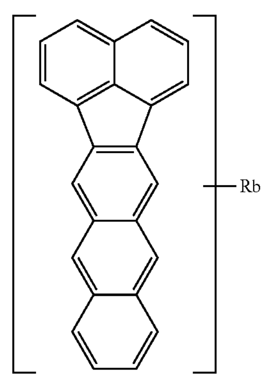

(9)

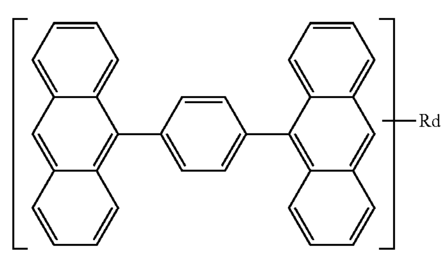

-continued (10)

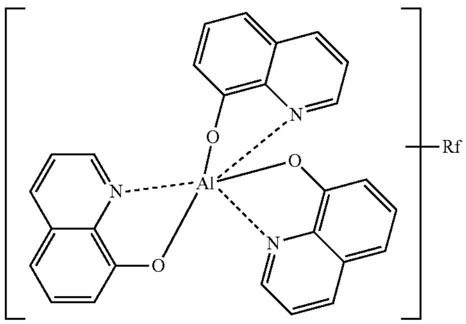

(11)

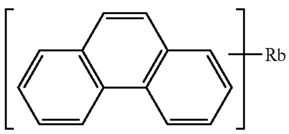

(12)

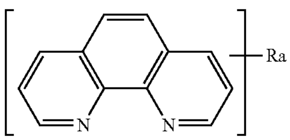

wherein R is a substituted or unsubstituted aryl group having 6 to 40 ring carbon atoms (preferably, a substituted or unsubstituted aryl group having 6 to 18 ring carbon atoms), a substituted or unsubstituted heterocyclic group having 3 to 40 ring atoms (preferably, a substituted or unsubstituted heterocyclic group having 3 to 18 ring atoms) or a substituted or unsubstituted alkyl group having 1 to 50 carbon atoms (preferably, a substituted or unsubstituted alkyl group having 1 to 20 carbon atoms).

a is an integer of 0 to 7, b is an integer of 0 to 9, c is an integer of 0 to 11, d is an integer of 0 to 22, f is an integer of 0 to 18, and when each of a to f is 2 or more, plural Rs may be the same or different.

The aryl group, the heterocyclic group and the alkyl group are the same as those of the substituted or unsubstituted aromatic hydrocarbon group, a substituted or unsubstituted aromatic heterocyclic group and the substituted or unsubstituted alkyl group represented by $Ar^1$ to $Ar^4$ of the adjacent layer compound.

In the formulas (2) to (12), R may be bonded to any of the aromatic ring or the heterocyclic ring, and two or more Rs may be bonded to the same aromatic ring or the heterocyclic ring.

As the fluorescent dopant, the aromatic amine represented by the following formula, the styrylamine represented by the following formula or the like are preferable. The fluorescent dopant may be used alone or in combination of two or more.

(1)

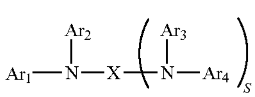

wherein $Ar^1$ to $Ar^4$ are independently a substituted or unsubstituted aryl group having 6 to 40 ring carbon atoms, a substituted or unsubstituted heterocyclic group having 3 to 40 ring atoms or a substituted or unsubstituted alkyl group having 1 to 50 carbon atoms.

X is a substituted or unsubstituted 1+s valent fused aromatic ring group having 10 to 40 ring carbon atoms or a substituted or unsubstituted 1+s valent styryl group.

s is an integer of 0 to 3, and when is 2 or 3, two or three —$NAr^3Ar^4$ may be the same or different, and when s is 0, —$NAr^3Ar^4$ is a hydrogen atom.

[Substrate]

As the substrate, a glass plate, a polymer plate or the like can be used.

Examples of the glass plate, in particular, include soda-lime glass, barium/strontium-containing glass, lead glass, aluminosilicate glass, borosilicate glass, barium borosilicate glass and quartz. Examples of the polymer plate include polycarbonate, acrylic polymer, polyethylene terephthalate, polyethersulfone and polysulfone.

[Anode]

The anode is formed of a conductive material, for example, and one having a work function larger than 4 eV is suitable.

As the conductive material, carbon, aluminum, vanadium, iron, cobalt, nickel, tungsten, silver, gold, platinum and palladium, alloys thereof, oxidized metals such as tin oxide and indium oxide which are used for an ITO substrate and a NESA substrate and an organic conductive resin such as a polythiophene and polypyrrole are used.

The anode may be formed of two or more layers, if necessary.

[Cathode]

The cathode is formed of a conductive material, for example, and one having a work function smaller than 4 eV is suitable.

As the conductive material, magnesium, calcium, tin, lead, titanium, yttrium, lithium, ruthenium, manganese, aluminum, lithium fluoride and alloys thereof are used, but usable materials are not limited thereto.

Representative examples of the alloy include, though not limited thereto, a magnesium/silver alloy, a magnesium/indium alloy and a lithium/aluminum alloy. The amount ratio of an alloy is controlled by the temperature of the deposition source, atmosphere, vacuum degree or the like, and a suitable ratio is selected.

If necessary, the cathode each may be formed of two or more layers. This cathode can be formed by making the conductive material into a thin film by vapor deposition, sputtering or some other methods.

In the case where light is outcoupled from the emitting layer through the cathode, the cathode preferably has a light transmittance of larger than 10%.

The sheet resistance of the cathode is preferably several hundreds Ω/□ or less, and the film thickness thereof is usually from 10 nm to 1 μm, preferably from 50 to 200 nm.

[Hole-Injecting Layer and Hole-Transporting Layer]

The hole-injecting/transporting layer is a layer which helps injection of holes to the emitting layer, and transports the holes to the emission region. It has a large hole mobility, and normally has a small ionization energy of 5.6 eV or less.

As the material for such hole-injecting/transporting layer, a material which transports holes to the emitting layer at a lower electric field is preferable. Further, it is preferred that the mobility of holes be at least $10^{-4}$ $cm^2/V \cdot sec$ when applying an electric field of $10^4$ to $10^6$ V/cm.

Specific examples of materials for a hole-injecting/hole-transporting layer include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-

45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232, 103, 4,175,961 and 4,012,376, JP-B-49-35702 and 39-27577, JP-A-55-144250, 56-119132 and 56-22437, DE1, 110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers) disclosed in JP-A-1-211399.

In addition, an inorganic compound such as p-type Si and p-type SiC can be used as the hole-injecting material.

As the material for the hole-injecting/transporting layer, a cross-linkable material can be used. As a cross-linkable hole-injecting/transporting layer, a layer obtained by allowing a cross-linking agent disclosed in Chem. Mater. 2008, 20, 413-422, Chem. Mater. 2011, 23(3), 658-681, WO2008108430, WO2009102027, WO2009123269, WO2010016555, WO2010018813 or the like to be insoluble by heat, light or the like can be given.

[Electron-Injecting Layer and Electron-Transporting Layer]

The electron-injecting/transporting layer is a layer which helps injection of electrons to the emitting layer and transports the electrons to the emission ragion, and has a large electron mobility.

Further, it is known that, in an organic EL device, since emitted light is reflected by an electrode (the cathode, for example), light which is directly outcoupled from the anode interferes with light outcoupled after being reflected by the electrode. In order to utilize this interference effect efficiently, the film thickness of the electron-injecting/transporting layer is appropriately selected in a range of several nm to several μm. If the thickness is large, in particular, in order to avoid an increase in voltage, it is preferred that the electron mobility be at least $10^{-5}$ $cm^2$/Vs or more when an electric field of $10^4$ to $10^6$ V/cm is applied.

As the electron-transporting material used in the electron-injecting/transporting layer, an aromatic heterocyclic compound having one or more hetero atoms within the molecule is preferably used. In particular, a nitrogen-containing ring derivative is preferable. As the nitrogen-containing ring derivative, an aromatic ring having a nitrogen-containing six-membered ring or a five-membered ring skeleton or a fused aromatic ring compound having a nitrogen-containing six-membered ring or five-membered ring skeleton are preferable.

[Interlayer Insulating Film]

The interlayer insulating film in the organic EL multi-color emitting device of the invention is mainly used for separating each emitting element (emitting layer). In addition, it is used for flattening the edge of a highly-precise electrode and for electric insulation (prevention of short circuit) between a lower electrode and an upper electrode of an organic EL device.

As the constitution material used for the interlayer insulating film, normally, an organic material such as an acrylic resin, a polycarbonate resin and a polyimide resin and an inorganic oxide such as silicon oxide ($SiO_2$ or $SiO_x$), aluminum oxide ($Al_2O_3$ or AlOx), titanium oxide ($TiO_2$), silicon nitrate ($Si_3N_4$), silicon nitride oxide (SiOxNy) or the like can be given.

It is preferred that the interlayer insulating film be formed by a method in which a photosensitive group is introduced to the above-mentioned constitution material and the material is then processed to have a desired pattern by photolithography or by printing.

[Method for Producing an Organic EL Multi-Color Emitting Device]

Each layer of the organic EL multi-color emitting device of the invention can be formed by a known dry film-forming method such as vacuum vapor deposition, sputtering, plasma coating and ion plating and a known wet film-forming method such as spin coating, casting, microphotogravure coating, photogravure coating, bar coating, roll coating, slit coating, wire bar coating, dip coating, spray coating, screen printing, flexo printing, offset printing, inkjet method and nozzle printing. If a pattern is formed, a method such as screen printing, flexo printing, offset printing and ink jet printing or the like can be applied.

Although there are no particular restrictions are imposed on the film thickness of each layer, it is required to set it to a suitable film thickness. If the film thickness is too large, a large voltage is required to be applied in order to obtain a certain optical output, resulting in poor efficiency. If the film thickness is too small, pinholes or the like are generated, and hence, a sufficient luminance cannot be obtained even if an electric field is applied. The film thickness is normally in the range of 5 nm to 10 μm, with the range of 10 nm to 0.2 μm being further preferable.

As the method for forming the hole-injecting/transporting layer, for example, forming a solution containing an aromatic amine derivative into a film can be mentioned. As the film-forming method, the spin coating method, the casting method, the microphotogravure coating method, the gravure coating method, the bar coating method, the roll coating method, the slit coating method, the wire bar coating method, the dip coating method, the spray coating method, the screen printing method, the flexo printing method, the offset printing method, the ink-jet method, the nozzle printing method or the like can be mentioned. When a pattern is formed, the screen printing method, the flexo printing method, the offset printing method and the ink-jet printing method are preferable. Film formation by these methods can be conducted under conditions which are well known by a person in the art.

After the film formation, it suffices that the film be heated under vacuum and dried to remove the solvent. No polymerization reaction by light or heating at high temperatures (200° C. or higher) is necessary. Therefore, deterioration of performance by light or heating at high temperatures can be suppressed.

It suffices that the solution for forming the hole-injecting/transporing layer contain at least one kind of an aromatic amine derivative. In addition to the above-mentioned aromatic amine derivative, it may contain a hole-transporting material, an electron-transporting material, an emitting material, an acceptor material, a solvent and an additive such as a stabilizer.

The content of the aromatic amine derivative in the solution for film formation is preferably 20 to 100 wt %, more preferably 51 to 100 wt % relative to the total weight of the composition excluding the solvent. It is preferred that the aromatic amine derivative be a main component of the composition excluding the solvent. The amount ratio of the solvent is preferably 1 to 99.9 wt % relative to the solution for film formation, with 80 to 99 wt % being more preferable.

In the meantime, the "main component" means that the content of the aromatic amine derivative is 50 mass % or more.

The solution for film formation may contain an additive for controlling the viscosity and/or the surface tension, for example, a thickener (a high molecular compound, a poor solvent for the aromatic amine derivative of the invention, or the like), a viscosity reducing agent (a low-molecular compound or the like), a surfactant or the like. In order to improve storage stability, an antioxidant which does not affect the performance of the organic EL device, such as a phenol-based antioxidant and a phosphor-based antioxidant may be contained.

Example of the solvent for the solution for film formation include chlorine-based solvents such as chloroform, methylene chloride, 1,2-dichloroethane, 1,1,2-trichloroethane, chlorobenzene and o-dichlorobenzene; ether-based solvents such as tetrahydrofuran, dioxane, dioxolane, and anisole; aromatic hydrocarbon solvents such as toluene and xylene; aliphatic hydrocarbon-based solvents such as cyclohexane, methylcyclohexane, n-pentane, n-hexane, n-heptane, n-octane, n-nonane and n-decane; ketone-based solvents such as acetone, methylethylketone, cyclohexanone, benzophenone and acetophenone; ester-based solvents such as ethyl acetate, butyl acetate, ethyl cellosolve acetate, methyl benzoate and phenyl acetate; polyvalent alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and derivatives thereof; alcohol-based solvents such as methanol, ethanol, propanol, isopropanol and cyclohexanol; sulfoxide-based solvents such as dimethylsulfoxide; and amide-based solvents such as N-methyl-2-pyrrolidone and N,N-dimethylformamide. These organic solvents may be used alone or in combination of two or more. Of these, in respect of solubility, homogeneity of a coating film, viscosity properties or the like, aromatic hydrocarbon-based solvents, ether-based solvents, aliphatic hydrocarbon-based solvents, ester-based solvents and ketone-based solvents are preferable. Toluene, xylene, ethylbenzene, diethylbenzene, trimethylbenzene, n-propylbenzene, isopropylbenzene, n-butylbenzene, isobutylbenzene, 5-butylbenzene, n-hexylbenzene, cyclohexylbenzene, 1-methylnaphthalene, tetralin, 1,3-dioxane, 1,4-dioxane, 1,3-dioxolane, anisole, ethoxybenzene, cyclohexane, bicyclohexyl, cyclohexenyl cyclohexanone, n-heptylcyclohexane, n-hexylcyclohexane, decaline, methyl benzoate, cyclohexanone, 2-propylcyclohexanone, 2-heptanone, 3-heptanone, 4-heptanone, 2-octanone, 2-nonanone, 2-decanone, dicyclohexylketone, acetophenone and benzophenone are more preferable.

As the step for color coding when the emitting layer, the hole-injecting/transporting layer or the like are formed by patterning, it is desirable to conduct color coding by using the above-mentioned coating method. The color coding method is not limited to this, and color coding can be conducted by a known method. In addition to the coating method, a pattern may be formed by using a metal mask. Further, a pattern may be formed by the laser transfer method disclosed in JP-A-2003-229258 or JP-A-2004-200170.

By using various materials and the layer forming method mentioned above, a first light-emitting element having a configuration of anode/hole-injecting layer/hole-transporting layer/first emitting layer/first adjacent layer/second electron-transporting layer/first electron-transporting layer/cathode, for example, and a second light-emitting element having a configuration of anode/hole-injecting layer/hole-transporting layer/second adjacent layer/second emitting layer/first electron-transporting layer/cathode, whereby the organic EL multi-color emitting device of the invention can be fabricated. Further, the organic EL device can be fabricated in the order of film formation reverse to that mentioned above from the cathode to the anode. The hole-injecting layer and the hole-transporting layer do not necessarily have a configuration in which different two layers are stacked, and they are respectively formed as a single layer using the material which functions as the hole-injecting/transporting layer.

In particular, in the organic EL multi-color emitting device of the invention, since the adjacent layer compound is an organic EL material which is suited to a hybrid connecting layer (HCL) which is present in the boundary of a coating layer and a deposition layer, a hybrid organic EL multi-color emitting device in which a coating layer which is capable of forming a large-sized screen at a low cost and a high-performance deposition layer are combined can be fabricated.

EXAMPLES

In the Examples and the Comparative Examples, an organic EL device was fabricated by using the following compounds.

HT1

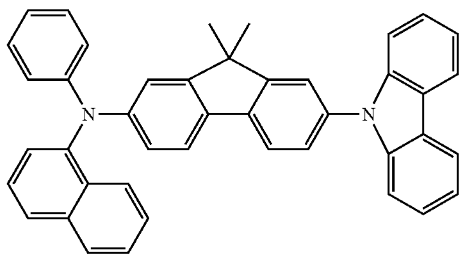

EM1

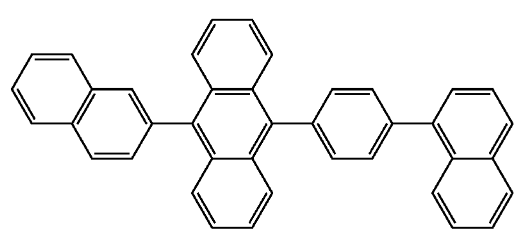

-continued
BD1
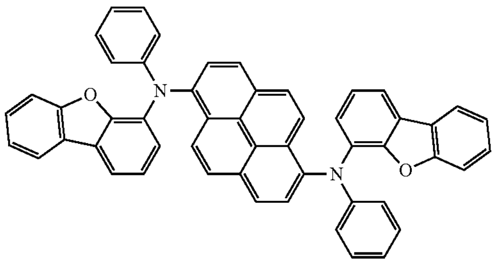
ET1
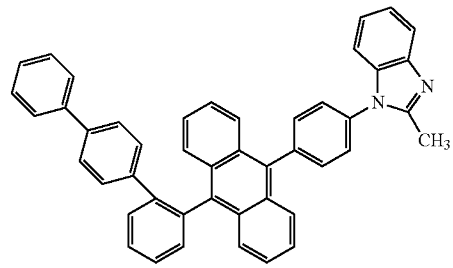
HT2
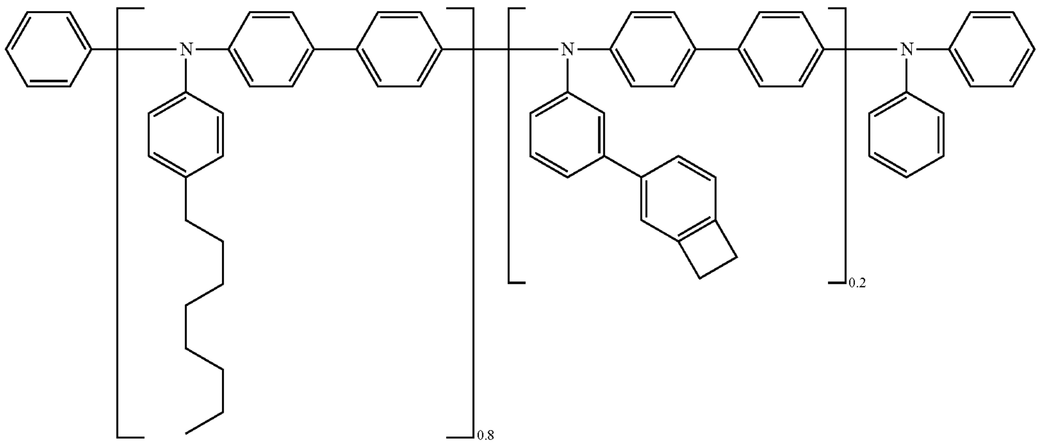
Mw20,000
EM2
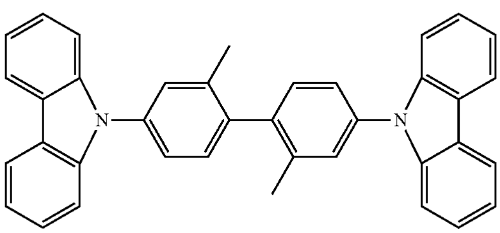
GD1
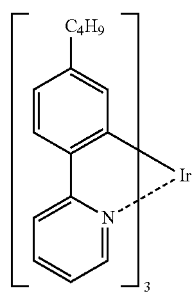
Compound 1
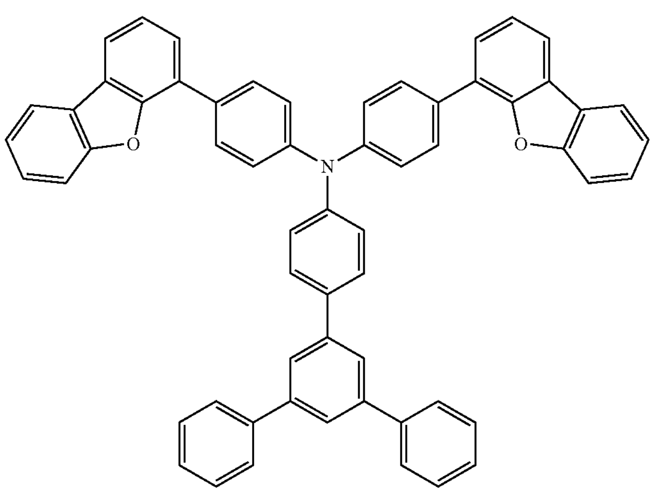

-continued
Compound 2
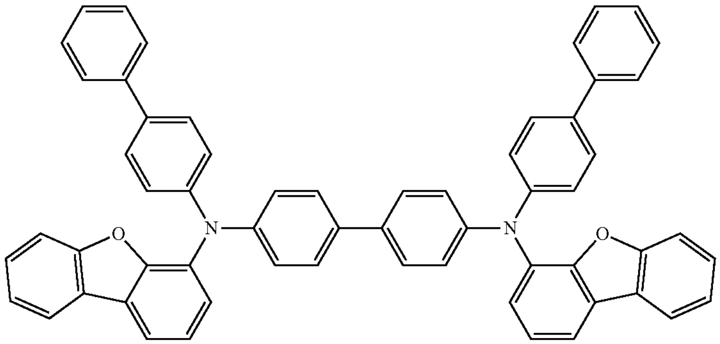
Compound 3
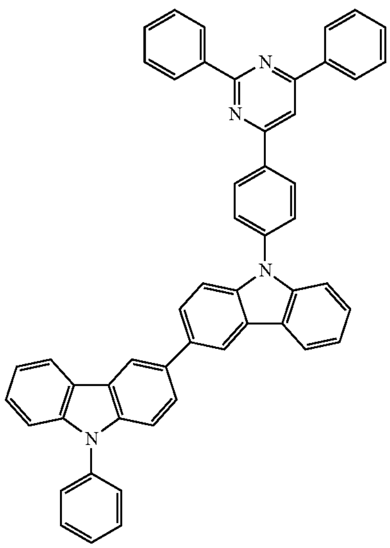
Compound 4
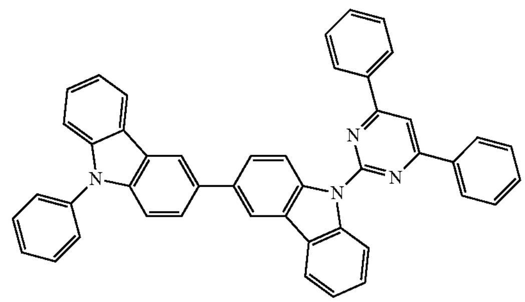
Compound 8
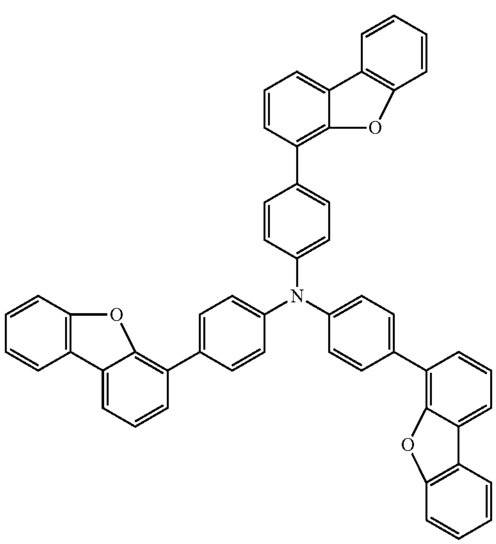
Compound 9
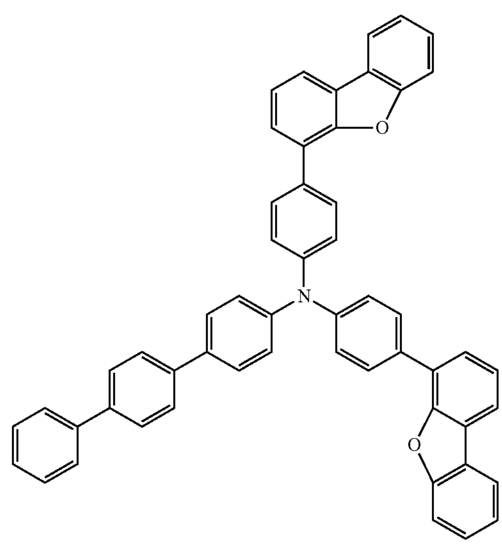

-continued
Compound 10
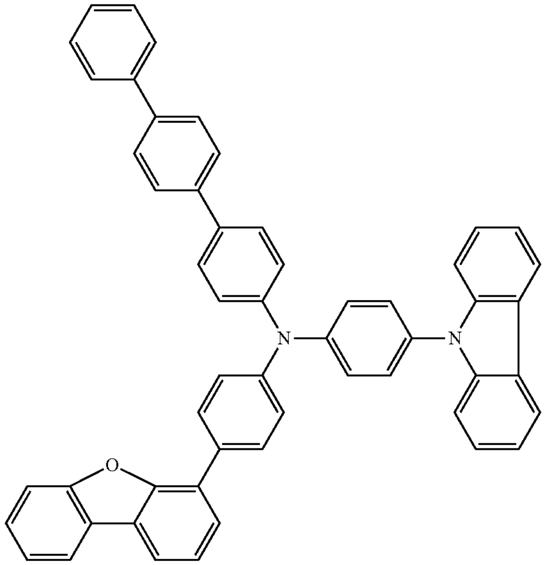
Compound 11
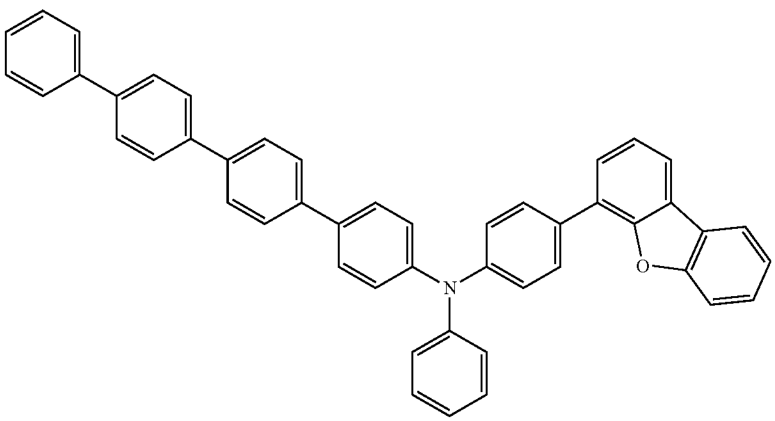
Compound 12
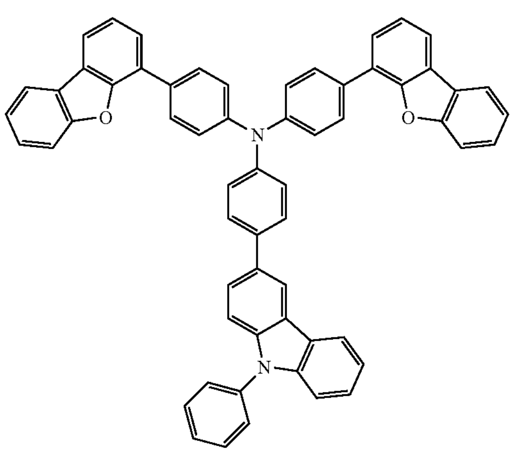
Compound 14
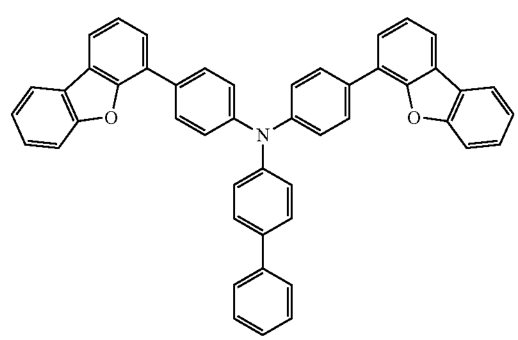

-continued
Compound 15
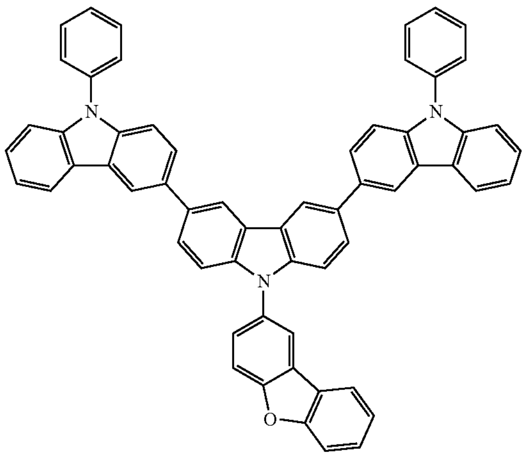
Compound 16
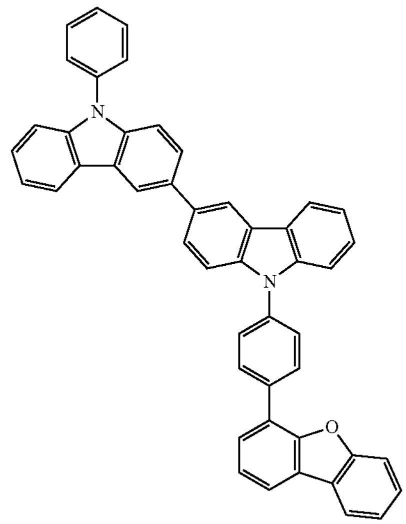
Compound 17
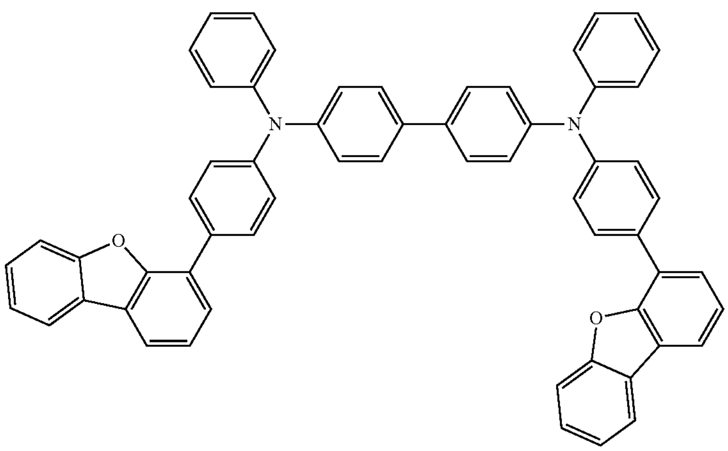
Compound 18
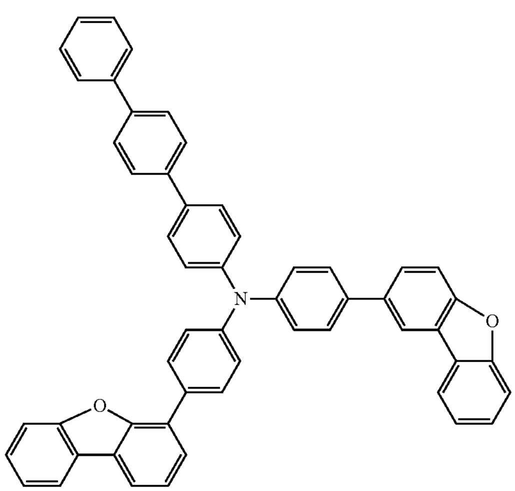
Compound 19
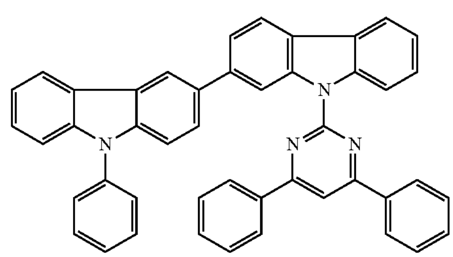

-continued
Compound 20
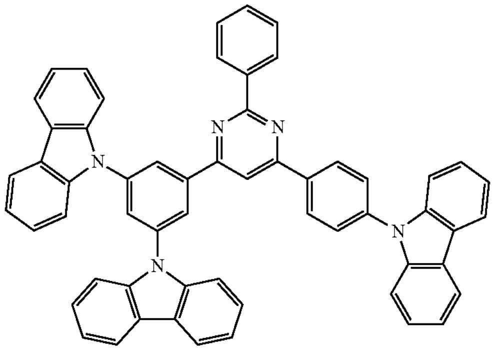
Compound 21
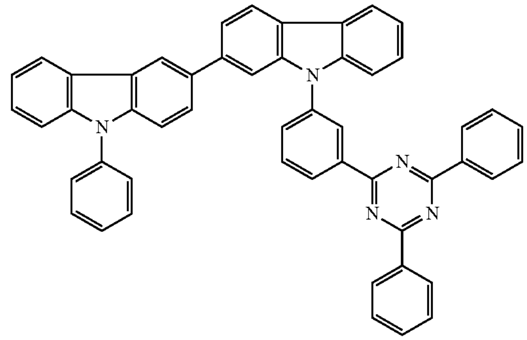
Compound 22
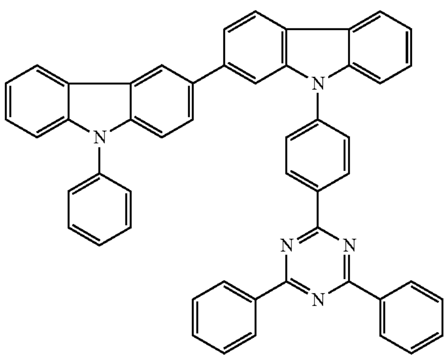
Compound 23
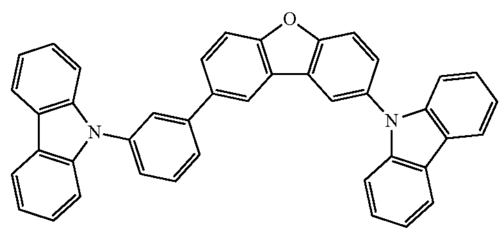
Compound 24
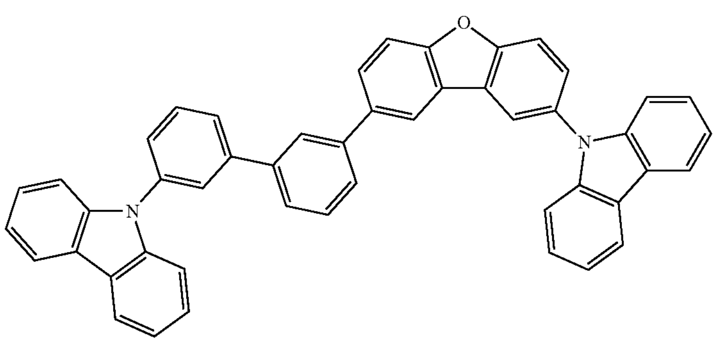
Compound 25
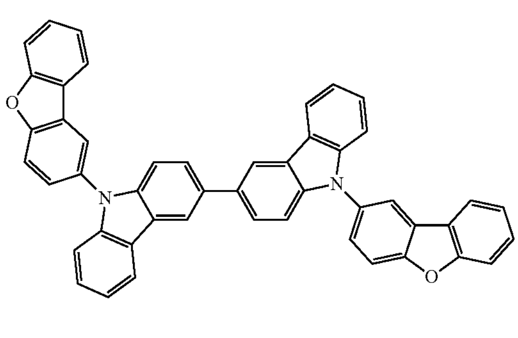
Compound 26
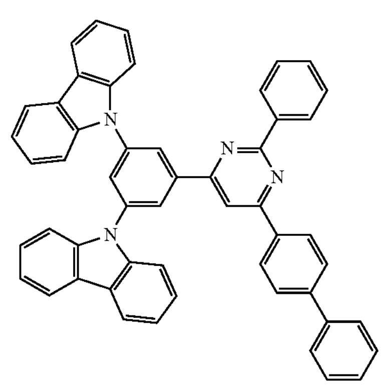

-continued

Compound 27

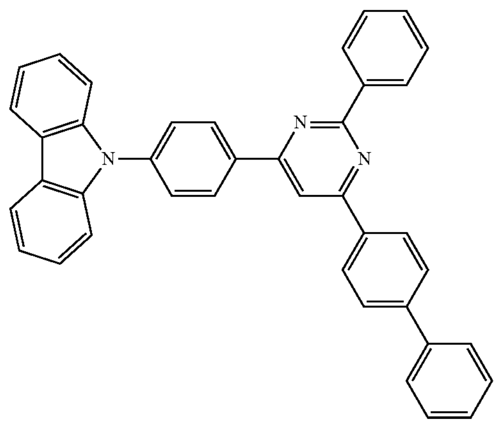

Compound 28

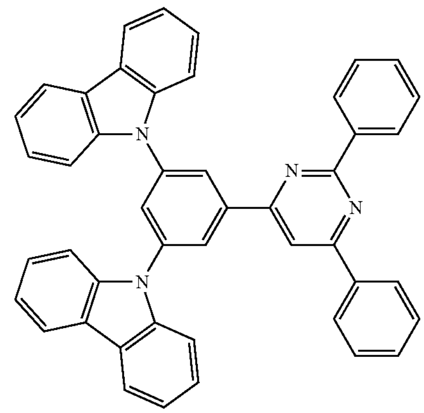

Compound A

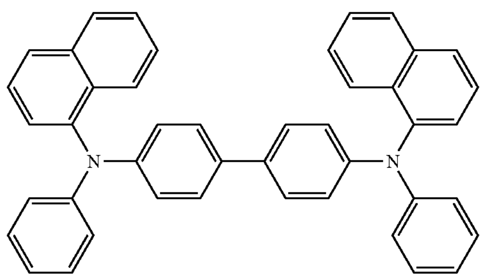

Compound B

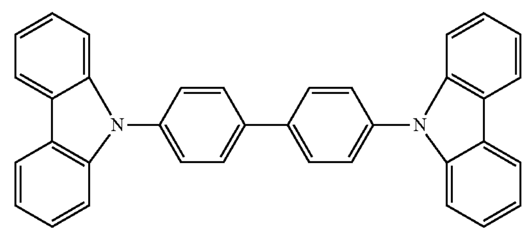

Compound C

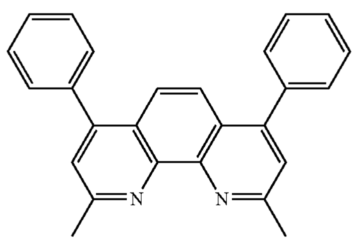

The triplet energy T1, the singlet energy S1, the ionization potential IP and the electron affinity Af of the above-mentioned compounds 1 to 4, 8 to 12, 14 to 28 and A to C were measured by the following method. The results are shown in Table 1.

(1) Triplet Energy (T1)

Triplet energy was measured by using a commercially available apparatus F-4500 (manufactured by Hitachi High Technologies Corporation). The conversion formula of T1 was as follows.

$$T1(\text{eV})=1239.85/\lambda_{edge}$$

The "$\lambda_{edge}$ (unit: nm)" means, when the phosphorescent intensity and the wavelength are taken at the vertical axis and the horizontal axis respectively to express a phosphorescent spectrum and a tangential line is drawn against the rise on the shorter wavelength side of the phosphorescent spectrum, a wavelength value of the intersection of the tangential line and the horizontal axis.

(2) Ionization Potential (IP)

An ionization potential was measured by means of a photoelectron spectrometer (AC-3, manufactured by RIKEN Co., Ltd.) in the atmosphere. Specifically, the material is irradiated with light, and the amount of electrons generated by charge separation is measured.

The ionization potential (Ip) means energy required to remove electrons from a host material compound for ionization.

(3) Affinity (Af)

Affinity was calculated from the measured value of the ionization potential Ip and the singlet energy (S1:Eg). The calculation was conducted as follows.

$$Af=Ip-Eg$$

The singlet energy (S1:Eg) means a difference between the energy in the lowest excited singlet state and the ground state, and was measured at the absorption edge of the absorption spectrum in benzene. Specifically, an absorption spectrum was measured by means of a commercially available UV-visible spectrophotometer and the singlet energy was calculated from the wavelength of the rise of the spectrum.

Here, the affinity (Af, electron affinity) means energy which is emitted or absorbed when one electron is given to the molecule of the host material. The affinity was defined as positive in the case of emission and defined as negative in the case of absorption.

TABLE 1

| | Triplet energy [eV] | Singlet energy [eV] | Ionization potential [eV] | Affinity [eV] |
|---|---|---|---|---|
| Compound 1 | 2.61 | 3.17 | 5.68 | 2.51 |
| Compound 2 | 2.65 | 3.15 | 5.52 | 2.37 |
| Compound 3 | 2.80 | 3.10 | 5.72 | 2.62 |
| Compound 4 | 2.91 | 3.09 | 5.53 | 2.44 |
| Compound 8 | 2.61 | 3.15 | 5.63 | 2.48 |
| Compound 9 | 2.58 | 3.14 | 5.57 | 2.43 |
| Compound 10 | 2.57 | 3.18 | 5.68 | 2.50 |
| Compound 11 | 2.58 | 3.13 | 5.71 | 2.58 |
| Compound 12 | 2.60 | 3.14 | 5.51 | 2.37 |
| Compound 14 | 2.61 | 3.17 | 5.61 | 2.44 |
| Compound 15 | 2.84 | 3.36 | 5.42 | 2.06 |
| Compound 16 | 2.81 | 3.40 | 5.65 | 2.25 |
| Compound 17 | 2.55 | 3.09 | 5.67 | 2.58 |
| Compound 18 | 2.56 | 3.16 | 5.52 | 2.36 |
| Compound 19 | 2.74 | 3.41 | 5.48 | 2.07 |
| Compound 20 | 2.90 | 3.16 | 6.16 | 3.00 |
| Compound 21 | 2.73 | 3.41 | 5.58 | 2.17 |
| Compound 22 | 2.72 | 3.14 | 5.70 | 2.56 |
| Compound 23 | 3.04 | 3.54 | 6.13 | 2.59 |
| Compound 24 | 2.93 | 3.54 | 6.11 | 2.62 |
| Compound 25 | 2.94 | 3.36 | 5.50 | 2.14 |
| Compound 26 | 2.65 | 3.51 | 6.13 | 2.62 |
| Compound 27 | 2.72 | 3.25 | 5.91 | 2.66 |
| Compound 28 | 2.90 | 3.55 | 5.71 | 2.16 |
| Compound A | 2.46 | 3.09 | 5.49 | 2.40 |
| Compound B | 2.81 | 3.38 | 5.86 | 2.48 |
| Compound C | 2.69 | 3.52 | 6.10 | 2.58 |

Example 1

In order to confirm the effects of the organic EL multi-color emitting device of the invention, the first light-emitting element and the second light-emitting element were evaluated.

[Formation of a Second Light-Emitting Element (Blue Fluorescent Emitting Device)]

A glass substrate measuring 25 mm×75 mm×1.1 mm thick, with an ITO transparent electrode was subjected to ultrasonic cleaning in isopropyl alcohol for 5 minutes and then to UV ozone cleaning for 30 minutes. On the thus cleaned glass substrate with the transparent electrode, ND1501 (aniline oligomer manufactured by Nissan Chemical Industries, Ltd.) was formed into a 25 nm-thick film by the spin coating method. The film was heated at 230° C. to form a hole-injecting layer. Subsequently, a xylene solution (1.0 wt %) of HT1 was formed into a film of 30 nm by the spin coating method, dried at 120° C., whereby a hole-transporting layer was formed. Subsequently, as the material for the second adjacent layer (second organic layer), compound 1 was formed into a 10 nm-thick film by deposition. Then, as the second emitting layer (blue emitting layer) (third organic layer), EM1 (host material) and BD1 (dopant material) were deposited at a mass ratio of 97:3, whereby a 35 nm-thick emitting layer was formed. Further, ET1 was formed into a 25 nm-thick film by deposition. This layer functioned as the electron-transporting layer. Thereafter, Li as the reductive dopant (Li source: manufactured by SAES Getters) and Alq were co-deposited to form an Alq:Li film (film thickness: 10 nm) as the electron-injecting layer. On this Alq:Li film, metal Al was deposited to form a metal cathode, and glass sealed in nitrogen, whereby a blue-emitting organic EL device as the second light-emitting element was fabricated.

Current (10 mA/$cm^2$) was flown to the thus fabricated second light-emitting element to evaluate the performance. The light emitting element emitted blue light, and the luminous efficiency was 7.0 cd/A, and the period of time from the start of operation until the luminance was reduced by 20% (LT80) was 250 hours at 50° C. and 25 mA/$cm^2$. The results are shown in Table 2.

[Formation of a First Light-Emitting Element (a Green Phosphorescent Emitting Element)]

A glass substrate measuring 25 mm×75 mm×1.1 mm thick, with an ITO transparent electrode, was subjected to ultrasonic cleaning in isopropyl alcohol for 5 minutes and then to UV ozone cleaning for 30 minutes. On the thus cleaned glass substrate with the transparent electrode, ND1501 (manufactured by Nissan Chemical Industries, Ltd.) was formed into a 25 nm-thick film by the spin coating method. The film was heated at 230° C. to form a hole-injecting layer. Subsequently, a xylene solution (1.0 wt %) of HT2 disclosed in WO2009/102027 was formed into a film of 30 nm by the spin coating method, dried at 230° C. by heating, whereby a hole-transporting layer was formed. Subsequently, as the first emitting layer (green emitting layer) (first organic layer), a xylene solution (1.0 wt %) of EM2 (host material) and GD1 (dopant material) (a mass ratio of 90:10) was prepared, and the solution was formed into a 60 nm-thick film by spin coating, and dried at 120° C. Subsequently, as the material for the first adjacent layer (second organic layer), the compound 1 which is the same as the material for the second adjacent layer was formed into a 10 nm-thick film by deposition. Then, EM1 (host material) and BD1 (dopant material) were deposited at a rate of 97:3, whereby a layer with a thickness of 35 nm (blue common layer) (third organic layer) was formed. Subsequently, ET1 was formed into a 25 nm-thick film by deposition. These layers functioned as the electron-transporting layer. Thereafter, Li as the reductive dopant (Li source: manufactured by SAES Getters) and Alq were co-deposited to form an Alq:Li film (film thickness: 10 nm) as the electron-injecting layer. On this Alq:Li film, metal Al was deposited to form a metal cathode, and glass sealed in nitrogen, whereby a green-emitting organic EL device as the first light-emitting element was fabricated.

Current (1 mA/$cm^2$) was flown to the thus fabricated first light-emitting element to evaluate the performance. The light emitting element emitted green light, and the luminous efficiency was 53 cd/A. Further, current (0.1 to 30 mA/$cm^2$) was flown to the first light-emitting element to confirm a change in chromaticity of emitted color. As a result, it was found that a change in CIE-x (Δx) was 0.024 and a change in CIE-y (Δy) was 0.057. The results are shown in Table 2.

Examples 2 to 11

A first light-emitting element and a second light-emitting element were produced and evaluated in the same manner as in Example 1, except that the adjacent layers obtained by depositing the compounds 8 to 12 and 14 to 18 shown in Table 2 in a single layer was used instead of the first adjacent layer and the second adjacent layer formed of the compound 1. The results are shown in Table 2.

Example 12

The first light-emitting element and the second light-emitting element were produced and evaluated in the same manner as in Example 1, except that the adjacent layers obtained by depositing the compound 2 in a thickness of 5 nm and subsequently the compound 1 in a thickness of 5 nm were used instead of the first adjacent layer and the second adjacent layer formed of the compound 1. The results are shown in Table 2.

Examples 13 to 54

The first light-emitting element and the second light-emitting element were produced and evaluated in the same manner as in Example 12, except that the first adjacent layer and the second adjacent layer were formed by using the compounds shown in Table 2 instead of using the compounds 1 and 2. The results are shown in Table 2.

Comparative Examples 1 to 3

The first light-emitting element and the second light-emitting element were produced and evaluated in the same manner as in Example 1, except that the first adjacent layer and the second adjacent layer, which were a single layer, were formed by using the compounds (A to C) shown in Table 2 instead of the compound 1 in Example 1. The results are shown in Table 2.

TABLE 2

| | Adjacent layer | Second light-emitting element Luminous efficiency [cd/A] | Second light-emitting element Life [hr] | First light-emitting element Luminous efficiency [cd/A] | First light-emitting element Change in chromaticity Δx [−] | First light-emitting element Change in chromaticity Δy [−] |
|---|---|---|---|---|---|---|
| Example 1 | Compound 1 | 7.0 | 250 | 53 | 0.024 | 0.057 |
| Example 2 | Compound 8 | 7.0 | 250 | 53 | 0.025 | 0.060 |
| Example 3 | Compound 9 | 7.2 | 230 | 55 | 0.028 | 0.058 |
| Example 4 | Compound 10 | 7.1 | 240 | 52 | 0.028 | 0.059 |
| Example 5 | Compound 11 | 7.0 | 250 | 53 | 0.025 | 0.055 |
| Example 6 | Compound 12 | 6.8 | 200 | 50 | 0.020 | 0.050 |
| Example 7 | Compound 14 | 7.2 | 250 | 51 | 0.033 | 0.058 |
| Example 8 | Compound 15 | 6.5 | 200 | 58 | 0.020 | 0.056 |
| Example 9 | Compound 16 | 6.5 | 180 | 58 | 0.023 | 0.057 |
| Example 10 | Compound 17 | 6.5 | 180 | 50 | 0.021 | 0.055 |
| Example 11 | Compound 18 | 6.9 | 240 | 51 | 0.024 | 0.057 |
| Example 12 | Compound 2/Compound 1 | 6.7 | 100 | 50 | 0.038 | 0.089 |
| Example 13 | Compound 3/Compound 1 | 7.1 | 250 | 58 | 0.012 | 0.015 |
| Example 14 | Compound 4/Compound 1 | 7.3 | 160 | 57 | 0.011 | 0.016 |
| Example 15 | Compound 19/Compound 1 | 5.8 | 120 | 55 | 0.009 | 0.012 |
| Example 16 | Compound 19/Compound 8 | 5.7 | 110 | 54 | 0.010 | 0.013 |
| Example 17 | Compound 19/Compound 9 | 5.8 | 120 | 55 | 0.009 | 0.012 |
| Example 18 | Compound 19/Compound 10 | 5.7 | 100 | 56 | 0.009 | 0.011 |
| Example 19 | Compound 20/Compound 1 | 5.2 | 110 | 57 | 0.011 | 0.013 |
| Example 20 | Compound 20/Compound 8 | 5.1 | 100 | 56 | 0.010 | 0.013 |
| Example 21 | Compound 20/Compound 9 | 5.2 | 110 | 57 | 0.012 | 0.014 |
| Example 22 | Compound 20/Compound 14 | 5.2 | 120 | 55 | 0.013 | 0.012 |
| Example 23 | Compound 21/Compound 1 | 4.9 | 100 | 52 | 0.006 | 0.008 |
| Example 24 | Compound 21/Compound 8 | 4.7 | 110 | 51 | 0.007 | 0.009 |
| Example 25 | Compound 21/Compound 9 | 4.9 | 100 | 52 | 0.006 | 0.007 |
| Example 26 | Compound 21/Compound 11 | 5.0 | 100 | 51 | 0.006 | 0.008 |
| Example 27 | Compound 22/Compound 1 | 5.4 | 180 | 57 | 0.011 | 0.013 |
| Example 28 | Compound 22/Compound 9 | 5.5 | 180 | 58 | 0.012 | 0.013 |

| | Adjacent layer | Second light-emitting element Luminous efficiency [cd/A] | Second light-emitting element Lifetime [hr] | First light-emitting element Luminous efficiency [cd/A] | First light-emitting element Change in chromaticity Δx [−] | First light-emitting element Change in chromaticity Δy [−] |
|---|---|---|---|---|---|---|
| Example 29 | Compound 22/Compound 11 | 5.4 | 190 | 57 | 0.012 | 0.013 |
| Example 30 | Compound 22/Compound 14 | 5.5 | 190 | 56 | 0.013 | 0.014 |
| Example 31 | Compound 23/Compound 1 | 6.5 | 280 | 58 | 0.008 | 0.010 |
| Example 32 | Compound 23/Compound 8 | 6.5 | 280 | 58 | 0.008 | 0.010 |
| Example 33 | Compound 23/Compound 9 | 6.6 | 270 | 59 | 0.008 | 0.011 |
| Example 34 | Compound 23/Compound 14 | 6.7 | 260 | 59 | 0.007 | 0.010 |
| Example 35 | Compound 24/Compound 1 | 6.6 | 260 | 57 | 0.010 | 0.012 |
| Example 36 | Compound 24/Compound 8 | 6.7 | 250 | 57 | 0.010 | 0.012 |
| Example 37 | Compound 24/Compound 9 | 6.6 | 270 | 58 | 0.011 | 0.013 |
| Example 38 | Compound 24/Compound 14 | 6.7 | 260 | 56 | 0.012 | 0.013 |
| Example 39 | Compound 25/Compound 1 | 6.2 | 200 | 55 | 0.016 | 0.019 |
| Example 40 | Compound 25/Compound 8 | 6.2 | 190 | 55 | 0.017 | 0.019 |
| Example 41 | Compound 25/Compound 9 | 6.1 | 220 | 54 | 0.017 | 0.019 |
| Example 42 | Compound 25/Compound 11 | 6.2 | 200 | 56 | 0.016 | 0.018 |
| Example 43 | Compound 26/Compound 1 | 6.2 | 200 | 55 | 0.016 | 0.019 |
| Example 44 | Compound 26/Compound 8 | 6.2 | 190 | 54 | 0.016 | 0.019 |
| Example 45 | Compound 26/Compound 9 | 6.2 | 210 | 55 | 0.017 | 0.020 |
| Example 46 | Compound 26/Compound 10 | 6.1 | 200 | 55 | 0.016 | 0.019 |

TABLE 2-continued

| | | | | | | |
|---|---|---|---|---|---|---|
| Example 47 | Compound 27/Compound 1 | 6.2 | 200 | 55 | 0.016 | 0.019 |
| Example 48 | Compound 27/Compound 8 | 6.2 | 200 | 54 | 0.016 | 0.019 |
| Example 49 | Compound 27/Compound 9 | 6.1 | 210 | 55 | 0.017 | 0.019 |
| Example 50 | Compound 27/Compound 11 | 6.1 | 190 | 55 | 0.017 | 0.019 |
| Example 51 | Compound 28/Compound 1 | 6.2 | 200 | 55 | 0.016 | 0.019 |
| Example 52 | Compound 28/Compound 9 | 6.1 | 210 | 54 | 0.016 | 0.019 |
| Example 53 | Compound 28/Compound 11 | 6.2 | 200 | 55 | 0.015 | 0.018 |
| Example 54 | Compound 28/Compound 14 | 6.1 | 220 | 56 | 0.017 | 0.020 |
| Com. Ex. 1 | Compound A | 4.8 | 80 | 48 | 0.072 | 0.165 |
| Com. Ex. 2 | Compound B | 2.4 | 1 | — | — | — |
| Com. Ex. 3 | Compound C | 0.2 | 1 | — | — | — |

In Examples 1 to 11 in which the adjacent layer was formed in a single layer, the compounds 1, 8 to 12 and 14 to 18 were used. These compounds contain an arylamine site and a dibenzofuran site, or a carbazole site and a dibenzofuran site. That is, since it has a hole-transporting unit of amine and carbazole and an electron-transporting unit of dibenzofuran, the luminous efficiency of each of the second light-emitting element (blue) and the first light-emitting element (green) was preferable. The reason therefor is that, while holes are fully injected to the emitting layer of the second light-emitting element (blue), electrons are fully injected into the emitting layer of the first light-emitting element (green).

The second light-emitting element (blue) has a long life. The reason therefor is that, in addition to the amine unit or the carbazole unit, the second light-emitting element has a dibenzofuran unit having a high resistance to electrons.

In Examples 12 to 54 in which the adjacent layer was formed of two layers, a layer formed of the compounds 2, 3, 4, 19 to 28 and a layer formed of the compounds 1, 8, 9, 10, 11 and 14 were stacked.

The compounds 2, 3, 4, 19 to 28 each are a compound having a relatively high T1, having an arylamine site and a dibenzofuran site, or a carbazole site and a dibenzofuran site, or a site having a carbazole site and a nitrogen-containing six-membered ring structure. In these examples, as the layer in contact with the emitting layer of the first light-emitting element, a layer formed of a compound having a T1 which is larger than that in other layers was used.

By stacking a compound having a large T1 (2.65 or more), in addition to the effects brought by the single layer structure, the dependency of the chromaticity of the first light-emitting element (green) on the current was decreased. The reason therefor is assumed that, due to the confining effects of the triplet excitons, the stacked compounds prevented the triplet energy of the first light-emitting element (green) from diffusing to the blue emitting layer as the upper layer.

In particular, the compounds 23 and 24 (carbazole site and dibenzofuran site) each have a particularly large T1. Since the amounts of holes and electrons are appropriately controlled, the efficiencies of the second light-emitting element (blue) and the first light-emitting element (green) and the dependency of the chromaticity of the first light-emitting element (green) are controlled in a well-balanced manner.

On the other hand, in the compounds A to C used in Comparative Examples 1 to 3, the efficiency of the second light-emitting element (blue emitting element) is low, and has a significantly short life. Therefore, by these compounds, it is impossible to fabricate a highly efficient, long-lived and high-quality organic EL multi-color light emitting device.

Meanwhile, of the compounds A to C, the compound A was most excellent in respect of luminous efficiency of blue color and life time of the second light-emitting element. In the first light-emitting element (green emitting element), blue emission appears among the green emission, and as a result, chromaticity varies greatly as the current varies. At the same time, the luminous efficiency of the green color was also decreased. The reason therefor is assumed that, in the compound A, the triplet exciton energy of the green color is diffused to the blue emitting layer through the compound A.

INDUSTRIAL APPLICABILITY

The organic EL multi-color emitting device of the invention can preferably be used in a display for use in commercial or industrial purposes and color displays or the like, and they can be preferably used in a flat panel TV, a note PC, a mobile phone, a display of a game machine, a car-mounted TV or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. An organic EL multi-color light-emitting device comprising a substrate, and a first light-emitting element and a second light-emitting element arranged on the surface of the substrate;

the first light-emitting element comprising, between an anode and a cathode, a first organic layer, a second organic layer and a third organic layer in this sequence in a direction perpendicular to the surface of the substrate;

the second light-emitting element comprising, between an anode and a cathode, a second organic layer and a third organic layer in this sequence in a direction perpendicular to the surface of the substrate;

the second organic layer of the first light-emitting element and the second organic layer of the second light-emitting element comprise the same compound, and the third organic layer of the first light-emitting element and the third organic layer of the second light-emitting element may be the same or different;

the first organic layer comprising a first light-emitting dopant;

the third organic layer of the first light-emitting element and the third organic layer of the second light-emitting element comprising a second light-emitting dopant, and the third organic layer of the first light-emitting element is an electron-injecting and/or electron-transporting layer;

the second organic layer of the first light-emitting element and the second organic layer of the second light-emitting element comprising any of the following compounds (A) to (D):

(A) a compound comprising an arylamine site, and a furan site or a thiophene site, (B) a compound comprising an arylamine site and a site comprising a nitrogen-containing six-membered ring structure, (C) a compound comprising a carbazole site, and a furan site or a thiophene site, and (D) a compound comprising a carbazole site and a site comprising a nitrogen-containing six membered ring structure, wherein the first and second light-emitting elements emit different color light, and the thickness of the second organic layer of the first light-emitting element is the same as the thickness of the second organic layer of the second light-emitting element.

2. The organic EL multi-color light-emitting device according to claim 1, wherein the compounds (A) to (D) are a compound represented by the following formula (1) or (2):

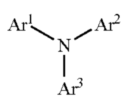

(1)

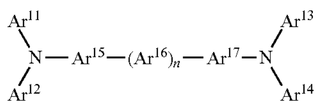

(2)

wherein, in the formula (1), one pair of $Ar^1$ and $Ar^2$, $Ar^1$ and $Ar^3$ and $Ar^2$ and $Ar^3$ is respectively bonded with each other to form a substituted or unsubstituted aromatic heterocyclic ring having 5 to 52 ring atoms; and/or $Ar^1$ to $Ar^3$ are independently a substituted or unsubstituted aromatic hydrocarbon group having 6 to 50 ring carbon atoms or a substituted or unsubstituted aromatic heterocyclic group having 5 to 52 ring atoms;

provided that at least one of $Ar^1$ to $Ar^3$ is a substituent represented by the following formula (a) or the following formula (b);

in the formula (2), at least one pair of $Ar^{11}$ and $Ar^{15}$, $Ar^{11}$ and $Ar^{15}$, $Ar^{13}$ and $Ar^{17}$ and $Ar^{14}$ and $Ar^{17}$ are respectively bonded with each other to form a substituted or unsubstituted aromatic heterocyclic ring having 5 to 52 ring atoms; and/or $Ar^{11}$ to $Ar^{14}$ are independently a substituted or unsubstituted aromatic hydrocarbon group having 6 to 50 ring carbon atoms or a substituted or unsubstituted aromatic heterocyclic group having 5 to 52 ring atoms; $Ar^{15}$ to $Ar^{17}$ are independently a substituted or unsubstituted divalent aromatic hydrocarbon group having 6 to 50 ring carbon atoms or a substituted or unsubstituted divalent aromatic heterocyclic group having 5 to 52 ring atoms;

provided that at least one of $Ar^{11}$ to $Ar^{14}$ is a substituent represented by the following formula (a) or the following formula (b); and n is an integer of 0 to 2:

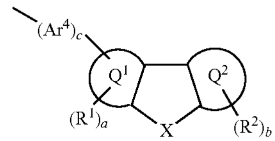

(a)

$$—(Ar^5)_d—AZ \quad \text{(b)}$$

wherein X is an oxygen atom (—O—) or a sulfur atom (—S—);

$Q^1$ and $Q^2$ are independently a saturated or unsaturated ring having 5 to 25 atoms;

AZ is a substituted or unsubstituted pyridinyl group, a substituted or unsubstituted pyrimidinyl group, a substituted or unsubstituted pyrazinyl group, a substituted or unsubstituted pyridazinyl group, a substituted or unsubstituted triazinyl group or a substituted or unsubstituted tetrazinyl group;

$Ar^4$ and $Ar^5$ are independently a substituted or unsubstituted divalent aromatic hydrocarbon group having 6 to 12 ring carbon atoms or a substituted or unsubstituted divalent aromatic heterocyclic group having 5 to 13 ring atoms, $R^1$ and $R^2$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, a substituted or unsubstituted aromatic hydrocarbon group having 6 to 25 ring carbon atoms, a substituted or unsubstituted aromatic heterocyclic group having 5 to 25 ring atoms, a halogen atom or a cyano group; and/or at least one of adjacent plural $R^1$s, adjacent plural $R^2$s and adjacent $R^1$ and $R^2$ are bonded with each other to form a substituted or unsubstituted saturated or unsaturated ring; and a, b, c and d are independently an integer of 0 to 3.

3. The organic EL multi-color light-emitting device according to claim 2, wherein, in the formula (1), when $Ar^1$ and $Ar^2$, $Ar^1$ and $Ar^3$ and $Ar^2$ and $Ar^3$ are not bonded with each other, at least one of $Ar^1$ to $Ar^3$ is a substituent represented by the formula (a).

4. The organic EL multi-color light-emitting device according to claim 2, wherein at least one of $Ar^1$, $Ar^2$ and $Ar^3$ in the formula (1) and at least one of $Ar^{11}$, $Ar^{12}$, $Ar^{13}$ and $Ar^{14}$ in the formula (2) is a substituent represented by the formula (a).

5. The organic EL multi-color light-emitting device according to claim 2, wherein the substituent represented by the formula (a) is a substituent represented by the following formula (a-1):

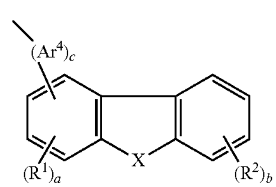

(a-1)

wherein X, $R^1$, $R^2$, $Ar^4$, a, b and c are the same as defined in the formula (a).

6. The organic EL multi-color light-emitting device according to claim 5, wherein the substituent represented by the formula (a-1) is a substituent represented by the following formula (a-2):

(a-2)

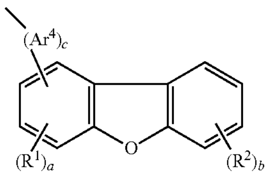

wherein $R^1$, $R^2$, $Ar^4$, a, b and c are the same as defined in the formula (a).

7. The organic EL multi-color light-emitting device according to claim 2, wherein at least one of $Ar^1$, $Ar^2$ and $Ar^3$ in the formula (1) and at least one of $Ar^{11}$, $Ar^{12}$, $Ar^{13}$ and $Ar^{14}$ in the formula (2) is a substituent represented by the following formula (c):

$$—Ar^{21}—Ar^{22}\!\left(Ar^{23}\right)_p \quad (c)$$

wherein $Ar^{21}$ to $Ar^{23}$ are independently a substituted or unsubstituted aromatic hydrocarbon group having 6 to 12 ring carbon atoms or a substituted or unsubstituted aromatic heterocyclic group having 5 to 13 ring atoms; and p is an integer of 0 to 2.

8. The organic EL multi-color light-emitting device according to claim 7, wherein the substituent represented by the formula (c) is a substituent represented by the following formula (c-1):

(c-1)

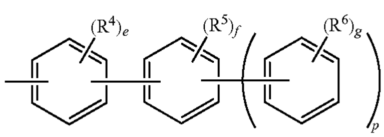

wherein $R^4$, $R^5$ and $R^6$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group; and/or at least one of plural $R^4$s, plural $R^5$s and plural $R^6$s are respectively bonded with each other to form a substituted or unsubstituted saturated or unsaturated ring; and/or at least one of adjacent $R^4$ and $R^5$, and adjacent $R^5$ and $R^6$ are respectively bonded with each other to form a substituted or unsubstituted saturated or unsaturated ring; and p is an integer of 0 to 2, e is an integer of 0 to 4 and f and g are independently an integer of 0 to 5.

9. The organic EL multi-color light-emitting device according to claim 2, wherein at least one of $Ar^4$ and $Ar^5$ is a linkage group represented by the formula (d) or (e):

(d)

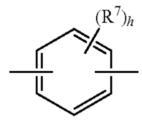

(e)

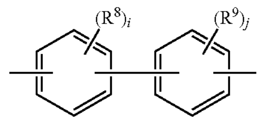

wherein $R^7$, $R^8$ and $R^9$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, an aromatic hydrocarbon group having 6 to 25 ring carbon atoms, an aromatic heterocyclic group having 5 to 25 ring atoms, a halogen atom or a cyano group; and/or at least one of plural $R^7$s, plural $R^8$s and plural $R^9$s are respectively bonded with each other to form a substituted or unsubstituted saturated or unsaturated ring; and/or adjacent $R^8$ and $R^9$ are bonded with each other to form a substituted or unsubstituted saturated or unsaturated ring; and h, i and j are independently an integer of 0 to 4.

10. The organic EL multi-color light-emitting device according to claim 2, wherein the compound represented by the formula (1) is a compound represented by the following formula (1-1):

(1-1)

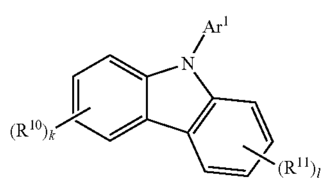

wherein $Ar^1$ is a substituent represented by the formula (a) or (b);

$R^{10}$ and $R^{11}$ are the same as $R^1$ and $R^2$ in the formula (a); and k and l are independently an integer of 0 to 4.

11. The organic EL multi-color light-emitting device according to claim 2 wherein, when the aromatic hydrocarbon group having 6 to 25 ring carbon atoms of $R^1$ and $R^2$ and the aromatic heterocyclic group having 5 to 25 ring atoms have a substituent, the substituent is a carbazolyl group, a dibenzofuranyl group or a dibenzothiophenyl group.

12. The organic EL multi-color light-emitting device according to claim 2, wherein the compound represented by the formula (2) is a compound represented by the following formula (f):

(f)

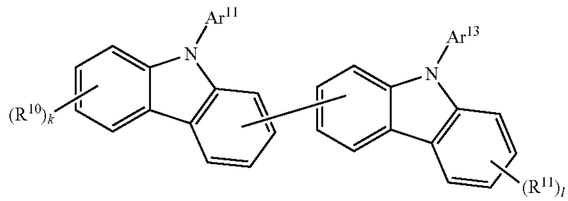

wherein $Ar^{11}$ and $Ar^{13}$ are independently a substituted or unsubstituted aromatic hydrocarbon group having 6 to 50 ring carbon atoms or a substituted or unsubstituted aromatic heterocyclic group having 5 to 52 ring atoms, and at least one of $Ar^{11}$ and $Ar^{13}$ is a substituent represented by the formula (a) or (b);

$R^{10}$ and $R^{11}$ are the same as $R^1$ and $R^2$ in the formula (a); and k and l are independently an integer of 0 to 4.

13. The organic EL multi-color light-emitting device according to claim 12, wherein the compound represented by the formula (f) is a compound represented by the following formula (f-1) or the following formula (f-2):

(f-1)

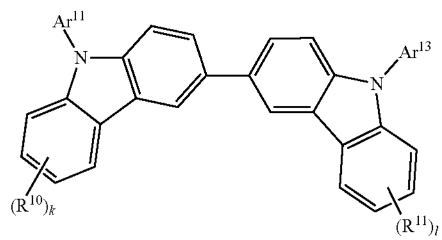

(f-2)

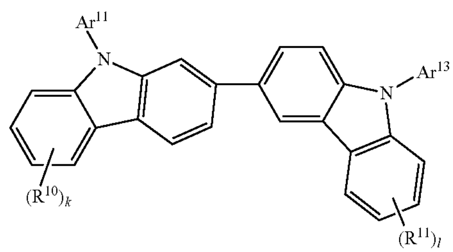

wherein $Ar^{11}$, $Ar^{13}$, $R^{10}$, $R^{11}$, k and l are as defined in the formula (f).

14. The organic EL multi-color light-emitting device according to claim 1, wherein the second organic layer is in contact with the first organic layer and the second organic layer comprises the compound represented by the formula (C) or (D).

15. The organic EL multi-color light-emitting device according to claim 1, wherein the second organic layer is in contact with the third organic layer, and the second organic layer comprises the compound represented by the formula (A) or (B).

16. The organic EL multi-color light-emitting device according to claim 1, wherein the second organic layer is a single layer or a stack of a plurality of organic layers, and the second organic layer comprises two or more selected from the compounds (A) to (D).

17. The organic EL multi-color light-emitting device according to claim 16, wherein the second organic layer is a stack of a plurality of organic layers.

18. The organic EL multi-color light-emitting device according to claim 1, wherein the second organic layer comprises a compound having a triplet energy of 2.55 eV or more.

19. The organic EL multi-color light-emitting device according to claim 1, wherein the second organic layer is in contact with the first organic layer, and the second organic layer comprises a compound having a triplet energy of 2.65 eV or more.

20. The organic EL multi-color light-emitting device according to claim 1, wherein the first organic layer is a red, yellow or green phosphorescent emitting layer and the third organic layer of the second light-emitting element is a blue fluorescent emitting layer.

21. The organic EL multi-color light-emitting device according to claim 1, wherein the first organic layer is formed by coating and the third organic layer is formed by deposition.

22. The organic EL multi-color light-emitting device according to claim 1, wherein a hole-injecting and/or hole-transporting layer formed by coating is provided on the anode side of the second organic layer of the second light-emitting element.

23. The organic EL multi-color light-emitting device according to claim 1, wherein the compounds (A) to (D) are a compound represented by the following formula (1) or (2):

(1)

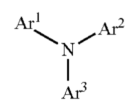

(2)

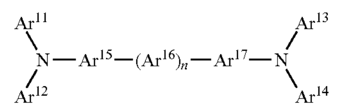

wherein, in the formula (1), one pair of $Ar^1$ and $Ar^2$, $Ar^1$ and $Ar^3$ and $Ar^2$ and $Ar^3$ is respectively bonded with each other to form a substituted or unsubstituted aromatic heterocyclic ring having 5 to 52 ring atoms; and/or $Ar^1$ to $Ar^3$ are independently a substituted or unsubstituted aromatic hydrocarbon group having 6 to 50 ring carbon atoms or a substituted or unsubstituted aromatic heterocyclic group having 5 to 52 ring atoms;

provided that at least one of $Ar^1$ to $Ar^3$ is a substituent represented by the following formula (a) or the following formula (b);

when $Ar^1$ and $Ar^2$, $Ar^1$ and $Ar^3$ and $Ar^2$ and $Ar^3$ are not bonded with each other, at least one of $Ar^1$ to $Ar^3$ is a substituent represented by the formula (a);

in the formula (2), at least one pair of $Ar^{11}$ and $Ar^{15}$, $Ar^{11}$ and $Ar^{15}$, $Ar^{13}$ and $Ar^{17}$ and $Ar^{14}$ and $Ar^{17}$ are respectively bonded with each other to form a substituted or unsubstituted aromatic heterocyclic ring having 5 to 52 ring atoms; and/or $Ar^{11}$ to $Ar^{14}$ are independently a substituted or unsubstituted aromatic hydrocarbon group having 6 to 50 ring carbon atoms or a substituted or unsubstituted aromatic heterocyclic group having 5 to 52 ring atoms; $Ar^{15}$ to $Ar^{17}$ are independently a substituted or unsubstituted divalent aromatic hydrocarbon group having 6 to plural $R^2$s and adjacent $R^1$ and $R^2$ are bonded with each other to form a substituted or unsubstituted saturated or unsaturated ring; and a, b, c and d are independently an integer of 0 to 3.

24. The organic EL multi-color light-emitting device according to claim 1, wherein the compounds (A) to (D) are a compound represented by the following formula (1) or (2):

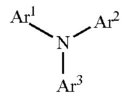

(1)

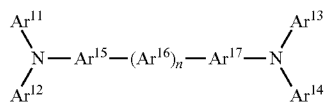

(2)

wherein, in the formula (1), one pair of $Ar^1$ and $Ar^2$, $Ar^1$ and $Ar^3$ and $Ar^2$ and $Ar^3$ is respectively bonded with each other to form a substituted or unsubstituted aromatic heterocyclic ring having 5 to 52 ring atoms; and/or $Ar^1$ to $Ar^3$ are independently a substituted or unsubstituted aromatic hydrocarbon group having 6 to 50 ring carbon atoms or a substituted or unsubstituted aromatic heterocyclic group having 5 to 52 ring atoms;

provided that at least one of $Ar^1$ to $Ar^3$ is a substituent represented by the following formula (a) or the following formula (b);

when $Ar^1$ and $Ar^2$, $Ar^1$ and $Ar^3$ and $Ar^2$ and $Ar^3$ are not bonded with each other, at least one of $Ar^1$ to $Ar^3$ is a substituent represented by the formula (a);

in the formula (2), at least one pair of $Ar^{11}$ and $Ar^{15}$, $Ar^{12}$ and $Ar^{15}$, $Ar^{13}$ and $Ar^{17}$ and $Ar^{14}$ and $Ar^{17}$ are respectively bonded with each other to form a substituted or unsubstituted aromatic heterocyclic ring having 5 to 52 ring atoms; and/or $Ar^{11}$ to $Ar^{14}$ are independently a substituted or unsubstituted aromatic hydrocarbon group having 6 to 50 ring carbon atoms or a substituted or unsubstituted aromatic heterocyclic group having 5 to 52 ring atoms; $Ar^{15}$ to $Ar^{17}$ are independently a substituted or unsubstituted divalent aromatic hydrocarbon group having 6 to 50 ring carbon atoms or a substituted or unsubstituted divalent aromatic heterocyclic group having 5 to 52 ring atoms;

provided that at least one of $Ar^{11}$ to $Ar^{14}$ is a substituent represented by the following formula (a) or the following formula (b); and n is an integer of 0 to 2:

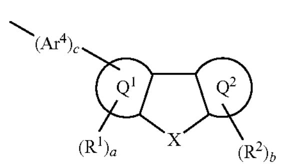

(a)

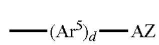

(b)

wherein X is an oxygen atom (—O—) or a sulfur atom (—S—);

$Q^1$ and $Q^2$ are independently a saturated or unsaturated ring having 5 to 25 atoms;

AZ is a substituted or unsubstituted pyridinyl group, a substituted or unsubstituted pyrimidinyl group, a substituted or unsubstituted pyrazinyl group, a substituted or unsubstituted pyridazinyl group, a substituted or unsubstituted triazinyl group or a substituted or unsubstituted tetrazinyl group;

$Ar^4$ and $Ar^5$ are independently a substituted or unsubstituted divalent aromatic hydrocarbon group having 6 to 12 ring carbon atoms or a substituted or unsubstituted divalent aromatic heterocyclic group having 5 to 13 ring atoms, $R^1$ and $R^2$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, a substituted or unsubstituted aromatic hydrocarbon group having 6 to 25 ring carbon atoms, a substituted or unsubstituted aromatic heterocyclic group having 5 to 25 ring atoms, a halogen atom or a cyano group; and/or at least one of adjacent plural $R^1$s, adjacent 50 ring carbon atoms or a substituted or unsubstituted divalent aromatic heterocyclic group having 5 to 52 ring atoms;

provided that at least one of $Ar^{11}$ to $Ar^{14}$ is a substituent represented by the following formula (a) or the following formula (b); and n is an integer of 0 to 2:

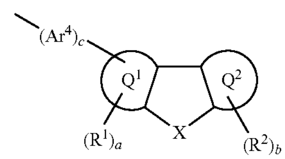

(a)

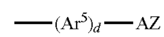

(b)

wherein X is an oxygen atom (—O—) or a sulfur atom (—S—);

$Q^1$ and $Q^2$ are independently a saturated or unsaturated ring having 5 to 25 atoms;

AZ is a substituted or unsubstituted pyridinyl group, a substituted or unsubstituted pyrimidinyl group, a substituted or unsubstituted pyrazinyl group, a substituted or unsubstituted pyridazinyl group, a substituted or unsubstituted triazinyl group or a substituted or unsubstituted tetrazinyl group;

$Ar^4$ and $Ar^5$ are independently a substituted or unsubstituted divalent aromatic hydrocarbon group having 6 to 12 ring carbon atoms or a substituted or unsubstituted divalent aromatic heterocyclic group having 5 to 13 ring atoms, $R^1$ and $R^2$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, a substituted or unsubstituted aromatic hydrocarbon group having 6 to 25 ring carbon atoms, a substituted or unsubstituted aromatic heterocyclic group having 5 to 25 ring atoms, a halogen atom or a cyano group; and/or at least one of adjacent plural $R^1$s, adjacent plural $R^2$s and adjacent $R^1$ and $R^2$ are bonded with each other to form a substituted or unsubstituted saturated or unsaturated ring; and a, b, c and d are independently an integer of 0 to 3.

25. The organic EL multi-color light-emitting device according to claim 1, wherein the second organic layer of the first light-emitting element and the second organic layer of the second light-emitting element each independently comprise a compound represented by the following formula (1) or (2):

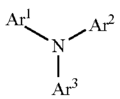

(1)

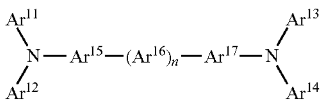

(2)

wherein, in the formula (1), one pair of $Ar^1$ and $Ar^2$, $Ar^1$ and $Ar^3$ and $Ar^2$ and $Ar^3$ is respectively bonded with each other to form a substituted or unsubstituted aromatic heterocyclic ring having 5 to 52 ring atoms; and/or $Ar^1$ to $Ar^3$ are independently a substituted or unsubstituted aromatic hydrocarbon group having 6 to 50 ring carbon atoms or a substituted or unsubstituted aromatic heterocyclic group having 5 to 52 ring atoms;

provided that at least one of $Ar^1$ to $Ar^3$ is a substituent represented by the following formula (a) or the following formula (b);

in the formula (2), at least one pair of $Ar^{11}$ and $Ar^{15}$, $Ar^{12}$ and $Ar^{15}$, $Ar^{13}$ and $Ar^{17}$ and $Ar^{14}$ and $Ar^{17}$ are respectively bonded with each other to form a substituted or unsubstituted aromatic heterocyclic ring having 5 to 52 ring atoms; and/or $Ar^{11}$ to $Ar^{14}$ are independently a substituted or unsubstituted aromatic hydrocarbon group having 6 to 50 ring carbon atoms or a substituted or unsubstituted aromatic heterocyclic group having 5 to 52 ring atoms; $Ar^{15}$ to $Ar^{17}$ are independently a substituted or unsubstituted divalent aromatic hydrocarbon group having 6 to 50 ring carbon atoms or a substituted or unsubstituted divalent aromatic heterocyclic group having 5 to 52 ring atoms;

provided that at least one of $Ar^{11}$ to $Ar^{14}$ is a substituent represented by the following formula (a) or the following formula (b); and n is an integer of 0 to 2:

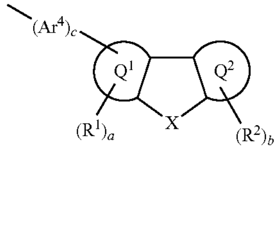

(a)

-continued $$—(Ar^5)_d—AZ \qquad (b)$$

wherein X is an oxygen atom (—O—) or a sulfur atom (—S—);

$Q^1$ and $Q^2$ are independently a saturated or unsaturated ring having 5 to 25 atoms;

AZ is a substituted or unsubstituted pyridinyl group, a substituted or unsubstituted pyrimidinyl group, a substituted or unsubstituted pyrazinyl group, a substituted or unsubstituted pyridazinyl group, a substituted or unsubstituted triazinyl group or a substituted or unsubstituted tetrazinyl group;

$Ar^4$ and $Ar^5$ are independently a substituted or unsubstituted divalent aromatic hydrocarbon group having 6 to 12 ring carbon atoms or a substituted or unsubstituted divalent aromatic heterocyclic group having 5 to 13 ring atoms, $R^1$ and $R^2$ are independently a linear or branched alkyl group having 1 to 15 carbon atoms, a linear or branched alkenyl group having 2 to 15 carbon atoms, a cycloalkyl group having 3 to 15 carbon atoms, a trialkylsilyl group having an alkyl group having 1 to 15 carbon atoms, a triarylsilyl group having an aryl group having 6 to 25 ring carbon atoms, an alkylarylsilyl group having an alkyl group having 1 to 15 carbon atoms and an aryl group having 6 to 25 ring carbon atoms, a substituted or unsubstituted aromatic hydrocarbon group having 6 to 25 ring carbon atoms, a substituted or unsubstituted aromatic heterocyclic group having 5 to 25 ring atoms, a halogen atom or a cyano group; and/or at least one of adjacent plural $R^1$s, adjacent plural $R^2$s and adjacent $R^1$ and $R^2$ are bonded with each other to form a substituted or unsubstituted saturated or unsaturated ring; and a, b, c and d are independently an integer of 0 to 3.

26. The organic EL multi-color light-emitting device according to claim 1, wherein the first light-emitting element emits blue light, the second light-emitting element emits red or green light, and the first light-emitting element and the second light-emitting element emit different color lights from each other.

27. The organic EL multi-color light-emitting device according to claim 1, wherein the first light-emitting element is a green-emitting element, a red-emitting element or a yellow-emitting element, and the second light-emitting element is a blue-emitting element.

28. The organic EL multi-color light-emitting device according to claim 1, wherein the second organic layer is capable of preventing emission of light from the third organic layer in the first light-emitting element.

* * * * *